(12) United States Patent
Yamazaki et al.

(10) Patent No.: US 11,943,929 B2
(45) Date of Patent: Mar. 26, 2024

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Hajime Kimura, Atsugi (JP); Takanori Matsuzaki, Atsugi (JP); Kiyoshi Kato, Atsugi (JP); Satoru Okamoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/129,120

(22) Filed: Mar. 31, 2023

(65) Prior Publication Data

US 2023/0309308 A1    Sep. 28, 2023

Related U.S. Application Data

(60) Continuation of application No. 17/319,389, filed on May 13, 2021, now Pat. No. 11,626,422, which is a
(Continued)

(30) Foreign Application Priority Data

Jun. 16, 2017  (JP) ................................. 2017-119073
Jul. 6, 2017    (JP) ................................. 2017-132740

(51) Int. Cl.
*H10B 43/27*      (2023.01)
*H01L 29/24*      (2006.01)
(Continued)

(52) U.S. Cl.
CPC .............. *H10B 43/27* (2023.02); *H10B 43/10* (2023.02); *H10B 43/35* (2023.02); *H10B 43/40* (2023.02);
(Continued)

(58) Field of Classification Search
CPC ....................................... H01L 29/24
See application file for complete search history.

(56) References Cited

U.S. PATENT DOCUMENTS 5,528,032 A     6/1996  Uchiyama
6,727,544 B2 *  4/2004  Endoh .................... H10B 69/00
                                                         257/305
(Continued)

FOREIGN PATENT DOCUMENTS

JP    2007-317874 A    12/2007
JP    2011-023543 A    2/2011
(Continued)

*Primary Examiner* — William A Harriston
(74) *Attorney, Agent, or Firm* — Eric J. Robinson; Robinson Intellectual Property Law Office, P.C.

(57) ABSTRACT

A semiconductor device with a large storage capacity per unit area is provided. The semiconductor device includes a first insulator including a first opening, a first conductor that is over the first insulator and includes a second opening, a second insulator that is over the first insulator and includes a third opening, and an oxide penetrating the first opening, the second opening, and the third opening. The oxide includes a first region at least in the first opening, a second region at least in the second opening, and a third region at least in the third opening. The resistances of the first region and the third region are lower than the resistance of the second region.

14 Claims, 73 Drawing Sheets

Related U.S. Application Data continuation of application No. 16/786,273, filed on Feb. 10, 2020, now Pat. No. 11,011,542, which is a division of application No. 16/004,890, filed on Jun. 11, 2018, now Pat. No. 10,593,693.

(51) Int. Cl.
  *H01L 29/51* (2006.01)
  *H10B 43/10* (2023.01)
  *H10B 43/35* (2023.01)
  *H10B 43/40* (2023.01)
  *H10B 43/50* (2023.01)

(52) U.S. Cl.
  CPC .............. *H10B 43/50* (2023.02); *H01L 29/24* (2013.01); *H01L 29/513* (2013.01)

(56) References Cited

U.S. PATENT DOCUMENTS

| | | |
|---|---|---|
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,330,208 B2 | 12/2012 | Alsmeier et al. |
| 8,349,681 B2 | 1/2013 | Alsmeier et al. |
| 8,372,720 B2 | 2/2013 | Fukuzumi et al. |
| 8,409,977 B2 | 4/2013 | Shim et al. |
| 8,450,791 B2 | 5/2013 | Alsmeier |
| 8,461,000 B2 | 6/2013 | Alsmeier et al. |
| 8,461,641 B2 | 6/2013 | Alsmeier et al. |
| 8,580,639 B2 | 11/2013 | Alsmeier et al. |
| 8,658,499 B2 | 2/2014 | Makala et al. |
| 8,729,624 B2 | 5/2014 | Fukuzumi et al. |
| 8,765,543 B2 | 7/2014 | Alsmeier et al. |
| 8,829,591 B2 | 9/2014 | Alsmeier |
| 8,860,108 B2 | 10/2014 | Yamazaki et al. |
| 8,872,254 B2 | 10/2014 | Lee et al. |
| 8,928,061 B2 | 1/2015 | Chien et al. |
| 8,946,810 B2 | 2/2015 | Alsmeier |
| 9,035,374 B2 | 5/2015 | Fukuzumi et al. |
| 9,053,984 B2 | 6/2015 | Kato |
| 9,117,923 B2 | 8/2015 | Shim et al. |
| 9,159,739 B2 | 10/2015 | Makala et al. |
| 9,165,940 B2 | 10/2015 | Chien et al. |
| 9,230,976 B2 | 1/2016 | Alsmeier |
| 9,356,042 B2 | 5/2016 | Fukuzumi et al. |
| 9,406,694 B1 | 8/2016 | Ikeno et al. |
| 9,502,431 B2 | 11/2016 | Sakuma et al. |
| 9,634,097 B2 | 4/2017 | Rabkin et al. |
| 9,780,170 B2 | 10/2017 | Ota et al. |
| 10,090,023 B2 | 10/2018 | Ohmaru et al. |
| 2009/0146206 A1* | 6/2009 | Fukuzumi ............ H10B 43/20 257/E21.442 |
| 2010/0213537 A1* | 8/2010 | Fukuzumi ............ H10B 43/27 257/326 |
| 2011/0065270 A1* | 3/2011 | Shim ..................... H10B 43/27 257/E21.613 |
| 2011/0101332 A1 | 5/2011 | Yamazaki et al. |
| 2011/0101334 A1 | 5/2011 | Yamazaki et al. |
| 2011/0101351 A1 | 5/2011 | Yamazaki |
| 2011/0147823 A1 | 6/2011 | Kuk et al. |
| 2011/0233648 A1 | 9/2011 | Seol et al. |
| 2012/0001243 A1 | 1/2012 | Kato |
| 2012/0001249 A1 | 1/2012 | Alsmeier et al. |
| 2012/0098048 A1 | 4/2012 | Choe et al. |
| 2012/0119287 A1 | 5/2012 | Park et al. |
| 2012/0319114 A1 | 12/2012 | Yamazaki et al. |
| 2013/0221356 A1 | 8/2013 | Yamazaki et al. |
| 2013/0292671 A1 | 11/2013 | Yamazaki et al. |
| 2013/0334593 A1 | 12/2013 | Seol et al. |
| 2014/0038400 A1 | 2/2014 | Park et al. |
| 2014/0097484 A1 | 4/2014 | Seol et al. |
| 2014/0187029 A1 | 7/2014 | Seol et al. |
| 2014/0225181 A1 | 8/2014 | Makala et al. |
| 2015/0041879 A1 | 2/2015 | Jayanti et al. |
| 2015/0054058 A1 | 2/2015 | Seol et al. |
| 2015/0171184 A1 | 6/2015 | Nakajima |
| 2015/0179662 A1 | 6/2015 | Makala et al. |
| 2015/0255485 A1 | 9/2015 | Kameoka et al. |
| 2015/0311301 A1 | 10/2015 | Seol et al. |
| 2015/0325586 A1 | 11/2015 | Seol et al. |
| 2015/0380422 A1 | 12/2015 | Sharangpani et al. |
| 2016/0071879 A1 | 3/2016 | Seol et al. |
| 2016/0104720 A1 | 4/2016 | Alsmeier |
| 2016/0104721 A1 | 4/2016 | Seol et al. |
| 2016/0247818 A1 | 8/2016 | Seol et al. |
| 2016/0247927 A1 | 8/2016 | Nomura et al. |
| 2017/0040416 A1 | 2/2017 | Ota et al. |
| 2017/0098655 A1 | 4/2017 | Costa et al. |
| 2018/0033799 A1 | 2/2018 | Kanamori et al. |

FOREIGN PATENT DOCUMENTS

| | | |
|---|---|---|
| JP | 2014-229814 A | 12/2014 |
| JP | 2015-109426 A | 6/2015 |
| JP | 2015-195331 A | 11/2015 |
| JP | 2016-063027 A | 4/2016 |
| JP | 2017-034144 A | 2/2017 |

* cited by examiner

718

SEMICONDUCTOR DEVICE AND METHOD FOR MANUFACTURING SEMICONDUCTOR DEVICE

BACKGROUND OF THE INVENTION

1. Field of the Invention

The present invention relates to, for example, a memory device and a semiconductor device. The present invention relates to, for example, manufacturing methods of the memory device and the semiconductor device. The present invention relates to a memory transistor included in a memory device and a manufacturing method thereof. The present invention relates to, for example, a processor and an electronic device. The present invention relates to manufacturing methods of the processor and the electronic device. The present invention relates to driving methods of the memory device, the processor, and the electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a memory device, a semiconductor circuit, and an electronic device include a semiconductor device in some cases.

2. Description of the Related Art

In recent years, with the increase in the amount of data manipulated, a semiconductor device having a larger storage capacity has been required. To increase storage capacity per unit area, stacking memory cells is effective (see Patent Documents 1 and 2). Stacking memory cells can increase storage capacity per unit area in accordance with the number of stacked memory cells.

REFERENCES

Patent Documents

[Patent Document 1] United States Published Patent Application No. 2011/0065270 A1
[Patent Document 2] U.S. Pat. No. 9,634,097 B2

SUMMARY OF THE INVENTION

In Patent Documents 1 and 2, a plurality of memory elements (also referred to as memory cells) are stacked and these memory elements are connected in series, so that a three-dimensional memory cell array (also referred to as a memory string) is formed. In such a three-dimensional memory cell array, as the number of stacked memory elements increases, the series resistance between the memory cells is increased, and the resistance of the memory cell array is increased. There has been a problem in that the high resistance of the memory cell array causes loss of current flowing through the memory cell array and heat generation in the memory cell array.

In Patent Document 1, a semiconductor pattern provided in a columnar form is in contact with an insulator including a charge storage layer. In addition, in Patent Document 2, a semiconductor pattern provided in a columnar form is in contact with an insulator functioning as a tunnel dielectric. When the semiconductor is in contact with the insulator, trap centers might be formed at the interface between them. The trap centers formed at the interface between the semiconductor and the insulator trap electrons and changes the threshold voltage of the transistor in the positive direction. Thus, the trap centers might affect the current driving power in the on state of the transistor, that is, the on-state current, the field-effect mobility, and the reliability.

In view of the above problems, an object of one embodiment of the present invention is to provide a semiconductor device having favorable electrical characteristics in which the formation of trap centers is suppressed.

Another object is to provide a semiconductor device with a large storage capacity per unit area. Another object is to provide a semiconductor device with a novel structure in which memory cells are stacked. Another object is to provide semiconductor devices with high productivity.

Another object is to provide a module including any of the above semiconductor devices. Another object is to provide an electronic device including any of the above semiconductor devices or the module. Another object is to provide a novel semiconductor device. Another object is to provide a novel module. Another object is to provide a novel electronic device.

Another object is to provide a semiconductor device with reduced power consumption in a circuit operation. Another object is to provide a module including a semiconductor device with reduced power consumption in a circuit operation. Another object is to provide an electronic device including a semiconductor device or a module with reduced power consumption in a circuit operation.

Note that the descriptions of these objects do not disturb the existence of other objects. One embodiment of the present invention does not necessarily achieve all the objects listed above. Other objects will be apparent from and can be derived from the description of the specification, the drawings, the claims, and the like.

One embodiment of the present invention is a semiconductor device including a first insulator including a first opening, a first conductor that is over the first insulator and includes a second opening, a second insulator that is over the first conductor and includes a third opening, and an oxide penetrating the first opening, the second opening, and the third opening. The oxide includes a first region in the first opening, a second region in the second opening, and a third region in the third opening. The resistances of the first region and the third region are lower than the resistance of the second region.

Another embodiment of the present invention is a semiconductor device including a first insulator including a first opening, a first conductor that is over the first insulator and includes a second opening, a second insulator that is over the first conductor and includes a third opening, an oxide penetrating the first opening, the second opening, and the third opening, a third insulator in contact with the oxide, and a second conductor in contact with the third insulator. The oxide is provided between the first conductor and the third insulator. The third insulator is provided between the oxide and the second conductor. The oxide includes a first region in the first opening, a second region in the second opening, and a third region in the third opening. The resistances of the first region and the third region are lower than the resistance of the second region.

In the above, the semiconductor device may further include a nitride containing at least one of silicon and a metal element. The nitride is preferably provided in contact with the first region and the third region.

In the above, the semiconductor device may further include a fourth insulator, a fifth insulator, and a sixth insulator. The fourth insulator is preferably provided between the first conductor and the oxide. The fifth insulator is preferably provided between the fourth insulator and the oxide. The sixth insulator is preferably provided between the fifth insulator and the oxide.

In the above, the fourth insulator is preferably an oxide containing at least one of silicon, aluminum, and hafnium.

In the above, the sixth insulator is preferably an oxide containing at least one of silicon, aluminum, and hafnium.

In the above, the nitride is preferably provided between the sixth insulator and the first region and between the sixth insulator and the third region.

In the above, a diameter of the first opening and a diameter of the third opening are preferably larger than a diameter of the second opening.

Another embodiment of the present invention is a method for manufacturing a semiconductor device, including the steps of forming a first insulating film; forming a first conductive film over the first insulating film; forming a second insulating film over the first conductive film; processing the second insulating film, the first conductive film, and the first insulating film to form a first insulator including the first opening, a first conductor that is over the first insulator and includes a second opening, and a second insulator that is over the first conductor and includes a third opening; processing the first insulator and the second insulator to make a diameter of the first opening and a diameter of the third opening larger than a diameter of the second opening; forming a third insulator to be in contact with the first insulator, the first conductor, and the second insulator in the first opening, the second opening, and the third opening; forming a first nitride containing at least one of silicon and a metal element to be in contact with the third insulator; processing the first nitride to form a second nitride having a sidewall surface substantially aligned with a sidewall surface of an inner wall of the third insulator in the first opening and the third opening; and forming an oxide to be in contact with the third insulator and the second nitride in the first opening, the second opening, and the third opening.

In the above, heat treatment is preferably performed after the formation of the oxide.

In the above, the third insulator preferably has a stacked-layer structure including a fourth insulator, a fifth insulator, and a sixth insulator. The third insulator having the stacked-layer structure is preferably formed by forming the fourth insulator, forming the fifth insulator after the formation of the fourth insulator, and forming the sixth insulator after the formation of the fifth insulator.

Another embodiment of the present invention is a semiconductor device including a first insulator including a first opening, a first conductor that is over the first insulator and includes a second opening, a second insulator that is over the first conductor and includes a third opening, an oxide provided in the first opening, the second opening, and the third opening, and a third insulator between the oxide and the first insulator, first conductor, and second insulator. A diameter of the second opening is larger than a diameter of the first opening and a diameter of the third opening. The oxide is provided along a side surface and a top surface of the first insulator, a side surface of the first conductor, and a bottom surface and a side surface of the second insulator with the third insulator provided between the oxide and the first insulator, first conductor and second insulator. The oxide includes a first region in the first opening, a second region in the second opening, and a third region in the third opening. The resistances of the first region and the third region are lower than the resistance of the second region.

Another embodiment of the present invention is a semiconductor device including a first insulator including a first opening, a first conductor that is over the first insulator and includes a second opening, a second insulator that is over the first conductor and includes a third opening, an oxide provided in the first opening, the second opening, and the third opening, a third insulator between the oxide and the first insulator, first conductor, and second insulator, a fourth insulator in contact with the oxide, and a second conductor in contact with the fourth insulator. A diameter of the second opening is larger than a diameter of the first opening and a diameter of the third opening. The oxide is provided along a side surface and a top surface of the first insulator, a side surface of the first conductor, and a bottom surface and a side surface of the second insulator with the third insulator provided between the oxide and the first insulator, first conductor and second insulator. The fourth insulator is provided between the oxide and the second conductor. The oxide includes a first region in the first opening, a second region in the second opening, and a third region in the third opening. The resistances of the first region and the third region are lower than the resistance of the second region.

In the above, the first conductor preferably serves as a first gate, and the second conductor preferably serves as a second gate.

In the above, the oxide preferably contains In, an element M (M is Al, Ga, Y, or Sn), and Zn.

In the above, the oxide preferably includes a first layer, a second layer in contact with an inner wall of the first layer, and a third layer in contact with an inner wall of the second layer. An energy gap of the second layer is preferably narrower than an energy gap of the first layer. An energy gap of the second layer is preferably narrower than an energy gap of the third layer.

In the above, it is preferable that the semiconductor device further include a fifth insulator in the second opening and the oxide be provided between the third insulator and the fifth insulator.

In the above, the first region and the third region preferably contain more argon than the second region.

In the above, the first region and the third region preferably contain a larger amount of at least one of hydrogen, nitrogen, and a metal element than the second region.

In the above, the third insulator preferably includes a sixth insulator, a seventh insulator, and an eighth insulator. The sixth insulator is preferably provided between the first conductor and the oxide. The seventh insulator is preferably provided between the sixth insulator and the oxide. The eighth insulator is preferably provided between the seventh insulator and the oxide.

In the above, the sixth insulator is preferably an oxide containing at least one of silicon, aluminum, and hafnium.

In the above, the eighth insulator is preferably an oxide containing at least one of silicon, aluminum, and hafnium.

Another embodiment of the present invention is a method for manufacturing a semiconductor device, including the steps of forming a first insulating film; forming a first conductive film over the first insulating film; forming a second insulating film over the first conductive film; processing the second insulating film, the first conductive film, and the first insulating film to form a first insulator including the first opening, a first conductor that is over the first insulator and includes a second opening, and a second insulator that is over the first conductor and includes a third opening; processing the first conductor to make a diameter of the second opening larger than a diameter of the first opening and a diameter of the third opening; forming a third insulator to be in contact with the first insulator, the first conductor, and the second insulator in the first opening, the second opening, and the third opening; forming an oxide to be in contact with the third insulator; forming a third insulating film to be in contact with the oxide; processing the third insulating film to form a fourth insulator having a sidewall surface substantially aligned with a sidewall surface of an inner wall of the oxide in the second opening; and performing treatment for reducing resistance on part of the oxide using the fourth insulator as a mask.

In the above, the treatment for reducing resistance is preferably treatment for adding an element to the oxide.

In the above, the element is preferably at least one selected from argon, hydrogen, boron, carbon, nitrogen, fluorine, phosphorus, sulfur, chlorine, helium, neon, krypton, xenon, aluminum, ruthenium, titanium, tantalum, tungsten, chromium, and indium.

In the above, the treatment for reducing resistance is preferably any one of plasma treatment, ion implantation treatment, ion doping treatment, and reverse sputtering treatment.

According to one embodiment of the present invention, a semiconductor device having favorable electrical characteristics and in which the formation of trap centers is suppressed can be provided.

A semiconductor device with a large storage capacity per unit area can be provided. A semiconductor device with a novel structure in which memory cells (also referred to as memory transistors) are stacked can be provided. A semiconductor device that can be manufactured with high productivity can be provided.

A module including the semiconductor device can be provided. An electronic device including the semiconductor device or the module can be provided. A novel semiconductor device can be provided. A novel module can be provided. A novel electronic device can be provided.

In a circuit operation, a semiconductor device with reduced power consumption can be provided. In a circuit operation, a module including a semiconductor device with reduced power consumption can be provided. In a circuit operation, an electronic device including a semiconductor device or a module with reduced power consumption can be provided.

Note that the description of these effects does not preclude the existence of other effects. One embodiment of the present invention does not have to have all the effects listed above. Other effects will be apparent from and can be derived from the description of the specification, the drawings, the claims, and the like.

DETAILED DESCRIPTION OF THE INVENTION

Figure 1:
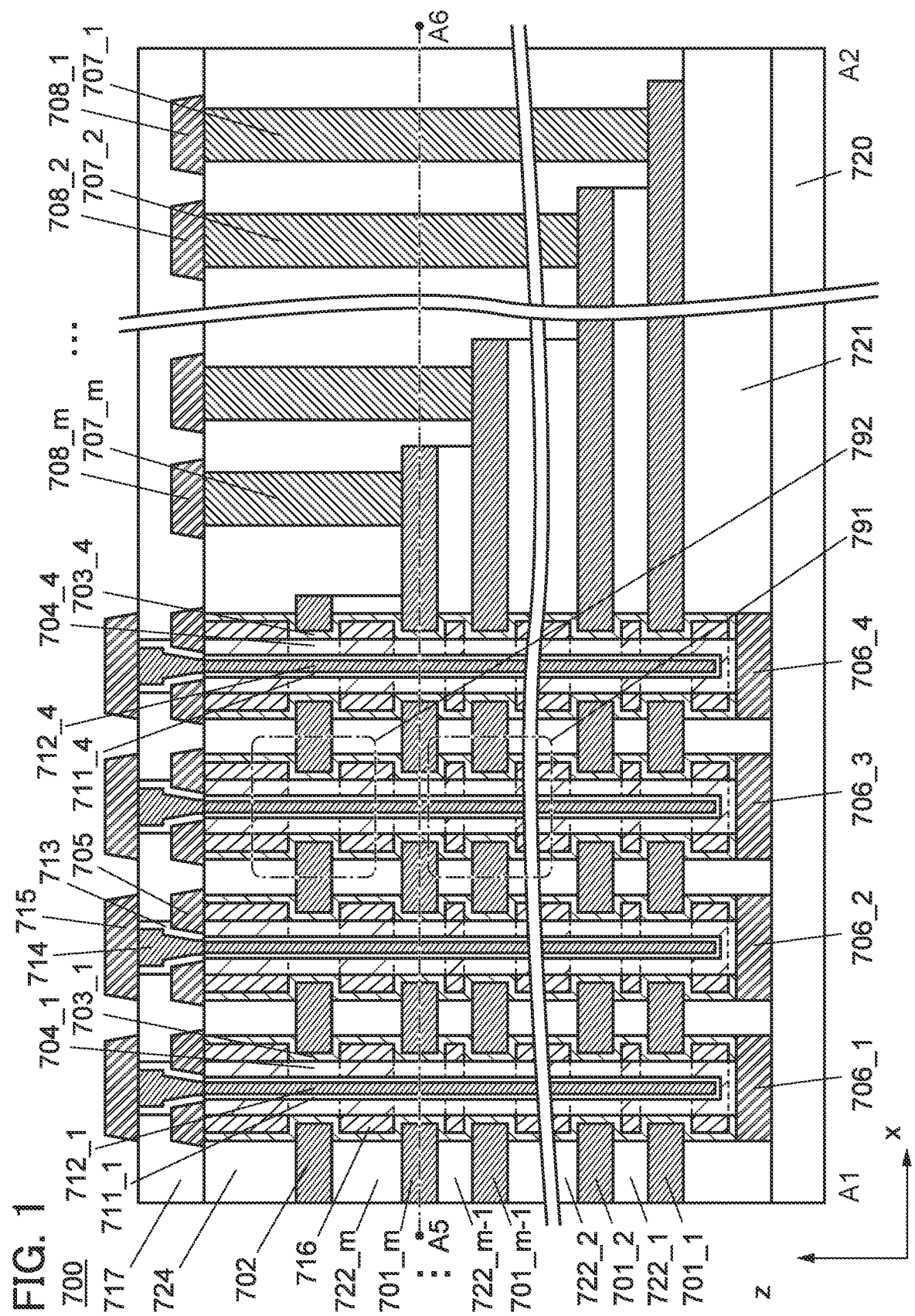
FIG. 1 is a cross-sectional view illustrating a semiconductor device of one embodiment of the present invention.

Embodiments will be described below with reference to the accompanying drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the scale is not necessarily limited to that illustrated in the drawings. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Furthermore, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement (e.g., over, above, under, and below) are used for convenience in describing a positional relation between components with reference to drawings. Furthermore, the positional relationship between components is changed as appropriate in accordance with a direction in which each component is described. Thus, the positional relation is not limited to that described with a term used in this specification and can be explained with another term as appropriate depending on the situation.

Note that in this specification and the like, the term "electrically connected" includes the case where components are connected through an object having any electric function. There is no particular limitation on the "object having any electric function" as long as electric signals can be transmitted and received between components that are connected through the object. Examples of the "object having any electric function" are a switching element such as a transistor, a resistor, an inductor, a capacitor, and an element with a variety of functions as well as an electrode and a wiring.

Note that in this specification and the like, a nitride oxide refers to a compound that includes more nitrogen than oxygen. An oxynitride refers to a compound that includes more oxygen than nitrogen. The content of each element can be measured by Rutherford backscattering spectrometry (RBS), for example.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. In addition, the term "perpendicular" indicates that the angle formed between two straight lines is greater than or equal to 800 and less than or equal to $100°$, and accordingly also includes the case where the angle is greater than or equal to 850 and less than or equal to $95°$. In addition, the term "substantially perpendicular" indicates that the angle formed between two straight lines is greater than or equal to $60°$ and less than or equal to $120°$.

In this specification, trigonal and rhombohedral crystal systems are included in a hexagonal crystal system.

Note that in this specification, a barrier film refers to a film having a function of inhibiting the penetration of oxygen and impurities such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

Note that in this specification and the like, "In:Ga:Zn=4:2:3 or a neighborhood of In:Ga:Zn=4:2:3" refers to an atomic ratio where, when In is 4 with respect to the total number of atoms, Ga is greater than or equal to 1 and less than or equal to 3 ($1 \leq Ga \leq 3$) and Zn is greater than or equal to 2 and less than or equal to 4.1 ($2 \leq Zn \leq 4.1$). "In:Ga:Zn=5:1:6 or a neighborhood of In:Ga:Zn=5:1:6" refers to an atomic ratio where, when In is 5 with respect to the total number of atoms, Ga is greater than 0.1 and less than or equal to 2 ($0.1 < Ga \leq 2$) and Zn is greater than or equal to 5 and less than or equal to 7 ($5 \leq Zn \leq 7$). "In:Ga:Zn=1:1:1 or a neighborhood of In:Ga:Zn=1:1:1" refers to an atomic ratio where, when In is 1 with respect to the total number of atoms, Ga is greater than 0.1 and less than or equal to 2 ($0.1 < Ga \leq 2$) and Zn is greater than 0.1 and less than or equal to 2 ($0.1 < Zn \leq 2$).

Embodiment 1

In this embodiment, a structure, a manufacturing method, a circuit configuration, and an operation of a semiconductor device of one embodiment of the disclosed invention will be described with reference to FIG. 1 to FIGS. 36A to 36C.

(Memory Transistor MT, Memory Cell Array 700)

Figure 2A:
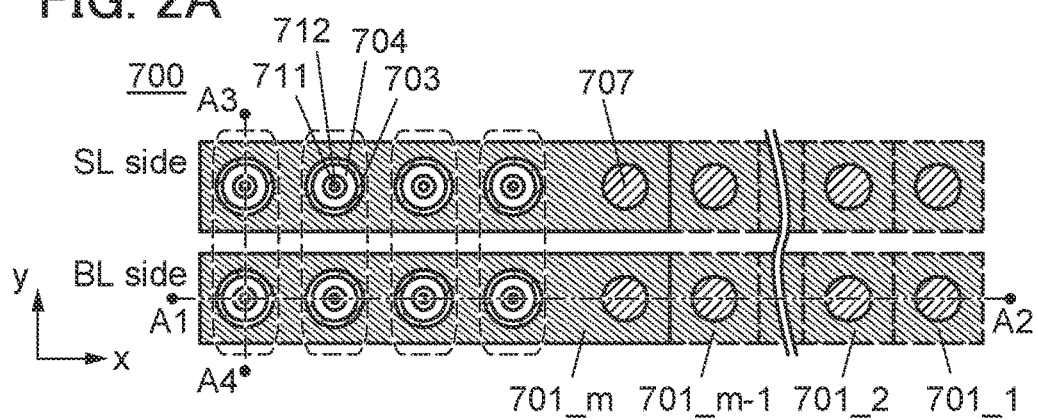
FIGS. 2A and 2B are a top view and a cross-sectional view illustrating a semiconductor device of one embodiment of the present invention.
Figure 2B:
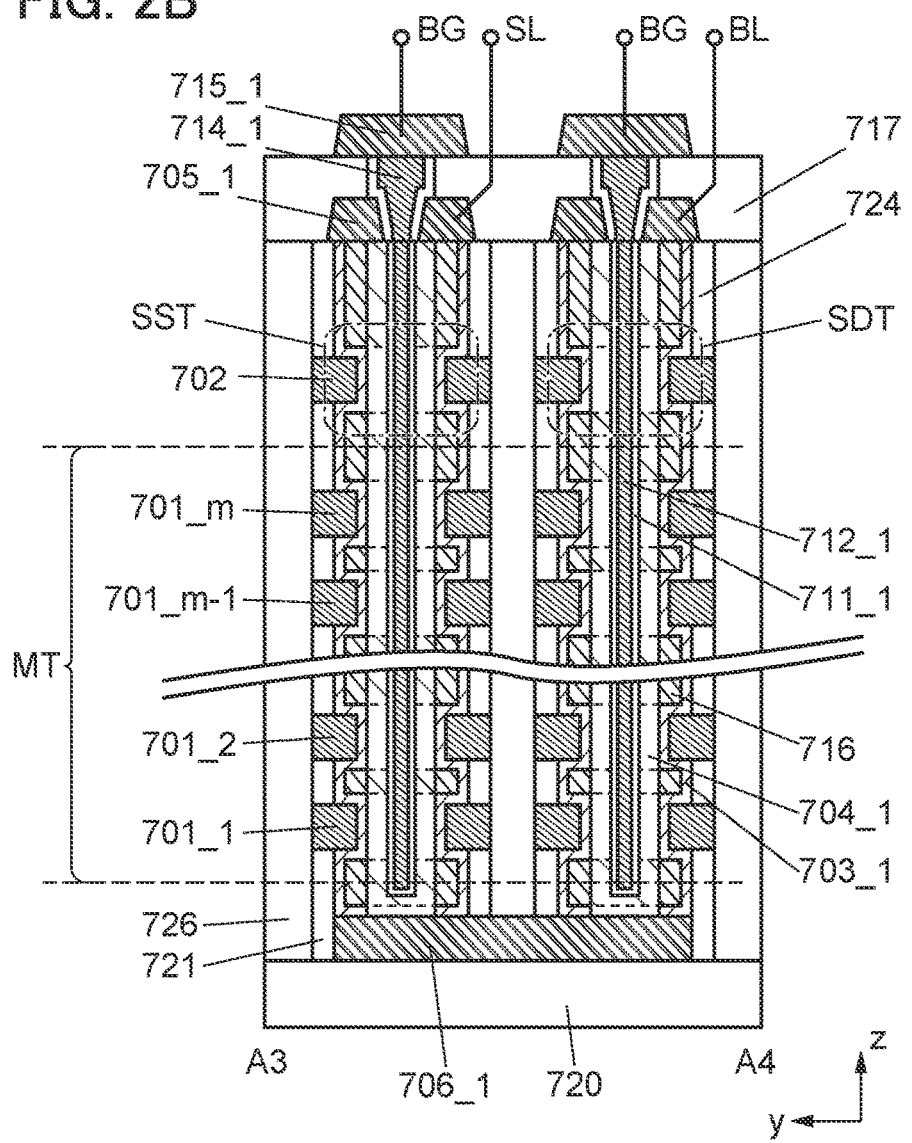
Figure 3A:
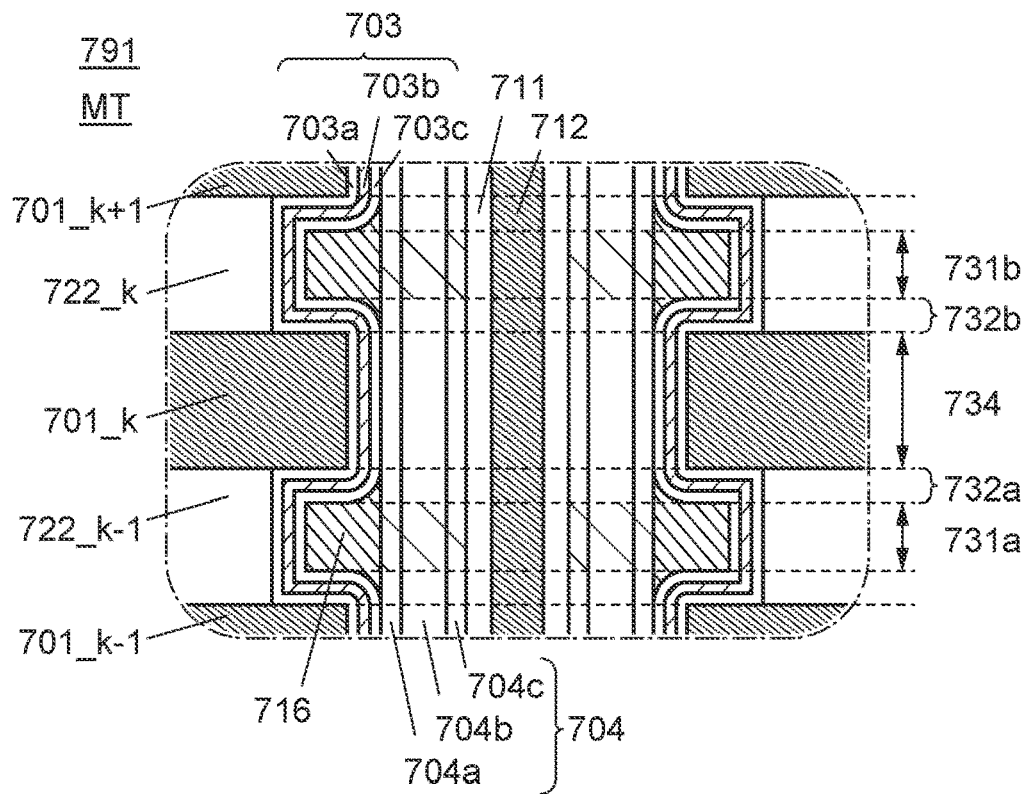
FIGS. 3A and 3B are cross-sectional views illustrating a semiconductor device of one embodiment of the present invention.
Figure 3B:
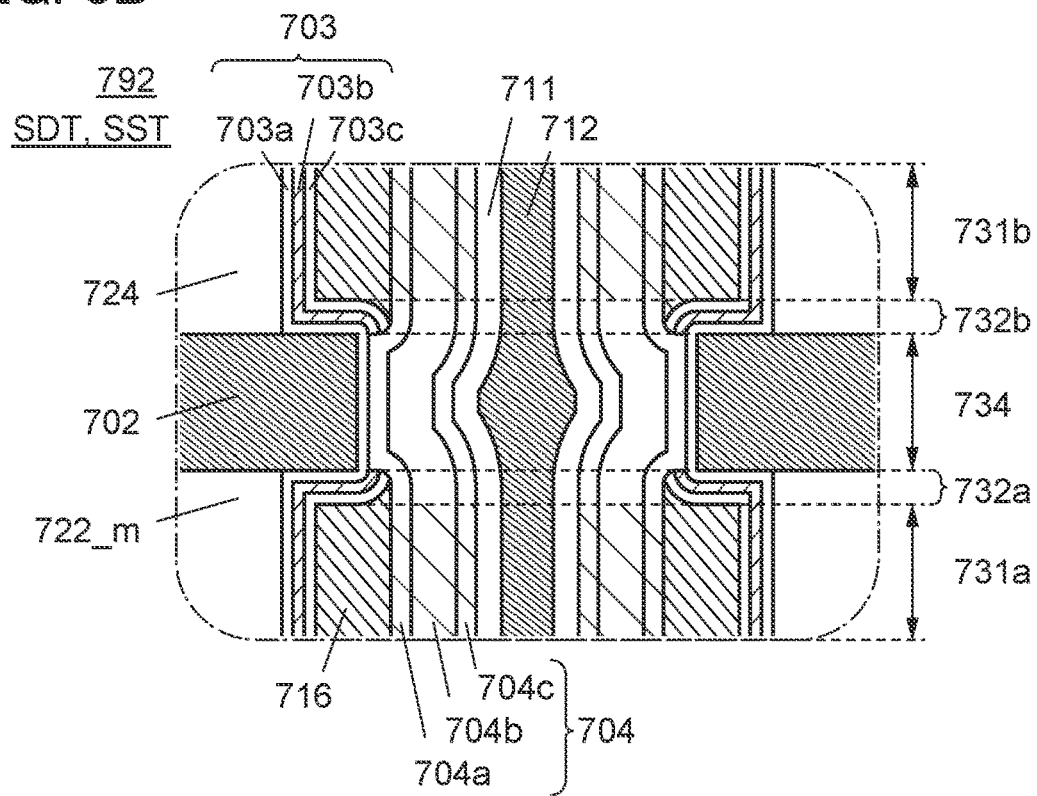

First, structures of a memory transistor MT and a memory cell array 700 of the semiconductor device are described with reference to FIG. 1 to FIGS. 3A and 3B. FIG. 1 is a cross-sectional view of a memory cell array 700. FIG. 2A is a top view of the memory cell array 700. Note that FIG. 2A is a top view taken along dashed-dotted line A5-A6 in FIG. 1 and some components are not illustrated. FIG. 1 is a cross-sectional view taken along dashed-dotted line A1-A2 in FIG. 2A. FIG. 2B is a cross-sectional view taken along dashed-dotted line A3-A4 in FIG. 2A, which illustrates an example of a memory string. FIG. 3A is an enlarged cross-sectional view of a portion surrounded by dashed-dotted line 791 in FIG. 1, which illustrates an example of a memory transistor MT functioning as a memory cell. FIG. 3B is an enlarged cross-sectional view of a portion surrounded by dashed-dotted line 792 in FIG. 1, which illustrates an example of a transistor functioning as a selection transistor. Note that in the following description, rectangular coordinates using an x-axis, a y-axis, and a z-axis are set as illustrated in FIG. 1 and FIGS. 2A and 2B for the sake of convenience. Here, the x-axis and the y-axis are parallel to the top surface of a base 720 provided with the memory cell array 700 and the z-axis is perpendicular to the top surface of the base 720.

The memory cell array 700 includes: an insulator 721 over the base 720; a stack in which a conductor 701 (conductors 701_1 to 701_$m$ ($m$ is a natural number of 2 or more)) and an insulator 722 (insulators 722_1 to 722_$m$) are alternately stacked over the insulator 721; a conductor 702 over the stack; an insulator 724 over the conductor 702 and the stack; an insulator 703 (insulators 703_1 to 703_4) in an opening portion formed through the insulator 724, the conductor 702, the stack, and the insulator 721; an oxide 704 (oxides 704_1 to 704_4) on the inner side of the insulator 703; a layer 716 that contains at least one of a metal element, hydrogen, and nitrogen and is provided between the insulator 703 and the oxide 704 to be in contact with part of the oxide 704; an insulator 711 (insulators 711_1 to 711_4) on the inner side of the oxide 704; a conductor 712 (conductors 712_1 to 712_4) on the inner side of the insulator 711; a conductor 705 (conductors 705_1 to 705_4) electrically connected to upper end portions of the oxides 704_1 to 704_4; a conductor 706 (conductors 706_1 to 706_4) electrically connected to lower end portions of the oxides 704_1 to 704_4; an insulator 717 and an insulator 713 over the insulator 724 and the conductor 705; a conductor 714 and a conductor 715 electrically connected to each of the conductors 712_1 to 7124; a conductor 707 (conductors 707_1 to 707_$m$) electrically connected to the conductors 701_1 to 701_$m$; and a conductor 708 (conductors 708_1 to 708_$m$) electrically connected to the conductors 707_1 to 707_$m$. Note that in FIG. 1 and FIGS. 2A and 2B, four or more stages of the conductors 701 are illustrated to show a plurality of conductors 701; however, this embodiment is not limited to FIG. 1 and at least two stages of the conductors 701 are provided.

As illustrated in FIG. 1 and FIG. 2A, the conductor 701 extends in the x-axis direction. As illustrated in FIG. 1 and FIG. 2B, the insulator 703 and the oxide 704 extend in the z-axis direction. That is, the conductor 701 and the insulator 703 and oxide 704 are preferably provided to cross each other perpendicularly. Furthermore, as illustrated in FIG. 1, the conductor 707 extends in the z-axis direction. The conductor 708 may extend in the y-axis direction. In addition, a conductor functioning as a bit line BL connected to the conductor 705 may extend in the y-axis direction. Part of the conductor 705 may function as the bit line BL and the conductor 705 may extend in the y-axis direction.

The conductor 712 is formed in a columnar shape and extends in the z-axis direction. In addition, the insulator 711 is provided to surround the conductor 712 and the oxide 704 is provided to surround the insulator 711, each of which extends in the z-axis direction. In other words, the conductor 712 is provided as a core on the inner side of the columnar oxide 704 that extends in the z-axis direction, and the insulator 711 is provided between the oxide 704 and the conductor 712. The insulator 703 is provided to surround the periphery of the side of the columnar oxide 704. The conductor 707 is formed in a columnar shape and extends in the z-axis direction.

The diameter of an opening formed in the insulator 721, the insulator 722, and the insulator 724 is larger than the diameter of an opening formed in the conductor 701 and the conductor 702. The layer 716 is provided on the side surfaces of the insulators 721, 722, and 724 with the insulator 703 provided therebetween. The layer 716 is in contact with part of the oxide 704, whereby the resistance of the contact region is reduced and a low-resistance region is formed. When the oxide 704 has a low-resistance region, in the memory string or memory cell array where the memory cells are stacked, the series resistance between the memory cells can be reduced.

The columnar oxide 704 is electrically connected to the conductor 706 at the lower end in the z-axis direction and electrically connected to the conductor 705 at the upper end. As illustrated in FIG. 2B, the conductor 706 is electrically connected to the lower ends of two adjacent columnar oxides 704, and the upper ends of the two adjacent columnar oxides 704 are electrically connected to the electrically separated conductors 705. In this embodiment, the U-shaped memory string in which the two columnar oxides 704 are electrically connected to each other through the conductor 706 is described; however, the present invention is not limited thereto. For example, the conductor 706 may serve as one of a bit line BL and a source line SL and the conductor 705 may serve as the other of the bit line BL and the source line SL. In this case, the conductor 706 may be electrically connected to a plurality of columnar oxide 704 or one columnar oxide 704. Furthermore, the conductor 705 may be electrically connected to a plurality of columnar oxide 704 or one columnar oxide 704.

In the case where the lower end of the columnar oxide 704 is electrically connected to one of the bit line BL and the source line SL and the upper end thereof is electrically connected to the other, a selection transistor is preferably provided at around the lower end and upper end of the columnar oxide 704. For example, in the case where the conductor 706 serves as part of the bit line BL and the conductor 705 serves as part of the source line SL, a selection transistor SST is provided between the conductor 706 and the memory transistor MT and a selection transistor SDT is provided between the conductor 705 and the memory transistor MT.

Here, a region where the conductor 701 crosses the insulator 703 and the oxide 704 and the vicinity of the region serve as the memory transistor MT. In addition, a region where the conductor 702 crosses the insulator 703 and the oxide 704 and the vicinity of the region serve as the selection transistor. The channel length direction of each of the memory transistor MT and the selection transistor is parallel to the z-axis direction. The memory transistor MT and the selection transistor are electrically connected in series to form the memory string.

FIG. 3A is an enlarged cross-sectional view of a portion surrounded by dashed-dotted line 791 in FIG. 1, which illustrates a cross section of the memory transistor MT in a k-th stage (k is an integer greater than or equal to 2 and less than or equal to m−1). The memory transistor MT includes the conductor 701_$k$, the insulator 703 (the insulators 703$a$, 703$b$, and 703$c$), and the oxide 704 (the oxides 704$a$, 704$b$, and 704$c$). In addition, the conductor 712 and the insulator 711 may be included.

The conductor 701_$k$ serves as a gate of the memory transistor MT, the insulator 703$a$ serves as a gate insulating layer, the insulator 703b serves as a charge accumulation layer, and the insulator 703c serves as a tunnel insulating layer.

Although the details are described later, the oxide 704 includes the oxide 704a, the oxide 704b, and the oxide 704c, and the oxide 704a has an energy gap relatively wider than that of the oxide 704b, and the oxide 704c has an energy gap relatively wider than that of the oxide 704b. In other words, the oxide 704b has an energy gap relatively narrower than those of the oxides 704a and 704c.

In the oxide 704, a region 734 that is positioned in the same layer as the conductor 701_k serves as a channel formation region. Furthermore, in the oxide 704, a region 731 (regions 731a and 731b) in contact with the layer 716 containing at least one of a metal element, hydrogen, and nitrogen serves as a low-resistance region. A region 732 (regions 732a and 732b) positioned between the region 734 and the region 731 serves as a junction region. The resistance of the region 732 is preferably lower than that of the region 734. Furthermore, the resistance of the region 732 may be substantially equal to or higher than that of the region 731. The region 732 may serve as a channel formation region like the region 734 or serve as a low-resistance region like the region 731.

The memory transistor MT in the k-th stage and the memory transistor MT in the k−1-th stage or the transistor MT in the k+1-th stage share the low-resistance region. The oxide 704 has a structure where the channel formation regions and the low-resistance regions are alternately stacked. When the oxide 704 has the low-resistance region, the series resistance between the memory cells can be reduced in the memory string where the memory cells are stacked or in the memory cell array.

In the case where the conductor 712 is provided, the conductor 701_k serves as a first gate and the conductor 712 serves as a second gate. Note that the first gate is referred to as a control gate or simply a gate, and the second gate is referred to as a back gate in some cases. The insulator 711 is provided between the oxide 704 and the conductor 712 and serves as a second gate insulating layer. At this time, the insulator 703a serves as a first gate insulating layer. In the circuit operation of the memory transistor MT, the potential of the conductor 712 which serves as the second gate is controlled, whereby power consumption of the memory transistor MT can be reduced.

FIG. 3B is an enlarged cross-sectional view of a portion surrounded by dashed-dotted line 792 in FIG. 1, which illustrates a cross section of the selection transistor (the transistor on the bit line side (SDT) and the transistor on the source line side (SST)). The selection transistor includes the conductor 702, the insulator 703 (the insulators 703a, 703b, and 703c), and the oxide 704 (the oxides 704a, 704b, and 704c). In addition, the conductor 712 and the insulator 711 may be included.

The conductor 702 serves as a gate of the selection transistor and the insulator 703a serves as a gate insulating layer. As the gate insulating layer, at least the insulator 703a is provided, and the insulator 703b and the insulator 703c are not necessarily provided. Alternatively, after the insulators 703a, 703b, and 703c are provided, the insulators 703b and 703c may be partly removed.

The oxide 704 includes the oxide 704a, the oxide 704b, and the oxide 704c, and the oxide 704a has an energy gap relatively wider than that of the oxide 704b, and the oxide 704c has an energy gap relatively wider than that of the oxide 704b. In other words, the oxide 704b has an energy gap relatively narrower than those of the oxides 704a and 704c.

In the oxide 704, a region 734 that is positioned in the same layer as the conductor 702 serves as a channel formation region. Furthermore, in the oxide 704, a region 731 (regions 731a and 731b) in contact with the layer 716 containing at least one of a metal element, hydrogen, and nitrogen serves as a low-resistance region. A region 732 (regions 732a and 732b) positioned between the region 734 and the region 731 serves as a junction region. The resistance of the region 732 is preferably lower than that of the region 734. Furthermore, the resistance of the region 732 may be substantially equal to or higher than that of the region 731. The region 732 may serve as a channel formation region like the region 734 or serve as a low-resistance region like the region 731.

In the case where the conductor 712 is provided, the conductor 702 serves as a first gate and the conductor 712 serves as a second gate. Note that the first gate is referred to as a top gate or simply a gate, and the second gate is referred to as a back gate in some cases. The insulator 711 is provided between the oxide 704 and the conductor 712 and serves as a second gate insulating layer. At this time, the insulator 703a serves as a first gate insulating layer. With the conductor 712 which serves as the second gate, the threshold voltage of the selection transistor can be controlled.

Note that the structure of the semiconductor device in this embodiment is an example, and the present invention is not limited to the number, the position, and the like of the circuit element, the wiring, and the like illustrated in the drawings and the like according to this embodiment. The number, the position, and the like of the circuit element, the wiring, and the like included in the semiconductor device in this embodiment can be set as appropriate in accordance with the circuit configuration and the driving method.

The base 720 provided with the memory cell array 700 preferably has an insulating surface. As a substrate having an insulating surface, a semiconductor substrate provided with an insulator on its surface, an insulator substrate, a conductor substrate provided with an insulator on its surface, or the like is used. As the semiconductor substrate, a semiconductor substrate formed using silicon, germanium, or the like or a semiconductor substrate formed using silicon carbide, silicon germanium, gallium arsenide, indium phosphide, zinc oxide, gallium oxide, or the like is used. As the insulator substrate, a glass substrate, a quartz substrate, a sapphire substrate, a stabilized zirconia substrate (e.g., an yttria-stabilized zirconia substrate), a resin substrate, or the like is used. A semiconductor substrate in which an insulator region is provided in the above semiconductor substrate, e.g., a silicon on insulator (SOI) substrate, is used. As the conductor substrate, a graphite substrate, a metal substrate, an alloy substrate, a conductive resin substrate, or the like is used.

The conductor 701 serves as the gate of the memory transistor MT and is electrically connected to a word line. That is, the conductors 701, 707, and 708 also serve as part of the word line. Here, as illustrated in FIG. 1, the conductor 701 is preferably provided in a step-like shape where the conductor 701 in the lower layer extends to be closer to the A2 side than the conductor 701 in the upper layer does. The conductor 701 is provided in this manner, so that the conductor 701 in the upper layer does not overlap with a region of part of the top surface of the conductor 701 in the lower layer; thus, the regions in the conductors 701 can be connected to the respective conductors 707.

For the conductor 701, a conductive material such as silicon or metal can be used. When silicon is used, amorphous silicon or polysilicon can be used. Furthermore, a p-type impurity or an n-type impurity may be added to form conductive silicon. As a conductive material containing silicon, silicide containing titanium, cobalt, or nickel can be used for the conductor 701. In the case where a metal material is used for the conductor 701, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used.

The conductor 702 is provided over the conductor 701. The conductor 702 serves as the gate of the selection transistor (the transistor on the bit line side (SDT) and the transistor on the source line side (SST)) and is electrically connected to a wiring DGL and a wiring SGL. That is, the conductor 702 also serves as part of the wirings DGL and SGL. The conductor 702 can be formed using the material similar to that for the conductor 701. The conductor 702 may be formed using the same material as the conductor 701 or a different material from that of the conductor 701. The materials of the conductor 701 and the conductor 702 are determined depending on the usage in consideration of their work functions and the like.

Insulating films provided over and under the conductors 701 and 702 can be formed using an oxide, a nitride, an oxynitride, a nitride oxide, a metal oxide, a metal oxynitride, a metal nitride oxide, or the like which has an insulating property. For the insulating film, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like, which has a low relative permittivity, is preferably used.

Although aluminum oxide, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be used for the insulating film, these materials have a high relative permittivity; thus, parasitic capacitance may be generated between the conductors 701 or between the conductor 701 and the conductor 702. The material used for the insulating film can be determined depending on the design of the device or the usage.

The insulator 703 includes the insulator 703a, the insulator 703b, and the insulator 703c. The insulator 703a is provided on the conductor 701 side, the insulator 703c is provided on the oxide 704 side, and the insulator 703b is provided between the insulator 703a and the insulator 703c. The insulator 703a serves as a gate insulating layer, the insulator 703b serves as a charge accumulation layer, and the insulator 703c serves as a tunnel insulating layer.

Note that the selection transistor may have the same structure as the memory transistor MT. However, as illustrated in FIG. 3B, the selection transistor does not necessarily include the charge accumulation layer or the tunnel insulating layer. The transistor on the bit line side (SDT) and the transistor on the source line side (SST) may each have a structure where the insulators 703b and 703c are removed and only the insulator 703a is provided as the insulator 703. In FIG. 3B, the oxide 704 has a three-layer structure of the oxides 704a, 704b, and 704c; however, the present invention is not limited thereto. The oxide 704 may have a two-layer structure of the oxides 704a and 704b or a stacked-layer structure of four or more layers. As the second gate electrode, the conductor 712 may be provided. In this case, the conductor 702 serves as the first gate electrode, the insulator 703a serves as the first gate insulating film, and the insulator 711 serves as the second gate insulating film. With the conductor 712, the threshold voltage of the selection transistor can be controlled.

For the insulator 703a, silicon oxide or silicon oxynitride is preferably used. Aluminum oxide, hafnium oxide, or an oxide containing aluminum and hafnium may be used. Alternatively, a stack of any of these materials may be used for the insulator 703a.

The insulator 703b is preferably formed using a material that serves as a charge accumulation layer and is preferably formed using silicon nitride or silicon nitride oxide. Aluminum oxide, hafnium oxide, or an oxide containing aluminum and hafnium may be used.

For the insulator 703c, silicon oxide or silicon oxynitride is preferably used. Aluminum oxide, hafnium oxide, or an oxide containing aluminum and hafnium may be used. Alternatively, a stack of any of these materials may be used for the insulator 703c. Furthermore, the insulator 703c is preferably thinner than the insulator 703a. Although details are described later, in writing or erasing data to/from the memory transistor MT, charge is transferred between the oxide 704 and the insulator 703b through the insulator 703c. That is, the insulator 703c serves as a tunnel insulating layer.

In particular, in the case where the insulator 703 is formed in the opening provided in the stack including the conductor 701, the conductor 702, and the insulating films, the insulator 703 formed on the bottom portion of the opening needs to be removed by anisotropic etching using dry etching or the like. In anisotropic etching, the side surface of the insulator 703c is also exposed to plasma, a radical, a gas, a chemical solution, or the like. When the side surface of the insulator 703c is damaged in this manner, trap centers might be formed in the insulator 703c and might affect electrical characteristics of the transistor. To suppress the formation of the trap centers, the side surface of the insulator 703c is required to have high resistance to damage due to etching. In this case, for the insulator 703c, aluminum oxide, a stack of silicon oxide and aluminum oxide, or a stack of silicon oxynitride and aluminum oxide is preferably used.

The insulators 703a, 703b, and 703c can be formed by an atomic layer deposition (ALD) method or a chemical vapor deposition (CVD) method. To prevent contamination of the interfaces between the insulator 703a, the insulator 703b, and the insulator 703c, these insulators are preferably formed in succession without exposure to an air atmosphere in the same chamber or with a multi-chamber deposition apparatus including a plurality of chambers.

The oxide 704 is preferably formed using a metal oxide functioning as an oxide semiconductor (hereinafter, the metal oxide is also referred to as an oxide semiconductor). The oxide semiconductor is preferably used, in which case a transistor including the oxide semiconductor can have more favorable on-state characteristics and higher mobility than a transistor including a semiconductor made of silicon, for example.

For example, as the oxide 704, a metal oxide such as an In-M-Zn oxide (M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. An In—Ga oxide or an In—Zn oxide may be used as the oxide 704.

The oxide 704 preferably includes the oxide 704a provided on the insulator 703c side, the oxide 704b provided on the inner side of the oxide 704a, and the oxide 704c provided on the inner side of the oxide 704b. At this time, as the oxide 704a, an oxide having an energy gap relatively wider than that of the oxide 704b is preferably used. As the oxide 704c, an oxide having an energy gap relatively wider than that of the oxide 704b is preferably used. Here, an oxide having a wide energy gap is referred to as a wide gap and an oxide having a narrow energy gap is referred to as a narrow gap in some cases.

In the case where the oxides 704a and 704c are each a wide gap and the oxide 704b is a narrow gap, an energy of the conduction band minimum of each of the oxides 704a and 704c is preferably higher than that of the conduction band minimum of the oxide 704b. In other words, the electron affinity of each of the oxides 704a and 704c is preferably smaller than the electron affinity of the oxide 704b.

The oxides 704a, 704b, and 704c preferably have different atomic ratios of metal atoms. Specifically, the atomic ratio of the element M to constituent elements in the metal oxide used as the oxides 704a and 704c is preferably greater than that in the metal oxide used as the oxide 704b. Moreover, the atomic ratio of the element M to In in the metal oxide used as the oxides 704a and 704c is preferably greater than that in the metal oxide used as the oxide 704b. Moreover, the atomic ratio of the element In to the element M in the metal oxide used as the oxide 704b is preferably greater than that in the metal oxide used as the oxides 704a and 704c.

As the oxides 704a and 704c, for example, a metal oxide having a composition of In:Ga:Zn=1:3:4, In:Ga:Zn=1:3:2, or In:Ga:Zn=1:1:1, or a composition which is in the neighborhood of any of the above atomic ratios can be used. As the oxide 704b, for example, a metal oxide having a composition of In:Ga:Zn=4:2:3 to 4:2:4.1, In:Ga:Zn=1:1:1, or In:Ga:Zn=5:1:6, or a composition which is in the neighborhood of any of the above atomic ratios can be used. The oxides 704a, 704b, and 704c are preferably formed to satisfy the above atomic ratio. For example, it is preferable that the oxides 704a and 704c be each a metal oxide having a composition of In:Ga:Zn=1:3:4 or a composition which is in the neighborhood of the above atomic ratio and the oxide 704b be each a metal oxide having a composition of In:Ga:Zn=4:2:3 to 4:2:4.1 or a composition which is in the neighborhood of the above atomic ratios. Note that the above composition shows the atomic ratio in an oxide formed over a base or the atomic ratio in a sputtering target.

In addition, it is preferable that a CAAC-OS described later be used as the oxides 704a and 704c and a CAC-OS described later be used as the oxide 704b. In the case where the CAAC-OS is used as the oxides 704a and 704c, the c-axes are preferably aligned parallel to x-y plane shown in FIG. 1, FIGS. 2A and 2B, and the like, that is, perpendicular to the z-axis, and preferably aligned from the side surface of the opening to the central portion.

Here, in a junction portion of the oxides 704a and 704b and a junction portion of the oxides 704c and 704b, the conduction band minimum is gradually varied. In other words, the conduction band minimum in the junction portion of the oxides 704a and 704b and the junction portion of the oxides 704c and 704b is continuously varied or continuously connected. To vary the conduction band minimum gradually, the density of defect states in a mixed layer formed at the interface between the oxides 704a and 704b and the interface between the oxides 704c and 704b is decreased.

Specifically, when the oxides 704a, 704b, and 704c contain the same element (as a main component) in addition to oxygen, a mixed layer with a low density of defect states can be formed. For example, in the case where the oxide 704b is an In—Ga—Zn oxide, it is preferable to use an In—Ga—Zn oxide, a Ga—Zn oxide, gallium oxide, or the like as each of the oxides 704a and 704c. Accordingly, the density of defect states at the interface between the oxides 704a and 704b and the interface between the oxides 704c and 704b can be decreased. Thus, the influence of interface scattering on carrier conduction is small, and the memory transistor MT can have a high on-state current.

Note that the details of the metal oxide that can be used as the oxide 704 are described later.

FIG. 3A is the enlarged view of the memory transistor MT surrounded by dashed-dotted line 791 in FIG. 1. As illustrated in FIG. 3A, the oxide 704b is sandwiched between the oxides 704a and 704c. In such a structure, carriers mainly flow in the component having a narrow gap when the carriers flow in the oxide 704 from the conductor 705 toward the conductor 706 or from the conductor 706 toward the conductor 705. Thus, with the above structure, the oxide 704b which is a narrow gap is sandwiched between the oxides 704a and 704c which are wide gaps, whereby carriers flowing through the oxide 704 can be confined in the oxide 704b. This enables high current drive capability in the on state of the transistor, i.e., high on-state current and high field-effect mobility.

The oxide 704a is provided between the oxide 704b and the insulator 703c, whereby the oxide 704b that serves as a carrier path and the insulator 703c are not in contact with each other, so that the formation of trap centers can be suppressed. The trap centers formed at the interface between the semiconductor (oxide semiconductor) and the insulator trap electrons and cause the threshold voltage of the transistor to shift in the positive direction, which might adversely affect the reliability and the on-off characteristics of the transistor. Thus, a transistor using the oxide does not affect electrical characteristics due to the trap centers. This enables higher current drive capability in the on state of the transistor, i.e., higher on-state current and higher field-effect mobility. Furthermore, the transistor and a semiconductor device including the transistor can have high reliability.

To provide the low-resistance regions in the oxide 704, the layer 716 containing at least one of a metal element, hydrogen, and nitrogen is preferably provided in contact with part of the oxide 704. The layer 716 is provided on the side surfaces of the insulators 721, 722, and 724 with the insulator 703 provided therebetween. Although the details are described later, the diameter of the opening formed in the insulators 721, 722, and 724 is larger than the diameter of the opening formed in the conductors 701 and 702, and the layer 716 is provided only in the same layers as the insulators 721, 722, and 724. Thus, the oxide 704 includes a region in contact with the insulator 703 and a region in contact with the layer 716.

The layer 716 preferably has at least one of a function of supplying hydrogen to the oxide 704, a function of supplying nitrogen to the oxide 704, and a function of extracting oxygen from the oxide 704. The layer 716 having such a function is in contact with the oxide 704, whereby carriers are generated in the oxide 704.

Specifically, oxygen is extracted from the oxide 704, whereby oxygen vacancies are generated in the oxide 704. When hydrogen is trapped by these oxygen vacancies, carriers are generated. Alternatively, in the case where nitrogen is trapped by these oxygen vacancies, nitrogen is substituted for oxygen bonded to two indium atoms. When nitrogen is bonded to these two indium atoms, it is probable that nitrogen has an unpaired electron and serves as a carrier.

As the material having a function of supplying hydrogen to the oxide 704, silicon nitride containing hydrogen can be used. Furthermore, a material formed using a gas containing hydrogen when the material is formed can be used. For example, silicon, silicon oxide, silicon oxynitride, silicon nitride oxide, or the like formed using monosilane, disilane, ammonia, or the like can be used. As the material having a function of supplying nitrogen to the oxide 704, a nitride containing silicon or a metal element can be used. As such a material, silicon nitride, silicon nitride oxide, silicon oxynitride, or the like can be used. Alternatively, a nitride containing one or more of aluminum, tantalum, and titanium can be used. Specifically, aluminum nitride, tantalum nitride, titanium nitride, a nitride containing aluminum and tantalum, a nitride containing aluminum and titanium, or the like can be used.

After the layer 716 containing any one of a metal element, hydrogen, and nitrogen is provided in contact with the oxide 704, heat treatment is preferably performed. The heat treatment is performed, whereby extraction of oxygen, supply of hydrogen, or supply of nitrogen is promoted, and the resistance of part of the oxide 704 can be efficiently reduced. In this manner, by providing the low-resistance region in the oxide 704, the series resistance between the memory cells can be reduced in the memory string where the memory cells are stacked or in the memory cell array.

In the case where the conductor 712 is provided, a material similar to that of the conductor 701 can be used for the conductor 712. Since the conductor 712 needs to be formed in the opening having a large aspect ratio (in other words, the recession of the oxide 704 and the insulator 711), the conductor 712 is preferably formed by a CVD method, an ALD method, or a plating method. In that case, the insulator 711 can be formed using a material similar to that used for the insulator 703.

In the case where the insulator 711 is provided on the inner side of the oxide 704c, the insulator 711 is preferably formed using a material that can supply oxygen to the oxide 704 or a material that can supply impurities, such as hydrogen and nitrogen. When an oxide that contains hydrogen and nitrogen as little as possible is used for the insulator 711, oxygen can be supplied to the oxide 704 in some cases. By supplying oxygen to the oxide 704, impurities such as hydrogen and water contained in the oxide 704 can be removed and the oxide 704 is highly purified. When an oxide which contains impurities as little as possible is used as the oxide 704, the memory transistor MT and the semiconductor device including the memory transistor MT can have high reliability.

When an oxide containing hydrogen and nitrogen is used for the insulator 711, hydrogen and nitrogen can be supplied to the oxide 704 in some cases. When hydrogen and nitrogen are supplied to the oxide 704, the resistance of the oxide 704 might be decreased. The resistance of the oxide 704 is decreased such that it does not hinder the circuit operation, whereby the memory transistor MT can operate with lower driving voltage. This enables high current drive capability in the on state of the memory transistor MT, i.e., high on-state current and high field-effect mobility.

Note that the top-view shape of the opening formed in the stack provided with the memory transistor MT is, but not limited to, circular as illustrated in FIG. 2A and the like; the top-view shape can alternatively be, for example, elliptic or polygonal, e.g., a triangle or a quadrangle. In the case where a polygonal shape is employed, corners thereof may be rounded. The top-view shapes of the insulator 703 and the oxide 704 may change depending on the top-view shape of the opening. The opening may have a shape where a lower cross section (on the conductor 706 side) is smaller than an upper cross section (on the conductor 705 side).

The memory transistor MT is formed by the oxide 704, the insulator 703, and the conductor 701 (any one of the conductors 701_1 to 701_m). FIG. 1 and FIGS. 2A and 2B show an example in which m stages of memory transistors MT (m is a natural number of 2 or more) are stacked. Note that in FIG. 1 and FIGS. 2A and 2B, four or more stages of the conductors 701 are illustrated to show a plurality of conductors 701; however, this embodiment is not limited to FIG. 1 and at least two stages of the conductors 701 are provided.

The conductor 705 is electrically connected to the oxide 704 and serves as part of the source line SL or part of the bit line BL. The conductor 705 is preferably formed using a conductive material containing a metal element. Alternatively, a conductive material among materials that can be used for the layer 716 can be used for the conductor 705. In that case, the resistance of part of the oxide 704 is reduced as described above. A metal compound layer including the metal element contained in the conductor 705 and the component of the oxide 704 is preferably formed at the interface between the conductor 705 and the oxide 704. The metal compound layer is preferably formed, in which case the contact resistance between the conductor 705 and the oxide 704 can be reduced. Alternatively, oxygen contained in the oxide 704 is absorbed by the conductor 705 and the resistance of the oxide 704 in the vicinity of the interface between the conductor 705 and the oxide 704 is reduced, whereby the contact resistance between the conductor 705 and the oxide 704 can be reduced.

It is preferable that the conductor 705 be formed using a conductive material containing one or more metal elements selected from aluminum, ruthenium, titanium, tantalum, chromium, tungsten, and copper.

As illustrated in FIG. 2B, the conductor 706 electrically connects the oxide 704 electrically connected to the conductor 705 which serves as part of the bit line BL to the oxide 704 electrically connected to the conductor 705 serving as part of the source line SL, so that the memory string is formed. A region surrounded by a dotted line in FIG. 2A represents a memory string. In other words, FIG. 2A illustrates a memory cell array 700 including four memory strings.

The conductor 706 can be formed using a material similar to that used for the conductor 705. Alternatively, a conductive material among materials that can be used for the layer 716 can be used for the conductor 706. In that case, the resistance of part of the oxide 704 is reduced as described above. The conductor 706 can be formed using the same material as the conductor 705 or a different material from that of the conductor 705.

A metal compound layer including the metal element contained in the conductor 706 and the component of the oxide 704 is preferably formed at the interface between the conductor 706 and the oxide 704. The metal compound layer is preferably formed, in which case the contact resistance between the conductor 706 and the oxide 704 can be reduced. Alternatively, oxygen contained in the oxide 704 is absorbed by the conductor 706 and the resistance of the oxide 704 in the vicinity of the interface between the conductor 706 and the oxide 704 is reduced, whereby the contact resistance between the conductor 706 and the oxide 704 can be reduced.

(Memory Cell Array 700A)

Figure 4:
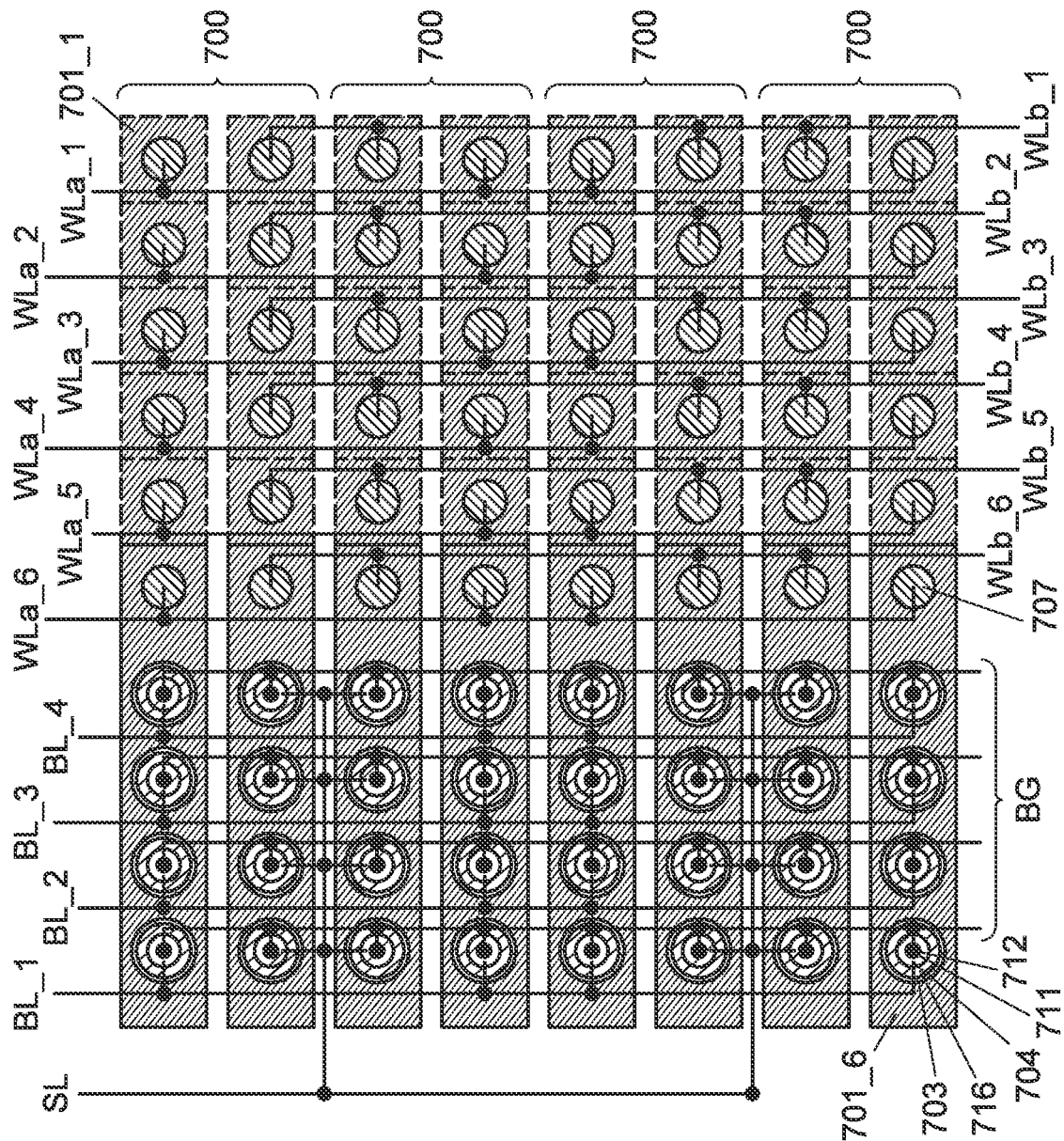
FIG. 4 is a top view illustrating a semiconductor device of one embodiment of the present invention.

FIG. 4 is a top view illustrating a memory cell array 700A in which a plurality of memory cell arrays 700 each including six stages of memory transistors MT are combined. Note that in FIG. 4, some components are not illustrated for simplicity. For example, the selection transistor (the transistor on the bit line side (SDT) and the transistor on the source line side (SST)) provided over the conductor 701 and the conductor 702 which is the component of the selection transistor are not illustrated. In addition, the conductor 705 serving as part of the bit line BL and the source line SL, the conductor 708 serving as part of the word line WL, and the conductor 715 serving as part of the wiring BG electrically connected to the conductor 712 serving as a second gate are shown by solid lines.

In the memory cell array 700A, each memory cell array 700 includes four memory strings including six stages of memory transistors MT.

The ends of the memory strings on the bit line side are electrically connected to the respective bit lines BL (BL_1 to BL_4). The ends of the memory strings on the source line side are electrically connected to the source line SL and are supplied with a common potential. The source line SL may be grounded or may be supplied with a constant potential. Alternatively, the potential may be changed depending on the operation of the circuit.

The conductors 701_1 to 701_6 are electrically connected to the respective word lines WL. The conductors 701_1 to 701_6 on the bit line side are electrically connected to WLa_1 to WLa_6, respectively, and the conductors 701_1 to 701_6 on the source line side are electrically connected to WLb_1 to WLb_6, respectively.

The conductors 712 are electrically connected to the wirings BG. Although FIG. 4 shows an example where the conductors 712 aligned in the column direction are electrically connected to the common wiring BG, the present invention is not limited to this example. The conductors 712 aligned in the row direction may be electrically connected to the common wiring BG. Different potentials may be applied to the wirings BG. Alternatively, the same potential may be applied to the plurality of wirings BG. In this case, the plurality of wirings BG are preferably electrically connected to each other. The plurality of wirings BG may refer to all the wirings BG included in the memory cell array 700A.

In order that a given potential is applied to the wiring BG, the wiring BG is preferably electrically connected to a circuit that controls the potential of the wiring BG (also referred to as a BG driver or a BG driver circuit, or simply referred to as a driver or a driver circuit). The BG driver circuit may be provided for each of the wirings BG or the plurality of wirings BG may be electrically connected to one BG driver circuit. For example, the memory cell array 700A may include one BG driver circuit and all the wirings BG included in the memory cell array 700A may be electrically connected to the BG driver circuit.

By appropriately selecting the bit line BL (from BL_1 to BL_4) and the word line WL (from WLa_1 to WLa_6 and WLb_1 to WLb_6), a given memory transistor MT in the memory cell array 700 can be selected. In addition, writing, reading, erasing, and the like can be performed on the selected memory transistor MT.

Since the selection transistor (not illustrated) is provided in each memory string, the given memory cell array 700 in the memory cell array 700A can be selected, and writing, reading, erasing, and the like can be performed on the given memory transistor MT in the selected memory cell array 700.

(Structure Example of Memory Device 750)

Figure 5:
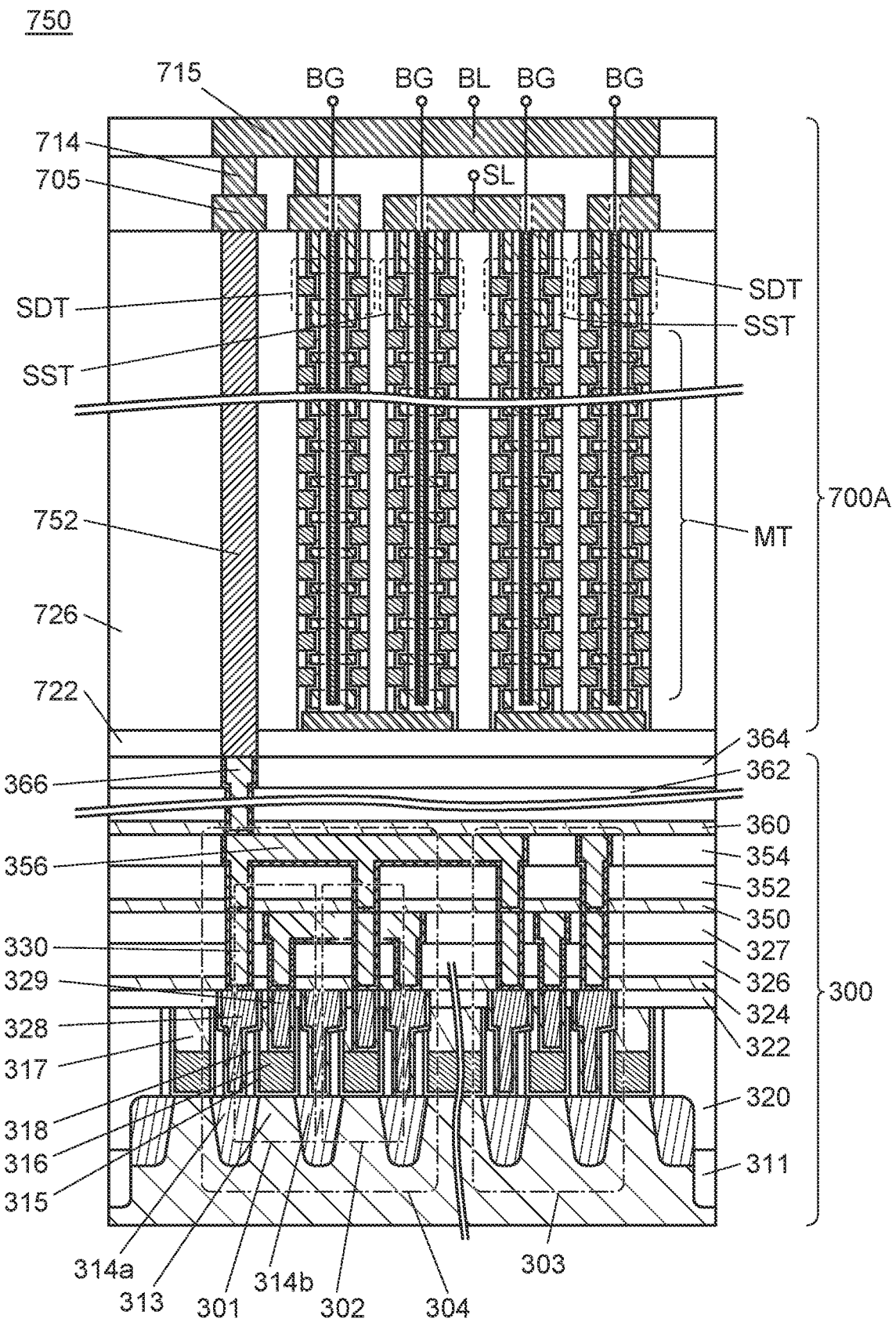
FIG. 5 is a cross-sectional view illustrating a semiconductor device of one embodiment of the present invention.

FIG. 5 illustrates a structure example of a memory device 750 in which the memory cell array 700A is stacked over a circuit 300. As illustrated in FIG. 5, the memory cell array 700A is stacked over a region where the circuit 300 including a transistor 301, a transistor 302, and a transistor 303 is formed. The transistor 301 and the transistor 302 are included in a sense amplifier 304 and the transistor 303 functions as a column selection switch. Specifically, the bit line BL of the memory cell array 700A is electrically connected to one of a source and a drain of the transistor 301, a gate of the transistor 301 is electrically connected to one of a source and a drain of the transistor 302, and a gate of the transistor 302 is electrically connected to the other of the source and the drain of the transistor 301. The one of the source and the drain of the transistor 301 and the other of the source and the drain of the transistor 302 are electrically connected to one of a source and a drain of the transistor 303 which functions as the column selection switch. Accordingly, the layout area of the memory device 750 can be reduced. Note that FIG. 5 illustrates an example where 10 stages of memory transistors MT are provided and one memory string includes 20 memory transistors MT. However, the number of stages of stacked memory transistors MT is not limited thereto. For example, 32 stages of memory transistors, 64 stages of memory transistors, 128 stages of memory transistors, or 200 or more stages of memory transistors may be stacked.

The bit line BL of the memory cell array 700A is electrically connected to the sense amplifier 304 and the transistor 303 functioning as the column selection switch through the conductor 752 formed to be embedded in an insulator 726, the insulator 722, and the like. Note that circuits and transistors included in the circuit 300 are examples and the circuit configurations and the transistor structures are not limited to these examples. In addition to the above, an appropriate circuit or transistor can be provided in accordance with the component of the memory device 750 such as a control circuit, a row decoder, a row driver, a source line driver, or an input-output circuit, or the driving method thereof.

The transistors 301, 302, and 303 are provided over a substrate 311 and each include a conductor 316, an insulator 315, a semiconductor region 313 that is a part of the substrate 311, and a low-resistance region 314a and a low-resistance region 314b functioning as a source region and a drain region. Note that as illustrated in FIG. 5, one low-resistance region may be used in common for a source region or a drain region of one of the transistors 301 and 302 and a source region or a drain region of the other of the transistors 301 and 302.

In each of the transistors 301, 302, and 303, the semiconductor region 313 (part of the substrate 311) in which a channel is formed has a protruding portion. Furthermore, the conductor 316 is provided so as to cover the top and side surfaces of the semiconductor region 313 with the insulator 315 positioned therebetween. Note that the conductor 316 may be formed using a material for adjusting the work function. The transistors 301, 302, and 303 are also referred to as FIN transistors because they each utilize a protruding portion of the semiconductor substrate. An insulator functioning as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

Although each of the transistors 301, 302, and 303 may be either a p-channel transistor or an n-channel transistor, the transistors 301 and 302 are preferably transistors having different polarities.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single crystal silicon. Alternatively, a material containing germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistors 301, 302, and 303 may each be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to the semiconductor material used for the semiconductor region 313.

The insulator 315 serves as a gate insulating film of each of the transistors 301, 302, and 303.

The conductor 316 functioning as a gate electrode can be formed using a semiconductor material such as silicon containing the element which imparts n-type conductivity, such as arsenic or phosphorus, or the element which imparts p-type conductivity, such as boron, or using a conductive material such as a metal material, an alloy material, or a metal oxide material.

Note that since the work function of a conductor depends on a material of the conductor, the threshold voltage can be adjusted by changing the material of the conductor. Specifically, it is preferable to use titanium nitride, tantalum nitride, or the like for the conductor. Furthermore, in order to ensure the conductivity and embeddability, it is preferable to use a stacked layer of metal materials such as tungsten and aluminum for the conductor. It is particularly preferable to use tungsten in terms of heat resistance.

An insulator 317 functioning as an etching stopper is preferably provided over the conductor 316. In addition, an insulator 318 functioning as a spacer is preferably provided on the side surface of the insulator 315. When the insulator 317 and the insulator 318 are provided, regions where the low-resistance regions 314a and 314b and a conductor 328 are electrically connected to each other can be defined in a self-aligned manner. Thus, even when misalignment occurs in forming the openings for exposing part of the low-resistance regions 314a and 314b, the openings for exposing the intended regions can be formed. The conductor 328 provided in the openings formed in this manner can provide a favorable contact with reduced contact resistance between the low-resistance regions 314a and 314b and the conductor 328. The contact between the low-resistance regions 314a and 314b formed in this manner and the conductor 328 may be referred to as a self-aligned contact. Furthermore, a conductor 329 electrically connected to the conductor 316 so as to be embedded in the insulator 317 and an insulator 322 may be provided.

An insulator 320, an insulator 322, an insulator 324, an insulator 326, and an insulator 327 are stacked in this order to cover the transistor 301, the transistor 302, and the transistor 303.

The insulator 320, the insulator 322, the insulator 324, the insulator 326, and the insulator 327 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may function as a planarization film for eliminating a level difference caused by the transistor 301 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen or impurities from the substrate 311, the transistor 301, or the like from diffusing to a region where the memory cell array 700A is provided.

For the film having a barrier property against hydrogen, silicon nitride formed by a CVD method can be used, for example. The diffusion of hydrogen to a semiconductor element including an oxide semiconductor, such as the memory transistor MT, degrades the characteristics of the semiconductor element in some cases. Therefore, a film that prevents hydrogen diffusion is preferably provided between the memory transistor MT and the transistor 301 or the like. The film that prevents hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$, in the TDS analysis at a film surface temperature of the insulator 324 of higher than or equal to 50° C. and lower than or equal to 500° C., for example.

Note that the permittivities of the insulators 326 and 327 are preferably lower than that of the insulator 324. For example, the relative permittivities of the insulators 326 and 327 are preferably lower than 4, further preferably lower than 3. The relative permittivities of the insulators 326 and 327 are, for example, preferably 0.7 or less times that of the insulator 324, further preferably 0.6 or less times that of the insulator 324. In the case where a material with a low permittivity is used for an interlayer film, the parasitic capacitance between wirings can be reduced.

The conductor 328, the conductor 329, a conductor 330, and the like that are electrically connected to the memory cell array 700A are provided in the insulator 320, the insulator 322, the insulator 324, the insulator 326, and the insulator 327. Note that the conductors 328, 329, and 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

As a material for each of plugs and wirings (e.g., the conductors 328, 329, and 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 327 and the conductor 330. For example, in FIG. 5, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to those for the conductors 328, 329, and 330.

Note that the insulator 350 is preferably formed using an insulator having a barrier property against hydrogen, as with the insulator 324, for example. Furthermore, the conductor 356 preferably contains a conductor having a barrier property against hydrogen. In particular, the conductor having a barrier property against hydrogen is formed in an opening of the insulator 350 having a barrier property against hydrogen. In such a structure, the transistor 301 and the like and the memory transistor MT can be separated by a barrier layer, so that the diffusion of hydrogen from the transistor 301 and the like to the memory transistor MT can be prevented.

Note that as the conductor having a barrier property against hydrogen, tantalum nitride is preferably used, for example. The use of a stack including tantalum nitride and tungsten having high conductivity can inhibit the diffusion of hydrogen from the transistor 301 and the like while the conductivity of a wiring is ensured. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 5, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be formed using a material similar to those for the conductors 328, 329, and 330.

Note that the insulator 360 is preferably formed using an insulator having a barrier property against hydrogen, as with the insulator 324, for example. Furthermore, the conductor 366 preferably contains a conductor having a barrier property against hydrogen. In particular, the conductor having a barrier property against hydrogen is formed in an opening of the insulator 360 having a barrier property against hydrogen. In such a structure, the transistor 301 and the like and the memory transistor MT can be separated by a barrier layer, so that the diffusion of hydrogen from the transistor 301 and the like to the memory transistor MT can be prevented.

The insulator 722 is provided over the insulator 364 and the conductor 366, and the memory cell array 700A is provided above the insulator 722. A barrier film formed using a material similar to that of the insulator 324 may be provided between the insulator 364 and the insulator 722.

Figure 6:
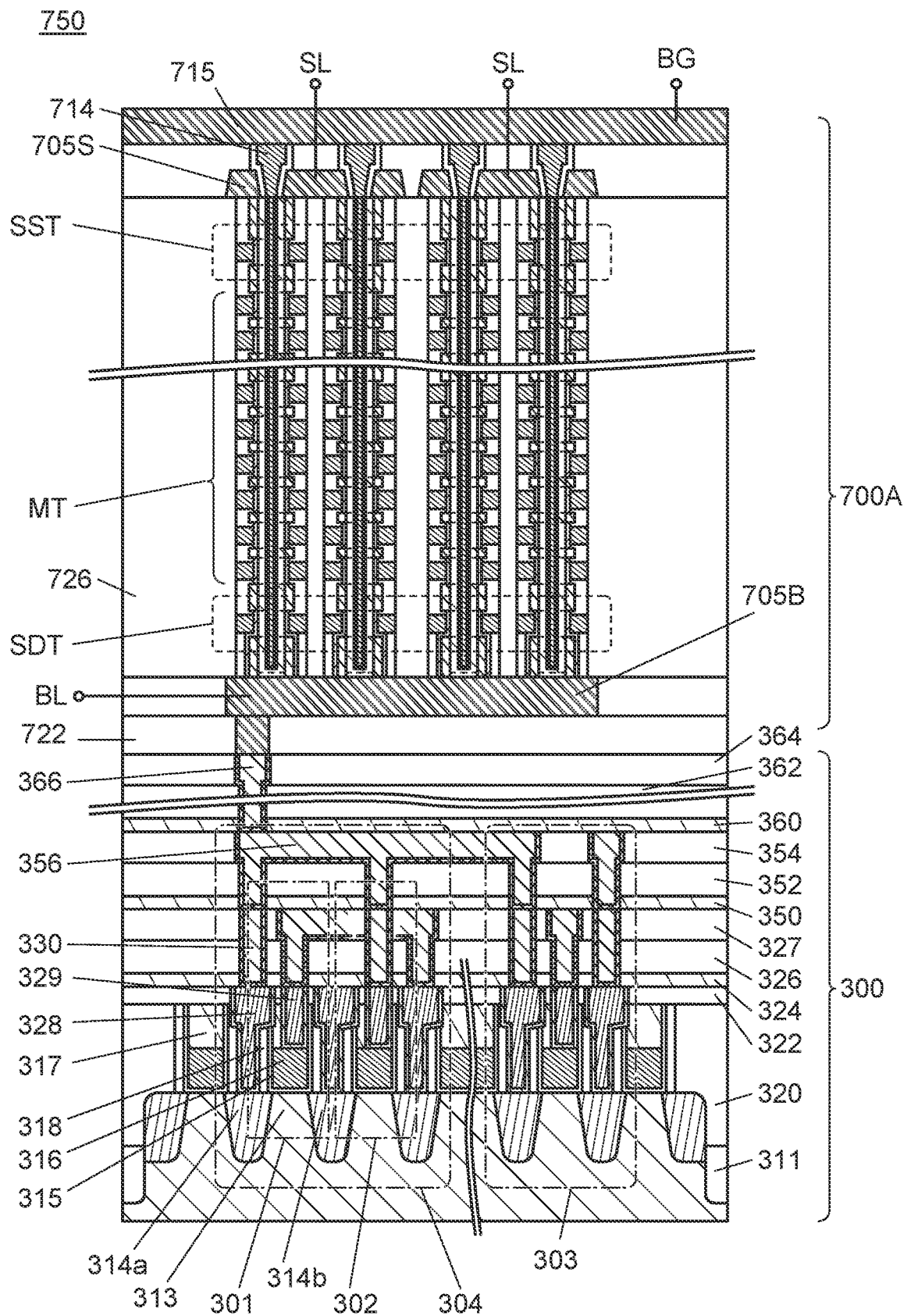
FIG. 6 is a cross-sectional view illustrating a semiconductor device of one embodiment of the present invention.

FIG. 5 illustrates an example of the memory cell array 700A including the U-shaped memory string in which the two columnar oxides 704 are electrically connected to each other through the conductor 706; however, the present invention is not limited to this example. In FIG. 6, in the columnar oxide 704 including 8 stages of memory transistors MT and the two selection transistors (SDT and SST), the lower end of one columnar oxide 704 is electrically connected to a conductor 705B functioning as the bit line BL and the upper end thereof is electrically connected to a conductor 705S functioning as the source line SL. That is, one memory string is formed of one columnar oxide 704. Although the conductor 705B is electrically connected to the lower ends of four columnar oxides in FIG. 6, the present invention is not limited thereto. One conductor 705B may be electrically connected to one columnar oxide 704, or one conductor 705B may be electrically connected to two or more columnar oxides 704. The conductor 705S is electrically connected to upper ends of two columnar oxides; however, the present invention is not limited thereto. One conductor 705S may be electrically connected to one columnar oxide 704, or one conductor 705S may be electrically connected to two or more columnar oxides 704.

The selection transistor SDT is provided between the conductor 705B and the memory transistor MT and the selection transistor SST is provided between the conductor 705S and the memory transistor MT. Such a structure in which the conductor 705B serving as the bit line BL is electrically connected to the circuit 300 provided under the conductor 705B is preferably used, in which case the number of wirings (lead wirings) and plugs for electrically connecting the memory cell array 700A to the circuit 300 can be reduced and the layout area of the memory device 750 can be reduced. Note that in FIG. 6, 8 stages of the memory transistors MT are stacked; however, the present invention is not limited thereto. The number of stages of memory transistors MT may be greater than or equal to 2 and less than or equal to 7, or may be greater than or equal to 9. For example, 32 stages of memory transistors, 64 stages of memory transistors, 128 stages of transistors, or 200 or more stages of memory transistors may be stacked.

<<Metal Oxide>>

A metal oxide that can be used for the oxide 704 of one embodiment of the present invention will be described below.

The metal oxide preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, or the like may be contained.

Here, the case where the metal oxide is an In-M-Zn oxide that contains indium, an element M, and zinc is considered. The element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also called a metal oxide in some cases. Moreover, a metal oxide containing nitrogen may be called a metal oxynitride.

[Composition of Metal Oxide]

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) functioning as carriers to flow, and the insulating function is to not allow electrons functioning as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide contains a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC metal oxide can be called a matrix composite or a metal matrix composite.

[Structure of Metal Oxide]

An oxide semiconductor (metal oxide) is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is a metal oxide with high crystallinity. By contrast, in the CAAC-OS, a reduction in electron mobility due to the grain boundary is less likely to occur because it is difficult to observe a clear grain boundary. Entry of impurities, formation of defects, or the like might decrease the crystallinity of a metal oxide. This means that the CAAC-OS has small amounts of impurities and defects (e.g., oxygen vacancies (Vo)). Thus, a metal oxide containing a CAAC-OS is physically stable. Therefore, the metal oxide containing a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the metal oxide is used for a channel formation region of a transistor will be described.

When the metal oxide is used for a channel formation region of a transistor, the transistor can have high field-effect mobility. In addition, the transistor can have high reliability.

Here, an example of the hypothesis about electric conduction of a metal oxide will be described.

Electric conduction in a solid is prevented due to a diffusion source which is called a scattering center. For example, it is known that in single crystal silicon, lattice scattering and ionized impurity scattering are main scattering centers. In other words, in the native state with few lattice defects and impurities, the carrier mobility is high because the electric conduction in the solid is not prevented.

The above might be applied to the metal oxide. For example, it is thought that a metal oxide containing oxygen less than that in the stoichiometric composition contains many oxygen vacancies Vo. The atoms around the oxygen vacancies are arranged more randomly than the atoms in the native state. It is possible that the distortion due to the oxygen vacancies might become a scattering center.

Furthermore, a metal compound containing more oxygen than that in the stoichiometric composition contains excess oxygen. Excess oxygen that is liberated in the metal compound becomes $O^-$ or $O^{2-}$ by receiving an electron. Excess oxygen that has become $O^-$ or $O^{2-}$ might be a scattering center.

As described above, it is thought that in the case where the metal oxide has a native state containing oxygen that satisfies the stoichiometric composition, the carrier mobility is high.

Since in an indium-gallium-zinc oxide (hereinafter referred to as IGZO), which is one kind of metal oxide containing indium, gallium, and zinc, crystal growth tends to hardly occur particularly in the air, a crystal whose size is small (e.g., the above-described nanocrystal) makes a stable structure compared with a crystal whose size is large (here, a crystal whose size is several millimeters or several centimeters) in some cases. This is probably because in the case where small crystals are connected to each other, distortion energy is reduced as compared with the case of forming a large crystal.

In a region where small crystals are connected to each other, defects may be formed to reduce the distortion energy of the region. Thus, the distortion energy is reduced without formation of a defect in the region, whereby the carrier mobility can be increased.

Moreover, a metal oxide with low carrier density is preferably used for the transistor. In order to reduce the carrier density of the metal oxide film, the concentration of impurities in the metal oxide film is reduced so that the density of defect states can be reduced. In this specification and the like, a state with a low impurity concentration and a low density of defect states is referred to as a highly purified intrinsic or substantially highly purified intrinsic state. The metal oxide has, for example, a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

A highly purified intrinsic or substantially highly purified intrinsic metal oxide film has a low density of defect states and accordingly has a low density of trap states in some cases.

Charges trapped by the trap states in the metal oxide take a long time to be released and may behave like fixed charges. Thus, a transistor whose channel formation region is formed in a metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the metal oxide is preferably reduced. As examples of the impurities, hydrogen, nitrogen, alkali metal, alkaline earth metal, iron, nickel, silicon, and the like are given.

[Impurity]

Here, the influence of impurities in the metal oxide is described.

When silicon or carbon that is one of Group 14 elements is contained in the metal oxide, defect states are formed. Thus, the concentration of silicon or carbon (measured by secondary ion mass spectrometry (SIMS)) is set to be lower than or equal to $2\times10^{18}$ atoms/$cm^3$, preferably lower than or equal to $2\times10^{17}$ atoms/$cm^3$ in the metal oxide or around an interface with the metal oxide.

When the metal oxide contains an alkali metal or an alkaline earth metal, defect states are formed and carriers are generated, in some cases. Thus, a transistor including a metal oxide that contains an alkali metal or an alkaline earth metal for a channel formation region is likely to be a normally-on transistor. Therefore, it is preferable to reduce the concentration of an alkali metal or an alkaline earth metal in the metal oxide. Specifically, the concentration of alkali metal or alkaline earth metal in the metal oxide, which is measured by SIMS, is lower than or equal to $1\times10^{18}$ atoms/$cm^3$, preferably lower than or equal to $2\times10^{16}$ atoms/$cm^3$.

When the metal oxide contains nitrogen, the metal oxide easily becomes n-type by generation of electrons functioning as carriers and an increase of carrier density. Thus, a transistor whose channel formation region includes a metal oxide that contains nitrogen is likely to be a normally-on transistor. For this reason, nitrogen in the metal oxide is preferably reduced as much as possible; for example, the concentration of nitrogen in the metal oxide measured by SIMS is set to lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, and still further preferably lower than or equal to $5\times10^{17}$ atoms/$cm^3$.

Hydrogen contained in a metal oxide reacts with oxygen bonded to a metal atom to be water, and thus causes an oxygen vacancy, in some cases. Entry of hydrogen into the oxygen vacancy generates an electron functioning as a carrier in some cases. Furthermore, in some cases, bonding of part of hydrogen to oxygen bonded to a metal atom causes generation of an electron functioning as a carrier. Thus, a transistor including a metal oxide that contains hydrogen is likely to be normally-on. For this reason, hydrogen in the metal oxide is preferably reduced as much as possible. Specifically, the hydrogen concentration of the metal oxide measured by SIMS is lower than $1\times10^{20}$ atoms/$cm^3$, preferably lower than $1\times10^{19}$ atoms/$cm^3$, further preferably lower than $5\times10^{18}$ atoms/$cm^3$, and still further preferably lower than $1\times10^{18}$ atoms/$cm^3$.

When a metal oxide with sufficiently reduced impurity concentration is used for a channel formation region in a transistor, the off-state current of the transistor can be reduced, and the transistor can have stable electrical characteristics.

(A Method for Manufacturing Memory Cell)

Next, one embodiment of a method for manufacturing a memory transistor MT that functions as a memory cell of the present invention is described with reference to FIGS. 7A to 7C to FIGS. 11A and 11B. Note that FIGS. 7A to 7C to FIGS. 11A and 11B are cross-sectional views illustrating a manufacturing process of the memory transistor MT.

Figure 7A:
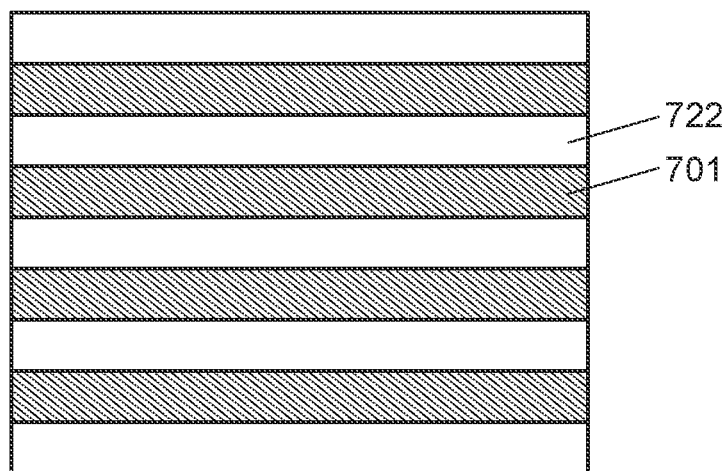
FIGS. 7A to 7C illustrate a manufacturing process of a semiconductor device of one embodiment of the present invention.

First, as illustrated in FIG. 7A, the conductors 701 and the insulators 722 are alternately stacked.

Figure 7B:
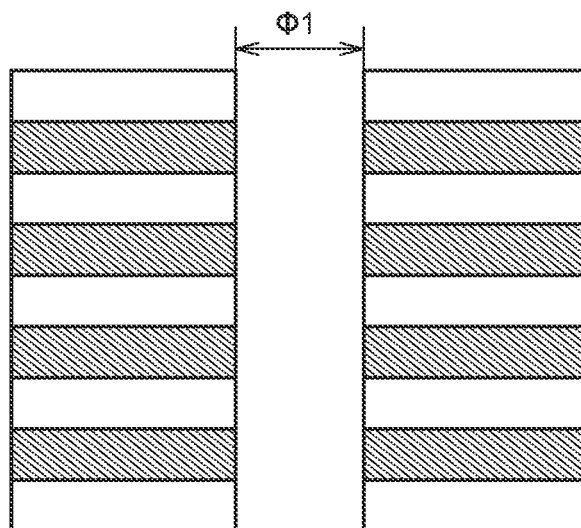

Then, as illustrated in FIG. 7B, the conductors 701 and the insulators 722 are processed to form an opening with a diameter of $\varphi1$ in the conductors 701 and the insulators 722.

Figure 7C:
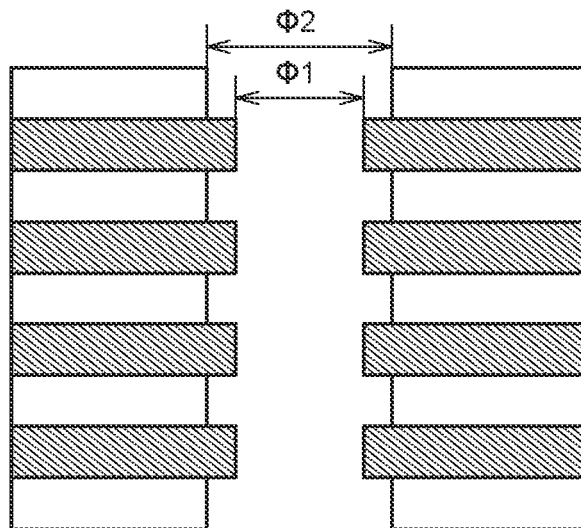

Next, as illustrated in FIG. 7C, the insulators 722 are subjected to isotropic etching to increase the opening diameter of the insulators 722. At this time, the diameter of the opening is $\varphi2$ ($>\varphi1$). In this case, it can be said that the insulator 722 is more recessed than the side surfaces of the conductors 701 between which the insulator 722 is sandwiched.

Figure 8A:
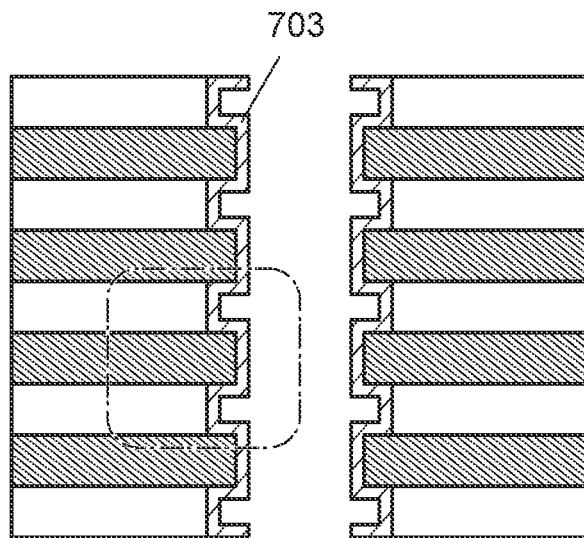
FIGS. 8A and 8B illustrate a manufacturing process of a semiconductor device of one embodiment of the present invention.
Figure 8B:
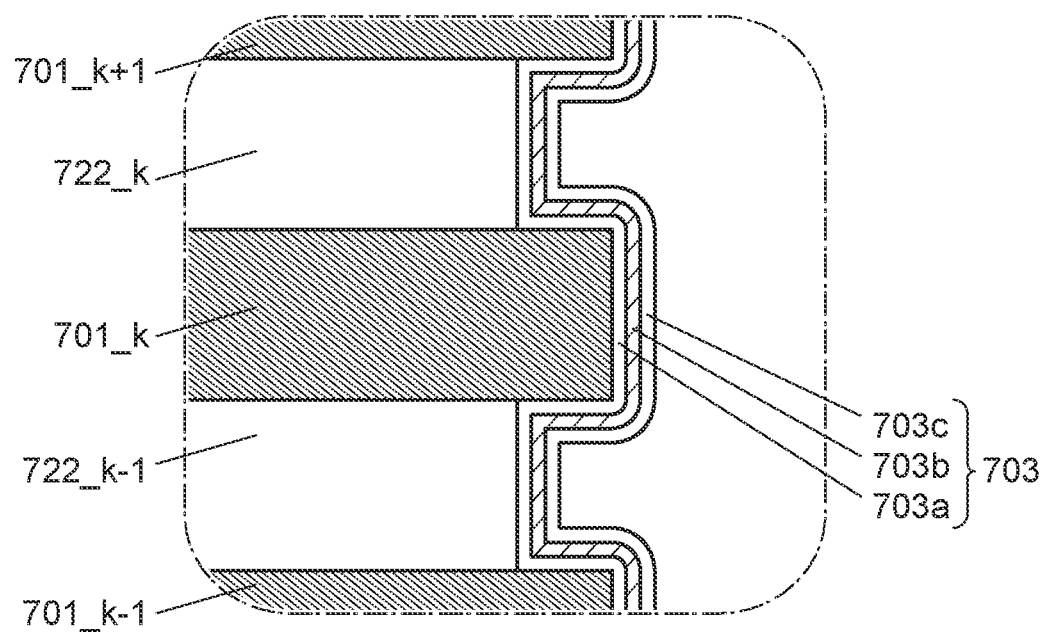

Next, as illustrated in FIGS. 8A and 8B, the insulator 703 is formed in the opening. FIG. 8B is an enlarged view of a region surrounded by dashed-dotted line in FIG. 8A, and illustrates a cross section of the conductor 701_k−1 and the insulator 722_k−1 in the k−1-th stage, the conductor 701_k and the insulator 722_k in the k-th stage, and the conductor 701_k+1 in the k+1-th stage (k is an integer of 2 or more and m−1 or less). The insulator 703 is formed by stacking the insulator 703a, the insulator 703b, and the insulator 703c in this order. The insulator 703 is formed with good coverage even on the recession of the insulator 722, and the insulator 703a is formed in contact with the side surface of the insulator 722 and the side surface, part of the top surface, and part of the bottom surface of the conductor 701.

Figure 9A:
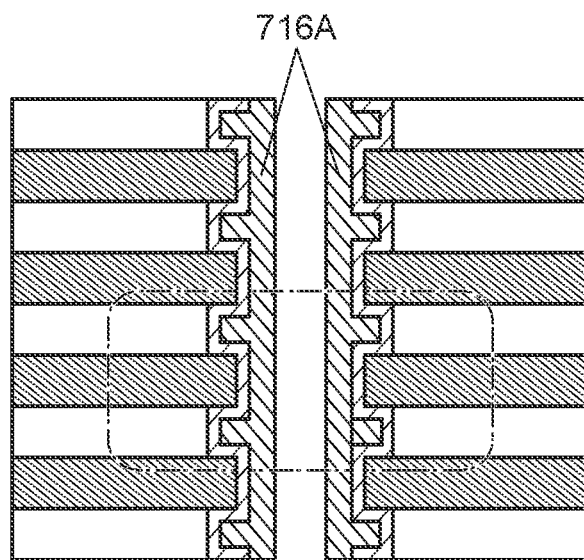
FIGS. 9A to 9C illustrate a manufacturing process of a semiconductor device of one embodiment of the present invention.
Figure 9B:
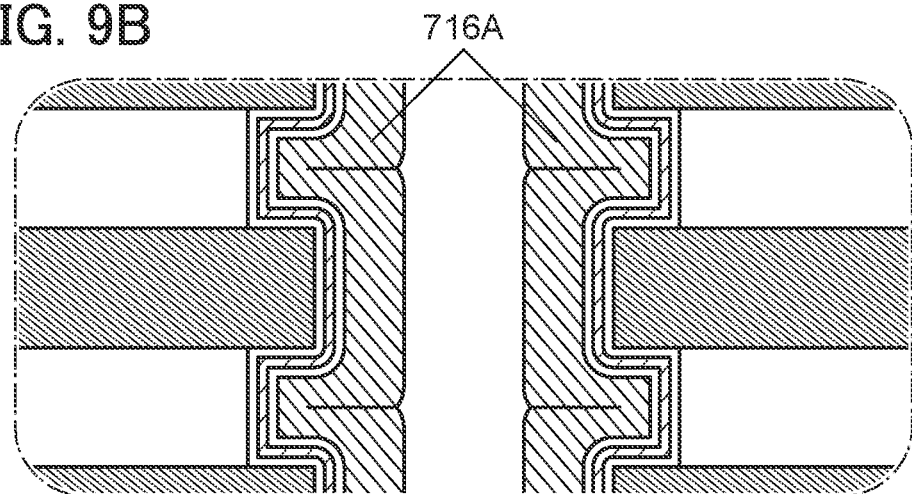
Figure 9C:
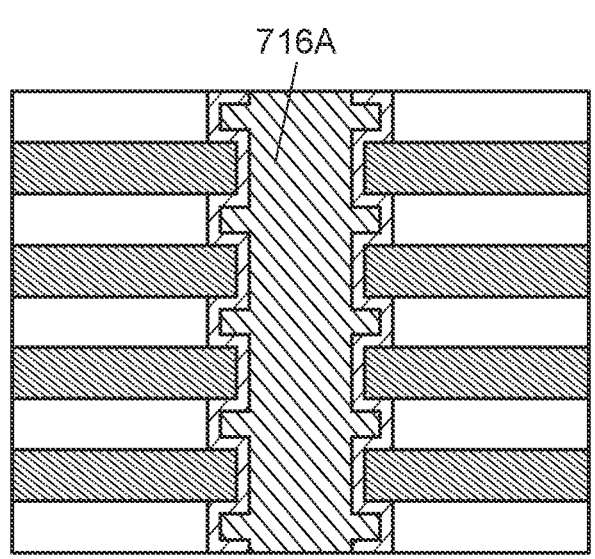

Next, as illustrated in FIG. 9A, a film 716A containing at least one of a metal element, hydrogen, and nitrogen is formed in the opening. FIG. 9B is an enlarged view of a portion surrounded by dashed-dotted line in FIG. 9A. As illustrated in FIG. 9B, the film 716A is formed to fill the recession with the insulator 703 provided between the film 716A and the insulator 722. However, the present invention is not limited thereto. As illustrated in FIG. 9C, the film 716A may be formed to fill not only the recession but also the whole opening.

Figure 10A:
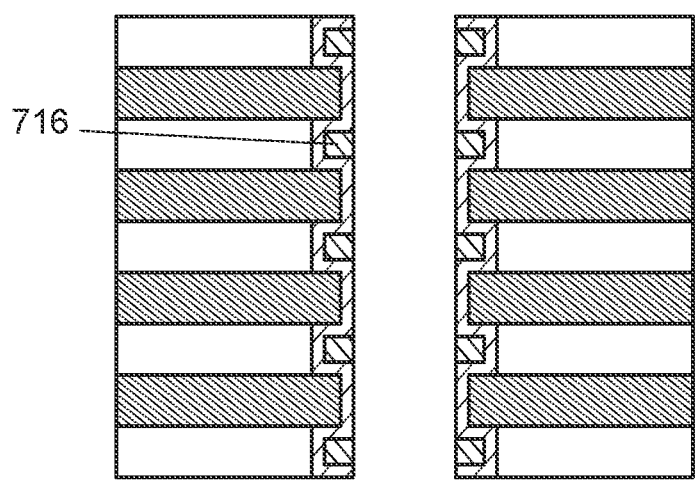
FIGS. 10A and 10B illustrate a manufacturing process of a semiconductor device of one embodiment of the present invention.

Next, the film 716A is processed to form the layer 716 containing at least one of a metal element, hydrogen, and nitrogen (see FIG. 10A). The processing of the film 716A can be performed by isotropic etching or anisotropic etching. In the case where the film 716A fills the recession and does not completely fill the opening as illustrated in FIG. 9A, the film 716A is preferably processed by isotropic etching. In contrast, in the case where the film 716A is formed to fill the recession and the opening as illustrated in FIG. 9C, it is preferable to use anisotropic etching. By such processing, the layer 716 can be formed in the recession.

Figure 10B:
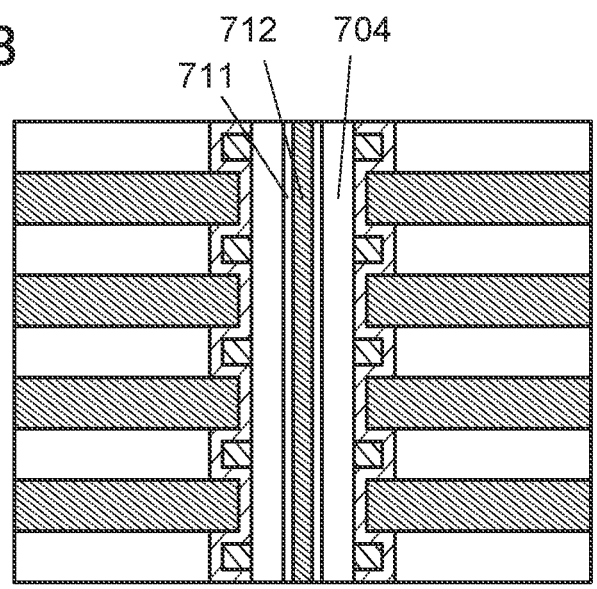
Figure 11A:
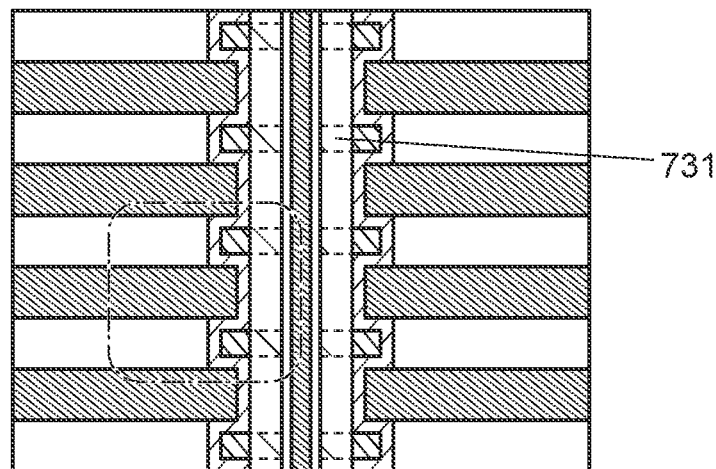
FIGS. 11A and 11B illustrate a manufacturing process of a semiconductor device of one embodiment of the present invention.
Figure 11B:
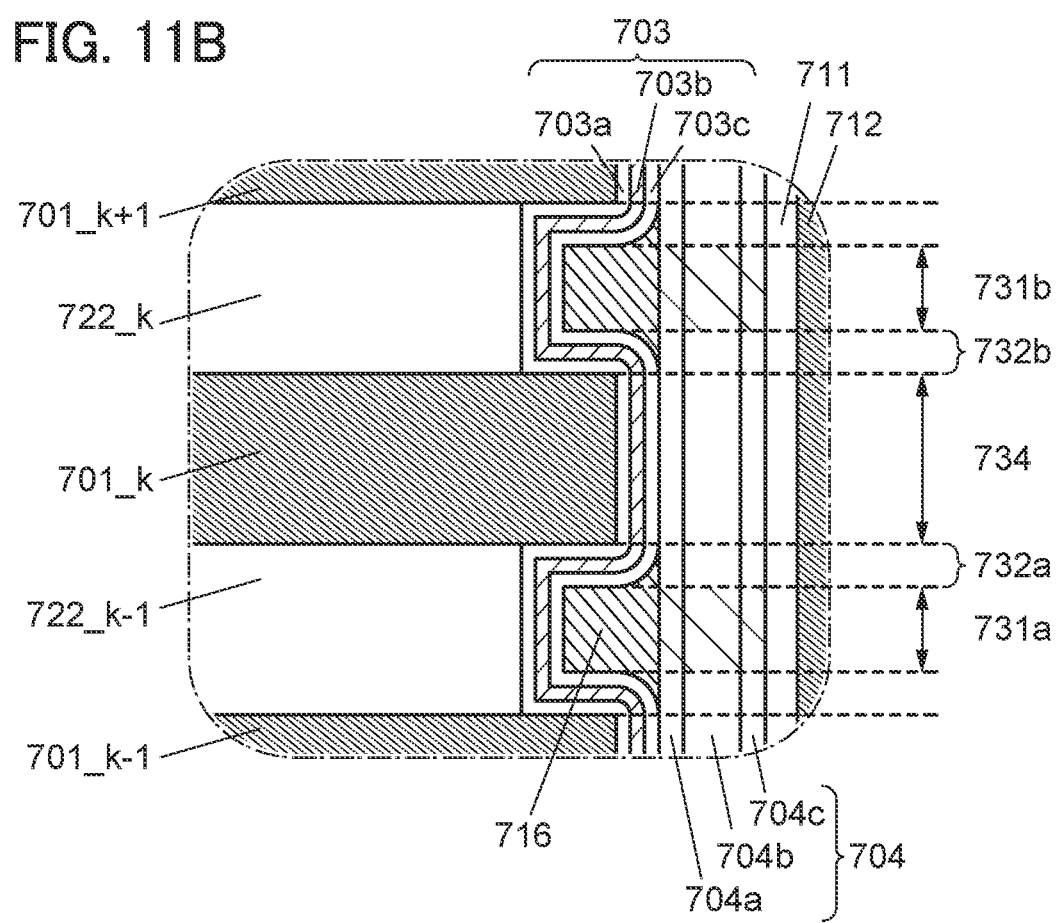

Next, as illustrated in FIG. 10B, the oxide 704 is formed in the opening. The oxide 704 positioned in the same layer as the conductor 701 is in contact with the insulator 703, and the oxide 704 positioned in the same layer as the insulator 722 is in contact with the layer 716.

Next, the insulator 711 is formed on the inner side of the oxide 704, and the conductor 712 is formed on the inner side of the insulator 711 (see FIG. 10B). Note that the conductor 712 is not necessarily provided, and the inside of the oxide 704 may be filled with the insulator 711.

Next, heat treatment is performed to reduce the resistance of the oxide 704 in contact with the layer 716. The region 731 (the regions 731a and 731b) in the oxide 704 is in contact with the layer 716, and thus have reduced resistance to become the low-resistance regions. In contrast, the resistance of the region 734, which is not in contact with the layer 716, is kept high. The region 732 (the regions 732a and 732b) positioned between the region 731 and the region 734 serves as a junction region. The resistance of the region 732 is preferably lower than that of the region 734. Furthermore, the resistance of the region 732 may be substantially equal to or higher than that of the region 731.

The region 734 of the oxide 704 serves as a channel formation region of the memory transistor MT. The region 731a serves as one of a source and a drain of the memory transistor MT and the region 731b serves as the other. The conductor 701_k serves as a first gate of the memory transistor MT, the conductor 712 serves as a second gate, the insulator 703a serves as the first gate insulating layer, the insulator 703b serves as a charge accumulation layer, the insulator 703c serves as a tunnel insulating layer, and the insulator 711 serves as the second gate insulating layer. Note that the source or the drain of the memory transistor MT in which the conductor 701_k serves as a gate may serve as a drain or a source in the transistor positioned over or under the memory transistor MT. For example, when the region 731b serves as a source of a transistor in which the conductor 701_k serves as a gate, the region 731b may serve as a drain of a transistor in which the conductor 701_k+1 serves as a gate.

Through the above steps, the memory transistor MT functioning as a memory cell can be formed. By the above method, the memory transistors MT in a plurality of layers can be formed at a time without performing patterning for forming the memory transistors MT for each layer. Furthermore, in the case where a memory cell array is formed by the above method, even when the number of layers of the memory transistors MT is increased, the number of steps of patterning and etching of the memory transistors MT is not increased. In this manner, the number of manufacturing steps of the memory cell array can be reduced; thus, a semiconductor device with high productivity can be provided.

(Method for Manufacturing Memory Cell Array)

Next, one embodiment of a method for manufacturing a memory cell array of the present invention is described with reference to FIGS. 12A to 12C to FIGS. 30A to 30C. FIGS. 12A, 13A, 14A, 15A, 16A, 17A, 18A, 19A, 20A, 21A, 22A, 23A, 24A, 25A, 26A, 27A, 28A, 29A, and 30A are top views seen from the z axis direction, and FIGS. 12B, 13B, 14B, 15B, 16B, 17B, 18B, 19B, 20B, 21B, 22B, 23B, 24B, 25B, 26B, 27B, 28B, 29B, and 30B are cross-sectional views taken along dashed-dotted line A1-A2 in FIGS. 12A, 13A, 14A, 15A, 16A, 17A, 18A, 19A, 20A, 21A, 22A, 23A, 24A, 25A, 26A, 27A, 28A, 29A, and 30A. FIGS. 12C, 13C, 14C, 15C, 16C, 17C, 18C, 19C, 20C, 21C, 22C, 23C, 24C, 25C, 26C, 27C, 28C, 29C, and 30C are cross-sectional views taken along dashed-dotted line A1-A2 in FIGS. 12A, 13A, 14A, 15A, 16A, 17A, 18A, 19A, 20A, 21A, 22A, 23A, 24A, 25A, 26A, 27A, 28A, 29A, and 30A. FIGS. 24D and 26D are enlarged cross-sectional views of a portion surrounded by dashed-dotted lines in FIGS. 24B and 26B, respectively.

Figure 12A:
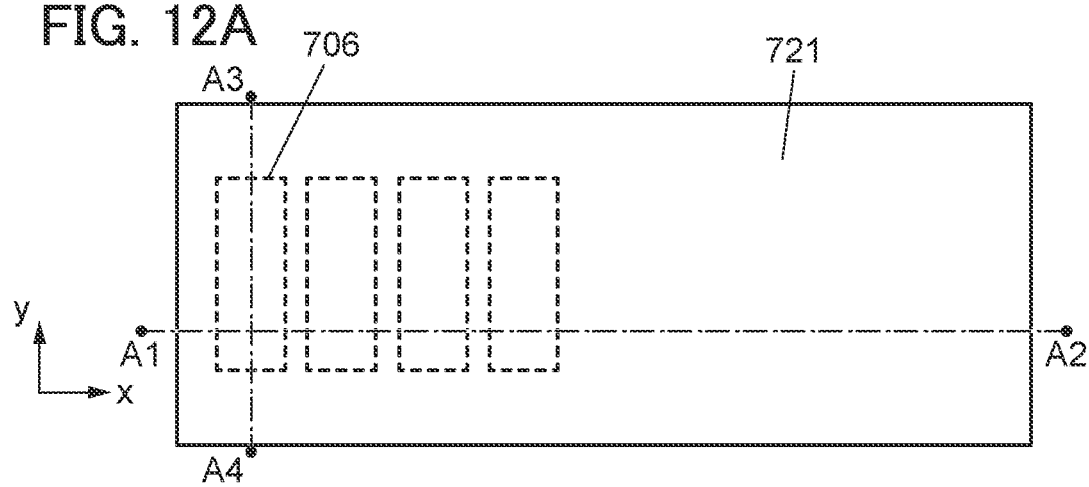
FIGS. 12A to 12C illustrate a manufacturing process of a semiconductor device of one embodiment of the present invention.
Figure 12B:
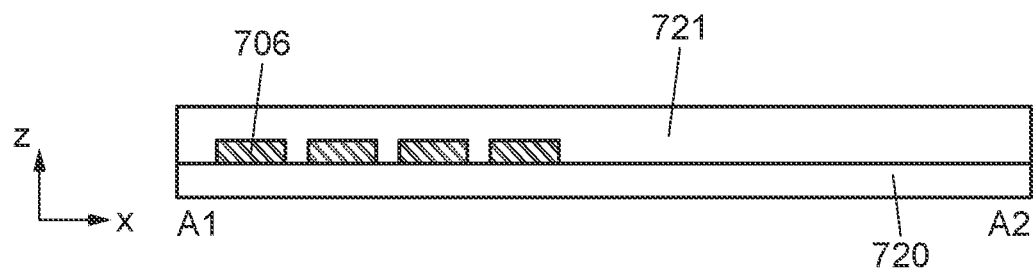
Figure 12C:
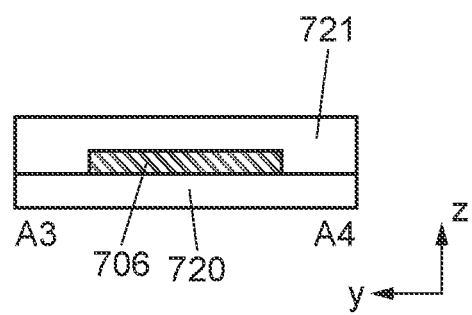
Figure 13A:
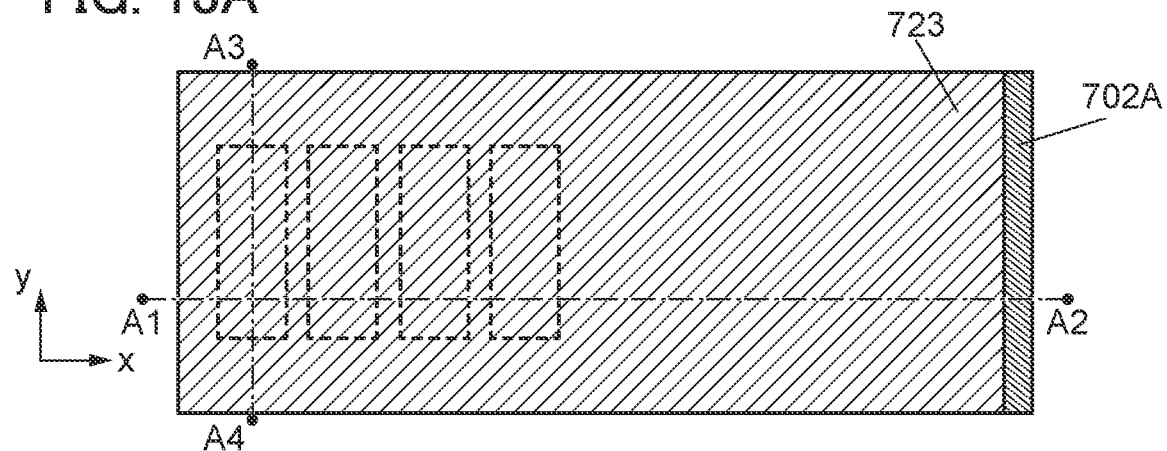
FIGS. 13A to 13C illustrate a manufacturing process of a semiconductor device of one embodiment of the present invention.
Figure 13B:
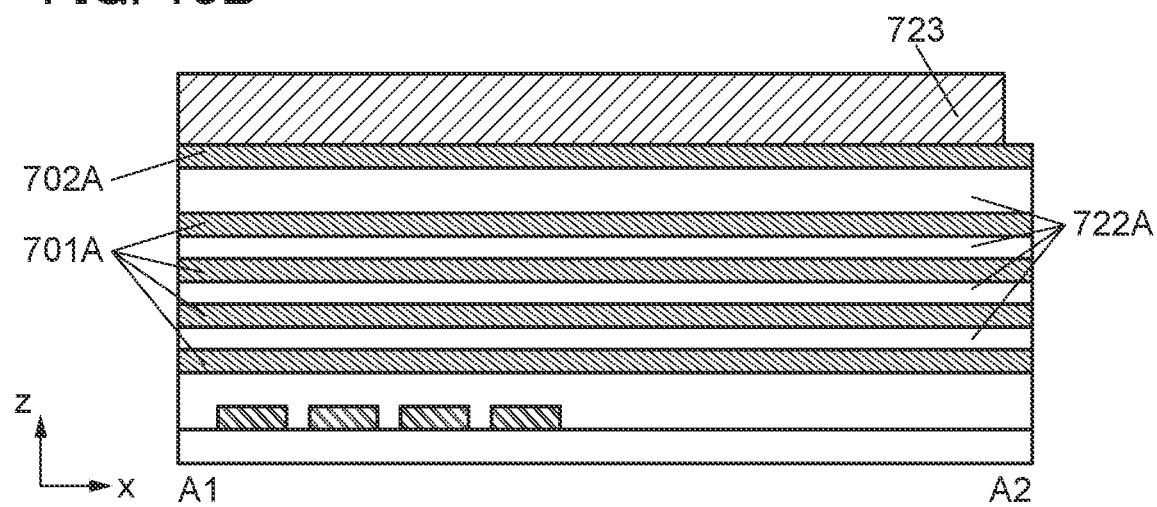
Figure 13C:
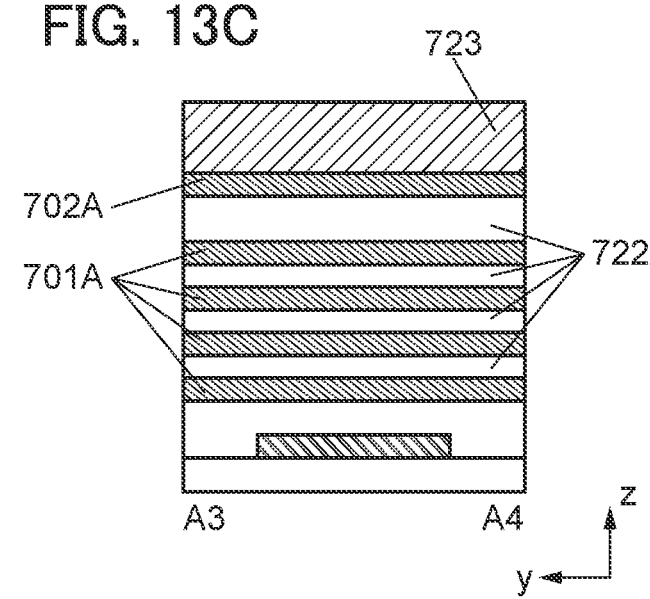

First, the conductor 706 is formed over the base 720 having an insulating surface, and the insulator 721 is formed to cover the conductor 706 (see FIGS. 12A to 12C).

A conductive film to be the conductor 706 is formed and processed by a lithography method, whereby the conductor 706 can be formed. Note that the method for forming the conductor 706 and the insulator 721 is not limited thereto. The insulator 721 may be formed over the base 720 and an unnecessary portion of the insulator 721 may be removed to form a groove or an opening, and the conductor 706 may be embedded in the groove or the opening. A formation method of such a conductor is referred to as a damascene method (a single damascene method or a dual damascene method) in some cases. When an insulating film is further formed over the conductor 706 formed by the damascene method and the insulator 721, the structure illustrated in FIGS. 12A to 12C can be obtained.

The conductor 706 and the insulator 721 can be formed by a sputtering method, a CVD method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

In the lithography method, first, a resist is exposed to light through a photomask. Next, a region exposed to light is removed or left using a developing solution, so that a resist mask is formed. Then, etching through the resist mask is conducted. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over a conductive film, a resist mask is formed thereover, and then the material of the hard mask is etched.

The processing can be performed by a dry etching method or a wet etching method. A dry etching method is suitable for microfabrication.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

In the case where a hard mask is used for etching of the conductive film, the etching may be performed with or without the resist mask. In the latter case, the resist mask may be removed during the etching. The hard mask may be removed by etching after the etching of the conductive film. The hard mask does not need to be removed in the case where the material of the hard mask does not affect the subsequent process or can be utilized in the subsequent process.

As the conductive film to be the conductor 706, a conductive film containing a metal element is preferably formed by a sputtering method. Alternatively, the conductive film can be formed by a CVD method.

The surface of the insulator 721 is preferably subjected to planarization treatment as needed. As the planarization treatment, a chemical mechanical polishing (CMP) method or a reflow method can be used.

Conductive films 701A and insulating films 722A are alternately stacked over the conductor 706 and the insulator 721. This embodiment shows an example in which the conductive film 701A is formed over the insulator 721 and the insulating film 722A is formed over the conductive film 701A; however, the order of the formation is not limited thereto. The insulating film 722A may be formed over the insulator 721, and the conductive film 701A may be formed over the insulating film 722A. A CVD method can be used for the formation of the conductive film 701A and the insulating film 722A. Alternatively, a sputtering method may be used.

Although four layers of the conductive films 701A and four layers of the insulating films 722A are formed in this embodiment, the number of stacked layers is not limited thereto. Five or more layers of the conductive films 701A and the insulating films 722A may be formed depending on the required performance of a semiconductor device. For example, the number of conductive films 701A and the number of insulating films 722A may each be 32, 64, 128, or 200 or more.

A conductive film 702A is formed over the uppermost layer of the insulating film 722A. A mask 723 is formed over the conductive film 702A (see FIGS. 13A to 13C). The conductive film 702A can be formed using a method and a material similar to those of the conductive film 701A. Note that the conductive film 702A may be formed by the same method as or a method different from that of the conductive film 701A. The conductive film 702A may be formed using the same material as or a material different from that of the conductive film 701A.

Figure 14A:
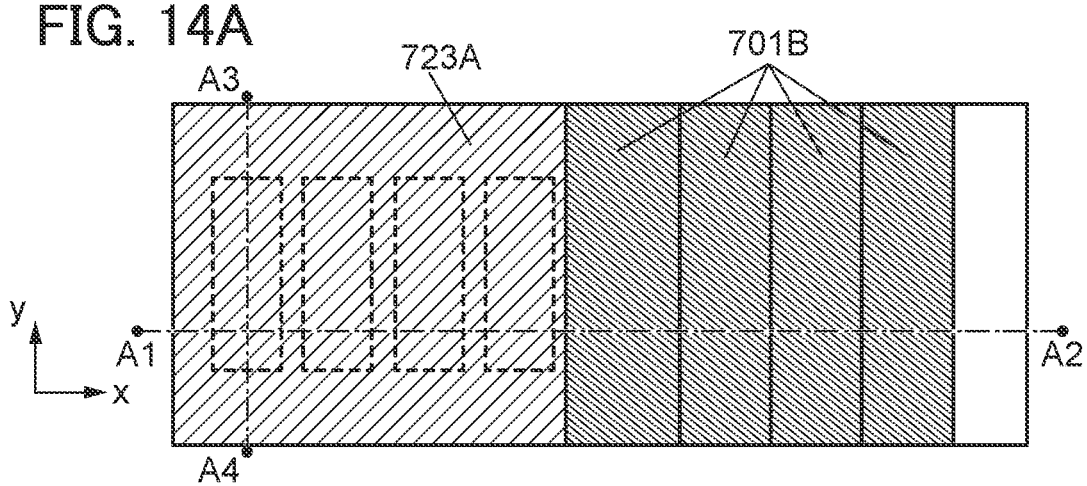
FIGS. 14A to 14C illustrate a manufacturing process of a semiconductor device of one embodiment of the present invention.
Figure 14B:
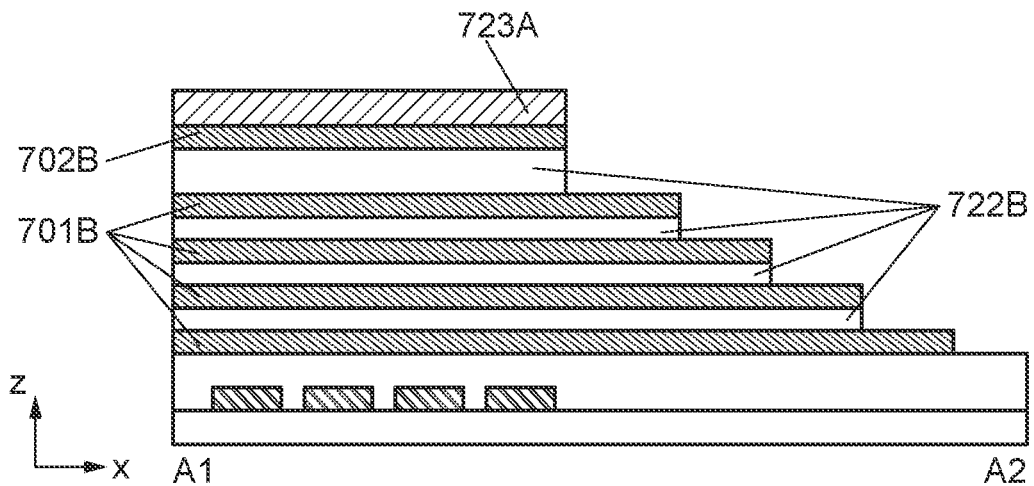
Figure 14C:
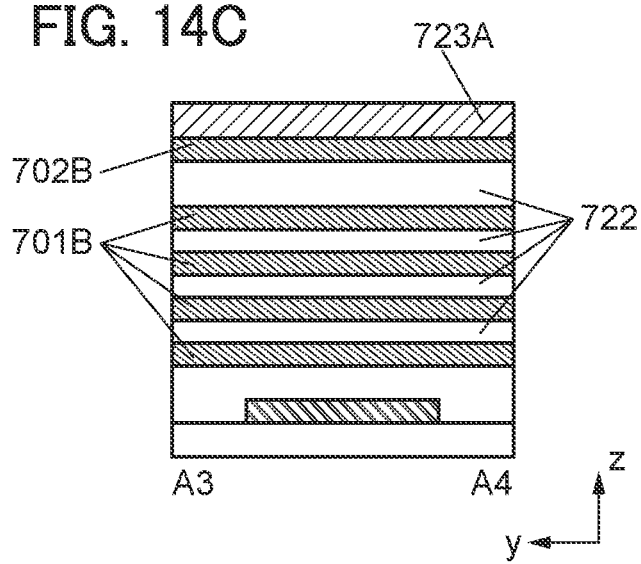
Figure 15A:
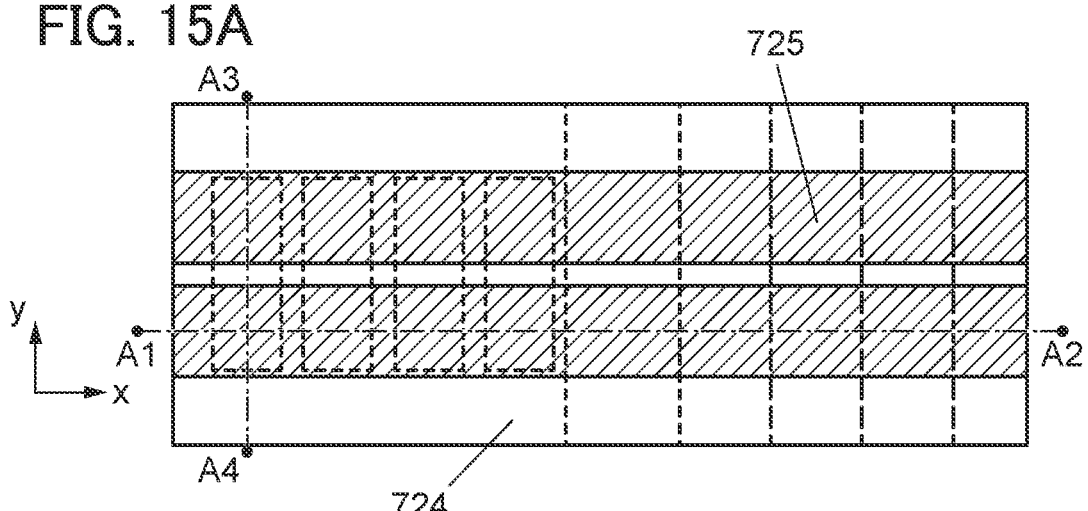
FIGS. 15A to 15C illustrate a manufacturing process of a semiconductor device of one embodiment of the present invention.
Figure 15B:
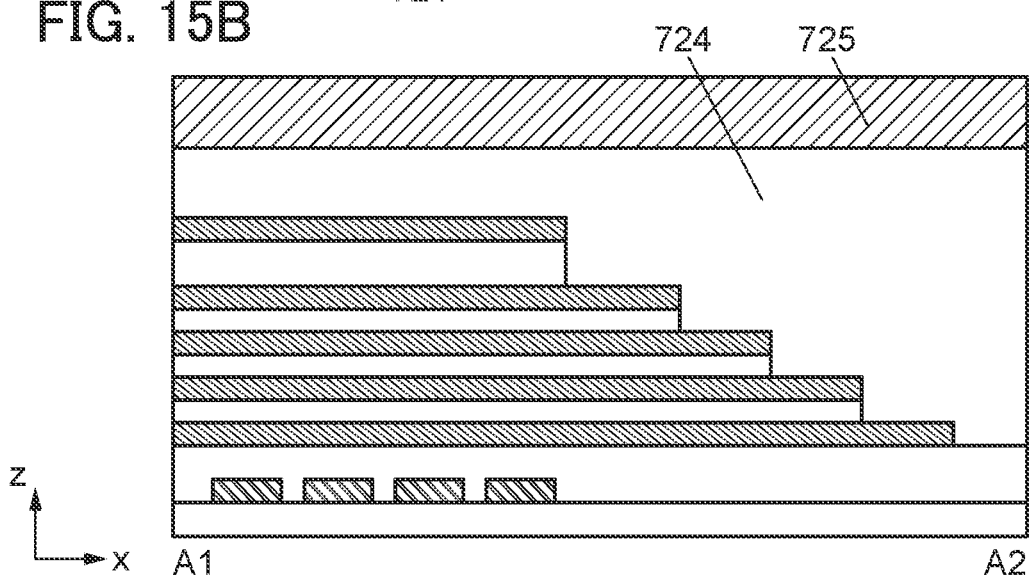
Figure 15C:
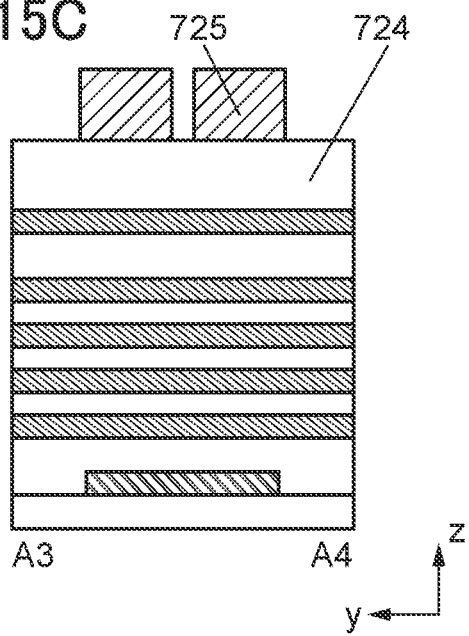
Figure 16A:
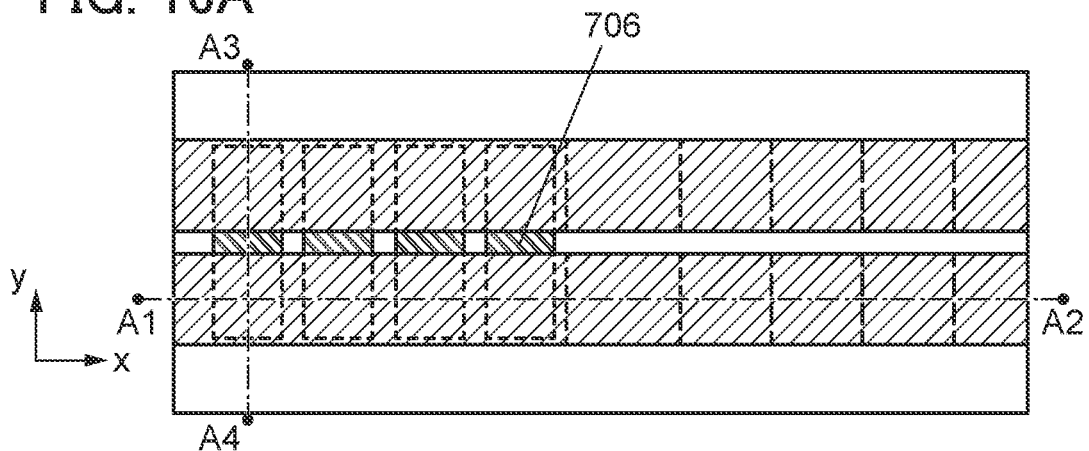
FIGS. 16A to 16C illustrate a manufacturing process of a semiconductor device of one embodiment of the present invention.
Figure 16B:
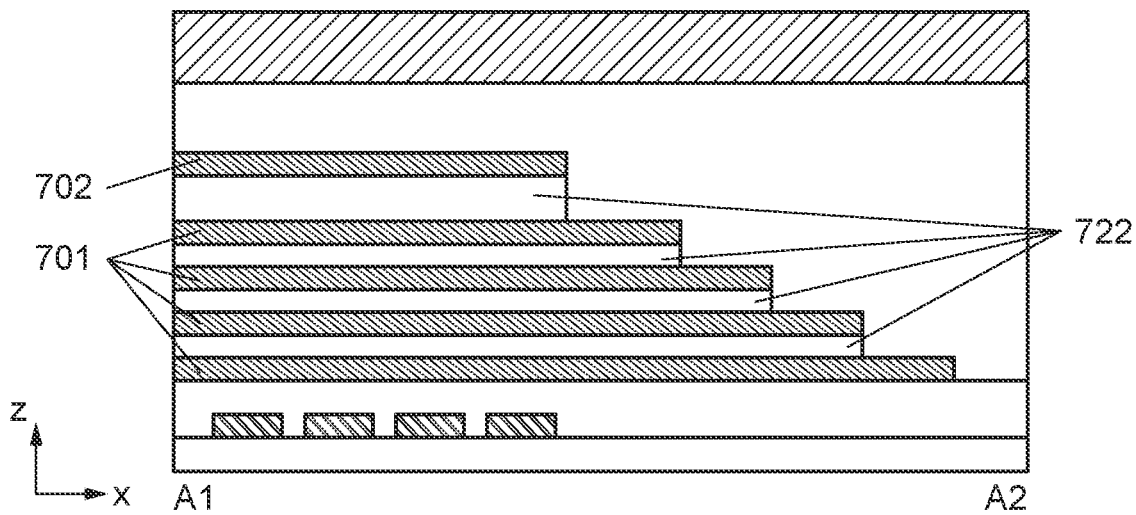
Figure 16C:
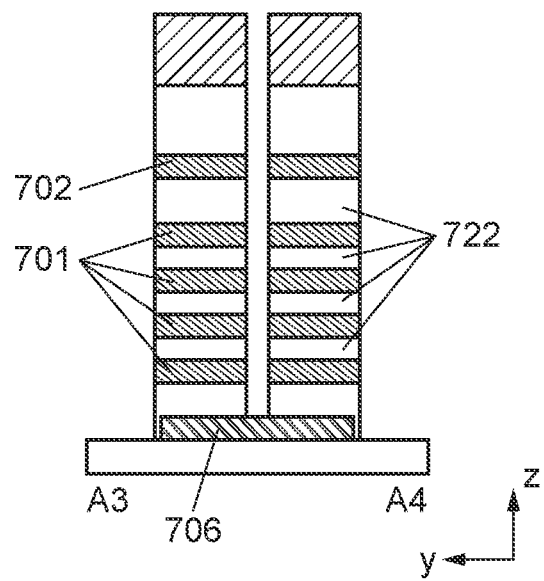
Figure 17A:
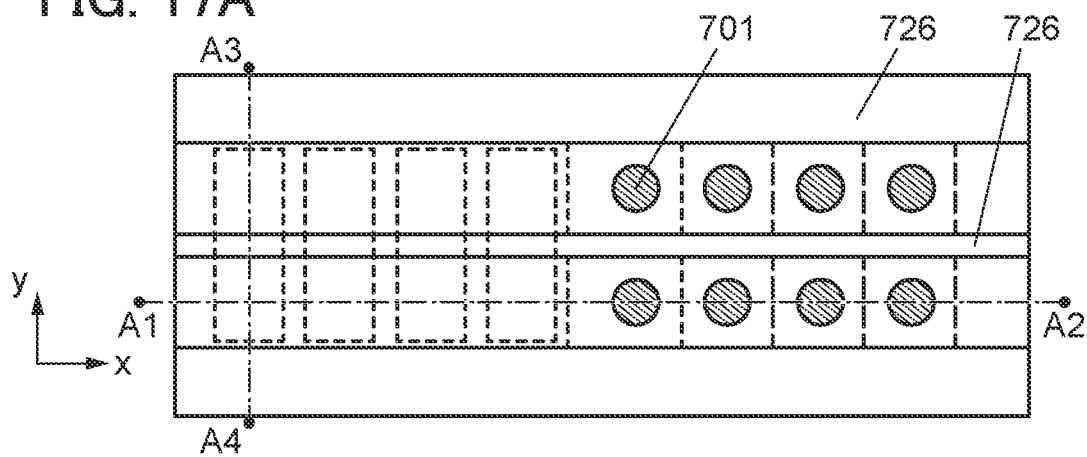
FIGS. 17A to 17C illustrate a manufacturing process of a semiconductor device of one embodiment of the present invention.
Figure 17B:
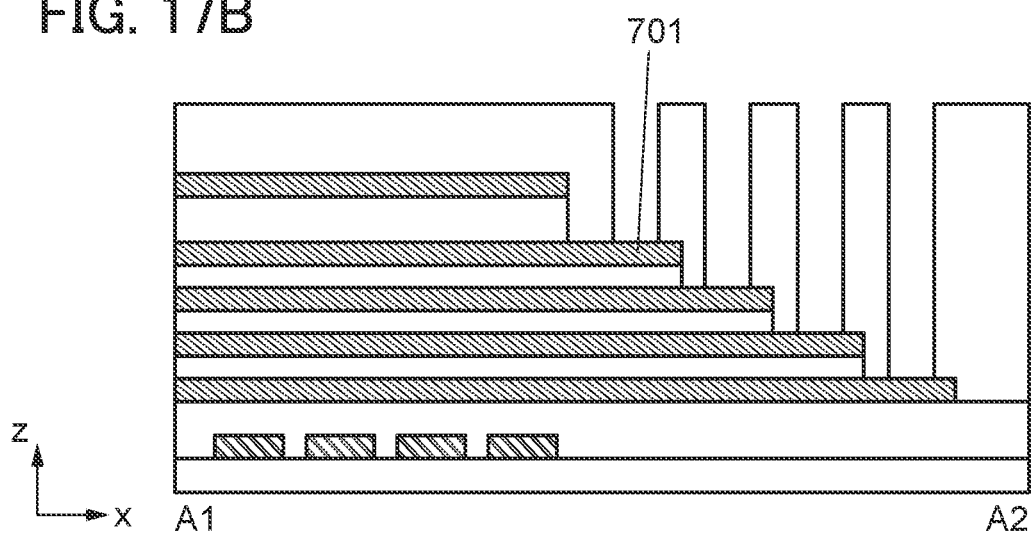
Figure 17C:
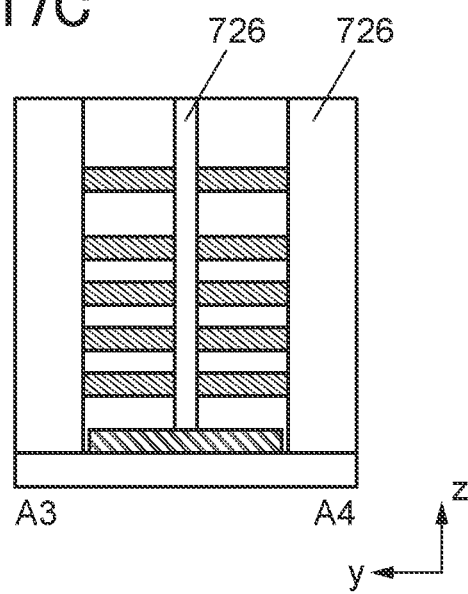

Next, the conductive film 702A, the conductive film 701A, and the insulating film 722A are processed to form a step-like conductive film 701B, a conductive film 702B, and an insulating film 722B illustrated in FIG. 14B. In the processing of the conductive film 702A, the conductive film 701A, and the insulating film 722A, etching of the conductive film 702A, the conductive film 701A, and the insulating film 722A and slimming of the mask 723 are alternately performed, whereby the step-like conductive film 701B, the conductive film 702B, and the insulating film 722B can be formed. By the processing of the conductive film 702A, the conductive film 701A, and the insulating film 722A, the mask 723 is reduced in width and thickness to be a mask 723A (see FIGS. 14A to 14C).

Then, the mask 723A is removed, and the insulator 724 is formed. The insulator 724 can be formed by a CVD method. The insulator 724 is preferably subjected to planarization treatment by a CMP method or a reflow method. A mask 725 is formed over the insulator 724. The mask 725 is formed over the planarized insulator 724, whereby the accuracy of lithography can be improved (see FIGS. 15A to 15C).

Then, the insulator 724, the conductive film 702B, the conductive film 701B, the insulating film 722B, and the insulator 721 are processed with the mask 725. By the processing, the conductor 701 serving as the gate of the memory transistor MT and electrically connected to the word line, and the conductor 702 serving as the gate of the selection transistor are formed. In addition, the insulating film 722B is processed into the insulator 722 (see FIGS. 16A to 16C).

Then, the mask 725 is removed. Next, the insulator 726 is formed to be embedded in the portions in the insulator 724, the conductive film 702B, the conductive film 701B, the insulating film 722B, and the insulator 721, which are removed by the above processing. The insulator 726 can be formed by a CVD method or an ALD method. It is particularly preferable to employ an ALD method, in which case a film with a uniform thickness can be formed in a groove or an opening having a large aspect ratio. Alternatively, the insulator 726 may be formed by a combination of an ALD method and a CVD method. The insulator 726 is preferably subjected to planarization treatment by a CMP method or a reflow method. When the planarization treatment is performed by a CMP method, the insulator 726 may be polished until the surface of the insulator 724 is exposed. The insulator 724 and the insulator 726 may be polished together. In this case, the thickness of the insulator 724 becomes small.

Next, the insulator 724 is processed by a lithography method to form first openings so that the conductor 701 is exposed. The first opening is formed to expose each of the conductors 701 formed in a step-like shape. Although not illustrated, an opening exposing the conductor 702 may be formed at the same time (see FIGS. 17A to 17C).

Figure 18A:
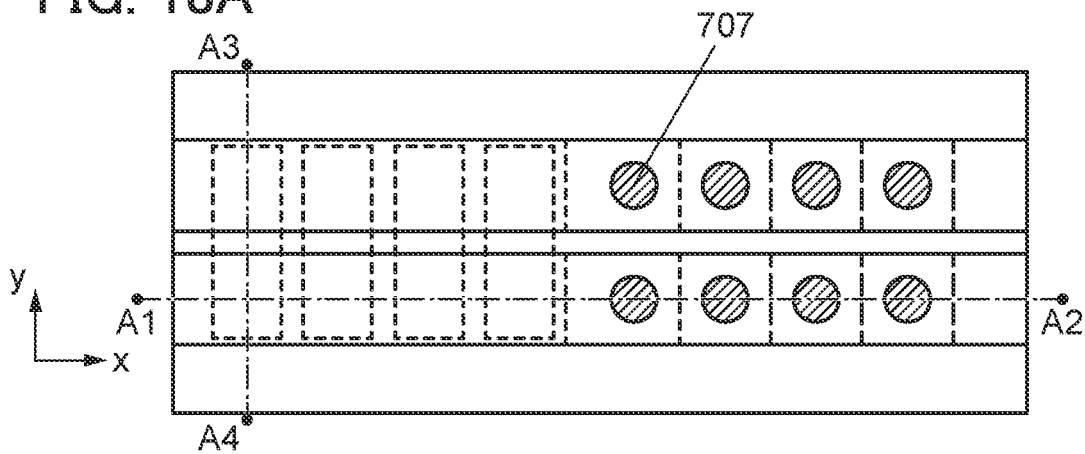
FIGS. 18A to 18C illustrate a manufacturing process of a semiconductor device of one embodiment of the present invention.
Figure 18B:
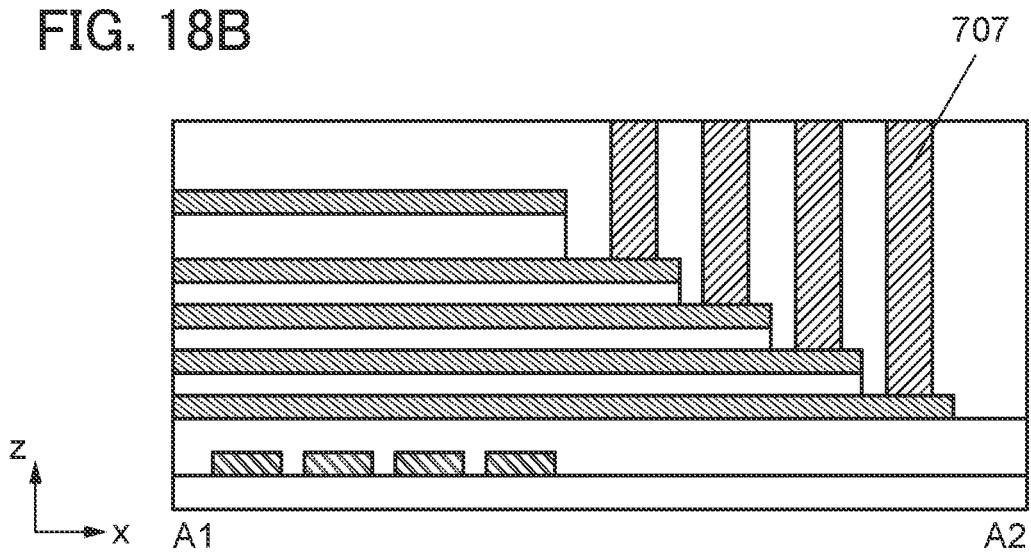
Figure 18C:
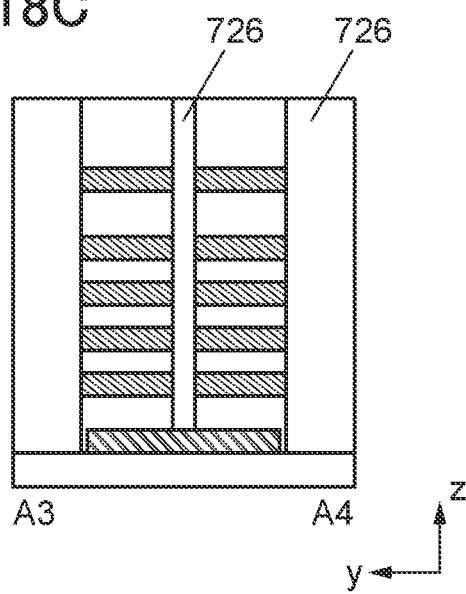

Next, the conductor 707 is formed to fill the first opening (see FIGS. 18A to 18C). The conductor 707 can be formed by a CVD method or an ALD method. It is particularly preferable to employ an ALD method, in which case a film with a uniform thickness can be formed in a groove or an opening having a large aspect ratio. Alternatively, the conductor 707 may be formed by a combination of an ALD method and a CVD method. The conductor 707 may have a stacked-layer structure of a plurality of layers. The conductor 707 can be formed in such a manner that a conductive film to be the conductor 707 is formed over the insulator 724 and in the first opening, and unnecessary portions of the conductive film are removed by CMP and the like.

Figure 19A:
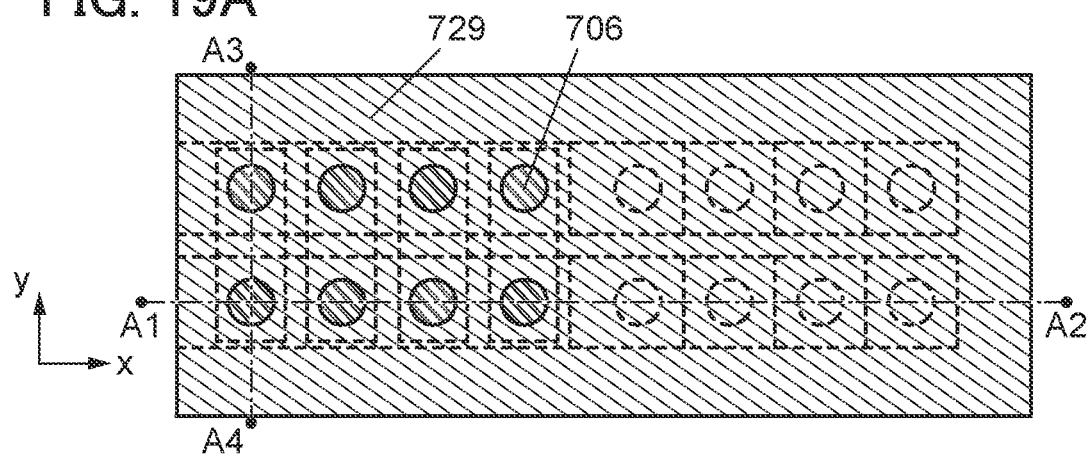
FIGS. 19A to 19C illustrate a manufacturing process of a semiconductor device of one embodiment of the present invention.
Figure 19B:
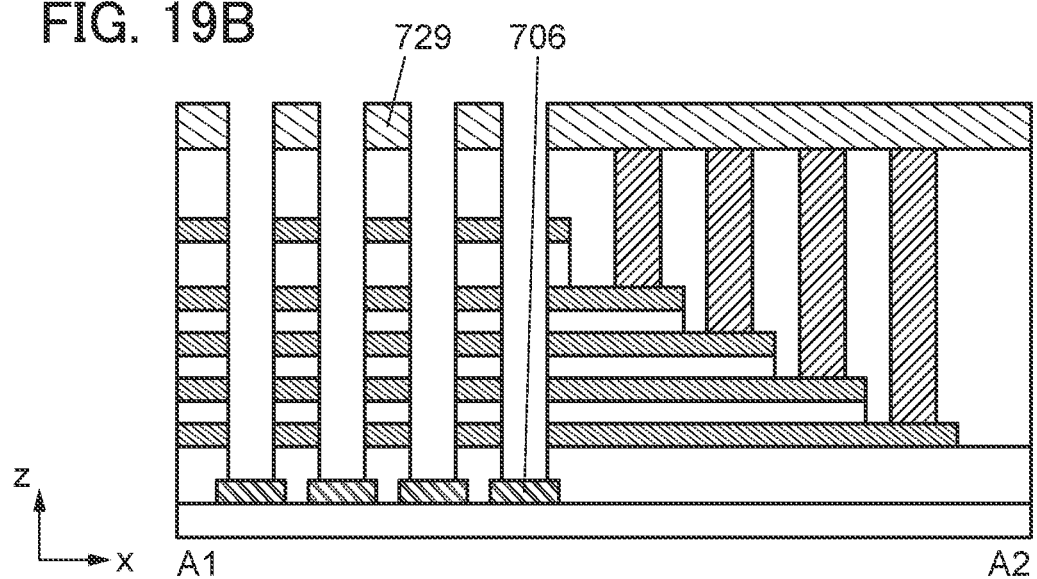
Figure 19C:
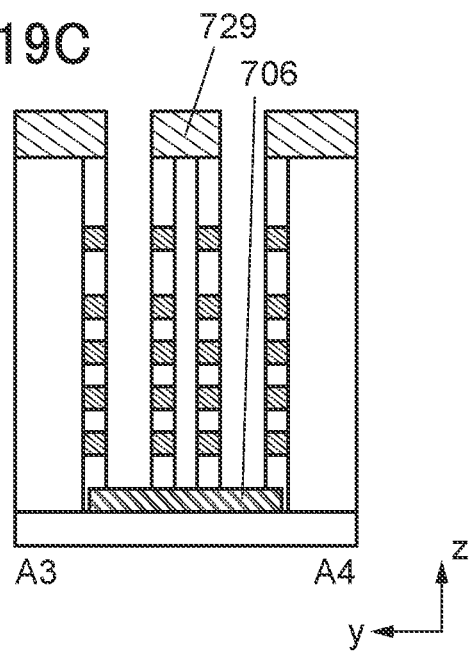

Next, a mask 729 is formed over the insulator 724 and the insulator 726, the insulator 724, the conductor 702, the conductor 701, the insulator 722, and the insulator 721 are processed by a lithography method, and second openings are formed to expose the conductor 706 (see FIGS. 19A to 19C).

Figure 20A:
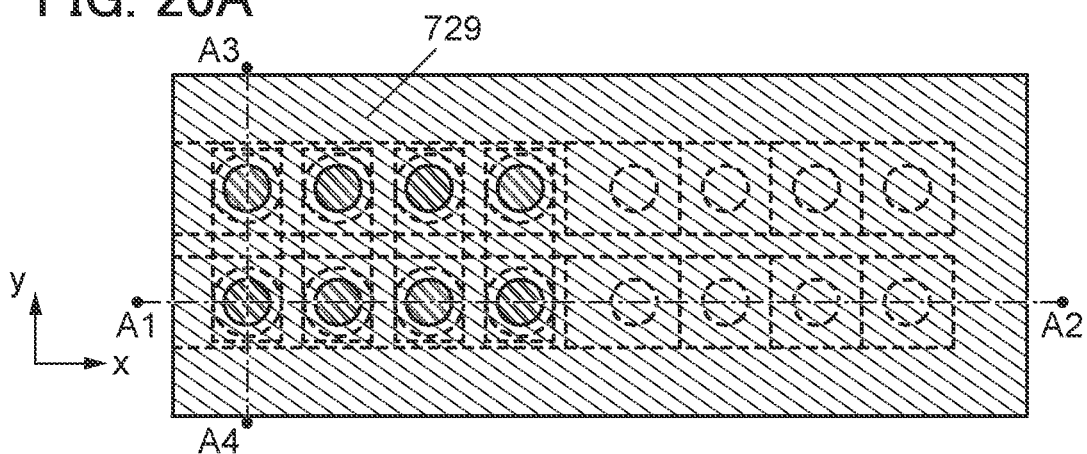
FIGS. 20A to 20C illustrate a manufacturing process of a semiconductor device of one embodiment of the present invention.
Figure 20B:
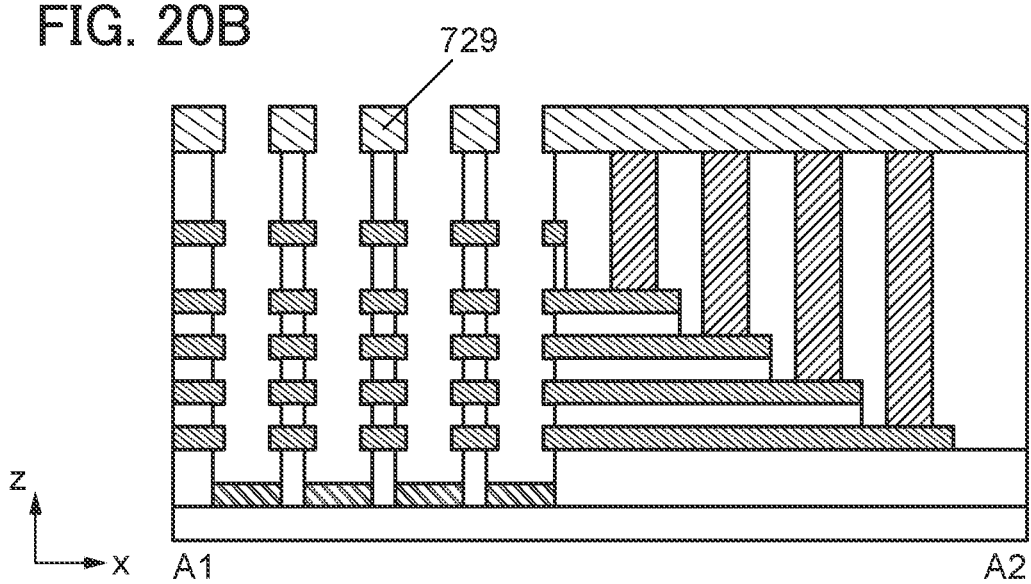
Figure 20C:
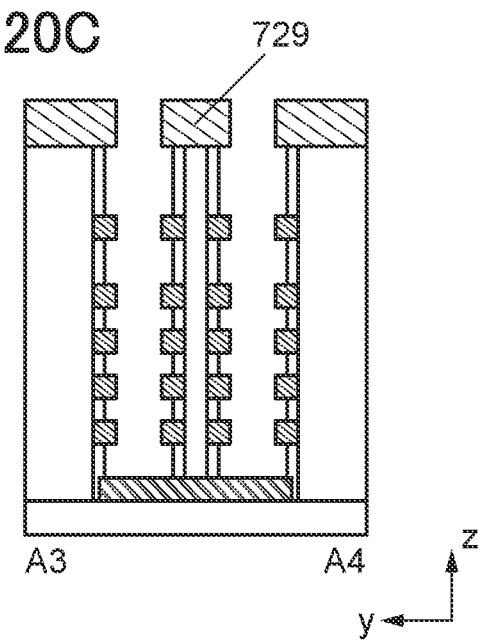

Next, the insulators 721, 722, and 724 are subjected to isotropic etching to make the diameter of the opening in the insulators 721, 722, and 724 large (see FIGS. 20A to 20C). By this treatment, the diameter of the opening in the insulators is larger than that of the opening in the conductors 701 and 702. It can be said that the insulators are more recessed than the side surface of the conductor (the conductor 701 or 702) positioned over or under the insulators. Such processing can be performed by isotropic etching using dry etching with a gas, a radical, plasma, or the like, or by isotropic etching using wet etching with a liquid. A liquid used for wet etching may be referred to as an etchant. In the case where isotropic etching is performed using dry etching, a gas, a radical, plasma, or the like containing at least one of chlorine, bromine, and fluorine can be used. The isotropic etching is preferably performed without removal of the mask 729.

Figure 21A:
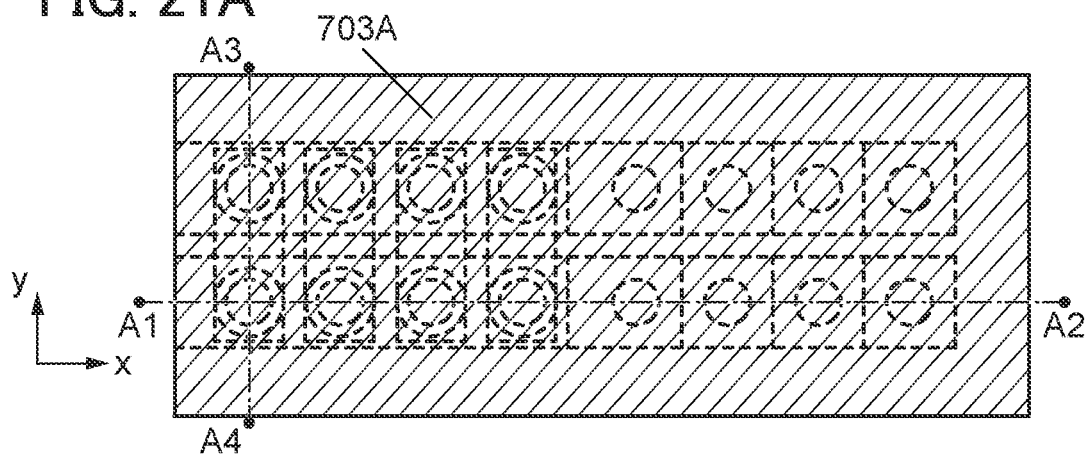
FIGS. 21A to 21C illustrate a manufacturing process of a semiconductor device of one embodiment of the present invention.
Figure 21B:
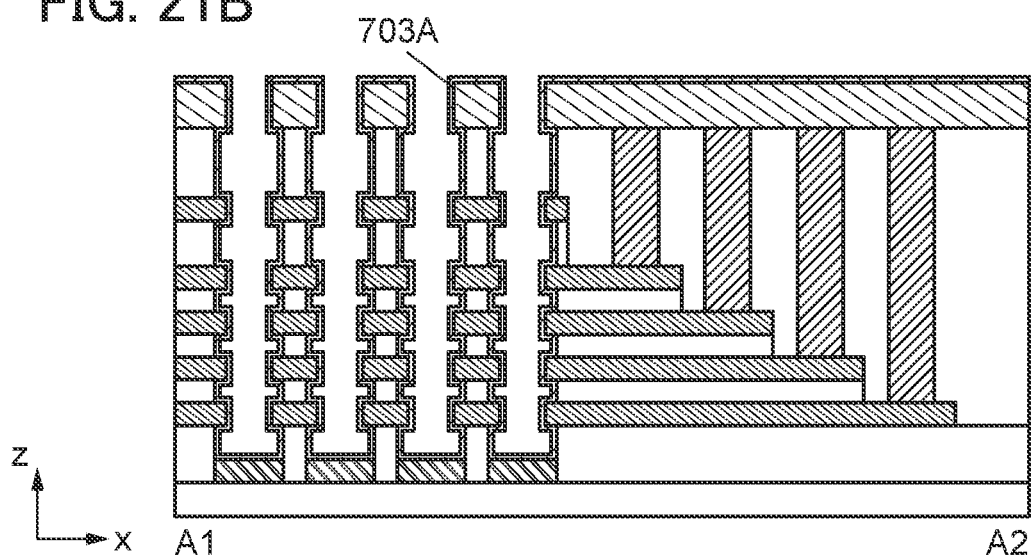
Figure 21C:
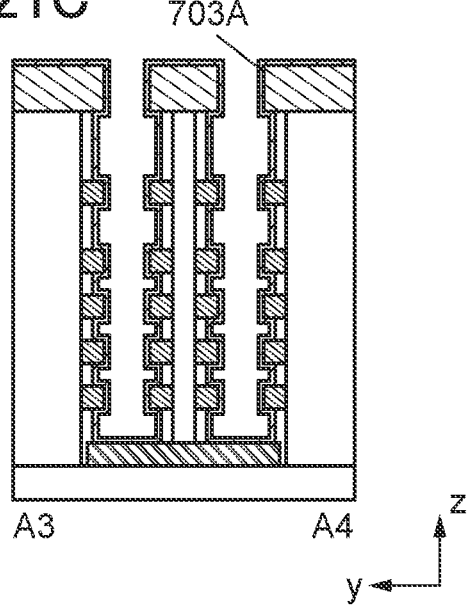

Next, an insulating film 703A to be the insulator 703 is formed over the insulator 724 and the conductor 707 and in the second opening (see FIGS. 21A to 21C). Note that, although not illustrated, the insulating film 703A may be formed by stacking an insulating film to be the insulator 703a, an insulating film to be the insulator 703b, and an insulating film to be the insulator 703c in this order. The insulating film 703A can be formed by a CVD method or an ALD method. It is particularly preferable to employ an ALD method, in which case a film with a uniform thickness can be formed in a groove or an opening having a large aspect ratio. Alternatively, the insulating film 703A may be formed by a combination of an ALD method and a CVD method. The insulating film to be the insulator 703a, the insulating film to be the insulator 703b, and the insulating film to be the insulator 703c may be formed using the same deposition apparatus or different deposition apparatuses. Note that the insulating film to be the insulator 703c is preferably formed to be thinner than the insulating film to be the insulator 703a, in which case the insulator 703c is thinner than the insulator 703a.

The insulating film 703A formed by the above method can have high coverage and can be formed in the recessions of the insulators 721, 722, and 724. That is, the insulating film 703A can be formed in contact with not only the side surfaces of the insulators 721, 722, and 724 and the side surfaces of the conductors 701 and 702, but also part of the top surfaces and part of the bottom surfaces of the conductors 701 and 702.

Figure 22A:
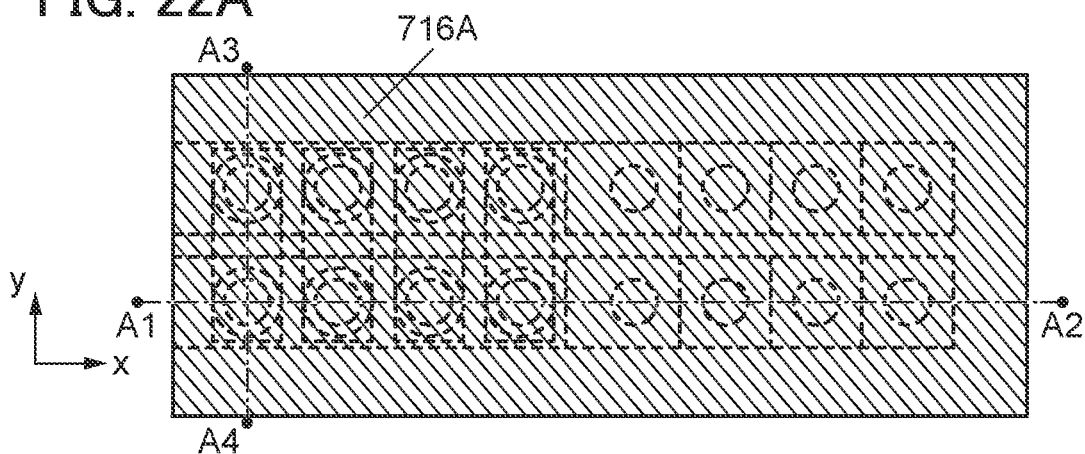
FIGS. 22A to 22C illustrate a manufacturing process of a semiconductor device of one embodiment of the present invention.
Figure 22B:
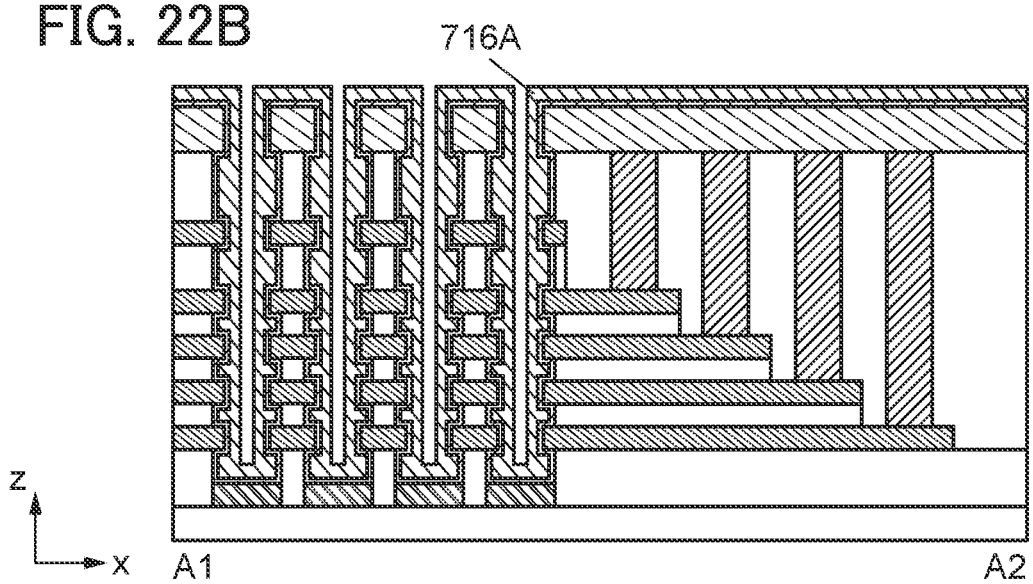
Figure 22C:
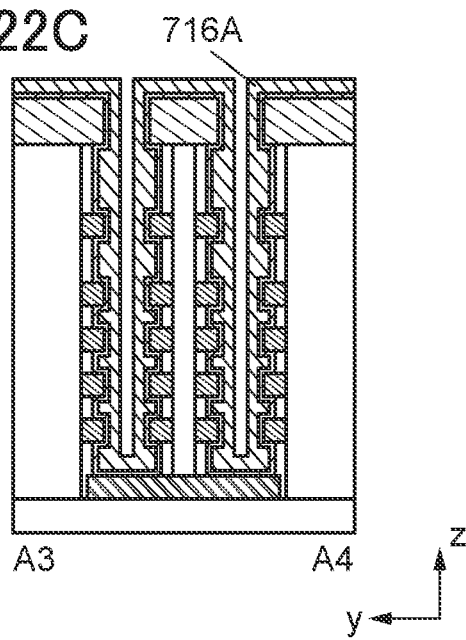

Then, the film 716A containing at least one of a metal element, hydrogen, and nitrogen is formed in the second opening (see FIGS. 22A to 22C). The film 716A is formed to fill the recessions of the insulators 721, 722, and 724, and does not need to fill the second opening entirely. The film 716A can be formed by a CVD method or an ALD method.

It is particularly preferable to employ an ALD method, in which case a film with a uniform thickness can be formed in a groove or an opening having a large aspect ratio. Alternatively, the film 716A may be formed by a combination of an ALD method and a CVD method.

Figure 23A:
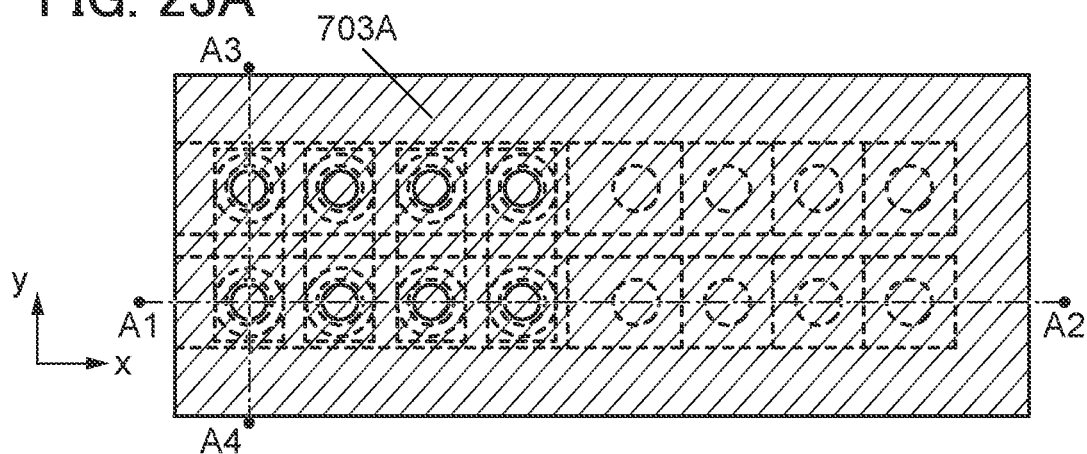
FIGS. 23A to 23C illustrate a manufacturing process of a semiconductor device of one embodiment of the present invention.
Figure 23B:
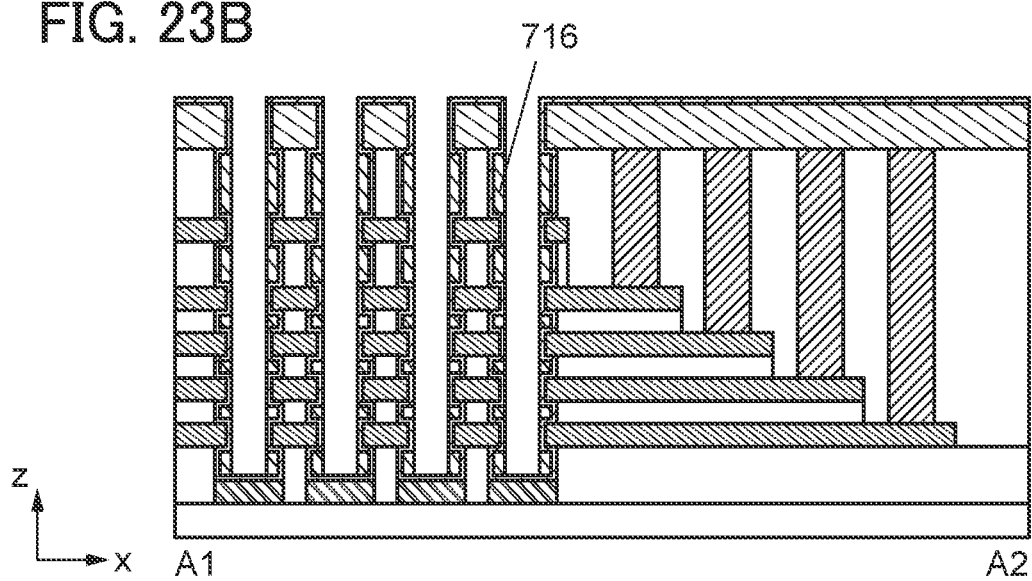
Figure 23C:
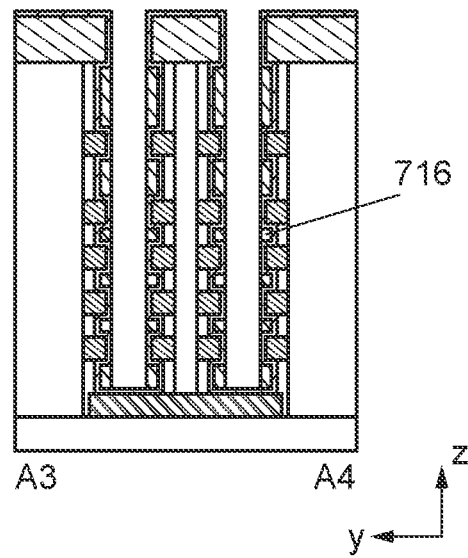
Figure 24A:
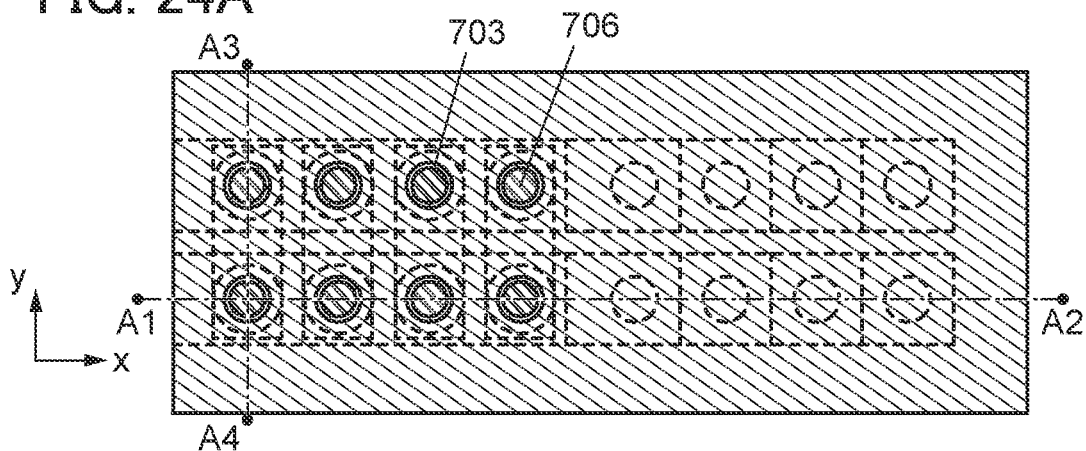
FIGS. 24A to 24D illustrate a manufacturing process of a semiconductor device of one embodiment of the present invention.
Figure 24B:
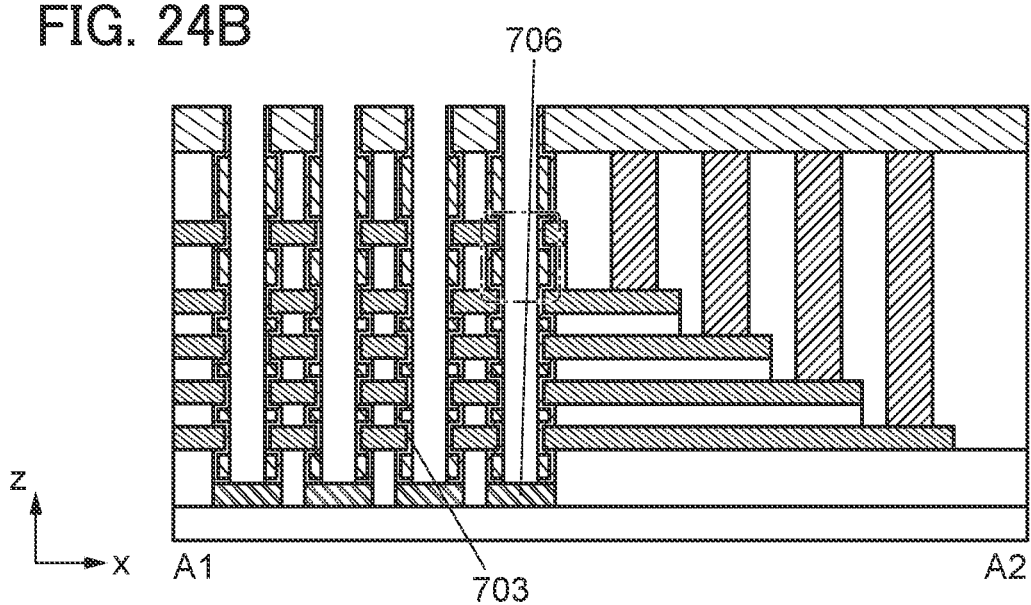
Figure 24C:
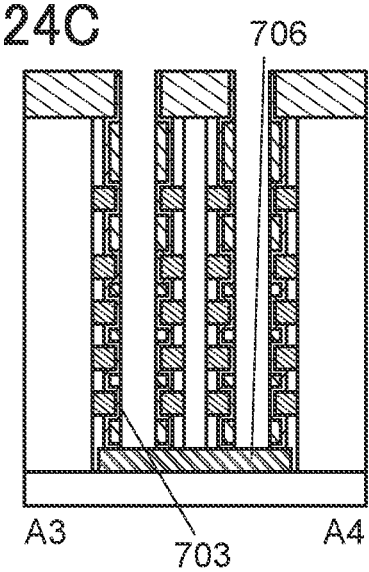
Figure 24D:
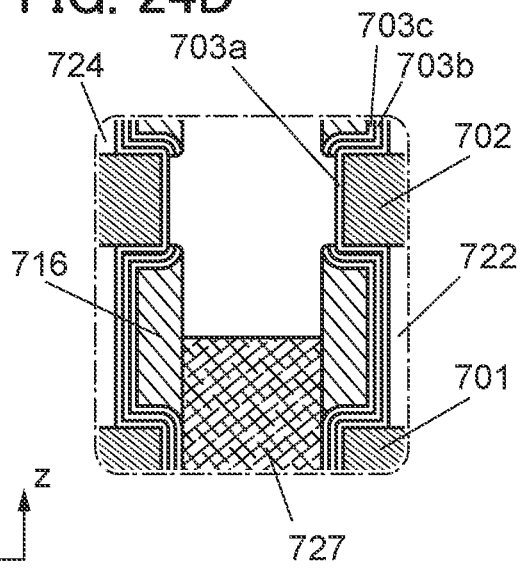
Figure 25A:
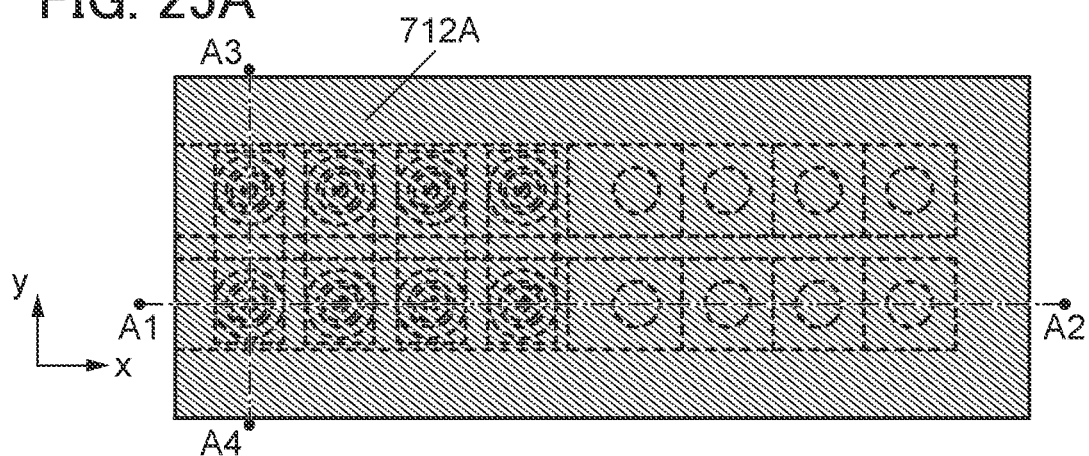
FIGS. 25A to 25C illustrate a manufacturing process of a semiconductor device of one embodiment of the present invention.
Figure 25B:
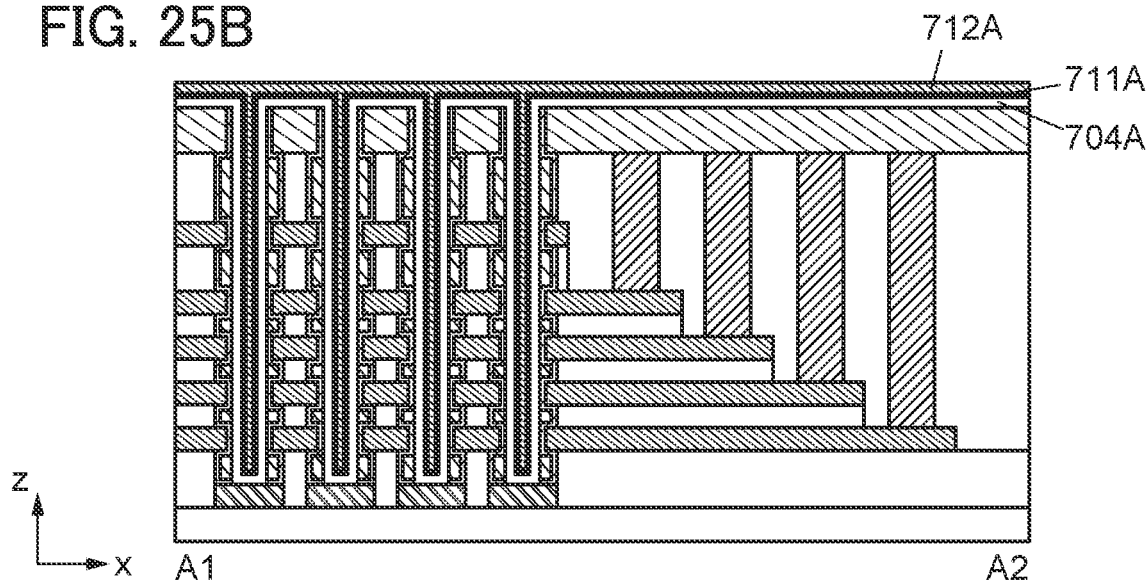
Figure 25C:
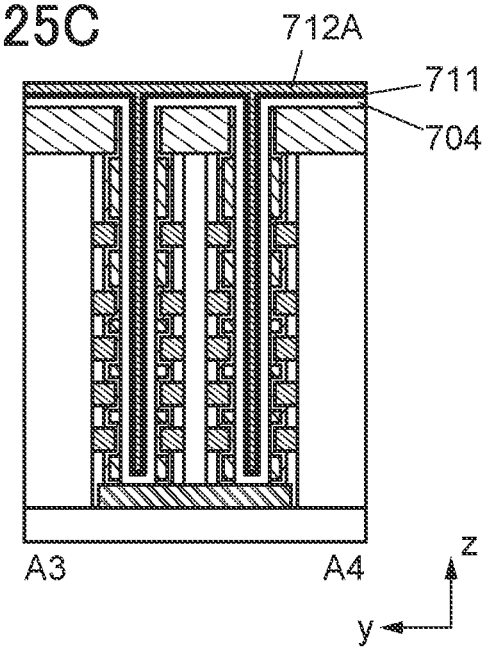

Next, the film 716A is processed to form the layer 716 containing at least one of a metal element, hydrogen, and nitrogen (see FIGS. 23A to 23C). The processing of the film 716A can be performed by isotropic etching or anisotropic etching. In the case where the film 716A fills the recession and does not completely fill the opening as illustrated in FIGS. 23A to 23C, the film 716A is preferably processed by isotropic etching. In contrast, in the case where the film 716A is formed to fill the recession and the opening, it is preferable to use anisotropic etching. By such processing, the layer 716 can be formed in the recession.

Then, the insulating film 703A formed on the bottom portion of the second opening is removed, so that the insulator 703 is obtained. Anisotropic etching is preferably used to remove the insulating film 703A. Here, the insulating film 703A over the insulator 724 and the conductor 707 is also removed; thus, the insulator 703 is provided only on the side wall of the second opening (see FIGS. 24A to 24D). The conductor 706 is exposed again by removing the insulating film 703A on the bottom portion of the second opening.

Here, as illustrated in FIG. 24D, the insulators 703b and 703c of the insulator 703 that are positioned in the upper portion of the second opening may be removed. FIG. 24D is an enlarged view of a portion surrounded by dashed-dotted line in FIG. 24B. First, the material 727 (also referred to as a sacrifice layer) which can be easily removed in a later step is formed to be embedded in the second opening, and the material 727 is removed by etching or the like to a desired depth in the second opening. The insulators 703c and 703b exposed by the etching are removed in this order, whereby only the insulator 703a can be used as the insulator 703 positioned in the horizontal direction (x-y direction) of the conductor 702. In this case, the gate insulating film of each of the selection transistors SST and SDT include the insulator 703a. After the insulators 703c and 703b are removed, the material 727 is removed.

Next, an oxide film 704A to be the oxide 704 is formed in the second opening. The oxide film 704A can be formed in such a manner that an oxide film to be the oxide 704a, an oxide film to be the oxide 704b, and an oxide film to be the oxide 704c are formed in this order over the insulator 724, the conductor 707, and the insulator 703 and in the second opening. Part of the oxide 704 is formed in contact with the layer 716. Part of the oxide 704 is formed in contact with the conductor 706.

The oxide film to be the oxide 704a, the oxide film to be the oxide 704b, and the oxide film to be the oxide 704c can be formed by a CVD method or an ALD method. It is particularly preferable to employ an ALD method, in which case a film with a uniform thickness can be formed in a groove or an opening having a large aspect ratio. Alternatively, the oxide films may be formed by a combination of an ALD method and a CVD method. Alternatively, the oxide films may be formed using different deposition methods or different deposition apparatuses.

Then, an insulating film 711A is formed on the inner side of the oxide film 704A, and a conductive film 712A is formed on the inner side of the insulating film 711A. The insulating film 711A and the conductive film 712A can be formed by a CVD method or an ALD method. It is particularly preferable to employ an ALD method, in which case a film with a uniform thickness can be formed in a groove or an opening having a large aspect ratio. Alternatively, the insulating film 711A and the conductive film 712A may be formed by a combination of an ALD method and a CVD method (see FIGS. 25A to 25C).

The insulator 711 can be formed using a material for supplying oxygen to the oxide 704 or a material for supplying hydrogen to the oxide 704 in accordance with the characteristics needed for the memory transistors MT and the semiconductor devices including the memory transistors MT.

Next, heat treatment is performed. The heat treatment is preferably performed in a nitrogen atmosphere at 200° C. to 500° C. inclusive, preferably 300° C. to 400° C. inclusive. The atmosphere in which heat treatment is performed is not limited to the above atmosphere as long as at least one of nitrogen, oxygen, and argon is contained. The heat treatment may be performed in a reduced-pressure atmosphere or in an atmospheric pressure atmosphere.

When the heat treatment is performed in the state where the oxide film 704A is in contact with the layer 716, the resistance of the oxide film 704A is reduced (see FIGS. 26A to 26D). The mechanism to reduce the resistance of the oxide film 704A is similar to that of the oxide 704. FIG. 26D is an enlarged view of a region surrounded by dashed-dotted line in FIG. 26B. As illustrated in FIG. 26D, the region 734 of the oxide film 704A is a low-resistance region. In contrast, in the oxide film 704A, the resistance of the region 731, which is not in contact with the layer 716, is kept high. Furthermore, the above-described junction region may be provided between the region 734 and the region 731.

In addition, also when the heat treatment is performed in the state where the oxide film 704A and the conductor 706 are in contact with each other, the resistance of the oxide film 704A is reduced. When the oxide film 704A is in contact with the conductor 706, a metal compound layer including a metal element contained in the conductor 706 and the component of the oxide film 704A are formed at the interface between the conductor 706 and the oxide film 704A in some cases. The metal compound layer is preferably formed, in which case the contact resistance between the conductor 706 and the oxide film 704A can be reduced. Oxygen contained in a region 728 of the oxide film 704A is absorbed by the conductor 706 in some cases. At this time, the resistance of the oxide film 704A in the vicinity of the interface between the conductor 706 and the oxide film 704A is reduced, so that the contact resistance between the conductor 706 and the oxide film 704A can be reduced. When the heat treatment is performed in the state where the oxide film 704A and the conductor 706 are in contact with each other, the oxide film 704A has lower resistance and the contact resistance between the conductor 706 and the oxide film 704A is further reduced.

Figure 26A:
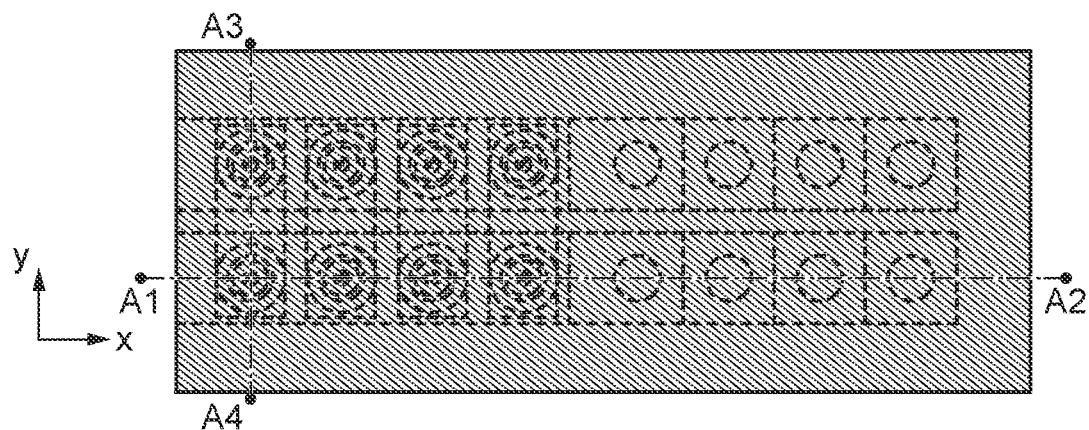
FIGS. 26A to 26D illustrate a manufacturing process of a semiconductor device of one embodiment of the present invention.
Figure 26B:
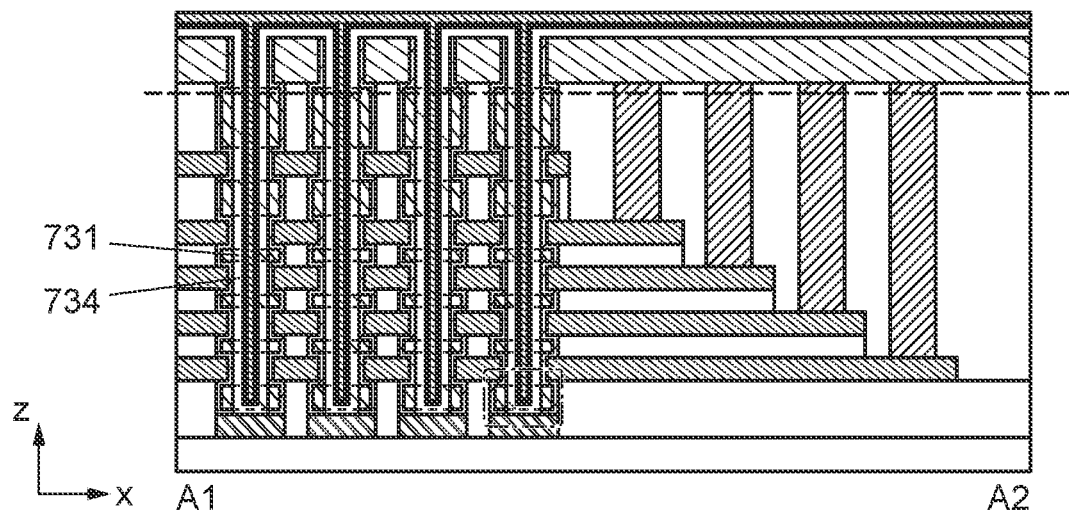
Figure 26C:
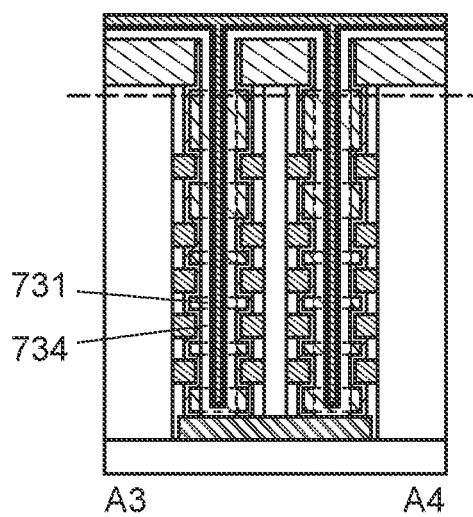
Figure 26D:
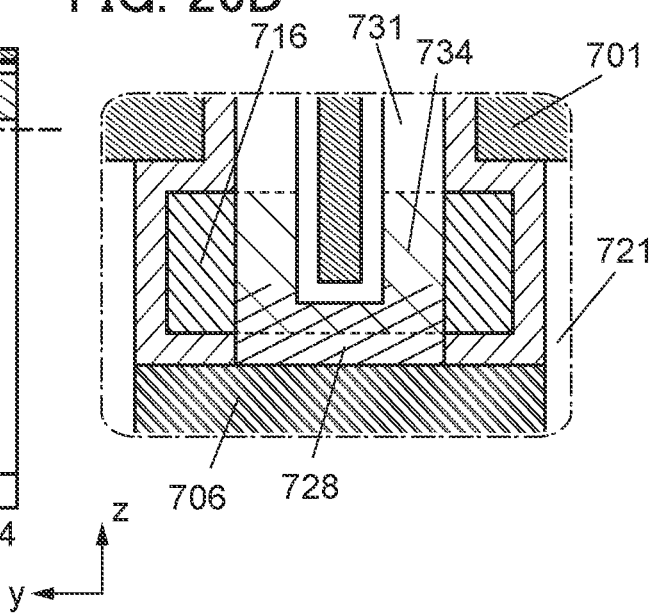
Figure 27A:
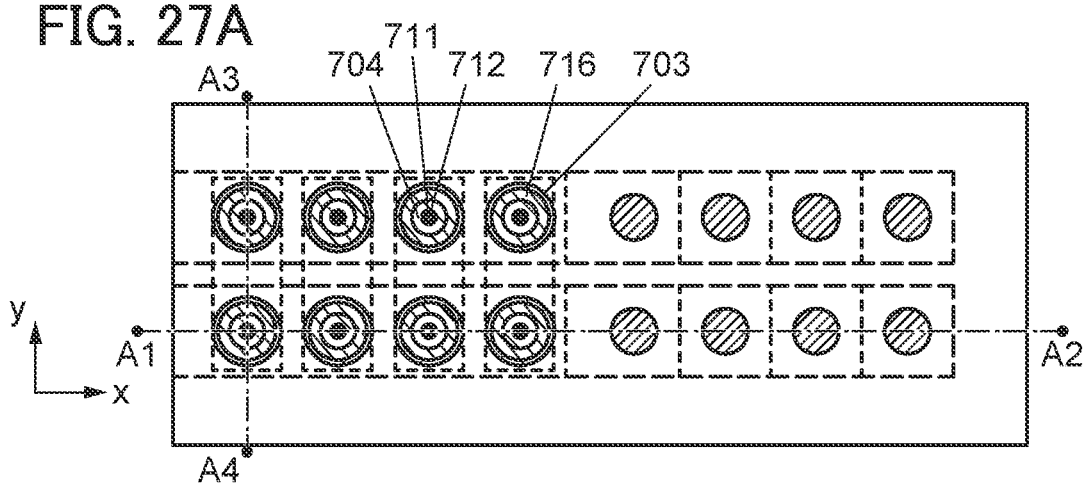
FIGS. 27A to 27C illustrate a manufacturing process of a semiconductor device of one embodiment of the present invention.
Figure 27B:
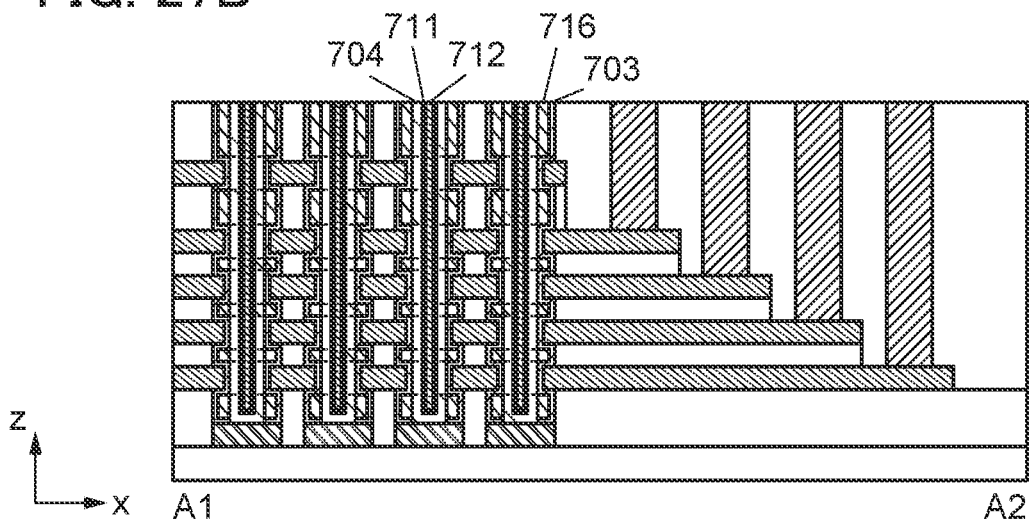
Figure 27C:
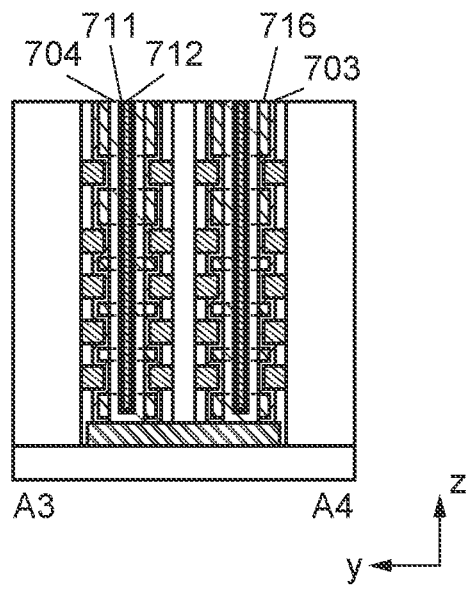

Then, unnecessary portions of the conductive film 712A, the insulating film 711A, and the oxide film 704A, which are portions above the dotted line in FIGS. 26B and 26C, are removed by a CMP method or the like to obtain the oxide 704, the insulator 711, and the conductor 712 (see FIGS. 27A to 27C). Note that the above-described heat treatment may be performed after the removal of unnecessary portions of the conductive film 712A, the insulating film 711A, and the oxide film 704A.

Figure 28A:
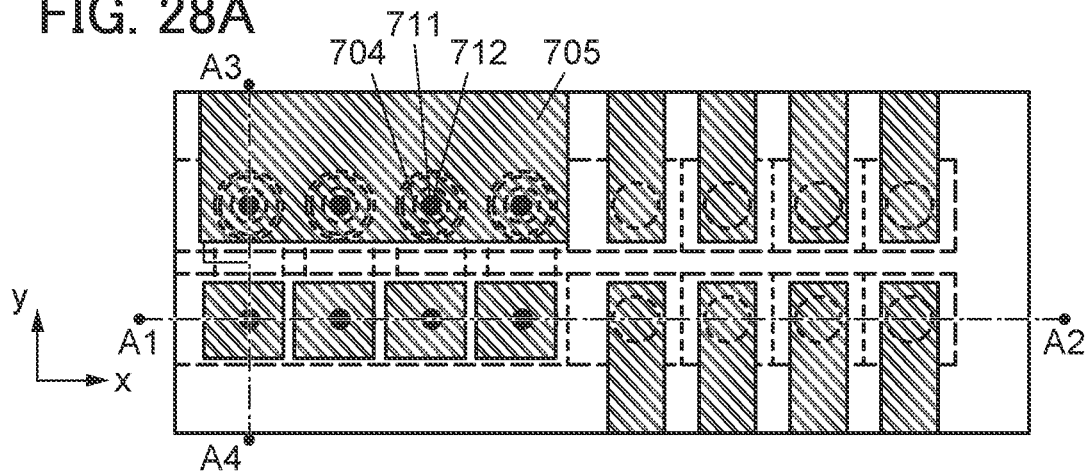
FIGS. 28A to 28C illustrate a manufacturing process of a semiconductor device of one embodiment of the present invention.
Figure 28B:
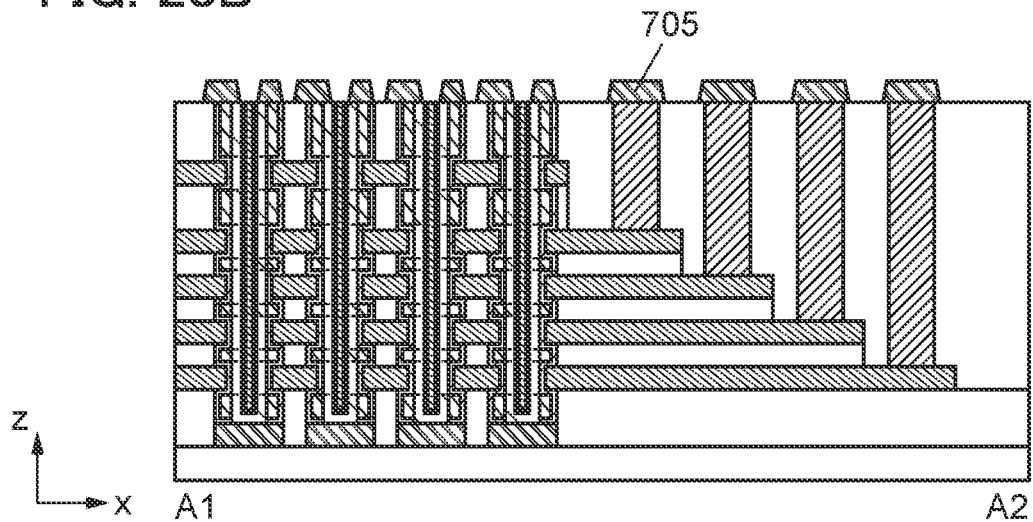
Figure 28C:
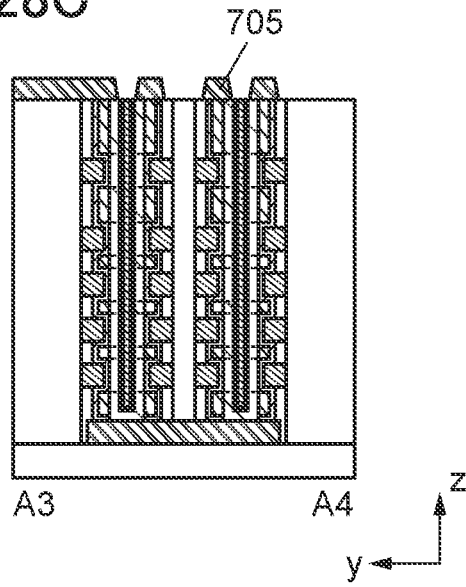

Next, as illustrated in FIGS. 28A to 28C, the conductor 705 serving as part of the bit line BL, the source line SL, and the word line WL is formed. The conductor 705 is provided to be electrically connected to the oxide 704 and the conductor 707. In the case where the conductor 712 is provided on the inner side of the oxide 704, it is preferable that at least an opening which exposes the conductor 712 be provided in the conductor 705 so that the conductor 705 and the conductor 712 are electrically separated from each other. In this case, the opening may be provided to expose the insulator 711. Part of the oxide 704 may be exposed.

Figure 29A:
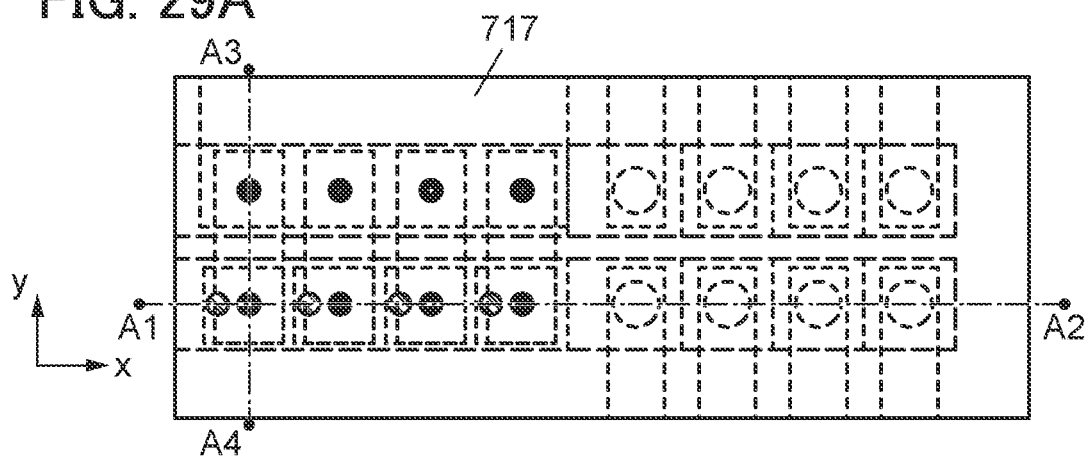
FIGS. 29A to 29C illustrate a manufacturing process of a semiconductor device of one embodiment of the present invention.
Figure 29B:
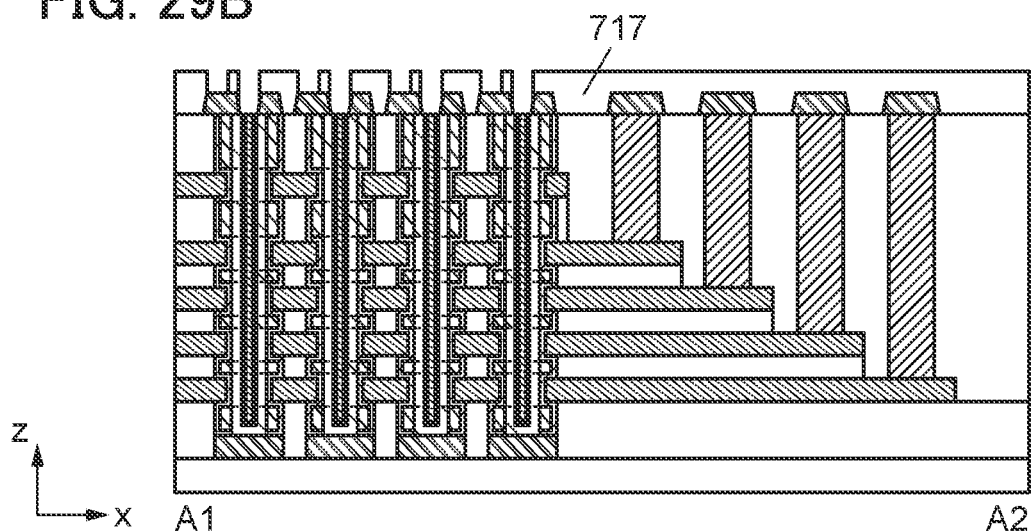
Figure 29C:
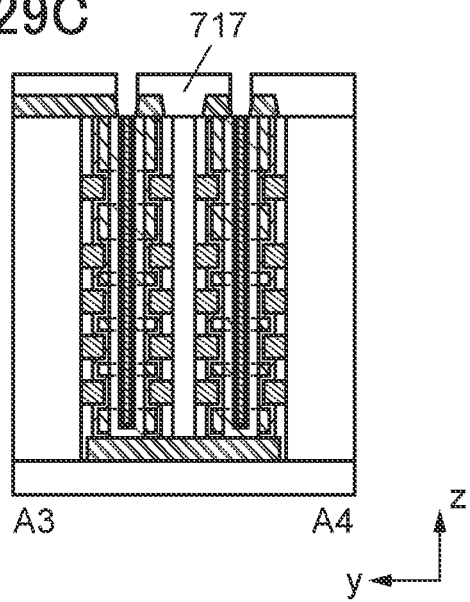

Then, as illustrated in FIGS. 29A to 29C, the insulator 717 is formed to cover the conductor 705. In the insulator 717, an opening which exposes part of the conductor 705 (the conductor 705 electrically connected to the oxide 704 on the bit line side) and the conductor 712 is provided. In the case where the opening which exposes the conductor 712 is formed, the diameter of the opening may be larger than that of the opening provided in the conductor 705. Since the conductor 705 includes an opening, the opening which exposes the conductor 712 can be formed in a self-aligned manner, and a defect such as formation of the opening whose diameter at the bottom portion has an unintentional size and a defect such as displacement of the opening from the conductor 712 can be prevented.

Figure 30A:
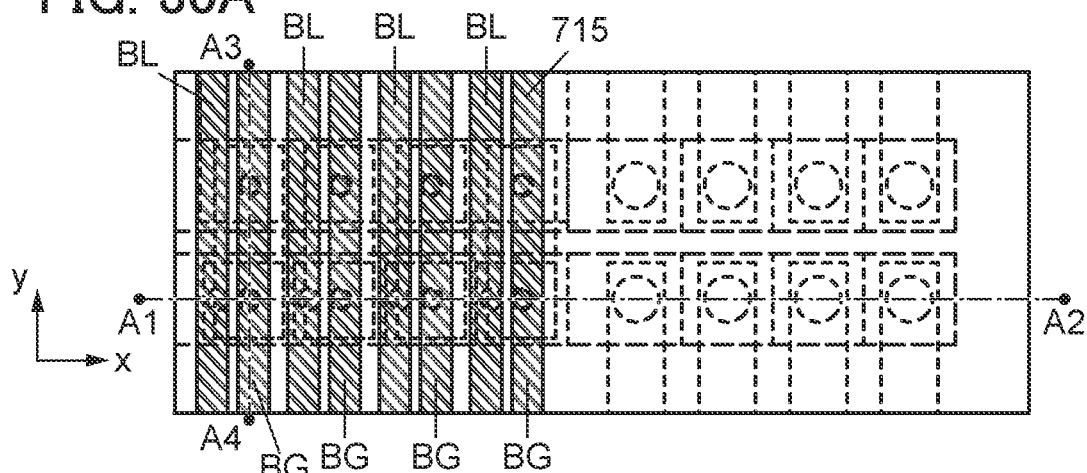
FIGS. 30A to 30C illustrate a manufacturing process of a semiconductor device of one embodiment of the present invention.
Figure 30B:
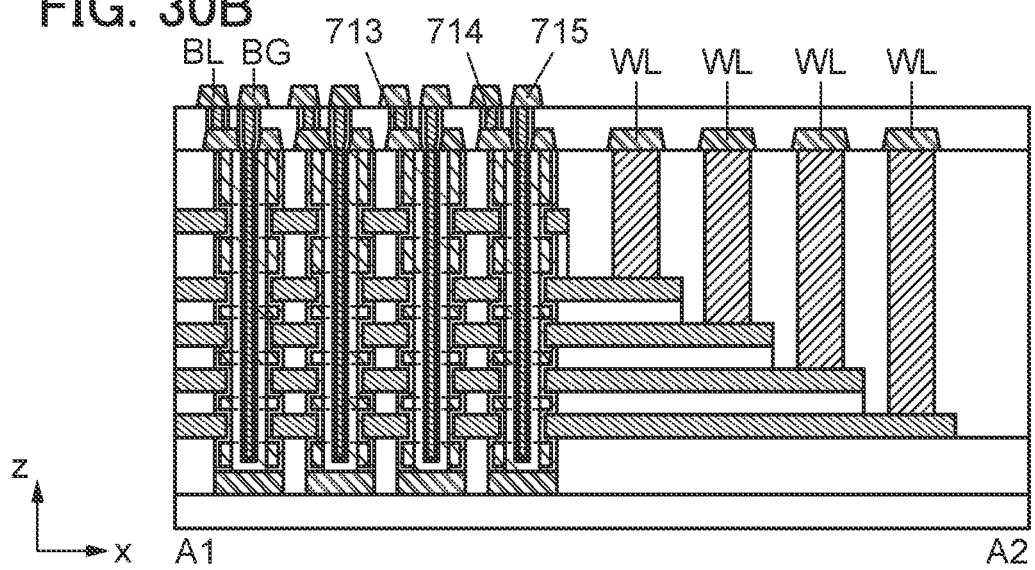
Figure 30C:
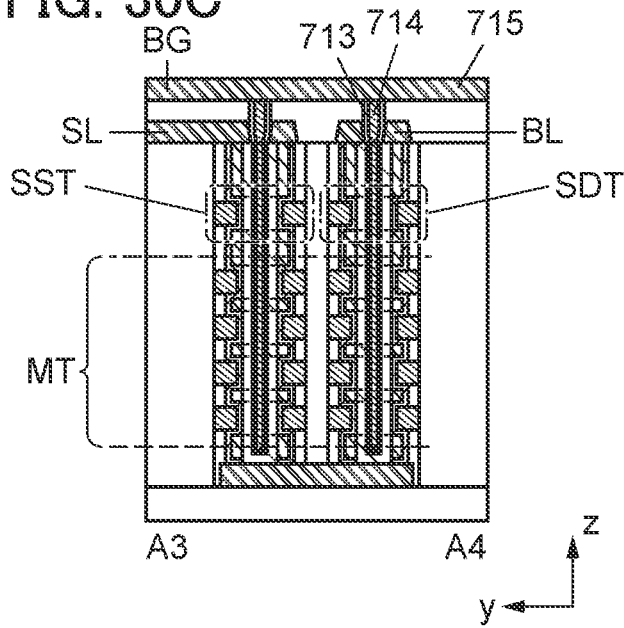

Then, as illustrated in FIGS. 30A to 30C, the insulator 713 is formed to cover the conductor 705 in the opening which is provided in the insulator 717 and exposes the conductor 712. First, an insulating film to be the insulator 713 is formed over the insulator 717 by a CVD method or an ALD method, and then anisotropic etching is performed, whereby the insulating film formed at the bottom portion of the opening is removed. At this time, the insulating film over the insulator 717 is also removed to form the insulator 713. The insulating film may be processed by a lithography method. At this time, the insulator 713 is also provided over the insulator 717 in some cases.

Next, the conductor 714 and the conductor 715 that serve as the bit line BL and the wiring BG are formed. Although the conductors 714 and 715 are illustrated as different layers in FIGS. 30A to 30C, the present invention is not limited thereto. The conductor 714 and the conductor 715 may be formed as one conductor at a time. When the conductor 714 and the conductor 715 are separately formed, a conductive film to be the conductor 714 is formed over the insulator 717 to be embedded in the opening in the insulator 717, and an unnecessary portion of conductive film is removed by a CMP method or the like, whereby the conductor 714 can be formed. After that, the conductor 715 is formed. The conductor 715 may be formed by a lithography method or a damascene method. At this time, the insulator 713 is provided on the side surface of the opening formed in the insulator 717 and the conductor 705; thus, the conductor 715 electrically connected to the conductor 712 is not electrically connected to the conductor 705. When the conductor 714 and the conductor 715 are formed at a time, a conductor serving as the conductor 714 and the conductor 715 can be formed by forming a conductive film over the insulator 717 to be embedded in the opening formed in the insulator 717 and processing the film by a lithography method.

Through the above steps, the memory cell array can be manufactured. In the description of this manufacturing process, the memory cell array includes four layers of the memory transistors MT and four memory strings; however, the present invention is not limited thereto. The memory cell may include five or more layers of the memory transistors MT or five or more memory strings. For example, a memory cell array including 32 layers, 64 layers, or 128 layers of the memory transistors MT can be manufactured. Moreover, a memory cell array including 200 or more layers of the memory transistors MT can be manufactured.

The memory cell array is manufactured in the above manner, whereby the memory transistors MT in a plurality of layers can be formed at a time without patterning for forming the memory transistors MT for each layer. Furthermore, in the case where a memory cell array is formed by the above method, even when the number of layers of the memory transistors MT is increased, the number of steps of patterning and etching is not increased. In this manner, the number of manufacturing steps of the memory cell array can be reduced; thus, a semiconductor device with high productivity can be provided.

(Configuration Example of 3D NAND)

Figure 31A:
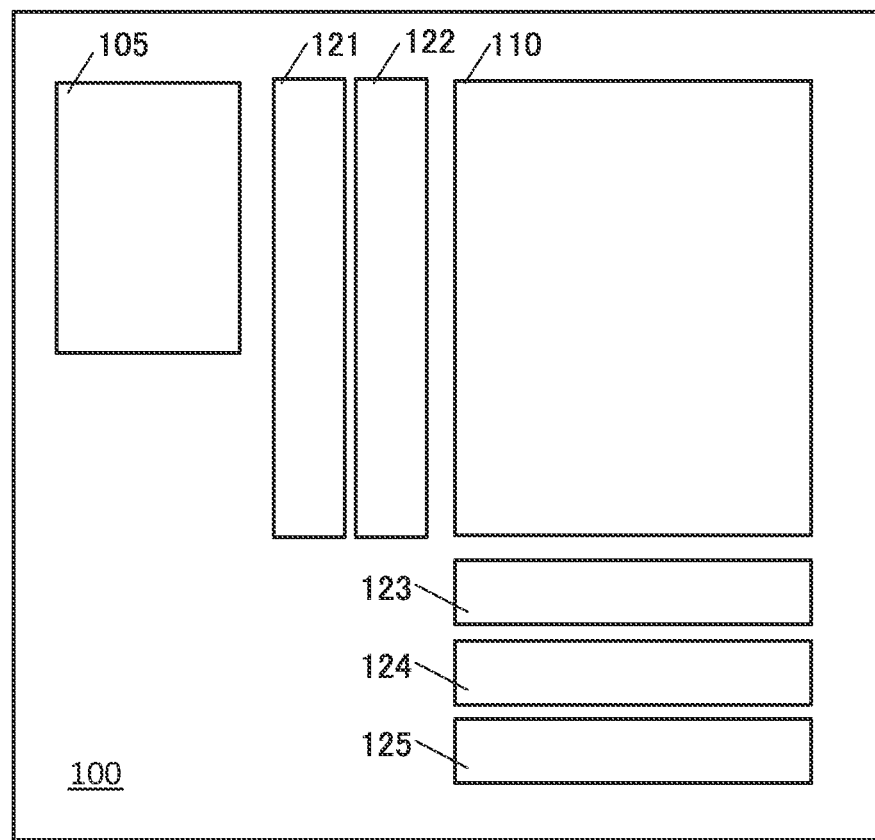
FIG. 31A is a functional block diagram illustrating a configuration example of a memory device of one embodiment of the present invention and FIG. 31B is a circuit diagram illustrating a configuration example of a memory string.

FIG. 31A illustrates a configuration example of a three-dimensional NAND-type nonvolatile memory device (3D NAND). A memory device 100 illustrated in FIG. 31A includes a control circuit 105, a memory cell array 110, and peripheral circuits.

The control circuit 105 controls the memory device 100 collectively and performs data writing and data reading. The control circuit 105 processes a command signal from the outside and generates a control signal for the peripheral circuits. As the peripheral circuits, a row decoder 121, a row driver 122, a sense amplifier 123, a source line driver 124, and an input/output circuit 125 are provided.

Figure 31B:
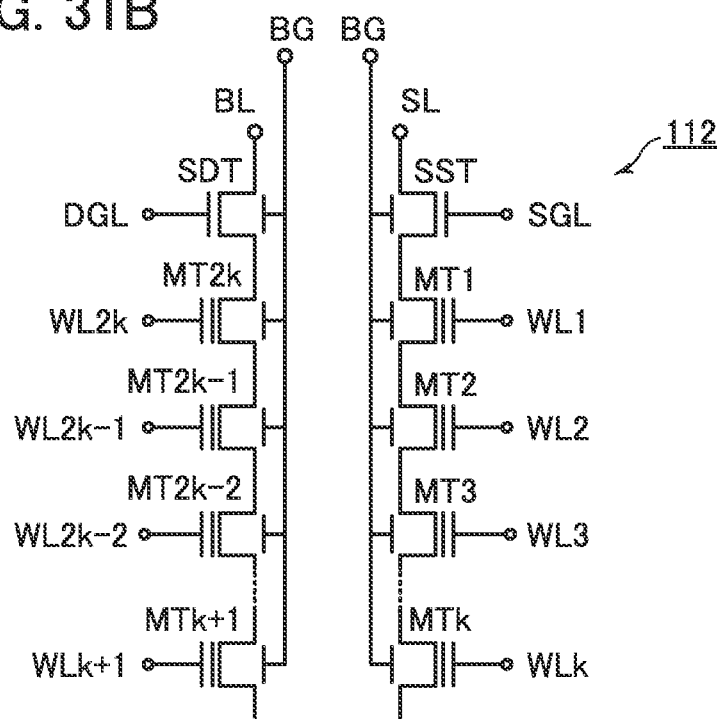

The memory cell array 110 includes a plurality of memory strings 112. FIG. 31B illustrates a circuit configuration example of the memory string 112. In the memory string 112, a selection transistor SST, memory transistors MT1 to MT2$k$ ($k$ is an integer of 1 or more), and a selection transistor SDT are electrically connected in series between the bit line BL and the source line SL.

Note that in the case where the memory transistors MT1 to MT2$k$ are not distinguished from each other, these memory transistors are referred to as memory transistors MT. The same applies to other elements.

The selection transistors SST and SDT and the memory transistors MT1 to MT2$k$ are each a transistor in which the channel is formed using a metal oxide as described above. The memory transistor MT includes a charge accumulation layer and is included in the nonvolatile memory cell.

A gate of the selection transistor SST and a gate of the selection transistor SDT are electrically connected to a wiring SGL and a wiring DGL which serve as selection gate lines, respectively. Gates of the memory transistors MT1 to MT2$k$ are electrically connected to word lines WL1 to WL2$k$, respectively. The bit line BL extends in the column direction, and the wirings SGL and DGL and the word line WL extend in the row direction.

The selection transistors SST and SDT and the memory transistor MT may each have a second gate as illustrated in FIG. 31B. The second gate is electrically connected to the wiring BG. FIG. 31B illustrates a wiring BG which is electrically connected to the second gates of the selection transistor SST and the memory transistors MT1 to MTk and a wiring BG which is electrically connected to the second gates of the selection transistor SDT and the memory transistors MTk+1 to MT2$k$. Different potentials or the same potential may be applied to the wirings BG. Furthermore, the wirings BG may be electrically connected to each other.

The wiring BG preferably extends in the column direction in parallel to the bit line BL but may extend in the row direction.

With the wiring BG, the threshold values of the selection transistors SST and SDT can be controlled. Furthermore, the potential of the wiring BG may be controlled in accordance with the circuit operation of the memory cell array.

The input/output circuit 125 performs temporarily holding data written to the memory cell array 110, temporarily holding data read out from the memory cell array 110, and the like.

The source line driver 124 drives the source line SL.

The bit line BL is electrically connected to the sense amplifier 123. The sense amplifier 123 detects voltage that is read out from the memory string 112 to the bit line BL at the time of data reading and amplifies it. In addition, the sense amplifier 123 inputs voltage corresponding to the writing data to the bit line BL at the time of data writing.

The row decoder 121 decodes address data input from the outside and selects a row to be accessed. The row driver 122 inputs voltage needed for writing, reading, and erasing data to the wirings DGL and SGL and the word lines WL in accordance with the decoded results by the row decoder 121.

Figure 32:
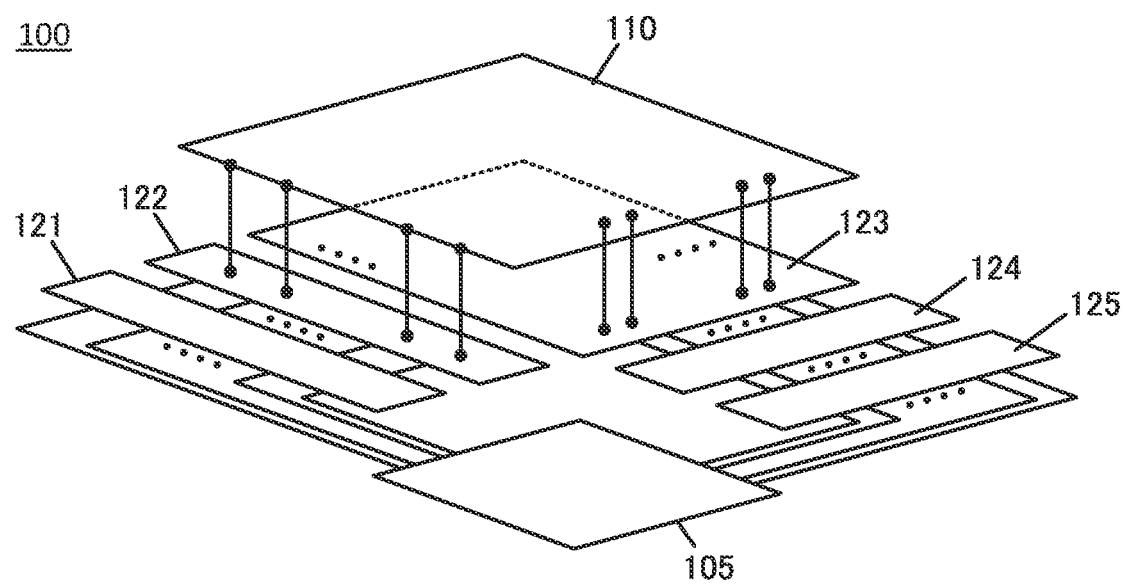
FIG. 32 is a functional block diagram illustrating a configuration example of a memory device of one embodiment of the present invention.

The memory cell array 110 may be provided in a layer different from the peripheral circuits such as the control circuit 105 and the sense amplifier 123. In particular, the memory cell array 110 is preferably stacked and overlapped with the sense amplifier 123, in which case the wiring led from the memory cell array 110 to the sense amplifier 123 can be more compact. FIG. 32 shows a block diagram of the memory device 100, shown in FIG. 31A, with a three-dimensional structure in which the memory cell array 110 is provided over the control circuit 105, the row decoder 121, the row driver 122, the sense amplifier 123, the source line driver 124, and the input/output circuit 125 to overlap with the sense amplifier 123.

Figure 33:
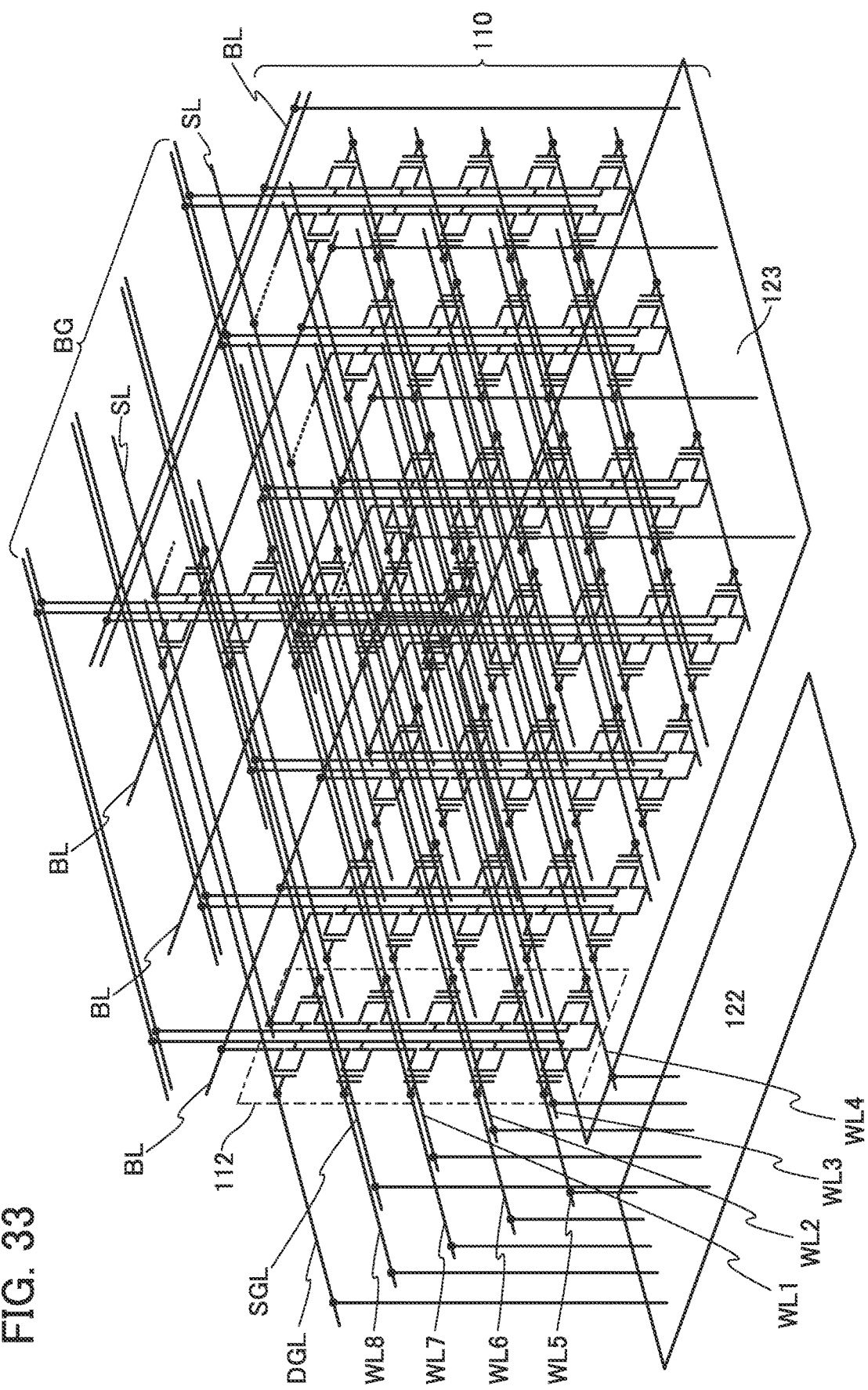
FIG. 33 illustrates an example of a three-dimensional structure of a memory cell array of one embodiment of the present invention.
Figure 34:
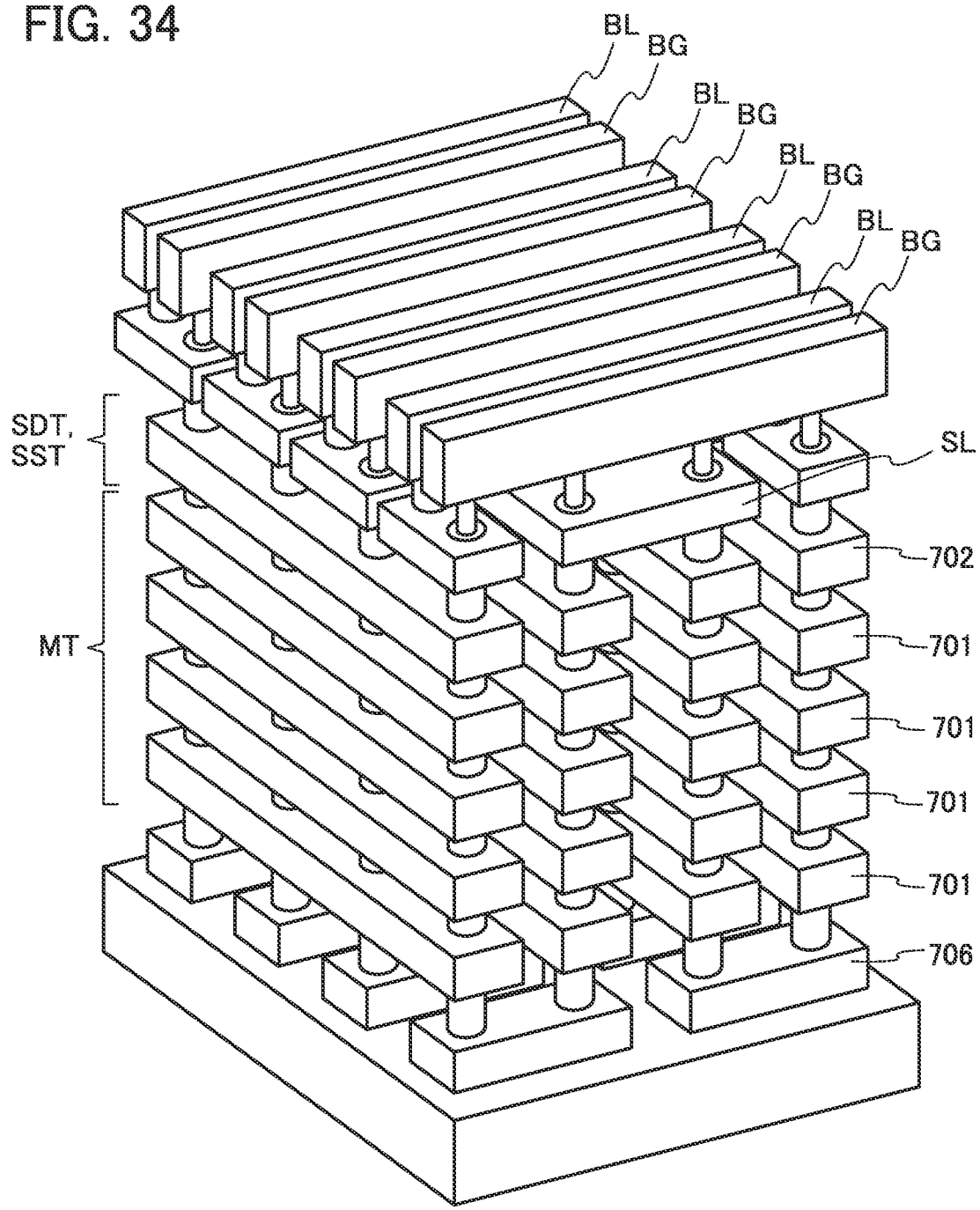
FIG. 34 illustrates an example of a three-dimensional structure of a memory cell array of one embodiment of the present invention.
Figure 35:
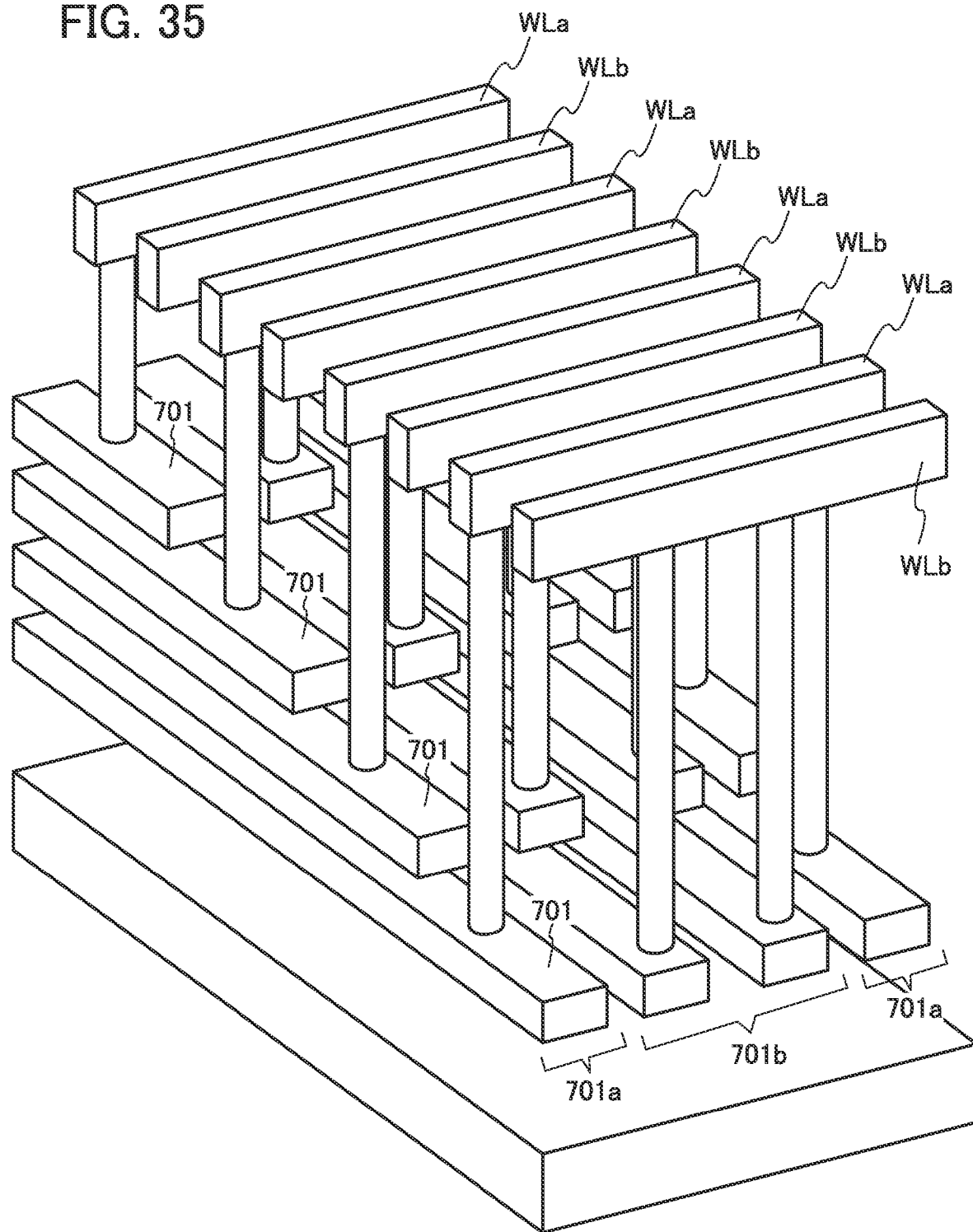
FIG. 35 illustrates an example of a three-dimensional structure of a memory cell array of one embodiment of the present invention.

A three-dimensional stacked-layer structure example of the memory cell array 110 is illustrated in FIG. 33 to FIG. 35. FIG. 33 is a circuit diagram schematically illustrating the three-dimensional structure example of the memory cell array 110. Some circuits (memory strings) are not illustrated for easy understanding. FIG. 34 is a perspective view illustrating the three-dimensional structure example of the memory cell array 110. FIG. 35 is a perspective view illustrating the three-dimensional structure example of the connection portion of the word line WL and the conductor 701. As illustrated in FIG. 33, the memory cell array 110 is stacked over a region where the sense amplifier 123 is formed. Accordingly, the layout area of the memory device 100 can be reduced. As illustrated in FIG. 34 and FIG. 35, even in the conductor 701 in the same stage, the conductor 701a on the bit line BL side is connected to the word line WLa, and the conductor 701b on the source line SL side is connected to the word line WLb. The wiring BG electrically connected to the conductor 712 is provided in the same layer as the bit line BL and extends in the column direction like the bit line BL in this example; however, the present invention is not limited thereto. An insulator may be provided over the bit line BL, and the wiring BG may be provided over the insulator. The wiring BG does not necessarily extend in the column direction and may extend in the row direction. Note that FIG. 33 to FIG. 35 illustrate an example in which eight memory transistors MT1 to MT8 are provided in one memory string 112.

(Description of Circuit Operation of Memory Device)

Next, operation of writing and reading data to/from the memory string 112 is described with reference to FIGS. 36A to 36C. Hereinafter, the memory transistors MT sharing each of the word lines WL1 to WL2k are collectively called a page.

Figure 36A:
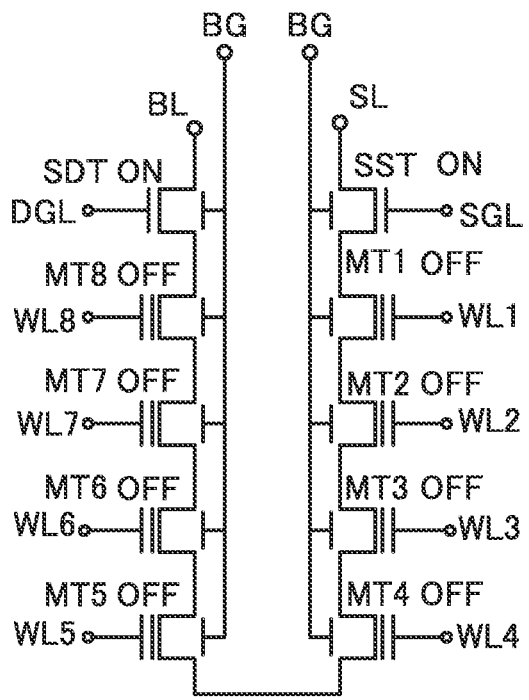
FIGS. 36A to 36C are circuit diagrams illustrating an operation of a memory device of one embodiment of the present invention.
Figure 36B:
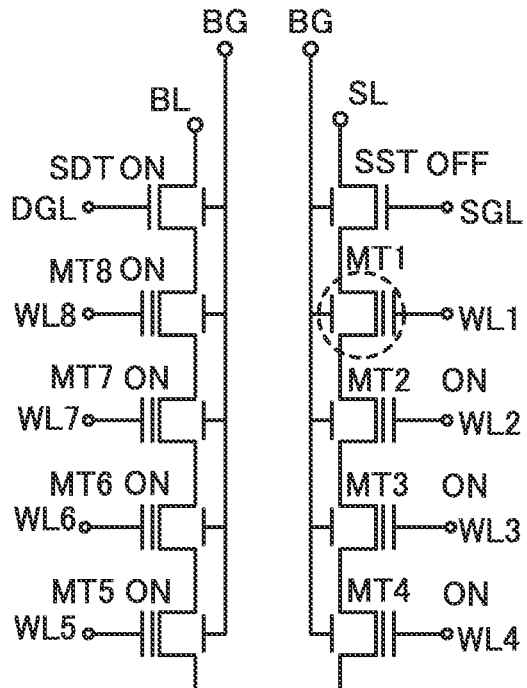
Figure 36C:
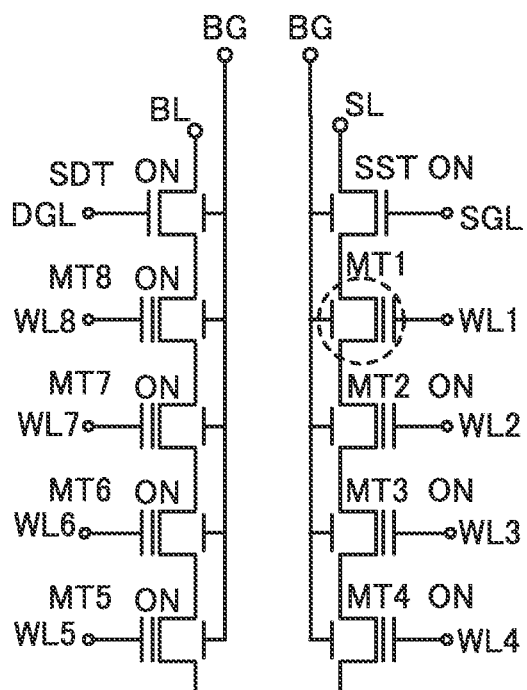

Although the memory string 112 includes the memory transistors MT1 to MT8 as an example in FIGS. 36A to 36C, the number of memory transistors MT is not limited to this example.

<Erasing Operation>

In the case where data is written to the memory transistor MT, data is preferably erased before the writing operation. The operation of erasing data is also referred to as a reset operation in some cases. An erasing operation is performed on every memory string 112 (also referred to as block). For example, an erasing operation can be performed in the following manner: a block storing data to be erased is selected, a low potential (a potential at which the memory transistors MT1 to MT8 are turned off, such as 0 V) is applied to the word lines WL1 to WL8, an erasing potential VE is applied to the source line SL and the bit line BL, and the selection transistors SDT and SST are turned on, as shown in FIG. 36A. Through the reset operation, electrons stored in the charge accumulation layer of each of the memory transistors MT1 to MT8 can be extracted. Accordingly, the memory transistors MT1 to MT8 hold data "1".

Alternatively, the erasing operation can be performed by application of an erasing potential to the wiring BG. The erasing operation can be performed in the following manner: an erasing potential (e.g., 15 V) is applied to the wiring BG, a low potential (a potential at which the transistors MT1 to MT8 are turned off, such as 0 V) is applied to the wirings WL1 to WL8, and the selection transistors SDT and SST are turned on.

Alternatively, data of the memory transistor MT can be erased in the following manner: the selection transistors SDT and SST are turned off to set an oxide including a channel formation region of the memory transistor MT in a floating state, and a positive charge (e.g., 15 V) is applied to the wiring BG as the erasing potential. At this time, the selection transistors SDT and SST are off, and thus the bit line BL and the source line SL are set at any potential. For example, to the wirings WL1 to WL8, a low potential (a potential at which the memory transistors MT1 to MT8 are turned off, such as 0 V) is applied. As a result, an oxide including a channel formation region is in a floating state; thus, the potential of the oxide increases with the increasing potential of the wiring BG, and electrons stored in the charge accumulation layer can be extracted to the oxide side.

In another erasing operation, to the wirings WL1 to WL8, a low potential (a potential at which the memory transistors MT1 to MT8 are turned off, such as 0 V) is applied, for example. Then, the selection transistors SDT and SST are turned on to increase the potentials of the bit line BL and the source line SL. At this time, the potentials of the bit line BL and the source line SL are set lower than that of the wirings BG. For example, the potentials of the bit line BL and the source line SL are set to 10 V and the potential of the wiring BG is set to 12 V. At this time, the memory transistor MT is turned on by the potential of the wiring BG, and an oxide included in the memory transistor MT holds a potential of 10 V. As a result, electrons stored in the charge accumulation layer can be extracted to the oxide side.

The erasing operation is not limited to the above-described method. The erasing operation may be performed by sequentially selecting the memory transistors MT storing data to be erased, for example. In that case, the erasing operation does not need to be performed on all the memory transistors MT and only the memory transistors MT storing data to be erased may be selected and the data may be erased. For example, the erasing operation may be performed on only the memory transistor MT to which data "0" has been written.

Note that data in the memory transistor MT which is not subjected to data rewriting is preferably stored in a different memory region in advance of the erasing operation of the block.

<Writing Operation>

Next, a data writing operation is described with reference to FIG. 36B.

A data writing operation can be performed for each of the above pages. First, a writing potential (e.g., 15 V) is applied to a word line of a page subjected to writing, and then a positive potential (a potential at which a transistor is turned on, such as 3 V) is applied to a word line of a page which is not subjected to writing. As shown in FIG. 36B, a writing potential is applied to the word line WL1 first, and then positive potentials are applied to the word lines WL2 to WL8. Then, the selection transistor SST is turned off and a positive potential is applied to the selection transistor SDT to turn on the selection transistor SDT. Thus, data corresponding to the potential of the bit line BL is written to the memory transistor MT1. Specifically, when a potential of the bit line BL is a low potential (e.g., 0 V), electrons are injected into the charge accumulation layer of the memory transistor MT1 because a potential difference between the word line WL1 and the bit line BL is increased. In the case where the potentials of the selection transistors SDT and the bit line BL are both positive potentials, the selection transistor SDT is turned off. At this time, the memory transistor MT is brought into an electrically floating state, so that electrons are not injected into the charge accumulation layer of the memory transistor MT1. That is, when the low potential is applied to the bit line BL, data "0" is written to the memory transistor MT1, and when the positive potential is applied to the memory transistor MT1, the data of the memory transistor MT1 remains "1".

Data writing can be performed page by page in such a manner that each of the bit lines BL is applied with a potential required in the corresponding memory string 112.

Multilevel data can be written to the memory transistor MT. For example, the amount of charges injected into the charge accumulation layer of the memory transistor MT can be controlled on the basis of a potential of the bit line BL or the like or a potential applying period.

<Reading Operation>

Then, a data reading operation is described with reference to FIG. 36C.

A data reading operation can also be performed for each of the pages. First, a low potential (e.g., 0 V) is applied to a word line of a page subjected to reading, and then a positive potential (a potential at which a transistor is turned on, such as 3 V) is applied to a word line of a page which is not subjected to reading. As shown in FIG. 36C, a low potential is applied to the word line WL1 first, and then positive potentials are applied to the wirings WL2 to WL8. Then, the selection transistors SDT and SST are turned on. A reading potential (e.g., 1 V) is applied to the bit line BL, and a low potential (e.g., 0 V) is applied to the source line SL. At this time, when the memory transistor MT has data "1", current flows to the memory string 112, so that the potential of the bit line BL decreases. When data stored in the memory transistor MT1 is "0", current does not flow to the memory string 112 and the potential of the bit line BL does not change. The sense amplifier 123 detects the potential of the bit line BL and amplifies it. Through the above steps, data in the memory string 112 can be read out.

At this time, a positive potential is applied to the wiring BG, whereby the threshold voltage (Vth) of the memory transistor MT may be shifted in the negative direction. The potential applied to the wiring BG is adjusted so that the memory transistor MT to which writing is not subjected becomes normally on. Thus, reading of wrong data can be prevented. In addition, a potential applied to the word line WL can be reduced, and power consumption of the memory device can be reduced.

Data in each of the memory strings 112 is output to the bit line BL; thus, data per page can be read.

The structure described in this embodiment can be used in appropriate combination with the structure described in any of the other embodiments.

Embodiment 2

In this embodiment, a structure and a manufacturing method of a semiconductor device of one embodiment of the present invention, which are different from those of Embodiment 1, will be described with reference to FIG. 37 to FIGS. 67A to 67C. Note that description of the same components as those in Embodiment 1 is omitted in some cases. In the semiconductor device illustrated in FIG. 37 to FIGS. 67A to 67C, components having the same functions as the components in the semiconductor device described in Embodiment 1 are denoted by the same reference numerals, and the detailed description thereof and the description of the formation method thereof are omitted in some cases. Furthermore, in the semiconductor device in this embodiment, the metal oxide described in Embodiment 1 can be used.

(Memory Transistor MT, Memory Cell Array 700)

Figure 37:
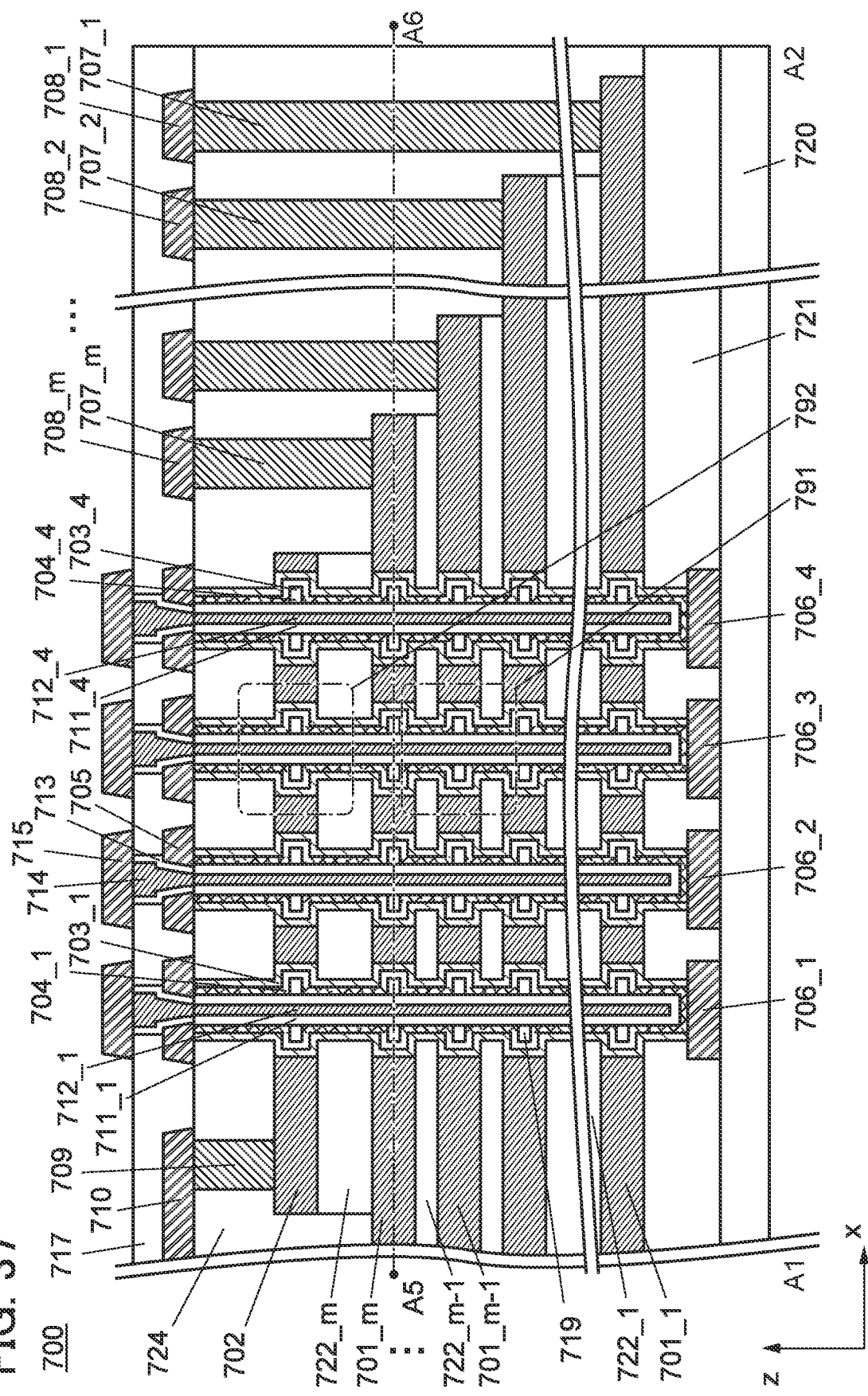
FIG. 37 is a cross-sectional view illustrating a semiconductor device of one embodiment of the present invention.
Figure 38A:
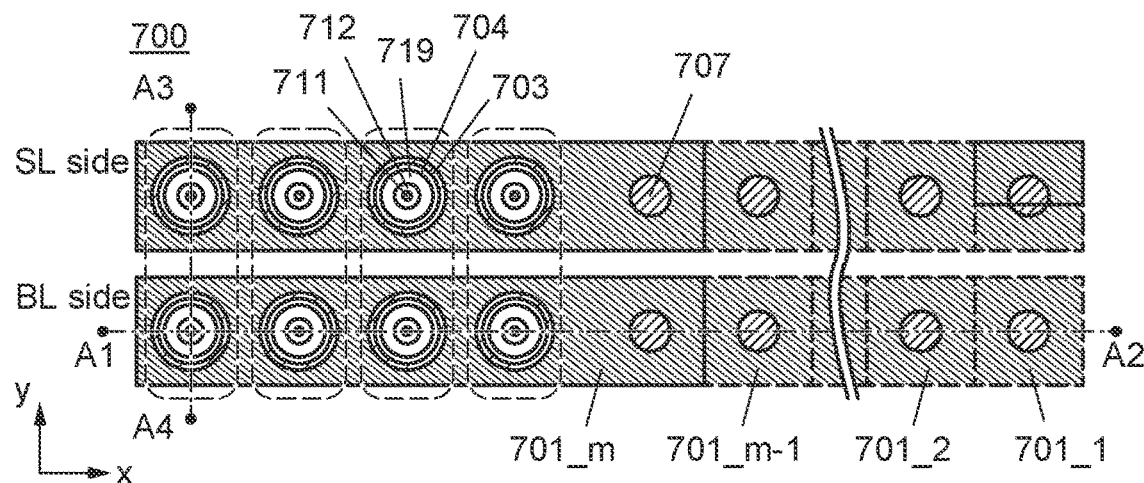
FIGS. 38A and 38B are a top view and a cross-sectional view illustrating a semiconductor device of one embodiment of the present invention.
Figure 38B:
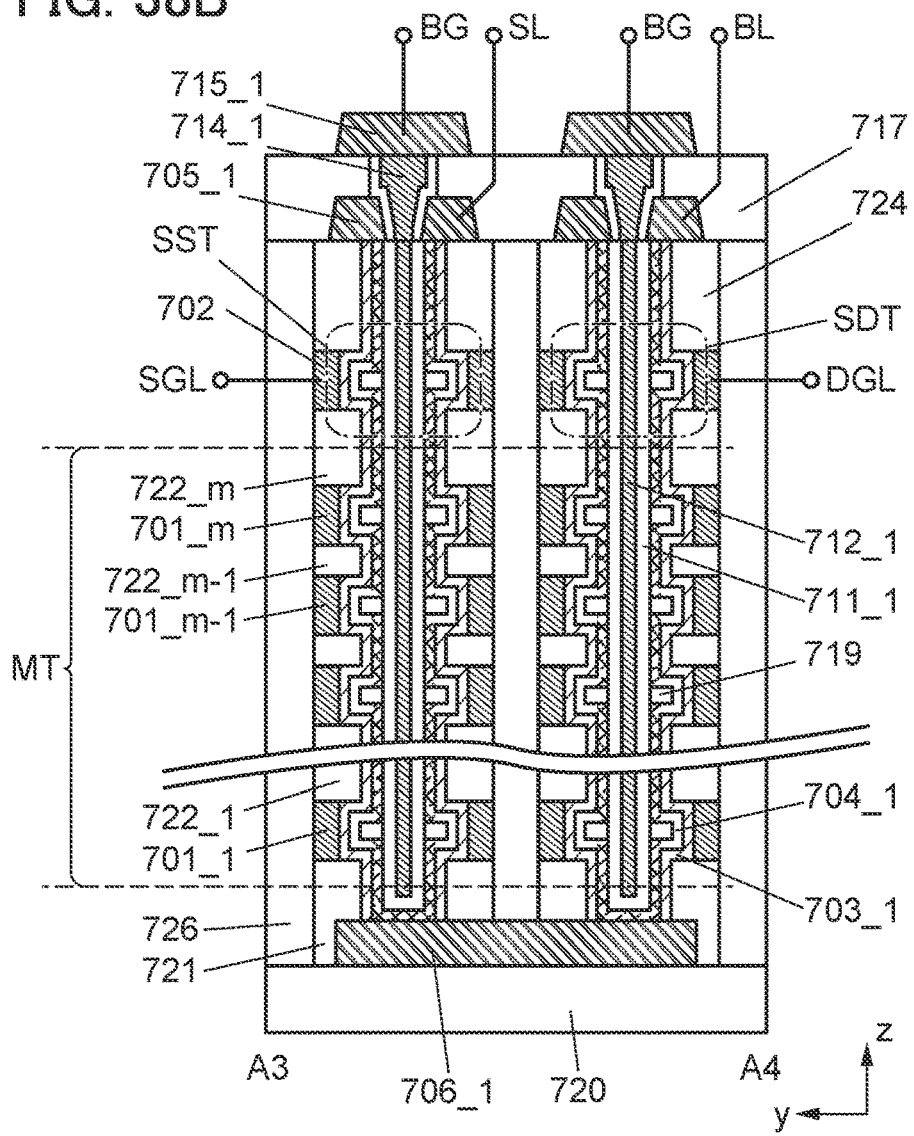
Figure 39A:
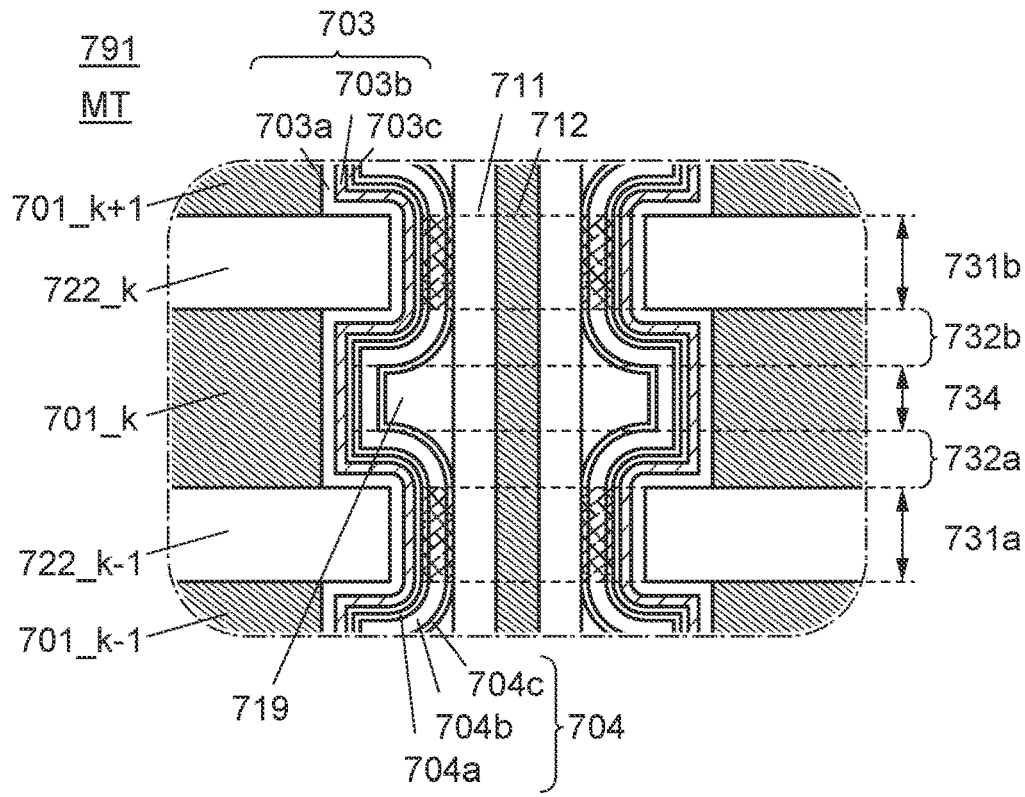
FIGS. 39A and 39B are cross-sectional views illustrating a semiconductor device of one embodiment of the present invention.
Figure 39B:
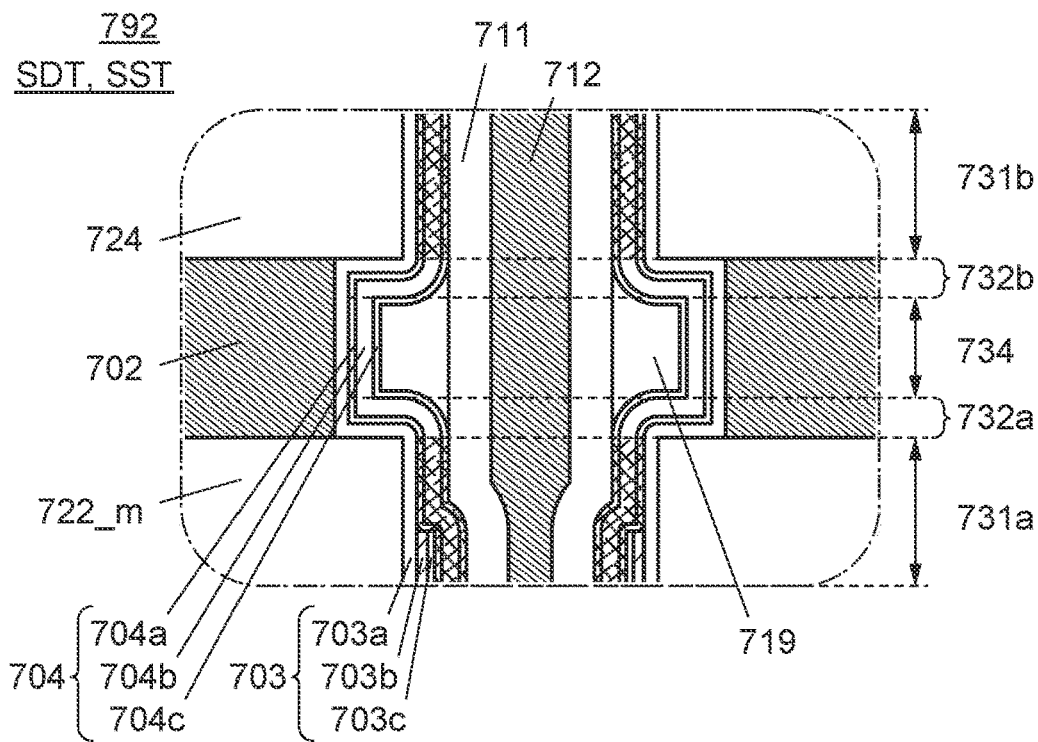

First, structures of a memory transistor MT and a memory cell array 700 of the semiconductor device are described with reference to FIG. 37 to FIGS. 39A and 39B. FIG. 37 is a cross-sectional view of a memory cell array 700. FIG. 38A is a top view of the memory cell array 700. Note that FIG. 38A is a top view taken along dashed-dotted line A5-A6 in FIG. 37 and some components are not illustrated. FIG. 37 is a cross-sectional view taken along dashed-dotted line A1-A2 in FIG. 38A. FIG. 38B is a cross-sectional view taken along dashed-dotted line A3-A4 in FIG. 38A, which illustrates an example of a memory string. FIG. 39A is an enlarged cross-sectional view of a portion surrounded by dashed-dotted line 791 in FIG. 37, which illustrates an example of a memory transistor MT functioning as a memory cell. FIG. 39B is an enlarged cross-sectional view of a portion surrounded by dashed-dotted line 792 in FIG. 37, which illustrates an example of a transistor functioning as a selection transistor. Note that in the following description, rectangular coordinates using an x-axis, a y-axis, and a z-axis are set as illustrated in FIG. 37 and FIGS. 38A and 38B for the sake of convenience. Here, the x-axis and the y-axis are parallel to the top surface of a base 720 provided with the memory cell array 700 and the z-axis is perpendicular to the top surface of the base 720.

The memory cell array 700 includes: an insulator 721 over the base 720; a stack in which a conductor 701 (conductors 701_1 to 701_m (m is a natural number of 2 or more)) and an insulator 722 (insulators 722_1 to 722_m) are alternately stacked over the insulator 721; a conductor 702 over the stack; an insulator 724 over the conductor 702 and the stack; an insulator 703 (insulators 703_1 to 703_4) in an opening portion formed through the insulator 724, the conductor 702, the stack, and the insulator 721; an oxide 704 (oxides 704_1 to 704_4) on the inner side of the insulator 703; a layer 716 containing at least one of a metal element, hydrogen, and nitrogen provided between the insulator 703 and the oxide 704 to be in contact with part of the oxide 704; an insulator 711 (insulators 711_1 to 711_4) on the inner side of the oxide 704; an insulator 719 serving as a mask for the oxide 704 between the oxide 704 and the insulator 711; a conductor 712 (conductors 712_1 to 712_4) on the inner side of the insulator 711; a conductor 705 (conductors 705_1 to 705_4) electrically connected to upper end portions of the oxides 704_1 to 704_4; a conductor 706 (conductors 706_1 to 706_4) electrically connected to lower end portions of the oxides 704_1 to 704_4; a conductor 707 (conductors 707_1 to 707_m) electrically connected to the conductors 701_1 to 701_m; a conductor 708 (conductors 708_1 to 708_m) electrically connected to the conductors 707_1 to 707_m; a conductor 709 electrically connected to the conductor 702; a conductor 710 electrically connected to the conductor 709; an insulator 717 and an insulator 713 over the insulator 724, the conductor 705, and the conductor 708; and a conductor 714 and a conductor 715 electrically connected to each of the conductors 712_1 to 712_4. Note that in FIG. 37 and FIGS. 38A and 38B, four or more stages of the conductors 701 are illustrated to show a plurality of conductors 701; however, this embodiment is not limited to FIG. 37 and at least two stages of the conductors 701 are provided.

As illustrated in FIG. 37 and FIG. 38A, the conductor 701 extends in the x-axis direction. As illustrated in FIG. 37 and FIG. 38B, the insulator 703 and the oxide 704 extend in the z-axis direction. That is, the conductor 701 and the insulator 703 and oxide 704 are preferably provided to cross each other perpendicularly. Furthermore, as illustrated in FIG. 37, the conductor 707 extends in the z-axis direction. The conductor 708 may extend in the y-axis direction. In addition, a conductor functioning as a bit line BL connected to the conductor 705 may extend in the y-axis direction. Part of the conductor 705 may function as the bit line BL and the conductor 705 may extend in the y-axis direction.

The conductor 712 is formed in a columnar shape and extends in the z-axis direction. In addition, the insulator 711 is provided to surround the conductor 712 and the oxide 704 is provided to surround the insulator 711, each of which extends in the z-axis direction. In other words, the conductor 712 is provided as a core on the inner side of the columnar oxide 704 that extends in the z-axis direction, and the insulator 711 is provided between the oxide 704 and the conductor 712. The insulator 703 is provided to surround the periphery of the side of the columnar oxide 704. The conductor 707 is formed in a columnar shape and extends in the z-axis direction.

The diameter of an opening formed in the conductor 701 and the conductor 702 is larger than the diameter of an opening formed in the insulator 721, the insulator 722, and the insulator 724. It can be said that the conductors are more recessed than the side surfaces of the insulators. The insulator 719 is provided on the side surfaces of the conductor 701 and the conductor 702 with the insulator 703 and the oxide 704 provided therebetween. That is, the insulator 703 and the oxide 704 are provided on the side surfaces of the insulator 721, the conductor 701, the insulator 722, the conductor 702, and the insulator 724 along the recessions, and the insulator 719 is provided in the recessions with the insulator 703 and the oxide 704 provided therebetween. The oxide 704 has a low-resistance region, and when the low-resistance region is formed in part of the oxide 704, the insulator 719 can serve as a mask to cover the oxide 704 in a portion where the low-resistance region is not formed. When the oxide 704 has a low-resistance region, in the memory string where the memory cells are stacked or in the memory cell array, the series resistance between the memory cells can be reduced. Furthermore, a region where the side surface of the oxide 704 is covered with the insulator 719 can serve as a channel formation region.

The columnar oxide 704 is electrically connected to the conductor 706 at the lower end in the z-axis direction and electrically connected to the conductor 705 at the upper end. As illustrated in FIG. 38B, the conductor 706 is electrically connected to the lower ends of two adjacent columnar oxides 704, and the upper ends of the two adjacent columnar oxides 704 are electrically connected to the electrically separated conductors 705. In this embodiment, the U-shaped memory string in which the two columnar oxides 704 are electrically connected to each other through the conductor 706 is described; however, the present invention is not limited thereto. For example, the conductor 706 may serve as one of a bit line BL and a source line SL and the conductor 705 may serve as the other of the bit line BL and the source line SL. In this case, the conductor 706 may be electrically connected to a plurality of columnar oxide 704 or one columnar oxide 704. Furthermore, the conductor 705 may be electrically connected to a plurality of columnar oxide 704 or one columnar oxide 704.

In the case where the lower end of the columnar oxide 704 is electrically connected to one of the bit line BL and the source line SL and the upper end thereof is electrically connected to the other, a selection transistor is preferably provided at around the lower end and upper end of the columnar oxide 704. For example, in the case where the conductor 706 serves as part of the bit line BL and the conductor 705 serves as part of the source line SL, a selection transistor SST is provided between the conductor 706 and the memory transistor MT and a selection transistor SDT is provided between the conductor 705 and the memory transistor MT.

Here, a region where the conductor 701 crosses the insulator 703 and the oxide 704 and the vicinity of the region serve as the memory transistor MT. In addition, a region where the conductor 702 crosses the insulator 703 and the oxide 704 and the vicinity of the region serve as the selection transistor. The channel formation region of each of the memory transistor MT and the selection transistor is provided along the above recession. The memory transistor MT and the selection transistor are electrically connected in series to form the memory string.

FIG. 39A is an enlarged cross-sectional view of a portion surrounded by dashed-dotted line 791 in FIG. 37, which illustrates a cross section of the memory transistor MT in a k-th stage (k is an integer greater than or equal to 2 and less than or equal to m−1). The memory transistor MT includes the conductor 701_k, the insulator 703 (the insulators 703a, 703b, and 703c), and the oxide 704 (the oxides 704a, 704b, and 704c). In addition, the conductor 712 and the insulator 711 may be included.

The conductor 701_k serves as a gate of the memory transistor MT, the insulator 703a serves as a gate insulating layer, the insulator 703b serves as a charge accumulation layer, and the insulator 703c serves as a tunnel insulating layer.

Although the details are described later, the oxide 704 includes the oxide 704a, the oxide 704b, and the oxide 704c, and the oxide 704a has an energy gap relatively wider than that of the oxide 704b, and the oxide 704c has an energy gap relatively wider than that of the oxide 704b. In other words, the oxide 704b has an energy gap relatively narrower than those of the oxides 704a and 704c.

In the oxide 704, a region 734 that is positioned in the same layer as the conductor 701_k serves as a channel formation region. Furthermore, in the oxide 704, a region 731 (regions 731a and 731b) not covered with the insulator 719 serves as a low-resistance region. A region 732 (regions 732a and 732b) positioned between the region 734 and the region 731 serves as a junction region. The resistance of the region 732 is preferably lower than that of the region 734. Furthermore, the resistance of the region 732 may be substantially equal to or higher than that of the region 731. The region 732 may serve as a channel formation region like the region 734 or serve as a low-resistance region like the region 731.

The memory transistor MT in the k-th stage and the memory transistor MT in the k−1-th stage or the transistor MT in the k+1-th stage share the low-resistance region. The oxide 704 has a structure where the channel formation regions and the low-resistance regions are alternately formed. When the oxide 704 has the low-resistance region, the series resistance between the memory cells can be reduced in the memory string where the memory cells are stacked or in the memory cell array.

In the case where the conductor 712 is provided, the conductor 701_k serves as a first gate and the conductor 712 serves as a second gate. Note that the first gate is referred to as a control gate or simply a gate, and the second gate is referred to as a back gate in some cases. The insulators 711 and 719 are provided between the oxide 704 and the conductor 712 and serves as a second gate insulating layer. At this time, the insulator 703a serves as a first gate insulating layer. In the circuit operation of the memory transistor MT, the potential of the conductor 712 which serves as the second gate is controlled, whereby power consumption of the memory transistor MT can be reduced.

FIG. 39B is an enlarged cross-sectional view of a portion surrounded by dashed-dotted line 792 in FIG. 37, which illustrates a cross section of the selection transistor (the transistor on the bit line side (SDT) and the transistor on the source line side (SST)). The selection transistor includes the conductor 702, the insulator 703 (the insulators 703a, 703b, and 703c), and the oxide 704 (the oxides 704a, 704b, and 704c). In addition, the conductor 712 and the insulator 711 may be included.

The conductor 702 serves as a gate of the selection transistor and the insulator 703a serves as a gate insulating layer. As the gate insulating layer, at least the insulator 703a is provided, and the insulator 703b and the insulator 703c are not necessarily provided. Alternatively, after the insulators 703a, 703b, and 703c are provided, the insulators 703b and 703c may be partly removed.

The oxide 704 includes the oxide 704a, the oxide 704b, and the oxide 704c, and the oxide 704a has an energy gap relatively wider than that of the oxide 704b, and the oxide 704c has an energy gap relatively wider than that of the oxide 704b. In other words, the oxide 704b has an energy gap relatively narrower than those of the oxides 704a and 704c.

In the oxide 704, a region 734 that is positioned in the same layer as the conductor 702 serves as a channel formation region. Furthermore, in the oxide 704, a region 731 (regions 731a and 731b) not covered with the insulator 719 serves as a low-resistance region. A region 732 (regions 732a and 732b) positioned between the region 734 and the region 731 serves as a junction region. The resistance of the region 732 is preferably lower than that of the region 734. Furthermore, the resistance of the region 732 may be substantially equal to or higher than that of the region 731. The region 732 may serve as a channel formation region like the region 734 or serve as a low-resistance region like the region 731.

In the case where the conductor 712 is provided, the conductor 702 serves as a first gate and the conductor 712 serves as a second gate. Note that the first gate is referred to as a top gate or simply a gate, and the second gate is referred to as a back gate in some cases. The insulators 711 and 719 are provided between the oxide 704 and the conductor 712 and serves as a second gate insulating layer. At this time, the insulator 703a serves as a first gate insulating layer. With the conductor 712 which serves as the second gate, the threshold voltage of the selection transistor can be controlled.

Note that the structure of the semiconductor device in this embodiment is an example, and the present invention is not limited to the number, the position, and the like of the circuit element, the wiring, and the like illustrated in the drawings and the like according to this embodiment. The number, the position, and the like of the circuit element, the wiring, and the like included in the semiconductor device in this embodiment can be set as appropriate in accordance with the circuit configuration and the driving method.

The base 720 provided with the memory cell array 700 preferably has an insulating surface. As a substrate having an insulating surface, a semiconductor substrate provided with an insulator on its surface, an insulator substrate, a conductor substrate provided with an insulator on its surface, or the like is used. As the semiconductor substrate, a semiconductor substrate formed using silicon, germanium, or the like or a semiconductor substrate formed using silicon carbide, silicon germanium, gallium arsenide, indium phosphide, zinc oxide, gallium oxide, or the like is used. As the insulator substrate, a glass substrate, a quartz substrate, a sapphire substrate, a stabilized zirconia substrate (e.g., an yttria-stabilized zirconia substrate), a resin substrate, or the like is used. A semiconductor substrate in which an insulator region is provided in the above semiconductor substrate, e.g., a silicon on insulator (SOI) substrate, is used. As the conductor substrate, a graphite substrate, a metal substrate, an alloy substrate, a conductive resin substrate, or the like is used.

The conductor 701 serves as the gate of the memory transistor MT and is electrically connected to a word line. That is, the conductors 701, 707, and 708 also serve as part of the word line. Here, as illustrated in FIG. 37, the conductor 701 is preferably provided in a step-like shape where the conductor 701 in the lower layer extends to be closer to the A2 side than the conductor 701 in the upper layer does. The conductor 701 is provided in this manner, so that the conductor 701 in the upper layer does not overlap with a region of part of the top surface of the conductor 701 in the lower layer; thus, the regions in the conductors 701 can be connected to the respective conductors 707.

For the conductor 701, a conductive material such as silicon or metal can be used. When silicon is used, amorphous silicon or polysilicon can be used. Furthermore, a p-type impurity or an n-type impurity may be added to form conductive silicon. As a conductive material containing silicon, silicide containing titanium, cobalt, or nickel can be used for the conductor 701. In the case where a metal material is used for the conductor 701, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used.

The conductor 702 is provided over the conductor 701. The conductor 702 serves as the gate of the selection transistor (the transistor on the bit line side (SDT) and the transistor on the source line side (SST)) and is electrically connected to a wiring DGL and a wiring SGL. That is, the conductors 702, 709, and 710 also serve as part of the wirings DGL and SGL. The conductor 702 can be formed using the material similar to that for the conductor 701. The conductor 702 may be formed using the same material as the conductor 701 or a different material from that of the conductor 701. The materials of the conductor 701 and the conductor 702 are determined depending on the usage in consideration of their work functions and the like.

Insulating films provided over and under the conductors 701 and 702 can be formed using an oxide, a nitride, an oxynitride, a nitride oxide, a metal oxide, a metal oxynitride, a metal nitride oxide, or the like which has an insulating property. For the insulating film, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like, which has a low relative permittivity, is preferably used.

Although aluminum oxide, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be used for the insulating film, these materials have a high relative permittivity; thus, parasitic capacitance may be generated between the conductors 701 or between the conductor 701 and the conductor 702. The material used for the insulating film can be determined depending on the design of the device or the usage.

The insulator 703 includes the insulator 703a, the insulator 703b, and the insulator 703c. The insulator 703a is provided on the conductor 701 side, the insulator 703c is provided on the oxide 704 side, and the insulator 703b is provided between the insulator 703a and the insulator 703c. The insulator 703a serves as a gate insulating layer, the insulator 703b serves as a charge accumulation layer, and the insulator 703c serves as a tunnel insulating layer.

Note that the selection transistor may have the same structure as the memory transistor MT. However, as illustrated in FIG. 39B, the selection transistor does not necessarily include the charge accumulation layer or the tunnel insulating layer. The transistor on the bit line side (SDT) and the transistor on the source line side (SST) may each have a structure where the insulators 703b and 703c are removed and only the insulator 703a is provided as the insulator 703. In FIG. 39B, the conductor 712 may be provided as the second gate electrode. In this case, the conductor 702 serves as the first gate electrode, the insulator 703a serves as the first gate insulating film, and the insulator 711 serves as the second gate insulating film. With the conductor 712, the threshold voltage of the selection transistor can be controlled.

For the insulator 703a, silicon oxide or silicon oxynitride is preferably used. Aluminum oxide, hafnium oxide, or an oxide containing aluminum and hafnium may be used. Alternatively, a stack of any of these materials may be used for the insulator 703a.

The insulator 703b is preferably formed using a material that serves as a charge accumulation layer and is preferably formed using silicon nitride or silicon nitride oxide. Aluminum oxide, hafnium oxide, or an oxide containing aluminum and hafnium may be used.

For the insulator 703c, silicon oxide or silicon oxynitride is preferably used. Aluminum oxide, hafnium oxide, or an oxide containing aluminum and hafnium may be used. Alternatively, a stack of any of these materials may be used for the insulator 703c. Furthermore, the insulator 703c is preferably thinner than the insulator 703a. Although details are described later, in writing or erasing data to/from the memory transistor MT, charge is transferred between the oxide 704 and the insulator 703b through the insulator 703c. That is, the insulator 703c serves as a tunnel insulating layer.

In particular, in the case where the insulator 703 is formed in the opening provided in the stack including the conductor 701, the conductor 702, and the insulating films, the insulator 703 formed on the bottom portion of the opening needs to be removed by anisotropic etching using dry etching or the like. In anisotropic etching, the side surface of the insulator 703c is also exposed to plasma, a radical, a gas, a chemical solution, or the like. When the side surface of the insulator 703c is damaged in this manner, trap centers might be formed in the insulator 703c and might affect electrical characteristics of the transistor. To suppress the formation of the trap centers, the side surface of the insulator 703c is required to have high resistance to damage due to etching. In this case, for the insulator 703c, aluminum oxide, a stack of silicon oxide and aluminum oxide, or a stack of silicon oxynitride and aluminum oxide is preferably used.

The insulators 703a, 703b, and 703c can be formed by an ALD method or a CVD method. To prevent contamination of the interfaces between the insulator 703a, the insulator 703b, and the insulator 703c, these insulators are preferably formed in succession without exposure to an air atmosphere in the same chamber or with a multi-chamber deposition apparatus including a plurality of chambers.

The oxide 704 is preferably formed using a metal oxide functioning as an oxide semiconductor (hereinafter, the metal oxide is also referred to as an oxide semiconductor). The oxide semiconductor is preferably used, in which case a transistor including the oxide semiconductor can have more favorable on-state characteristics and higher mobility than a transistor including a semiconductor made of silicon, for example.

For example, as the oxide 704, a metal oxide such as an In-M-Zn oxide (M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. An In—Ga oxide or an In—Zn oxide may be used as the oxide 704.

The oxide 704 preferably includes the oxide 704a provided on the insulator 703c side, the oxide 704b provided on the inner side of the oxide 704a, and the oxide 704c provided on the inner side of the oxide 704b. At this time, as the oxide 704a, an oxide having an energy gap relatively wider than that of the oxide 704b is preferably used. As the oxide 704c, an oxide having an energy gap relatively wider than that of the oxide 704b is preferably used. Here, an oxide having a wide energy gap is referred to as a wide gap and an oxide having a narrow energy gap is referred to as a narrow gap in some cases. In FIGS. 39A and 39B, the oxide 704 has a three-layer structure of the oxides 704a, 704b, and 704c; however, the present invention is not limited thereto. The oxide 704 may have a two-layer structure of the oxides 704a and 704b or a stacked-layer structure of four or more layers.

In the case where the oxides 704a and 704c are each a wide gap and the oxide 704b is a narrow gap, an energy of the conduction band minimum of each of the oxides 704a and 704c is preferably higher than that of the conduction band minimum of the oxide 704b. In other words, the electron affinity of each of the oxides 704a and 704c is preferably smaller than the electron affinity of the oxide 704b.

The oxides 704a, 704b, and 704c preferably have different atomic ratios of metal atoms. Specifically, the atomic ratio of the element M to constituent elements in the metal oxide used as the oxides 704a and 704c is preferably greater than that in the metal oxide used as the oxide 704b. Moreover, the atomic ratio of the element M to In in the metal oxide used as the oxides 704a and 704c is preferably greater than that in the metal oxide used as the oxide 704b. Moreover, the atomic ratio of the element In to the element M in the metal oxide used as the oxide 704b is preferably greater than that in the metal oxide used as the oxides 704a and 704c.

As the oxides 704a and 704c, for example, a metal oxide having a composition of In:Ga:Zn=1:3:4, In:Ga:Zn=1:3:2, or In:Ga:Zn=1:1:1, or a composition which is in the neighborhood of any of the above atomic ratios can be used. As the oxide 704b, for example, a metal oxide having a composition of In:Ga:Zn=4:2:3 to 4:2:4.1, In:Ga:Zn=1:1:1, or In:Ga:Zn=5:1:6, or a composition which is in the neighborhood of any of the above atomic ratios can be used. The oxides 704a, 704b, and 704c are preferably formed to satisfy the above atomic ratio. For example, it is preferable that the oxides 704a and 704c be each a metal oxide having a composition of In:Ga:Zn=1:3:4 or a composition which is in the neighborhood of the above atomic ratio and the oxide 704b be each a metal oxide having a composition of In:Ga:Zn=4:2:3 to 4:2:4.1 or a composition which is in the neighborhood of the above atomic ratios. Note that the above composition shows the atomic ratio in an oxide formed over a base or the atomic ratio in a sputtering target.

In addition, it is preferable that a CAAC-OS described later be used as the oxides 704a and 704c and a CAC-OS described later be used as the oxide 704b. In the case where the CAAC-OS is used as the oxides 704a and 704c, the c-axes are preferably aligned parallel to x-y plane shown in FIG. 37, FIGS. 38A and 38B, and the like, that is, perpendicular to the z-axis, and preferably aligned from the side surface of the opening to the central portion.

Here, in a junction portion of the oxides 704a and 704b and a junction portion of the oxides 704c and 704b, the conduction band minimum is gradually varied. In other words, the conduction band minimum in the junction portion of the oxides 704a and 704b and the junction portion of the oxides 704c and 704b is continuously varied or continuously connected. To vary the conduction band minimum gradually, the density of defect states in a mixed layer formed at the interface between the oxides 704a and 704b and the interface between the oxides 704c and 704b is decreased.

Specifically, when the oxides 704a, 704b, and 704c contain the same element (as a main component) in addition to oxygen, a mixed layer with a low density of defect states can be formed. For example, in the case where the oxide 704b is an In—Ga—Zn oxide, it is preferable to use an In—Ga—Zn oxide, a Ga—Zn oxide, gallium oxide, or the like as each of the oxides 704a and 704c. Accordingly, the density of defect states at the interface between the oxides 704a and 704b and the interface between the oxides 704c and 704b can be decreased. Thus, the influence of interface scattering on carrier conduction is small, and the memory transistor MT can have a high on-state current.

Note that the details of the metal oxide that can be used as the oxide 704 are described later.

FIG. 39A is the enlarged view of the memory transistor MT surrounded by dashed-dotted line 791 in FIG. 37. As illustrated in FIG. 39A, the oxide 704b is sandwiched between the oxides 704a and 704c. In such a structure, carriers mainly flow in the component having a narrow gap when the carriers flow in the oxide 704 from the conductor 705 toward the conductor 706 or from the conductor 706 toward the conductor 705. Thus, with the above structure, the oxide 704b which is a narrow gap is sandwiched between the oxides 704a and 704c which are wide gaps, whereby carriers flowing through the oxide 704 can be confined in the oxide 704b. This enables high current drive capability in the on state of the transistor, i.e., high on-state current and high field-effect mobility.

The oxide 704a is provided between the oxide 704b and the insulator 703c, whereby the oxide 704b that serves as a carrier path and the insulator 703c are not in contact with each other, so that the formation of trap centers can be suppressed. The trap centers formed at the interface between the semiconductor (oxide semiconductor) and the insulator trap electrons and cause the threshold voltage of the transistor to shift in the positive direction, which might adversely affect the reliability and the on-off characteristics of the transistor. Thus, a transistor using the oxide does not affect electrical characteristics due to the trap centers. This enables higher current drive capability in the on state of the transistor, i.e., higher on-state current and higher field-effect mobility. Furthermore, the transistor and a semiconductor device including the transistor can have high reliability.

To provide the low-resistance regions in the oxide 704, the insulator 719 serving as a mask of the oxide 704 is preferably provided. The insulator 719 is provided on the side surfaces of the conductors 701 and 702 with the insulator 703 and the oxide 704 provided therebetween. The details thereof will be described later. The diameter of the opening formed in the conductors 701 and 702 is larger than the diameter of the opening formed in the insulators 721, 722, and 724, and the insulator 719 is provided only in the same layers as the conductors 701 and 702. Thus, the oxide 704 includes a region covered with the insulator 719.

When treatment for reducing resistance is performed on the oxide 704 that is not covered with the insulator 719, the region 731 serving as the low-resistance region is formed in the oxide 704. Examples of the treatment for reducing resistance include a method for injecting a specific element of a rare gas such as argon, hydrogen, nitrogen, a metal, or the like, and a method for extracting oxygen from the oxide 704.

In the case where a specific element is injected to the oxide 704, plasma treatment, ion implantation treatment, ion doping treatment, or the like in an atmosphere containing the element can be used. The plasma treatment can be performed with an etching apparatus or a CVD apparatus. In addition, by using what is called reverse sputtering treatment using a sputtering apparatus, the element can be injected into the oxide 704.

In order to selectively reduce the resistance of the oxide 704, at least one of metal elements that increase conductivity of the oxide 704, such as aluminum, ruthenium, titanium, tantalum, tungsten, chromium, and indium, and an impurity is added to a desired region. As the impurity, the element that forms an oxygen vacancy, the element trapped by an oxygen vacancy, or the like may be used. Typical examples of the element are hydrogen, boron, carbon, nitrogen, fluorine, phosphorus, sulfur, chlorine, titanium, and a rare gas element. Typical examples of the rare gas element include helium, neon, argon, krypton, and xenon.

As described above, when the content of the metal element, the element that increases conductivity, the element that forms an oxygen vacancy, and the element trapped by an oxygen vacancy in the region 731 is increased, the carrier density is increased and the resistance can be reduced.

For example, the resistance of the oxide semiconductor in the region 731 can be reduced by injecting impurities such as a rare gas into the region 731 by plasma treatment, ion implantation treatment, ion doping treatment, reverse sputtering treatment, or the like using the insulator 719 as a mask.

Note that in this specification and the like, the reverse sputtering treatment refers to treatment in which voltage is applied to the substrate side with the use of a radio frequency (RF) power source and plasma is generated in the vicinity of the substrate to modify the substrate surface. The reverse sputtering treatment is preferably performed in such a manner that an inert gas (e.g., a rare gas such as argon or helium, nitrogen, or the like) is introduced into the treatment chamber.

For the addition of the impurities such as a rare gas, an ion implantation method by which an ionized source gas is subjected to mass separation and then added, an ion doping method by which an ionized source gas is added without mass separation, a plasma immersion ion implantation method, or the like can be used. In the case of performing mass separation, ion species to be added and its concentration can be adjusted properly. On the other hand, in the case of not performing mass separation, ions at a high concentration can be added in a short time. Alternatively, an ion doping method in which atomic or molecular clusters are generated and ionized may be employed. Note that the impurities and the metal elements to be added may be referred to as an element, dopant, ion, donor, acceptor, or the like.

In order to reduce the resistance of the region 731, for example, a metal film, an oxide film containing a metal element, a nitride film containing a metal element, or the like may be formed in contact with the region 731 of the oxide 704. Specifically, a metal film, an oxide film containing a metal element, or a nitride film containing a metal element is preferably provided in contact with the region 731 which is not covered with the insulator 719.

When the metal film, the oxide film containing a metal element, or the nitride film containing a metal element is formed in contact with the region 731 of the oxide 704, a metal element is diffused from the film into the region 731 of the oxide 704 and a metal compound is formed in the region 731, whereby the resistance of the region 731 is reduced. Some oxygen in the oxide 704 at and near an interface between the region 731 and the metal film, the oxide film containing a metal element, or the nitride film containing a metal element may be absorbed by the film and an oxygen vacancy may be formed in the region 731, so that the resistance of the region 731 may be reduced. Note that the regions of the oxide in which the resistance is reduced are not limited to the region 731 in this specification and the drawings regardless of the method of reducing resistance. The resistance of part of the region 732 may be reduced. The resistances of all of the layers included in the oxide 704, which are the oxides 704a, 704b, and 704c, do not need to be reduced, and the resistance of at least the oxide 704b, which serves as a carrier path, need to be reduced. For example, the resistance of only the oxides 704c and 704b may be reduced.

Heat treatment is preferably performed in an atmosphere containing nitrogen in a state where the region 731 and the metal film, the oxide film containing a metal element, or the nitride film containing a metal element is in contact with each other. By the heat treatment, the metal element is diffused from the metal film, the nitride film containing the metal element, or the oxide film containing the metal element into the region 731 of the oxide 704; thus, the metal element can be added to the region 731. At this time, the region 731 of the oxide 704 may be alloyed with the metal element. When the region 731 of the oxide 704 is alloyed with the metal element, the metal element added to the oxide semiconductor becomes relatively stable; therefore, a highly-reliable semiconductor device can be provided.

If hydrogen in the oxide 704 diffuses into a region 731 and enters an oxygen vacancy in the region 731, the hydrogen becomes relatively stable. Hydrogen in an oxygen vacancy in the region 734 is released from the oxygen vacancy by heat treatment at 250° C. or higher, diffuses into the region 731, enters an oxygen vacancy in the region 731, and becomes relatively stable. Thus, the resistance of the region 731 is further reduced, and the region 734 is purified (impurities such as water or hydrogen therein are reduced) and the resistance of the region 734 is increased.

In contrast, the addition of the metal element to the regions of the oxide 704 (the region 734 and the region 732) covered with the insulator 719 is suppressed because the insulator 719 is provided between the regions and the conductor 702. Furthermore, absorption of oxygen atoms in the regions 734 and 732 of the oxide 704 by the above-described metal film, nitride film containing a metal element, or oxide film containing a metal element is suppressed.

In the case where the metal film, the nitride film containing a metal element, or the oxide film containing a metal element has a property of absorbing hydrogen, hydrogen in the oxide 704 is absorbed by the film. Accordingly, hydrogen, which is an impurity in the oxide 704, can be reduced. In a later step, the metal film, the nitride film containing a metal element, or the oxide film containing a metal element may be removed together with hydrogen absorbed from the oxide 704.

The metal film, the oxide film containing a metal element, or the nitride film containing a metal element is not necessarily removed. In the case where the metal film, the oxide film containing a metal element, or the nitride film containing a metal element is oxidized by oxygen absorbed from the oxide 704 to be a high-resistant insulator, for example, the film may remain. In that case, the film may serve as a second gate insulating layer like the insulator 711.

In the case where a region having conductivity remains in the metal film, the oxide film containing a metal element, or the nitride film containing a metal element, for example, the region having conductivity is oxidized by heat treatment, so that the region becomes a high-resistant insulator. The heat treatment is preferably performed in an oxidation atmosphere, for example. In the case where a structure body containing oxygen is provided in the vicinity of the metal film, the oxide film containing a metal element, or the nitride film containing a metal element, by heat treatment, the metal film, the oxide film containing a metal element, or the nitride film containing a metal element may be reacted with oxygen contained in the structure body and oxidized.

The metal film, the oxide film containing a metal element, or the nitride film containing a metal element can serve as a second gate insulating film like the insulator 711 when the film remains as an insulator.

For example, the metal film, the oxide film containing a metal element, or the nitride film containing a metal element is preferably formed to have a thickness of greater than or equal to 0.5 nm and less than or equal to 5 nm, further preferably greater than or equal to 1 nm and less than or equal to 2 nm. When aluminum having a thickness of greater than or equal to 0.5 nm and less than or equal to 5 nm is oxidized by heat treatment, for example, aluminum oxide having a thickness of greater than or equal to 0.7 nm and less than or equal to 8 nm may be formed. Note that in the case where heat treatment is performed in the above oxidation atmosphere, such heat treatment is preferably performed after carrying out another heat treatment in which the oxide 704 is in contact with the metal film, the oxide film containing a metal element, or the nitride film containing a metal element in an atmosphere containing nitrogen. The heat treatment is performed in an atmosphere containing nitrogen once, in which case the oxygen in the oxide 704 is easily diffused into the metal film, the oxide film containing a metal element, or the nitride film containing a metal element.

A memory transistor and a selection transistor formed using an oxide semiconductor is likely to have its electrical characteristics changed by impurities and oxygen vacancies in a channel formation region in the oxide semiconductor; as a result, the reliability is reduced, in some cases. Moreover, if the channel formation region in the oxide semiconductor includes oxygen vacancies, the transistor tends to have normally-on characteristics. Thus, oxygen vacancies in the region 734 where a channel is formed are preferably reduced as much as possible. The insulator 719 is preferably formed using a material that can supply oxygen to the oxide 704, in which case the generation of oxygen vacancies can be suppressed or oxygen vacancies can be compensated in the region 734.

In the case where the conductor 712 is provided, a material similar to that of the conductor 701 can be used for the conductor 712. Since the conductor 712 needs to be formed in the opening having a large aspect ratio (in other words, the recession of the oxide 704 and the insulator 711), the conductor 712 is preferably formed by a CVD method, an ALD method, or a plating method. In that case, the insulator 711 can be formed using a material similar to that used for the insulator 703.

In the case where the insulator 711 is provided on the inner side of the oxide 704c, the insulator 711 is preferably formed using a material that can supply oxygen to the oxide 704 or a material that can supply impurities, such as hydrogen and nitrogen. When an oxide that contains hydrogen and nitrogen as little as possible is used for the insulator 711, oxygen can be supplied to the oxide 704 in some cases. By supplying oxygen to the oxide 704, impurities such as hydrogen and water contained in the oxide 704 can be removed and the oxide 704 is highly purified. When an oxide which contains impurities as little as possible is used as the oxide 704, the memory transistor MT and the semiconductor device including the memory transistor MT can have high reliability.

When an oxide containing hydrogen and nitrogen is used for the insulator 711, hydrogen and nitrogen can be supplied to the oxide 704 in some cases. When hydrogen and nitrogen are supplied to the oxide 704, the resistance of the oxide 704 might be decreased. The resistance of the oxide 704 is decreased such that it does not hinder the circuit operation, whereby the memory transistor MT can operate with lower driving voltage. This enables high current drive capability in the on state of the memory transistor MT, i.e., high on-state current and high field-effect mobility.

Note that the top-view shape of the opening formed in the stack provided with the memory transistor MT is, but not limited to, circular as illustrated in FIG. 38A and the like; the top-view shape can alternatively be, for example, elliptic or polygonal, e.g., a triangle or a quadrangle. In the case where a polygonal shape is employed, corners thereof may be rounded. The top-view shapes of the insulator 703 and the oxide 704 may change depending on the top-view shape of the opening. The opening may have a shape where a lower cross section (on the conductor 706 side) is smaller than an upper cross section (on the conductor 705 side).

The memory transistor MT is formed by the oxide 704, the insulator 703, and the conductor 701 (any one of the conductors 701_1 to 701_$m$). FIG. 37 and FIGS. 38A and 38B show an example in which m stages of memory transistors MT (m is a natural number of 2 or more) are stacked. Note that in FIG. 37 and FIGS. 38A and 38B, four or more stages of the conductors 701 are illustrated to show a plurality of conductors 701; however, this embodiment is not limited to FIG. 37 and at least two stages of the conductors 701 are provided.

The conductor 705 is electrically connected to the oxide 704 and serves as part of the source line SL or part of the bit line BL. The conductor 705 is preferably formed using a conductive material containing a metal element. Alternatively, a conductive material among materials that can be used for the metal film, the oxide film containing a metal element, or the nitride film containing a metal element can be used for the conductor 705. In that case, the resistance of part of the oxide 704 is reduced as described above. A metal compound layer including the metal element contained in the conductor 705 and the component of the oxide 704 is preferably formed at the interface between the conductor 705 and the oxide 704. The metal compound layer is preferably formed, in which case the contact resistance between the conductor 705 and the oxide 704 can be reduced. Alternatively, oxygen contained in the oxide 704 is absorbed by the conductor 705 and the resistance of the oxide 704 in the vicinity of the interface between the conductor 705 and the oxide 704 is reduced, whereby the contact resistance between the conductor 705 and the oxide 704 can be reduced.

It is preferable that the conductor 705 be formed using a conductive material containing one or more metal elements selected from aluminum, ruthenium, titanium, tantalum, chromium, tungsten, and copper.

As illustrated in FIG. 38B, the conductor 706 electrically connects the oxide 704 electrically connected to the conductor 705 which serves as part of the bit line BL to the oxide 704 electrically connected to the conductor 705 serving as part of the source line SL, so that the memory string is formed. A region surrounded by a dotted line in FIG. 38A represents a memory string. In other words, FIG. 38A illustrates a memory cell array 700 including four memory strings.

The conductor 706 can be formed using a material similar to that used for the conductor 705. Alternatively, a conductive material among materials that can be used for the metal film, the oxide film containing a metal element, or the nitride film containing a metal element can be used for the conductor 706. In that case, the resistance of part of the oxide 704 is reduced as described above. The conductor 706 can be formed using the same material as the conductor 705 or a different material from that of the conductor 705.

A metal compound layer including the metal element contained in the conductor 706 and the component of the oxide 704 is preferably formed at the interface between the conductor 706 and the oxide 704. The metal compound layer is preferably formed, in which case the contact resistance between the conductor 706 and the oxide 704 can be reduced. Alternatively, oxygen contained in the oxide 704 is absorbed by the conductor 706 and the resistance of the oxide 704 in the vicinity of the interface between the conductor 706 and the oxide 704 is reduced, whereby the contact resistance between the conductor 706 and the oxide 704 can be reduced.

The conductors 707, 708, 709, 710, 714, and 715 can be formed using a material that can be used for the conductor 701, 702, or 712. The conductors may be formed using the same material or different materials.

(Memory Cell Array 700A)

Figure 40:
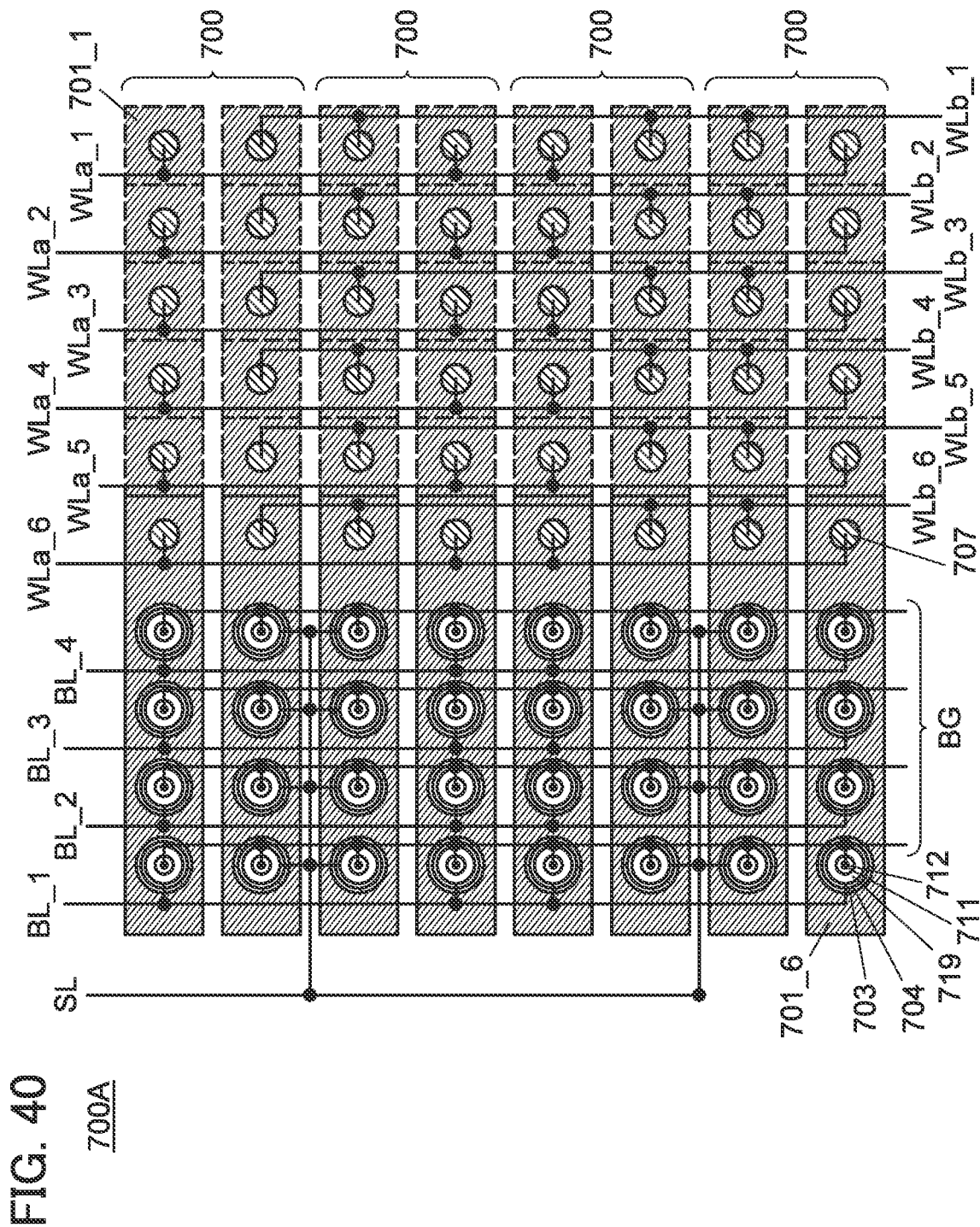
FIG. 40 is a top view illustrating a semiconductor device of one embodiment of the present invention.

FIG. 40 is a top view illustrating a memory cell array 700A in which a plurality of memory cell arrays 700 each including six stages of memory transistors MT are combined. Note that in FIG. 40, some components are not illustrated for simplicity. For example, the selection transistor (the transistor on the bit line side (SDT) and the transistor on the source line side (SST)) provided over the conductor 701 and the conductor 702 which is the component of the selection transistor are not illustrated. In addition, the conductor 705 serving as part of the bit line BL and the source line SL, the conductor 708 serving as part of the word line WL, and the conductor 715 serving as part of the wiring BG electrically connected to the conductor 712 serving as a second gate are shown by solid lines.

In the memory cell array 700A, each memory cell array 700 includes four memory strings including six stages of memory transistors MT.

The ends of the memory strings on the bit line side are electrically connected to the respective bit lines BL (BL_1 to BL_4). The ends of the memory strings on the source line side are electrically connected to the source line SL and are supplied with a common potential. The source line SL may be grounded or may be supplied with a constant potential. Alternatively, the potential may be changed depending on the operation of the circuit.

The conductors 701_1 to 701_6 are electrically connected to the respective word lines WL. The conductors 701_1 to 701_6 on the bit line side are electrically connected to WLa_1 to WLa_6, respectively, and the conductors 701_1 to 701_6 on the source line side are electrically connected to WLb_1 to WLb_6, respectively.

The conductors 712 are electrically connected to the wirings BG. Although FIG. 40 shows an example where the conductors 712 aligned in the column direction are electrically connected to the common wiring BG, the present invention is not limited to this example. The conductors 712 aligned in the row direction may be electrically connected to the common wiring BG. Different potentials may be applied to the wirings BG. Alternatively, the same potential may be applied to the plurality of wirings BG. In this case, the plurality of wirings BG are preferably electrically connected to each other. The plurality of wirings BG may refer to all the wirings BG included in the memory cell array 700A.

In order that a given potential is applied to the wiring BG, the wiring BG is preferably electrically connected to a circuit that controls the potential of the wiring BG (also referred to as a BG driver or a BG driver circuit, or simply referred to as a driver or a driver circuit). The BG driver circuit may be provided for each of the wirings BG or the plurality of wirings BG may be electrically connected to one BG driver circuit. For example, the memory cell array 700A may include one BG driver circuit and all the wirings BG included in the memory cell array 700A may be electrically connected to the BG driver circuit.

By appropriately selecting the bit line BL (from BL_1 to BL_4) and the word line WL (from WLa_1 to WLa_6 and WLb_1 to WLb_6), a given memory transistor MT in the memory cell array 700 can be selected. In addition, writing, reading, erasing, and the like can be performed on the selected memory transistor MT.

Since the selection transistor (not illustrated) is provided in each memory string, the given memory cell array 700 in the memory cell array 700A can be selected, and writing, reading, erasing, and the like can be performed on the given memory transistor MT in the selected memory cell array 700.

(Structure Example of Memory Device 750)

Figure 41:
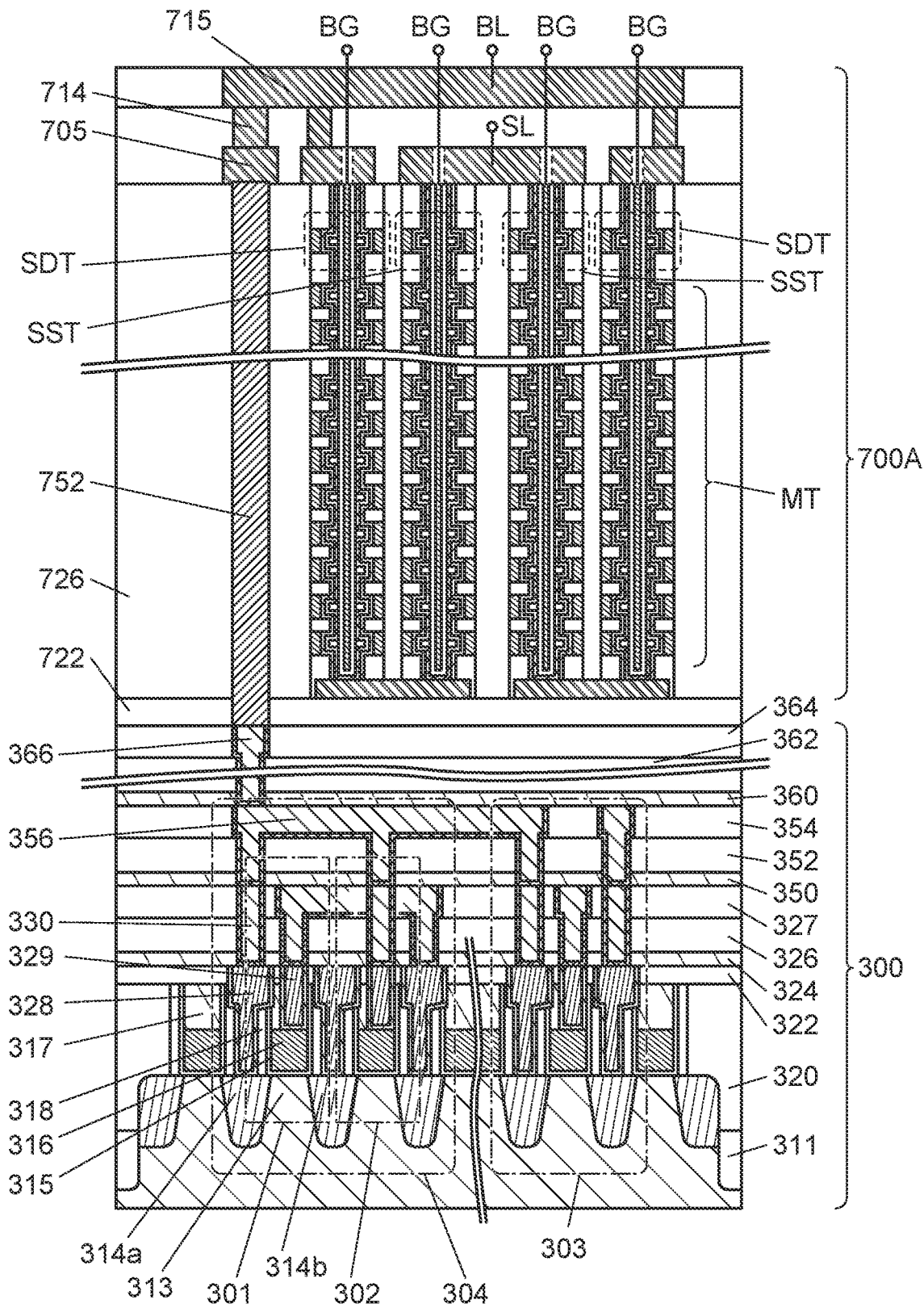
FIG. 41 is a cross-sectional view illustrating a semiconductor device of one embodiment of the present invention.

FIG. 41 illustrates a structure example of a memory device 750 in which the memory cell array 700A is stacked over a circuit 300. As illustrated in FIG. 41, the memory cell array 700A is stacked over a region where the circuit 300 including a transistor 301, a transistor 302, and a transistor 303 is formed. The transistor 301 and the transistor 302 are included in a sense amplifier 304 and the transistor 303 functions as a column selection switch. Specifically, the bit line BL of the memory cell array 700A is electrically connected to one of a source and a drain of the transistor 301, a gate of the transistor 301 is electrically connected to one of a source and a drain of the transistor 302, and a gate of the transistor 302 is electrically connected to the other of the source and the drain of the transistor 301. The one of the source and the drain of the transistor 301 and the other of the source and the drain of the transistor 302 are electrically connected to one of a source and a drain of the transistor 303 which functions as the column selection switch. Accordingly, the layout area of the memory device 750 can be reduced. Note that FIG. 41 illustrates an example where 10 stages of memory transistors MT are provided and one memory string includes 20 memory transistors MT. However, the number of stages of stacked memory transistors MT is not limited thereto. For example, 32 stages of memory transistors, 64 stages of memory transistors, 128 stages of memory transistors, or 200 or more stages of memory transistors may be stacked.

The bit line BL of the memory cell array 700A is electrically connected to the sense amplifier 304 and the transistor 303 functioning as the column selection switch through the conductor 752 formed to be embedded in an insulator 726, the insulator 722, and the like. Note that circuits and transistors included in the circuit 300 are examples and the circuit configurations and the transistor structures are not limited to these examples. In addition to the above, an appropriate circuit or transistor can be provided in accordance with the component of the memory device 750 such as a control circuit, a row decoder, a row driver, a source line driver, or an input-output circuit, or the driving method thereof.

The transistors 301, 302, and 303 are provided over a substrate 311 and each include a conductor 316, an insulator 315, a semiconductor region 313 that is a part of the substrate 311, and a low-resistance region 314a and a low-resistance region 314b functioning as a source region and a drain region. Note that as illustrated in FIG. 41, one low-resistance region may be used in common for a source region or a drain region of one of the transistors 301 and 302 and a source region or a drain region of the other of the transistors 301 and 302.

In each of the transistors 301, 302, and 303, the semiconductor region 313 (part of the substrate 311) in which a channel is formed has a protruding portion. Furthermore, the conductor 316 is provided so as to cover the top and side surfaces of the semiconductor region 313 with the insulator 315 positioned therebetween. Note that the conductor 316 may be formed using a material for adjusting the work function. The transistors 301, 302, and 303 are also referred to as FIN transistors because they each utilize a protruding portion of the semiconductor substrate. An insulator functioning as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

Although each of the transistors 301, 302, and 303 may be either a p-channel transistor or an n-channel transistor, the transistors 301 and 302 are preferably transistors having different polarities.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single crystal silicon. Alternatively, a material containing germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistors 301, 302, and 303 may each be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to the semiconductor material used for the semiconductor region 313.

The insulator 315 serves as a gate insulating film of each of the transistors 301, 302, and 303.

The conductor 316 functioning as a gate electrode can be formed using a semiconductor material such as silicon containing the element which imparts n-type conductivity, such as arsenic or phosphorus, or the element which imparts p-type conductivity, such as boron, or using a conductive material such as a metal material, an alloy material, or a metal oxide material.

Note that since the work function of a conductor depends on a material of the conductor, the threshold voltage can be adjusted by changing the material of the conductor. Specifically, it is preferable to use titanium nitride, tantalum nitride, or the like for the conductor. Furthermore, in order to ensure the conductivity and embeddability, it is preferable to use a stacked layer of metal materials such as tungsten and aluminum for the conductor. It is particularly preferable to use tungsten in terms of heat resistance.

An insulator 317 functioning as an etching stopper is preferably provided over the conductor 316. In addition, an insulator 318 functioning as a spacer is preferably provided on the side surface of the insulator 315. When the insulator 317 and the insulator 318 are provided, regions where the low-resistance regions 314a and 314b and the conductor 328 are electrically connected to each other can be defined in a self-aligned manner. Thus, even when misalignment occurs in forming the openings for exposing part of the low-resistance regions 314a and 314b, the openings for exposing the intended regions can be formed. The conductor 328 provided in the openings formed in this manner can provide a favorable contact with reduced contact resistance between the low-resistance regions 314a and 314b and the conductor 328. The contact between the low-resistance regions 314a and 314b formed in this manner and the conductor 328 may be referred to as a self-aligned contact. Furthermore, the conductor 329 electrically connected to the conductor 316 so as to be embedded in the insulators 317 and 322 may be provided.

An insulator 320, an insulator 322, an insulator 324, an insulator 326, and an insulator 327 are stacked in this order to cover the transistor 301, the transistor 302, and the transistor 303.

The insulator 320, the insulator 322, the insulator 324, the insulator 326, and the insulator 327 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may function as a planarization film for eliminating a level difference caused by the transistor 301 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen or impurities from the substrate 311, the transistor 301, or the like from diffusing to a region where the memory cell array 700A is provided.

For the film having a barrier property against hydrogen, silicon nitride formed by a CVD method can be used, for example. The diffusion of hydrogen to a semiconductor element including an oxide semiconductor, such as the memory transistor MT, degrades the characteristics of the semiconductor element in some cases. Therefore, a film that prevents hydrogen diffusion is preferably provided between the memory transistor MT and the transistor 301 or the like. The film that prevents hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$, in the TDS analysis at a film surface temperature of the insulator 324 of higher than or equal to 50° C. and lower than or equal to 500° C., for example.

Note that the permittivities of the insulators 326 and 327 are preferably lower than that of the insulator 324. For example, the relative permittivities of the insulators 326 and 327 are preferably lower than 4, further preferably lower than 3. The relative permittivities of the insulators 326 and 327 are, for example, preferably 0.7 or less times that of the insulator 324, further preferably 0.6 or less times that of the insulator 324. In the case where a material with a low permittivity is used for an interlayer film, the parasitic capacitance between wirings can be reduced.

The conductor 328, the conductor 329, the conductor 330, and the like that are electrically connected to the memory cell array 700A are provided in the insulator 320, the insulator 322, the insulator 324, the insulator 326, and the insulator 327. Note that the conductors 328, 329, and 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

As a material for each of plugs and wirings (e.g., the conductors 328, 329, and 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 327 and the conductor 330. For example, in FIG. 41, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to those for the conductors 328, 329, and 330.

Note that the insulator 350 is preferably formed using an insulator having a barrier property against hydrogen, as with the insulator 324, for example. Furthermore, the conductor 356 preferably contains a conductor having a barrier property against hydrogen. In particular, the conductor having a barrier property against hydrogen is formed in an opening of the insulator 350 having a barrier property against hydrogen. In such a structure, the transistor 301 and the like and the memory transistor MT can be separated by a barrier layer, so that the diffusion of hydrogen from the transistor 301 and the like to the memory transistor MT can be prevented.

Note that as the conductor having a barrier property against hydrogen, tantalum nitride is preferably used, for example. The use of a stack including tantalum nitride and tungsten having high conductivity can inhibit the diffusion of hydrogen from the transistor 301 and the like while the conductivity of a wiring is ensured. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 41, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be formed using a material similar to those for the conductors 328, 329, and 330.

Note that the insulator 360 is preferably formed using an insulator having a barrier property against hydrogen, as with the insulator 324, for example. Furthermore, the conductor 366 preferably contains a conductor having a barrier property against hydrogen. In particular, the conductor having a barrier property against hydrogen is formed in an opening of the insulator 360 having a barrier property against hydrogen. In such a structure, the transistor 301 and the like and the memory transistor MT can be separated by a barrier layer, so that the diffusion of hydrogen from the transistor 301 and the like to the memory transistor MT can be prevented.

The insulator 722 is provided over the insulator 364 and the conductor 366, and the memory cell array 700A is provided above the insulator 722. A barrier film formed using a material similar to that of the insulator 324 may be provided between the insulator 364 and the insulator 722.

Figure 42:
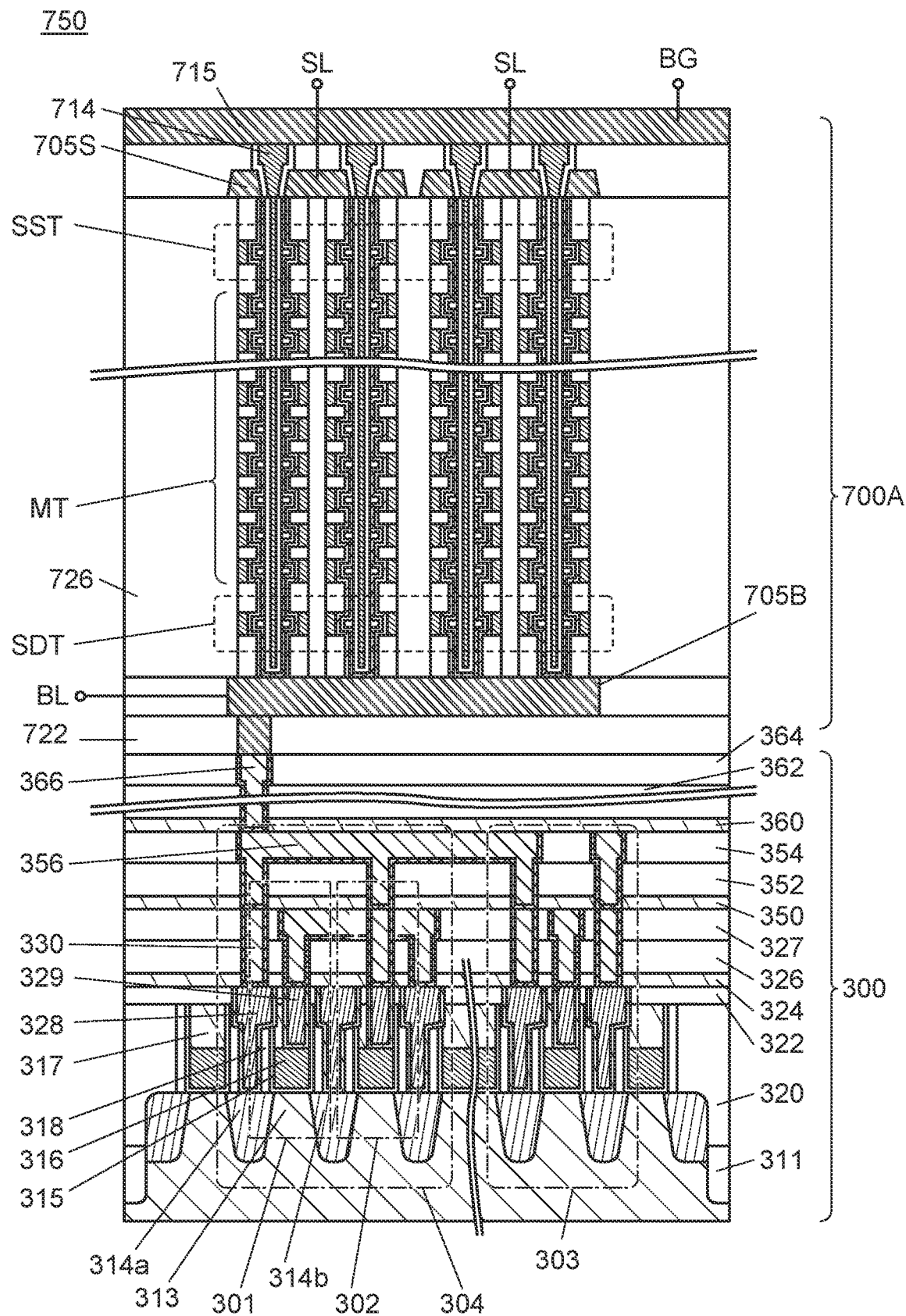
FIG. 42 is a cross-sectional view illustrating a semiconductor device of one embodiment of the present invention.

FIG. 41 illustrates an example of the memory cell array 700A including the U-shaped memory string in which the two columnar oxides 704 are electrically connected to each other through the conductor 706; however, the present invention is not limited to this example. In FIG. 42, in the columnar oxide 704 including 8 stages of memory transistors MT and the two selection transistors (SDT and SST), the lower end of one columnar oxide 704 is electrically connected to a conductor 705B functioning as the bit line BL and the upper end thereof is electrically connected to a conductor 705S functioning as the source line SL. That is, one memory string is formed of one columnar oxide 704. Although the conductor 705B is electrically connected to the lower ends of four columnar oxides in FIG. 42, the present invention is not limited thereto. One conductor 705B may be electrically connected to one columnar oxide 704, or one conductor 705B may be electrically connected to two or more columnar oxides 704. The conductor 705S is electrically connected to upper ends of two columnar oxides; however, the present invention is not limited thereto. One conductor 705S may be electrically connected to one columnar oxide 704, or one conductor 705S may be electrically connected to two or more columnar oxides 704.

The selection transistor SDT is provided between the conductor 705B and the memory transistor MT and the selection transistor SST is provided between the conductor 705S and the memory transistor MT. Such a structure in which the conductor 705B serving as the bit line BL is electrically connected to the circuit 300 provided under the conductor 705B is preferably used, in which case the number of wirings (lead wirings) and plugs for electrically connecting the memory cell array 700A to the circuit 300 can be reduced and the layout area of the memory device 750 can be reduced. Note that in FIG. 42, 8 stages of the memory transistors MT are stacked; however, the present invention is not limited thereto. The number of stages of memory transistors MT may be greater than or equal to 2 and less than or equal to 7, or may be greater than or equal to 9. For example, 32 stages of memory transistors, 64 stages of memory transistors, 128 stages of transistors, or 200 or more stages of memory transistors may be stacked.

The metal oxide described in Embodiment 1 can be referred to for a metal oxide that can be used as the oxide 704 in the present invention.

(A Method for Manufacturing Memory Cell)

Next, one embodiment of a method for manufacturing a memory transistor MT that functions as a memory cell of the present invention is described with reference to FIGS. 43A to 43C to FIGS. 48A and 48B. Note that FIGS. 43A to 43C to FIGS. 48A and 48B are cross-sectional views illustrating a manufacturing process of the memory transistor MT.

Figure 43A:
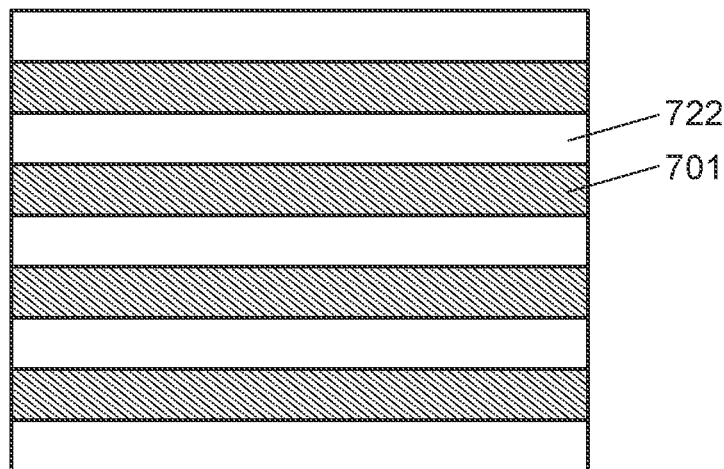
FIGS. 43A to 43C illustrate a manufacturing process of a semiconductor device of one embodiment of the present invention.

First, as illustrated in FIG. 43A, the conductors 701 and the insulators 722 are alternately stacked.

Figure 43B:
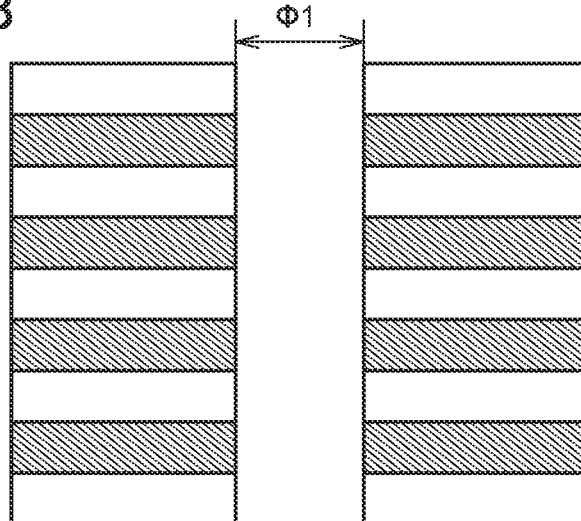

Then, as illustrated in FIG. 43B, the conductors 701 and the insulators 722 are processed to form an opening with a diameter of φ1 in the conductors 701 and the insulators 722.

Figure 43C:
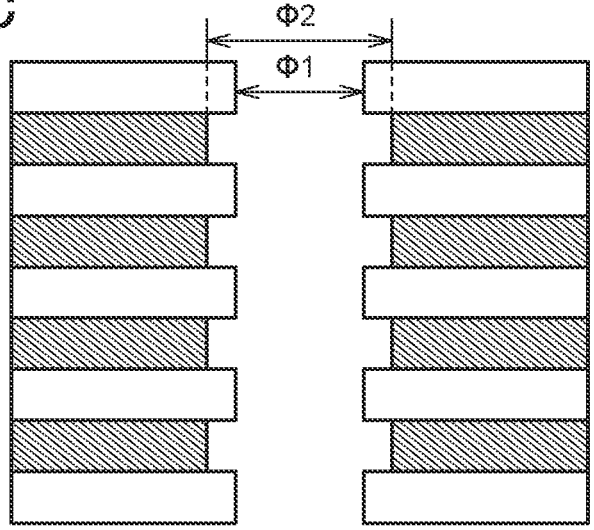

Next, as illustrated in FIG. 43C, the conductors 701 are subjected to isotropic etching to increase the opening diameter of the conductors 701. At this time, the diameter of the opening is φ2 (>φ1). In this case, it can be said that the conductor 701 is more recessed than the side surfaces of the insulators 722 between which the conductor 701 is sandwiched.

Figure 44A:
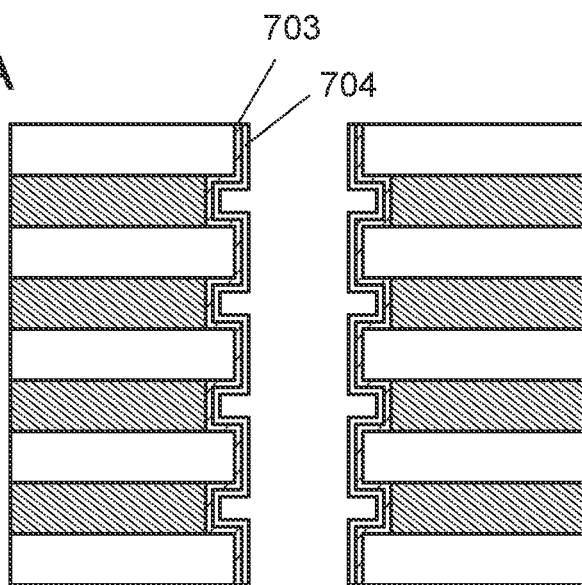
FIGS. 44A to 44C illustrate a manufacturing process of a semiconductor device of one embodiment of the present invention.

Next, as illustrated in FIG. 44A, the insulator 703 and the oxide 704 are formed in the opening. Although not illustrated in FIG. 44A, the insulator 703 is formed by stacking the insulators 703a, 703b, and 703c in this order. The oxide 704 is formed by stacking the oxides 704a, 704b, and 704c in this order. Before the oxide 704 is formed, the insulator 703 in the bottom portion of the opening is preferably removed. The insulator 703 and the oxide 704 are formed with good coverage even on the recession of the conductor 701, and the insulator 703a is formed in contact with the side surface of the conductor 701 and the side surface, part of the top surface, and part of the bottom surface of the insulator 722.

Figure 44B:
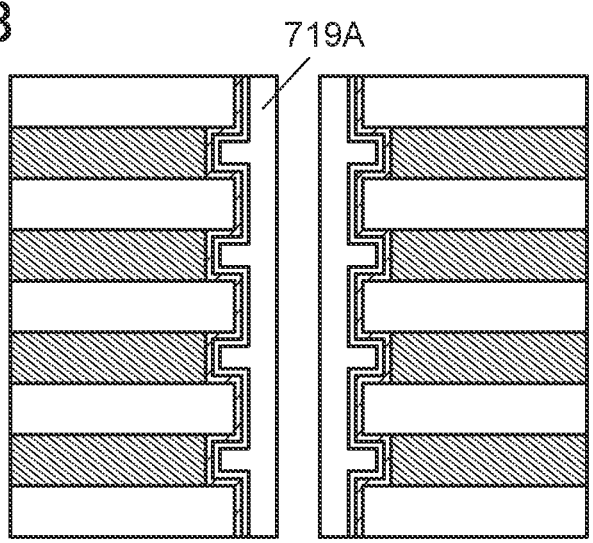
Figure 44C:
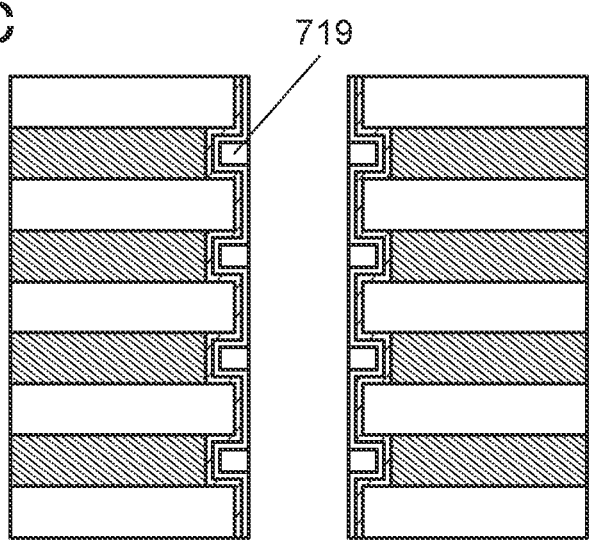

Next, as illustrated in FIG. 44B, an insulating film 719A is formed in the opening. The insulating film 719A is formed to fill the recession with the insulator 703 and the oxide 704 provided between the insulating film 719A and the conductor 701. However, the present invention is not limited thereto. The insulating film 719A may be formed to fill not only the recession but also the whole opening.

Next, the insulating film 719A is processed to form the insulator 719. The processing of the insulating film 719A can be performed by isotropic etching or anisotropic etching. In the case where the insulating film 719A fills the recession and does not completely fill the opening as illustrated in FIG. 44B, the insulating film 719A is preferably processed by isotropic etching. In contrast, in the case where the insulating film 719A is formed to fill the recession and the opening, it is preferable to use anisotropic etching. By such processing, the insulator 719 can be formed in the recession (see FIG. 44C).

Figure 45A:
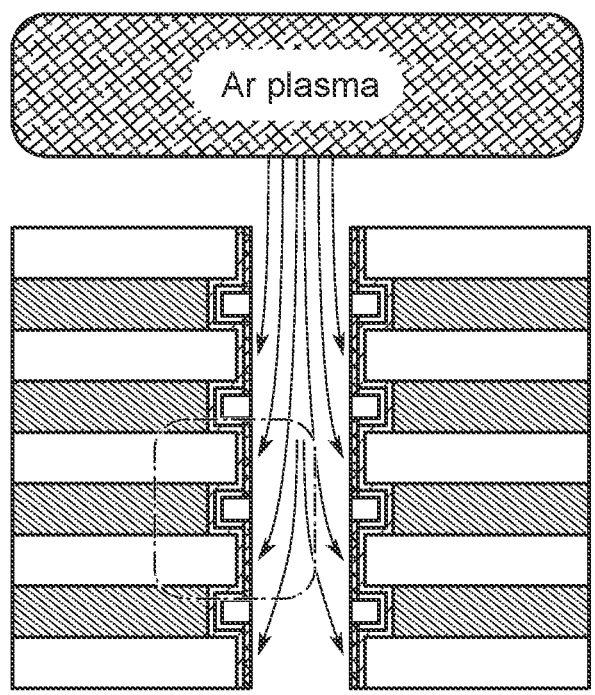
FIGS. 45A and 45B illustrate a manufacturing process of a semiconductor device of one embodiment of the present invention.
Figure 45B:
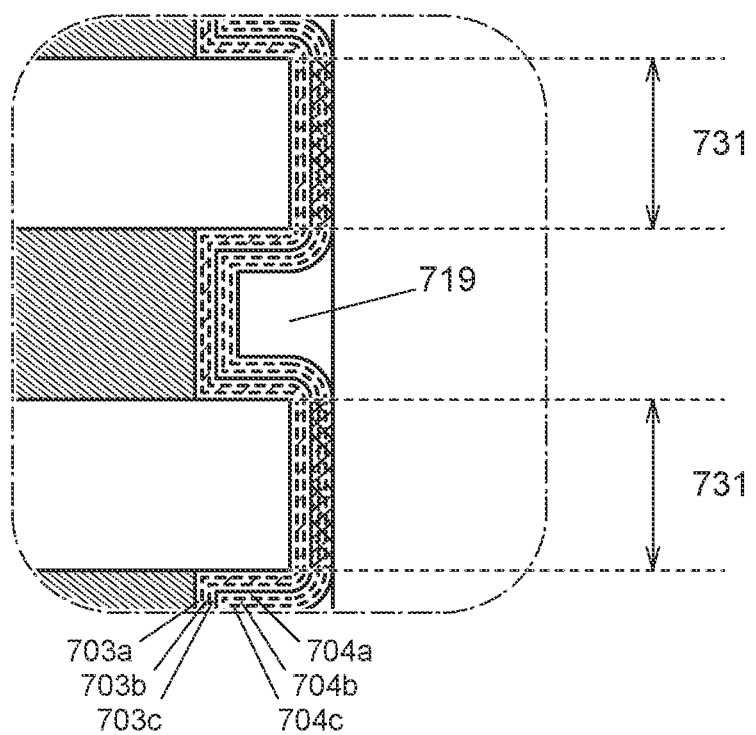

Next, as illustrated in FIGS. 45A and 45B and FIGS. 46A and 46B, a low-resistance region is formed in part of the oxide 704 using the insulator 719 as a mask. FIG. 45B is an enlarged view of a portion surrounded by dashed-dotted line in FIG. 45A. FIG. 45A shows an example in which argon is added to the region 731 of the oxide 704 by argon plasma to reduce the resistance. The element which is added by the treatment shown in FIG. 45A is not limited to the above example. Other than argon, hydrogen, boron, carbon, nitrogen, fluorine, phosphorus, sulfur, chlorine, titanium, helium, neon, krypton, xenon, or the like may be added thereto. Furthermore, a metal element that improves the conductivity of the oxide 704, such as aluminum, ruthenium, titanium, tantalum, tungsten, chromium, or indium, may be added. The plasma treatment can be performed with an etching apparatus or a CVD apparatus. The treatment for adding the element is not limited to the plasma treatment and can be ion implantation treatment, ion doping treatment, reverse sputtering treatment using a sputtering apparatus, or the like.

Figure 46A:
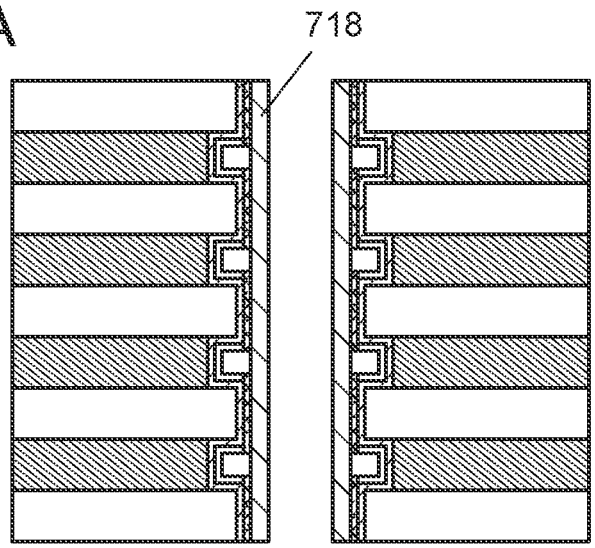
FIGS. 46A and 46B illustrate a manufacturing process of a semiconductor device of one embodiment of the present invention.
Figure 46B:
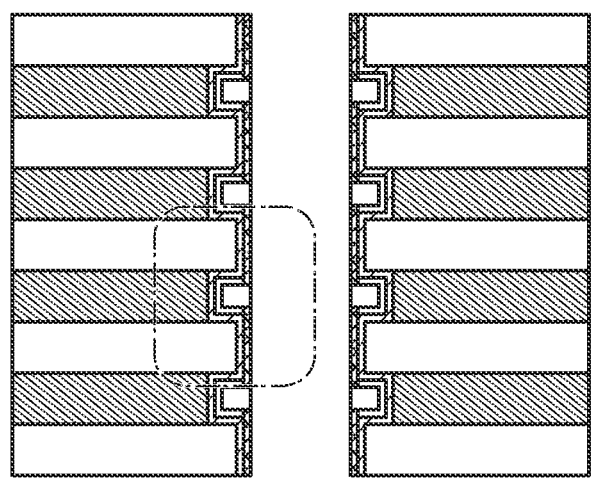

In addition, FIGS. 46A and 46B illustrate an example in which a film 718 including a metal film, an oxide film containing a metal element, or a nitride film containing a metal element is formed in contact with the region 731 of the oxide 704 to reduce the resistance of the region 731. As illustrated in FIG. 46A, the film 718 is formed, and heat treatment is performed as needed, whereby the resistance of the region 731 of the oxide 704 is reduced. After the resistance of the region 731 is reduced, the film 718 may be removed as illustrated in FIG. 46B. Note that FIG. 45B corresponds to a portion surrounded by dashed-dotted line in FIG. 46B.

The metal film, the oxide film containing a metal element, or the nitride film containing a metal element is not necessarily removed. The film may remain in the following case: the metal film, the oxide film containing a metal element, or the nitride film containing a metal element is an insulator or is oxidized by oxygen absorbed from the oxide 704 to be a high-resistant insulator, for example. In that case, the film may serve as a second gate insulating layer like the insulator 711.

The film 718 preferably has at least one of a function of supplying hydrogen to the oxide 704, a function of supplying nitrogen to the oxide 704, and a function of extracting oxygen from the oxide 704. The film 718 having such a function is in contact with the oxide 704, whereby carriers are generated in the oxide 704.

Specifically, oxygen is extracted from the oxide 704, whereby oxygen vacancies are generated in the oxide 704. When hydrogen is trapped by these oxygen vacancies, carriers are generated. Alternatively, in the case where nitrogen is trapped by these oxygen vacancies, nitrogen is substituted for oxygen bonded to two indium atoms. When nitrogen is bonded to these two indium atoms, it is probable that nitrogen has an unpaired electron and serves as a carrier.

As the material having a function of supplying hydrogen to the oxide 704, silicon nitride containing hydrogen can be used. Furthermore, a material formed using a gas containing hydrogen when the material is formed can be used. For example, silicon, silicon oxide, silicon oxynitride, silicon nitride oxide, or the like formed using monosilane, disilane, ammonia, or the like can be used. As the material having a function of supplying nitrogen to the oxide 704, a nitride containing silicon or a metal element can be used. As such a material, silicon nitride, silicon nitride oxide, silicon oxynitride, or the like can be used. Alternatively, a nitride containing one or more of aluminum, tantalum, and titanium can be used. Specifically, aluminum nitride, tantalum nitride, titanium nitride, a nitride containing aluminum and tantalum, a nitride containing aluminum and titanium, or the like can be used.

For example, the film 718 is preferably formed to have a thickness of greater than or equal to 0.5 nm and less than or equal to 5 nm, further preferably greater than or equal to 1 nm and less than or equal to 2 nm. When aluminum having a thickness of greater than or equal to 0.5 nm and less than or equal to 5 nm is oxidized by heat treatment, for example, aluminum oxide having a thickness of greater than or equal to 0.7 nm and less than or equal to 8 nm may be formed. Note that in the case where heat treatment is performed in the above oxidation atmosphere, such heat treatment is preferably performed after carrying out another heat treatment in which the oxide 704 is in contact with the metal film, the oxide film containing a metal element, or the nitride film containing a metal element in an atmosphere containing nitrogen. The heat treatment is performed in an atmosphere containing nitrogen once, in which case the oxygen in the oxide 704 is easily diffused into the metal film, the oxide film containing a metal element, or the nitride film containing a metal element.

After the film 718 containing any one of a metal element, hydrogen, and nitrogen is provided in contact with the oxide 704, heat treatment is preferably performed. The heat treatment is performed, whereby extraction of oxygen, supply of hydrogen, or supply of nitrogen is promoted, and the resistance of part of the oxide 704 can be efficiently reduced.

As described above, when a low-resistance region is provided in the oxide 704, in the memory string or memory cell array where the memory cells are stacked, the series resistance between the memory cells can be reduced.

Figure 47A:
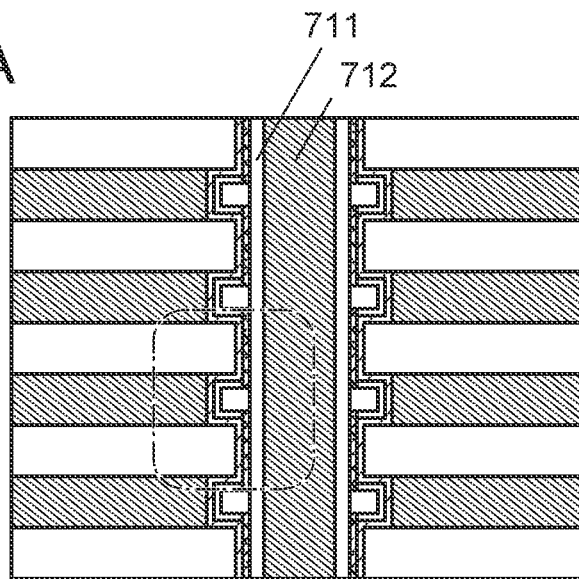
FIGS. 47A and 47B illustrate a manufacturing process of a semiconductor device of one embodiment of the present invention.
Figure 47B:
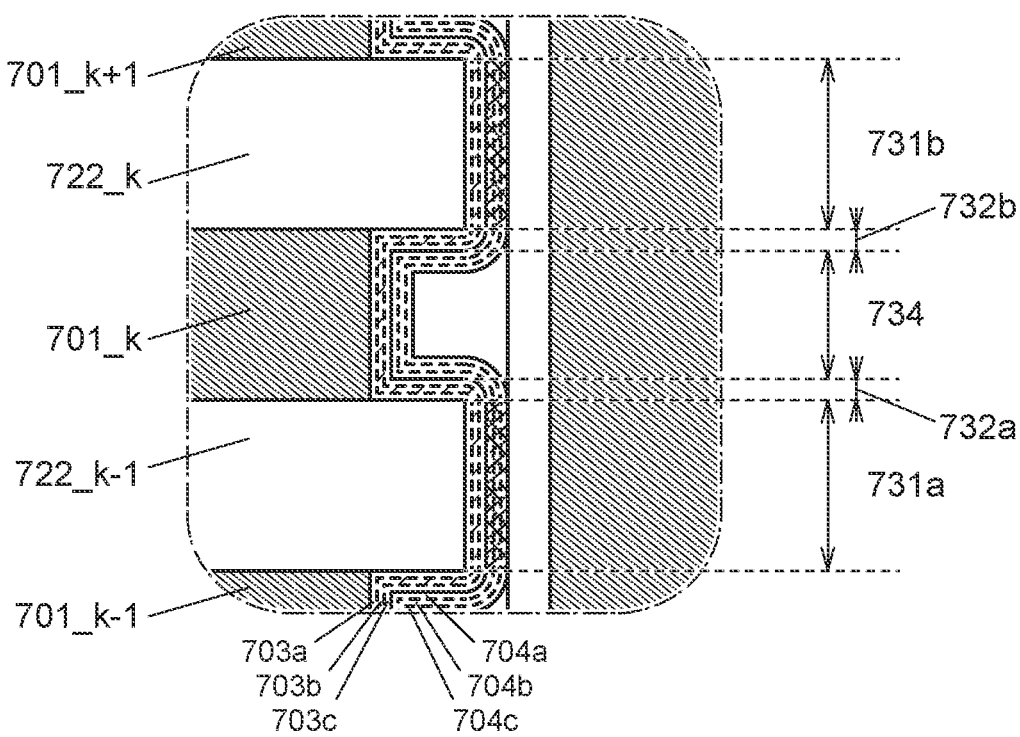

Next, the insulator 711 is formed on the inner side of the oxide 704 and the insulator 719, and the conductor 712 is formed on the inner side of the insulator 711 (see FIG. 47A). Note that the conductor 712 is not necessarily provided, and the inside of the oxide 704 may be filled with the insulator 711. In addition, FIG. 47B is an enlarged view of a portion surrounded by dashed-dotted line in FIG. 47A, and illustrates a cross section of the conductor 701_$k$−1 and the insulator 722_$k$−1 in the k−1-th stage, the conductor 701_$k$ and the insulator 722_$k$ in the k-th stage, and the conductor 701_$k$+1 in the k+i-th stage (k is an integer of 2 or more and m−1 or less).

Next, heat treatment may be performed. Through the heat treatment, oxygen is supplied from the insulator 719 to the oxide 704. In addition, impurities such as hydrogen are removed from the region 734, so that the region 734 is highly purified and the resistance of the region 734 is increased. The region 732 (the regions 732a and 732b) positioned between the region 731 and the region 734 serves as a junction region. The resistance of the region 732 is preferably lower than that of the region 734. Furthermore, the resistance of the region 732 may be substantially equal to or higher than that of the region 731.

The region 734 of the oxide 704 serves as a channel formation region of the memory transistor MT. The region 731a serves as one of a source and a drain of the memory transistor MT and the region 731b serves as the other. The conductor 701_k serves as a first gate of the memory transistor MT, the conductor 712 serves as a second gate, the insulator 703a serves as the first gate insulating layer, the insulator 703b serves as a charge accumulation layer, the insulator 703c serves as a tunnel insulating layer, and the insulator 711 serves as the second gate insulating layer. Note that the source or the drain of the memory transistor MT in which the conductor 701_k serves as a gate may serve as a drain or a source in the transistor positioned over or under the memory transistor MT. For example, when the region 731b serves as a source of a transistor in which the conductor 701_k serves as a gate, the region 731b may serve as a drain of a transistor in which the conductor 701_k+1 serves as a gate.

Through the above steps, the memory transistor MT functioning as a memory cell can be formed. By the above method, the memory transistors MT in a plurality of layers can be formed at a time without performing patterning for forming the memory transistors MT for each layer. Furthermore, in the case where a memory cell array is formed by the above method, even when the number of layers of the memory transistors MT is increased, the number of steps of patterning and etching of the memory transistors MT is not increased. In this manner, the number of manufacturing steps of the memory cell array can be reduced; thus, a semiconductor device with high productivity can be provided.

Figure 48A:
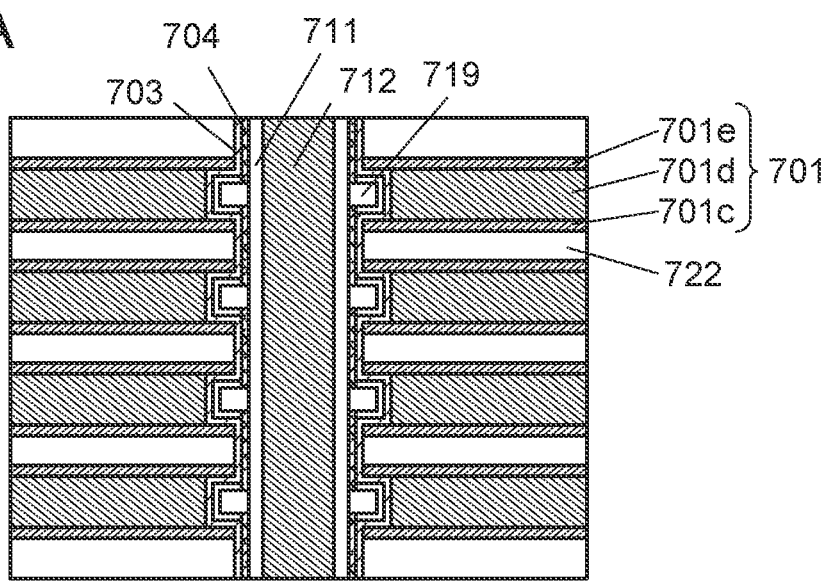
FIGS. 48A and 48B illustrate a manufacturing process of a semiconductor device of one embodiment of the present invention.

FIG. 48A illustrates another example of the conductor 701. In FIG. 48A, the conductor 701 has a three-layer structure of a conductor 701c, a conductor 701d, and a conductor 701e. The conductor 701d is more recessed than the side surfaces of the conductors 701c and 701e, and the conductor 701 is provided to surround the side surfaces, top surfaces, and bottom surfaces of the region 734 and the region 732 of the oxide 704 with the insulator 703 provided therebetween. Such a shape is preferably used, in which case an electric field from the conductor 701 can be applied to not only the region 734 but also the region 732, and the on-state characteristics of the memory transistor MT is improved.

To make the conductor 701d to be more recessed than the side surfaces of the conductors 701c and 701e, a material or etching conditions with which the etching rate of the conductor 701d in the isotropic etching is higher than those of the conductors 701c and 701e are used. For example, in the conditions where the conductor 701d is formed using tungsten and the conductors 701c and 701e are formed using conductive materials containing tantalum or titanium, or a nitride thereof, the conductor 701d may be selectively etched using a gas containing chlorine. Alternatively, in the conditions where the conductor 701d is formed using aluminum and the conductors 701c and 701e are formed using a conductive material containing tantalum or titanium, or a nitride thereof, wet etching may be selectively performed on the conductor 701d. Alternatively, in the conditions where the conductor 701d is formed using a material containing silicon, the conductors 701c and 701e are formed using a conductive material containing at least one of tantalum, titanium, and tungsten, or a nitride thereof, wet etching may be selectively performed on the conductor 701d.

Figure 48B:
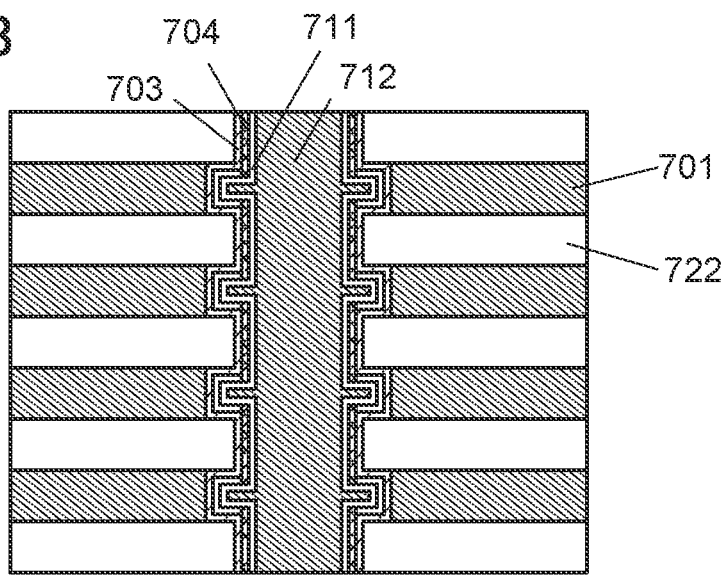

FIG. 48B illustrates another example of the conductor 712. In FIG. 48B, the insulator 719 is removed and the conductor 712 is provided to fill the region where the insulator 719 has been provided. With such a shape, an electric field from the conductor 712 can be effectively applied to the region 734 and the circuit operation of the memory device can be accurately performed as described later. In addition, the power consumption of the memory device can be reduced.

(Method for Manufacturing Memory Cell Array)

Next, one embodiment of a method for manufacturing a memory cell array of the present invention is described with reference to FIGS. 49A to 49C to FIGS. 67A to 67C. FIGS. 49A, 50A, 51A, 52A, 53A, 54A, 55A, 56A, 57A, 58A, 59A, 60A, 61A, 62A, 63A, 64A, 65A, 66A, and 67A are top views seen from the z axis direction, and FIGS. 49B, 50B, 51B, 52B, 53B, 54B, 55B, 56B, 57B, 58B, 59B, 60B, 61B, 62B, 63B, 64B, 65B, 66B, and 67B are cross-sectional views taken along dashed-dotted line A1-A2 in FIGS. 49A, 50A, 51A, 52A, 53A, 54A, 55A, 56A, 57A, 58A, 59A, 60A, 61A, 62A, 63A, 64A, 65A, 66A, and 67A. FIGS. 49C, 50C, 51C, 52C, 53C, 54C, 55C, 56C, 57C, 58C, 59C, 60C, 61C, 62C, 63C, 64C, 65C, 66C, and 67C are cross-sectional views taken along dashed-dotted line A1-A2 in FIGS. 49A, 50A, 51A, 52A, 53A, 54A, 55A, 56A, 57A, 58A, 59A, 60A, 61A, 62A, 63A, 64A, 65A, 66A, and 67A. FIGS. 59D and 62D are enlarged cross-sectional views of a portion surrounded by dashed-dotted lines in FIGS. 59B and 62B, respectively.

Figure 49A:
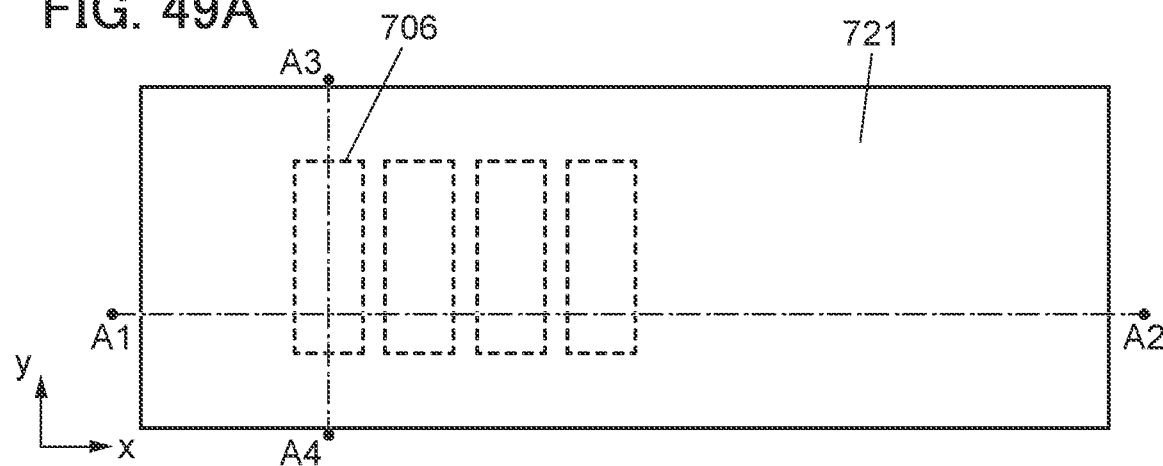
FIGS. 49A to 49C illustrate a manufacturing process of a semiconductor device of one embodiment of the present invention.
Figure 49B:
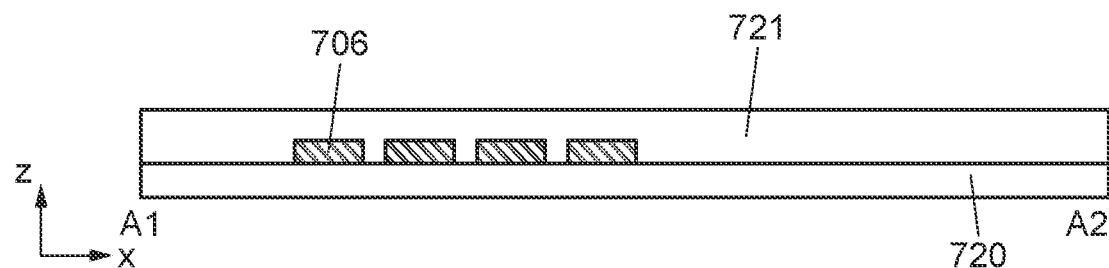
Figure 49C:
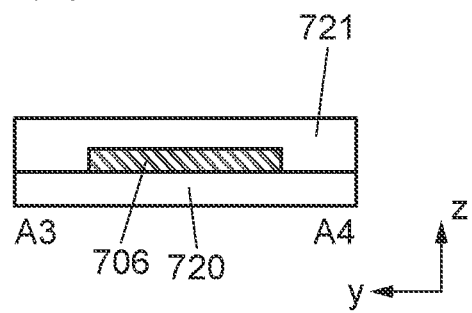
Figure 50A:
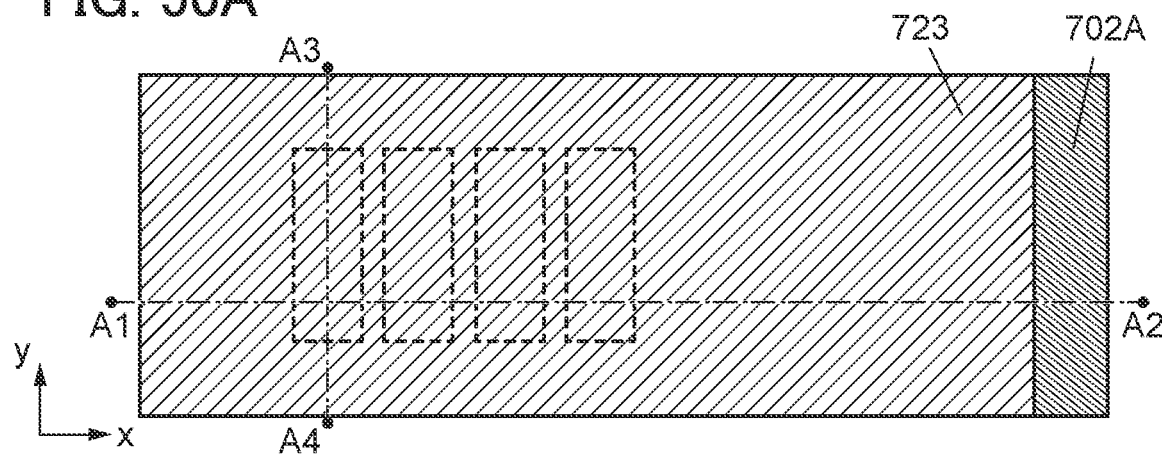
FIGS. 50A to 50C illustrate a manufacturing process of a semiconductor device of one embodiment of the present invention.
Figure 50B:
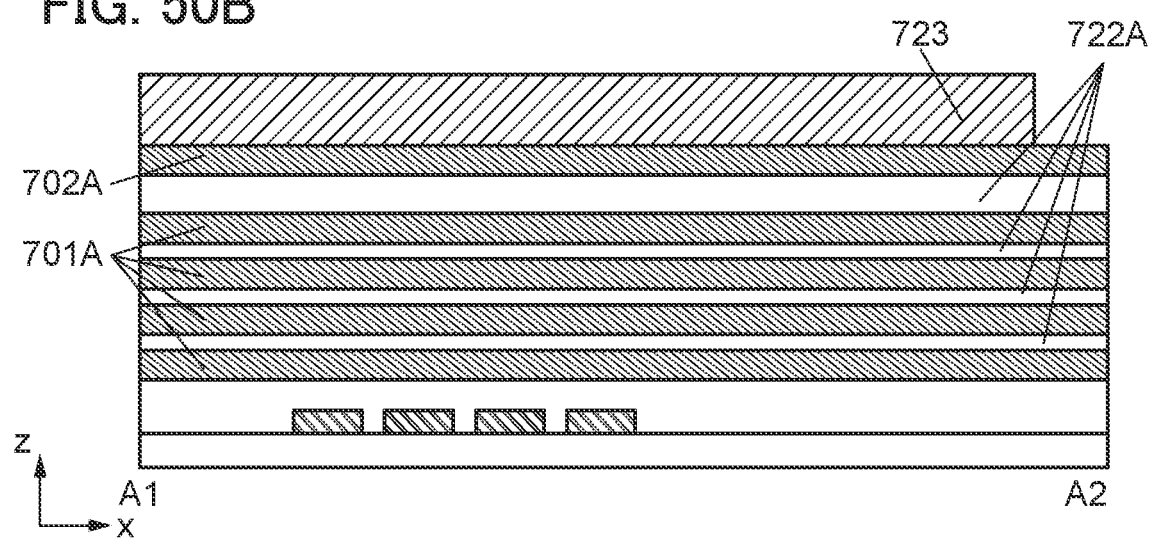
Figure 50C:
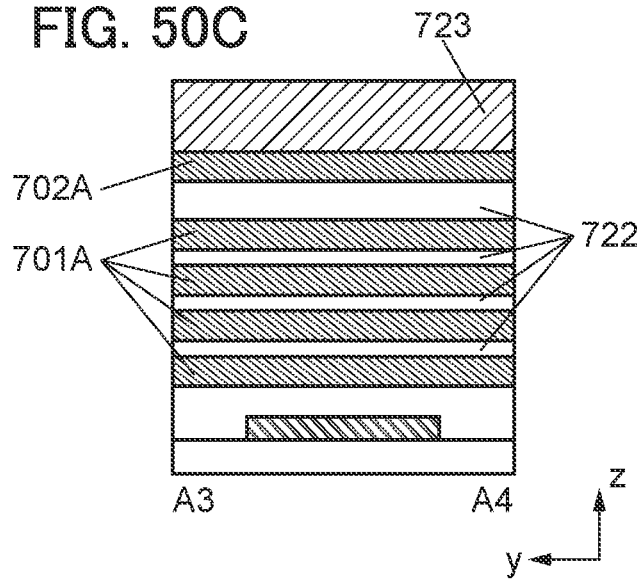

First, the conductor 706 is formed over the base 720 having an insulating surface, and the insulator 721 is formed to cover the conductor 706 (see FIGS. 49A to 49C).

A conductive film is formed and processed by a lithography method, whereby the conductor 706 is formed. Note that the method for forming the conductor 706 and the insulator 721 is not limited thereto. The insulator 721 may be formed over the base 720 and an unnecessary portion of the insulator 721 may be removed to form a groove or an opening, and the conductor 706 may be embedded in the groove or the opening. A formation method of such a conductor is referred to as a damascene method (a single damascene method or a dual damascene method) in some cases. When an insulating film is further formed over the conductor 706 formed by the damascene method and the insulator 721, the structure illustrated in FIGS. 49A to 49C can be obtained.

The conductor 706 and the insulator 721 can be formed by a sputtering method, a CVD method, an MBE method, a PLD method, an ALD method, or the like.

The processing can be performed by a dry etching method or a wet etching method. A dry etching method is suitable for microfabrication.

As the conductive film to be the conductor 706, a conductive film containing a metal element is preferably formed by a sputtering method. Alternatively, the conductive film can be formed by a CVD method.

The surface of the insulator 721 is preferably subjected to planarization treatment as needed. As the planarization treatment, a chemical mechanical polishing (CMP) method or a reflow method can be used.

Conductive films 701A and insulating films 722A are alternately stacked over the conductor 706 and the insulator 721. This embodiment shows an example in which the conductive film 701A is formed over the insulator 721 and the insulating film 722A is formed over the conductive film 701A; however, the order of the formation is not limited thereto. The insulating film 722A may be formed over the insulator 721, and the conductive film 701A may be formed over the insulating film 722A. A CVD method can be used for the formation of the conductive film 701A and the insulating film 722A. Alternatively, a sputtering method may be used.

Although four layers of the conductive films 701A and four layers of the insulating films 722A are formed in this embodiment, the number of stacked layers is not limited thereto. Five or more layers of the conductive films 701A and the insulating films 722A may be formed depending on the required performance of a semiconductor device. For example, the number of conductive films 701A and the number of insulating films 722A may each be 32, 64, 128, or 200 or more.

A conductive film 702A is formed over the uppermost layer of the insulating film 722A. A mask 723 is formed over the conductive film 702A (see FIGS. 50A to 50C). The conductive film 702A can be formed using a method and a material similar to those of the conductive film 701A. Note that the conductive film 702A may be formed by the same method as or a method different from that of the conductive film 701A. The conductive film 702A may be formed using the same material as or a material different from that of the conductive film 701A.

Figure 51A:
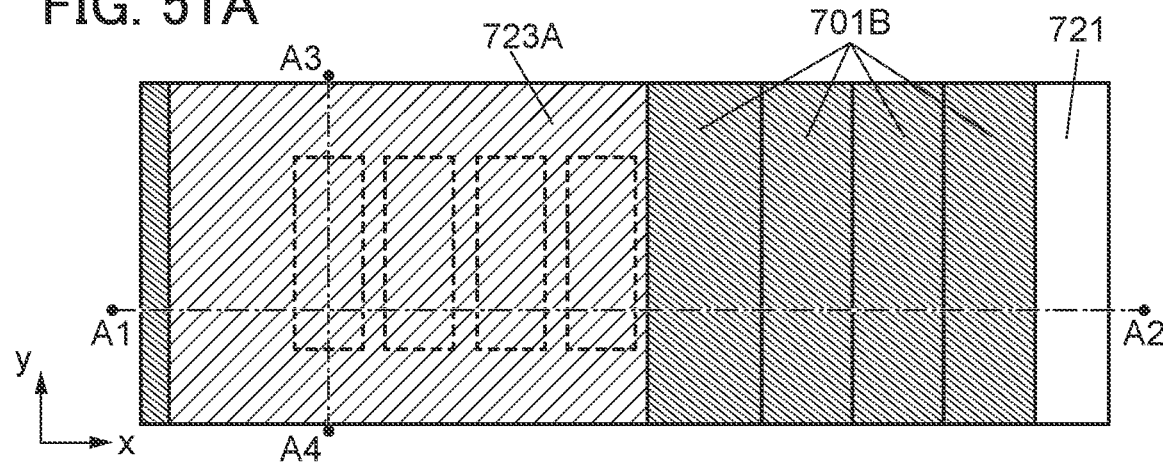
FIGS. 51A to 51C illustrate a manufacturing process of a semiconductor device of one embodiment of the present invention.
Figure 51B:
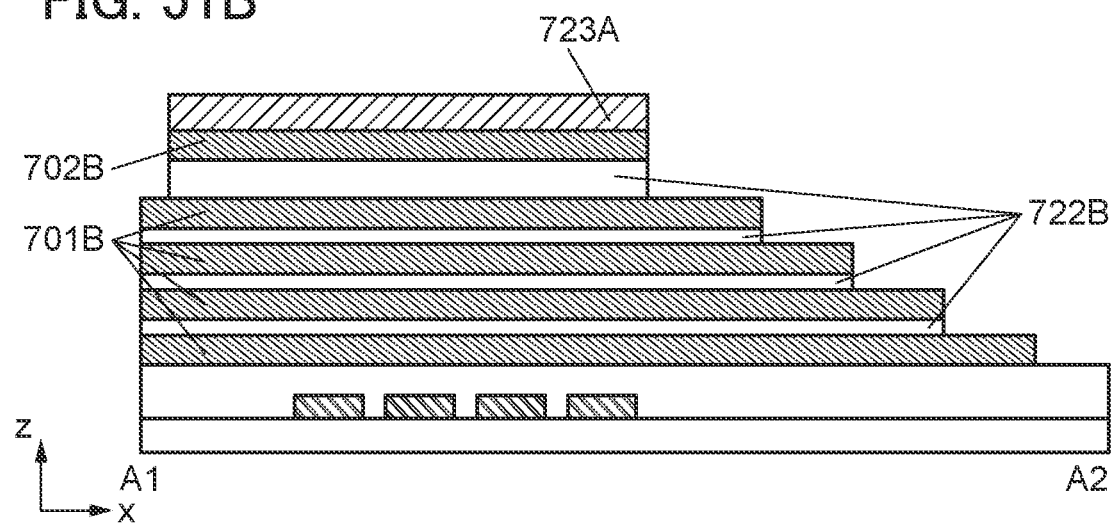
Figure 51C:
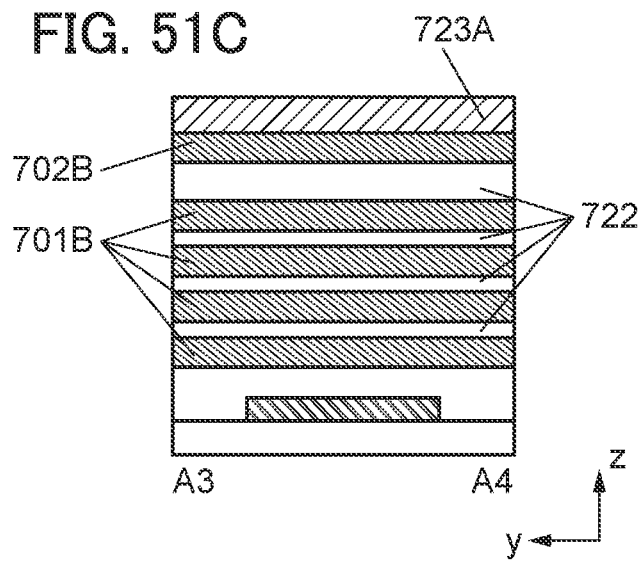
Figure 52A:
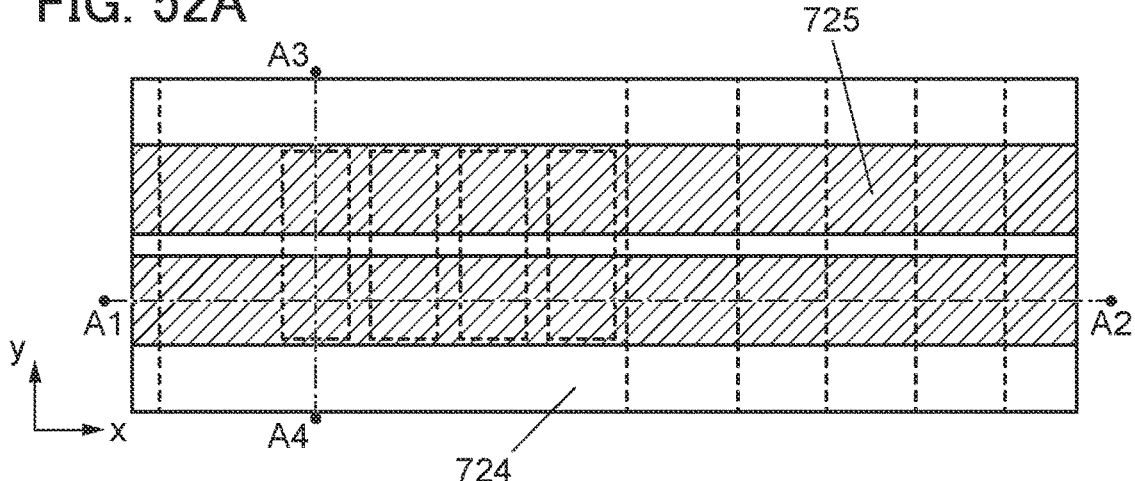
FIGS. 52A to 52C illustrate a manufacturing process of a semiconductor device of one embodiment of the present invention.
Figure 52B:
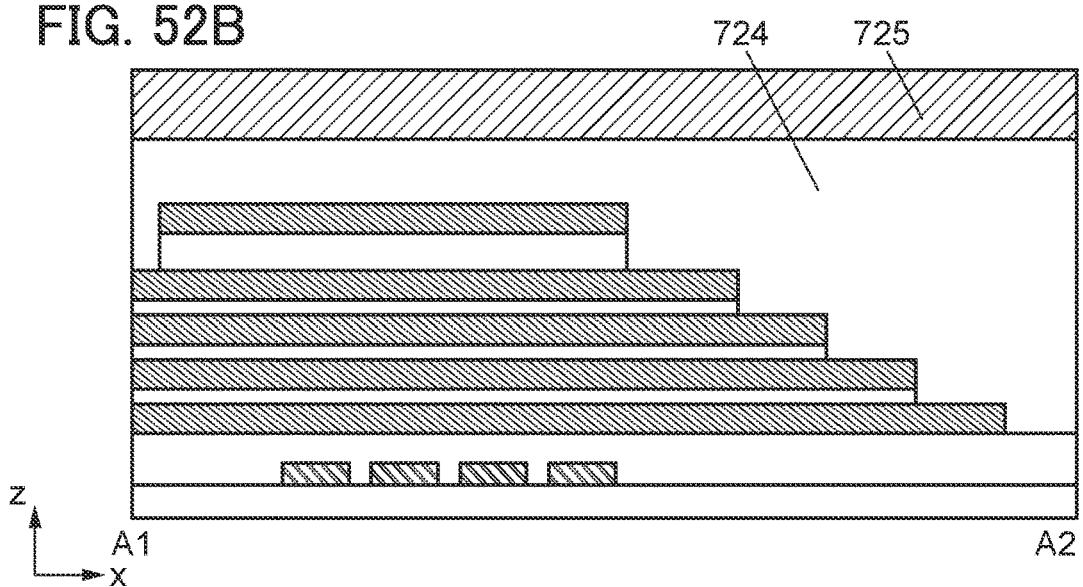
Figure 52C:
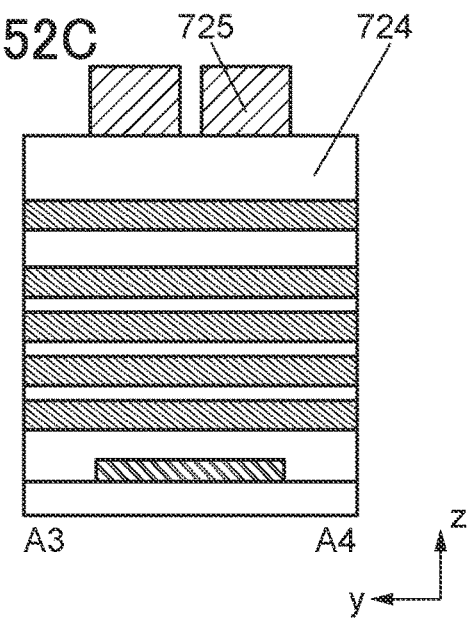
Figure 53A:
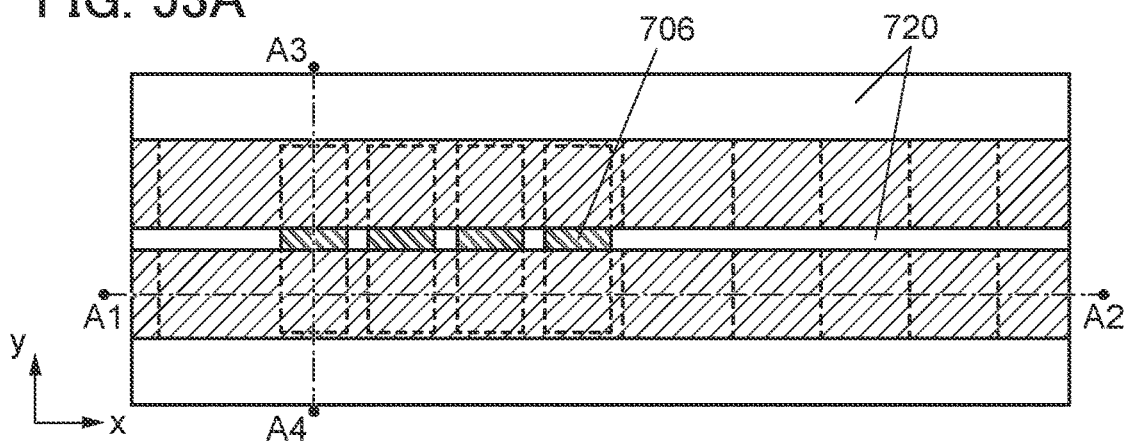
FIGS. 53A to 53C illustrate a manufacturing process of a semiconductor device of one embodiment of the present invention.
Figure 53B:
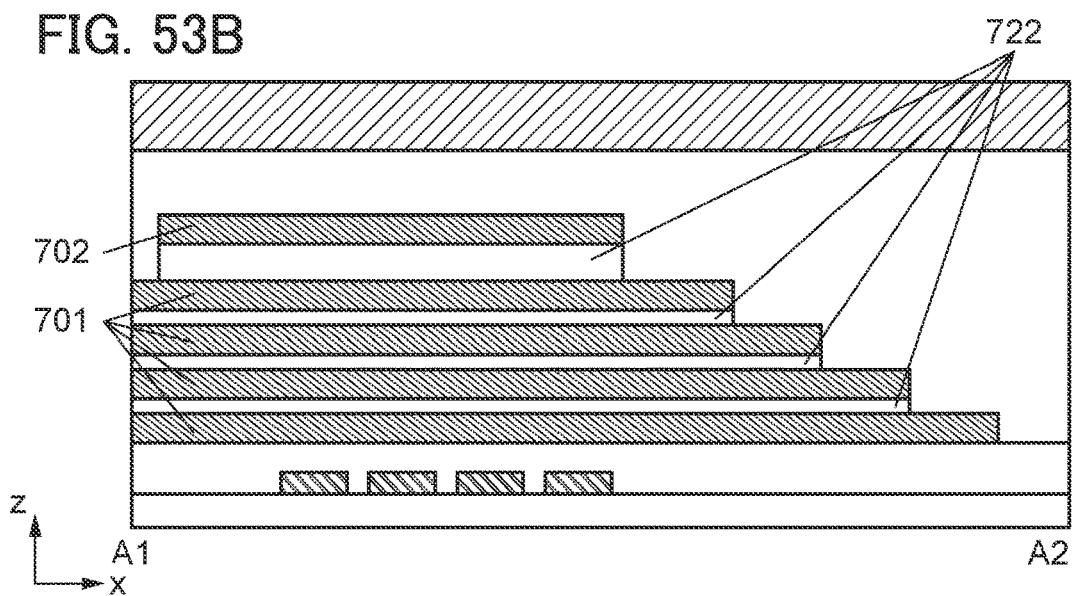
Figure 53C:
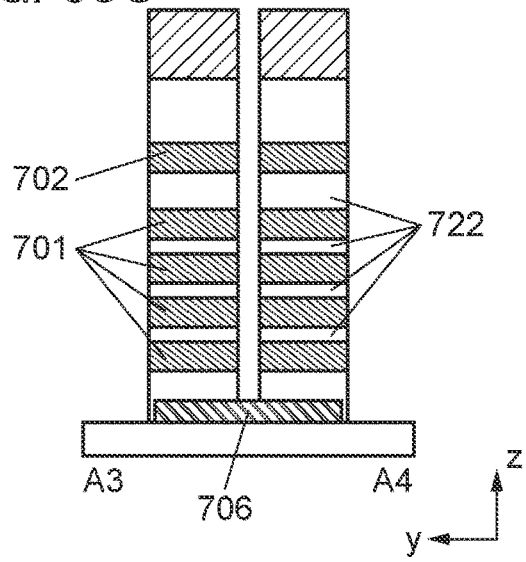
Figure 54A:
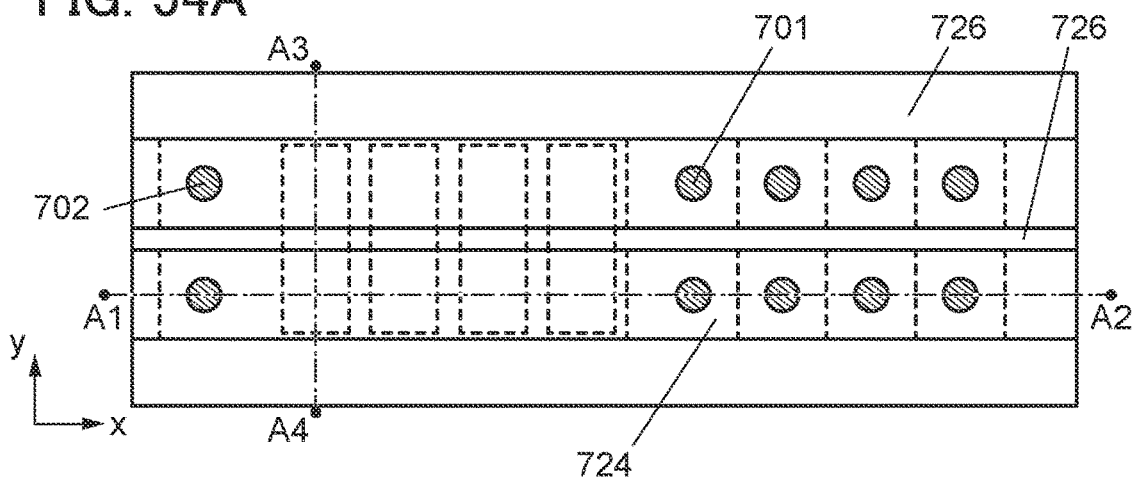
FIGS. 54A to 54C illustrate a manufacturing process of a semiconductor device of one embodiment of the present invention.
Figure 54B:
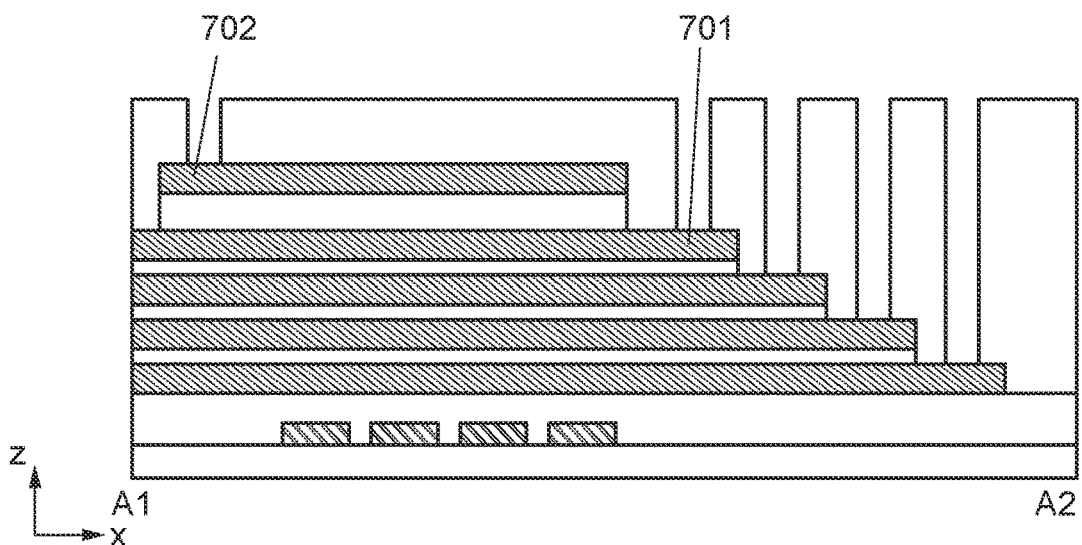
Figure 54C:
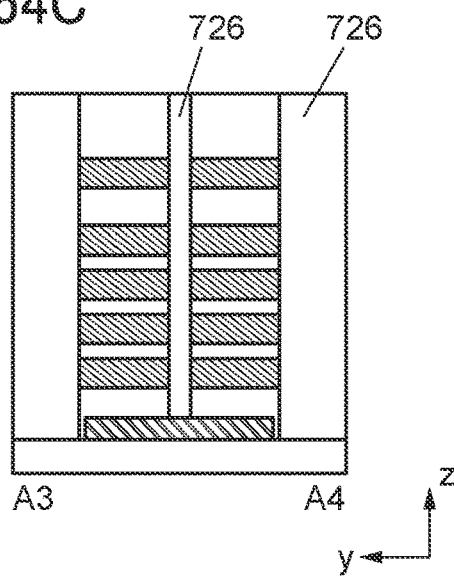

Next, the conductive film 702A, the conductive film 701A, and the insulating film 722A are processed to form a step-like conductive film 701B, a conductive film 702B, and an insulating film 722B illustrated in FIG. 51B. In the processing of the conductive film 702A, the conductive film 701A, and the insulating film 722A, etching of the conductive film 702A, the conductive film 701A, and the insulating film 722A and slimming of the mask 723 are alternately performed, whereby the step-like conductive film 701B, the conductive film 702B, and the insulating film 722B can be formed. By the processing of the conductive film 702A, the conductive film 701A, and the insulating film 722A, the mask 723 is reduced in width and thickness to be a mask 723A (see FIGS. 51A to 51C).

Then, the mask 723A is removed, and the insulator 724 is formed. The insulator 724 can be formed by a CVD method. The insulator 724 is preferably subjected to planarization treatment by a CMP method or a reflow method. A mask 725 is formed over the insulator 724. The mask 725 is formed over the planarized insulator 724, whereby the accuracy of lithography can be improved (see FIGS. 52A to 52C).

Then, the insulator 724, the conductive film 702B, the conductive film 701B, the insulating film 722B, and the insulator 721 are processed with the mask 725. By the processing, the conductor 701 serving as the gate of the memory transistor MT and electrically connected to the word line, and the conductor 702 serving as the gate of the selection transistor are formed. In addition, the insulating film 722B is processed into the insulator 722 (see FIGS. 53A to 53C).

Then, the mask 725 is removed. Next, the insulator 726 is formed to be embedded in the portions in the insulator 724, the conductive film 702B, the conductive film 701B, the insulating film 722B, and the insulator 721, which are removed by the above processing. The insulator 726 can be formed by a CVD method or an ALD method. It is particularly preferable to employ an ALD method, in which case a film with a uniform thickness can be formed in a groove or an opening having a large aspect ratio. Alternatively, the insulator 726 may be formed by a combination of an ALD method and a CVD method. The insulator 726 is preferably subjected to planarization treatment by a CMP method or a reflow method. When the planarization treatment is performed by a CMP method, the insulator 726 may be polished until the surface of the insulator 724 is exposed. The insulator 724 and the insulator 726 may be polished together. In this case, the thickness of the insulator 724 becomes small.

Next, the insulator 724 is processed by a lithography method to form first openings so that the conductors 701 and 702 are exposed. The first opening is formed to expose each of the conductors 701 formed in a step-like shape (see FIGS. 54A to 54C).

Figure 55A:
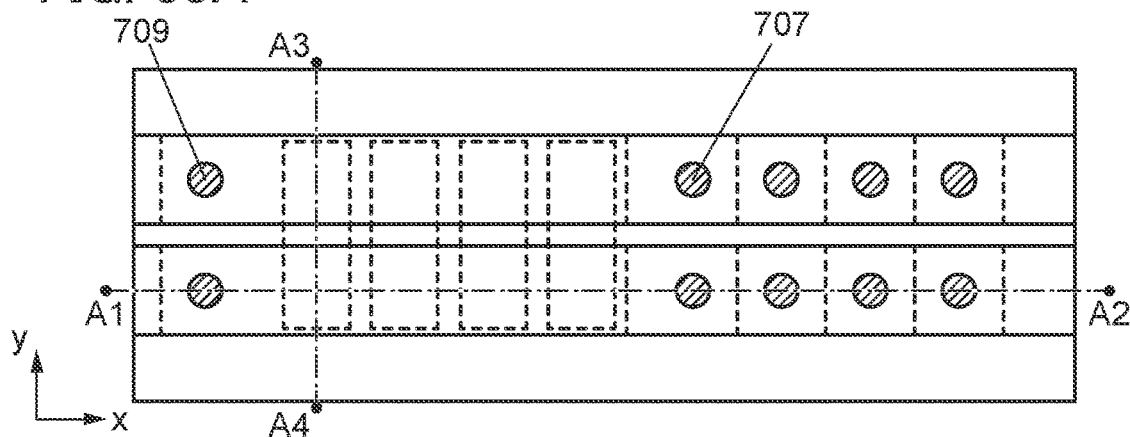
FIGS. 55A to 55C illustrate a manufacturing process of a semiconductor device of one embodiment of the present invention.
Figure 55B:
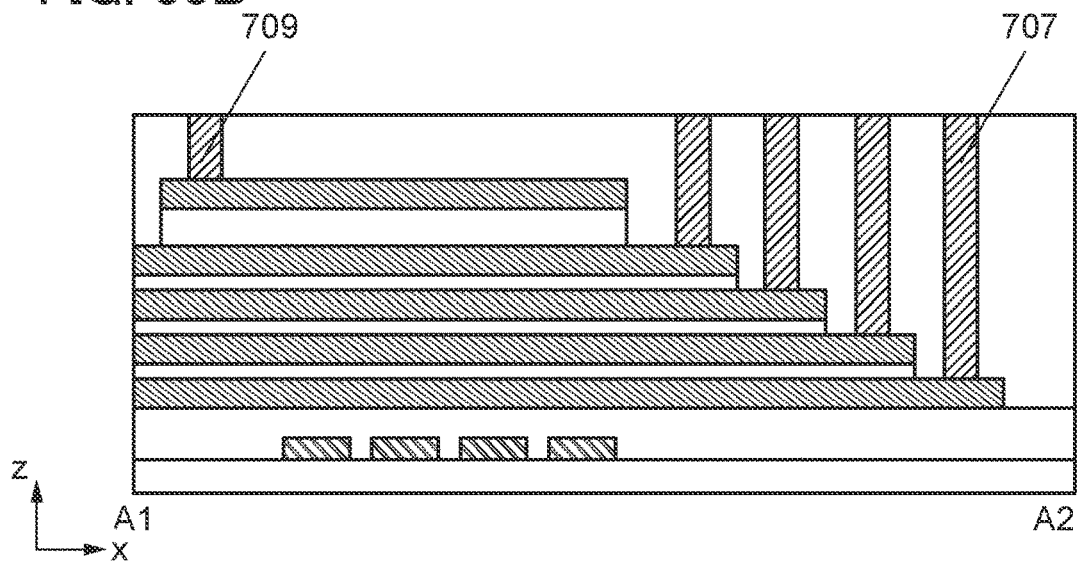
Figure 55C:
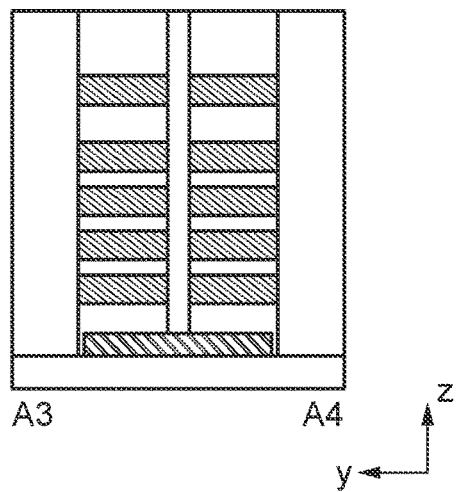

Next, the conductor 707 electrically connected to the conductor 701 and the conductor 709 electrically connected to the conductor 702 are formed to fill the first opening (see FIGS. 55A to 55C). The conductors 707 and 709 can be formed by a CVD method or an ALD method. It is particularly preferable to employ an ALD method, in which case a film with a uniform thickness can be formed in a groove or an opening having a large aspect ratio. Alternatively, the conductors 707 and 709 may be formed by a combination of an ALD method and a CVD method. The conductors 707 and 709 may each have a stacked-layer structure of a plurality of layers. The conductors 707 and 709 can be formed in such a manner that conductive films to be the conductors 707 and 709 are formed over the insulator 724 and in the first opening, and unnecessary portions of the conductive films are removed by CMP and the like.

Figure 56A:
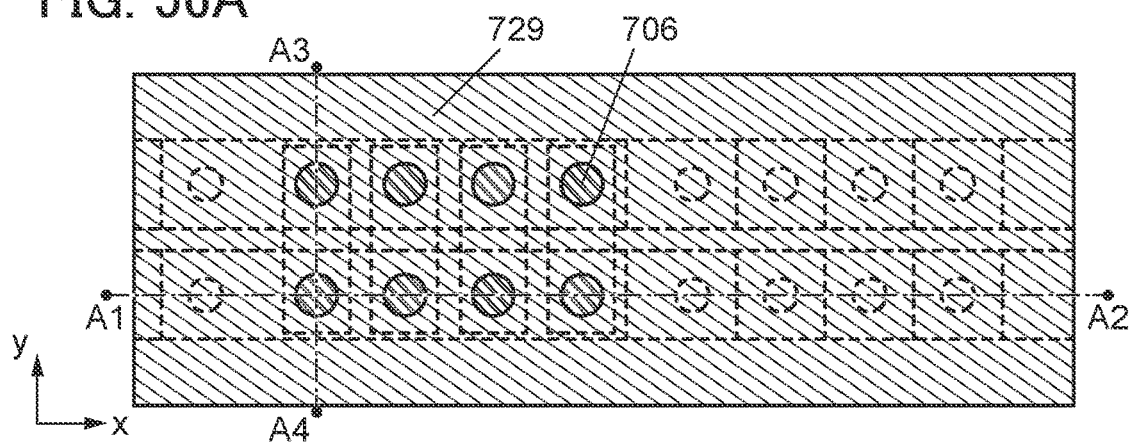
FIGS. 56A to 56C illustrate a manufacturing process of a semiconductor device of one embodiment of the present invention.
Figure 56B:
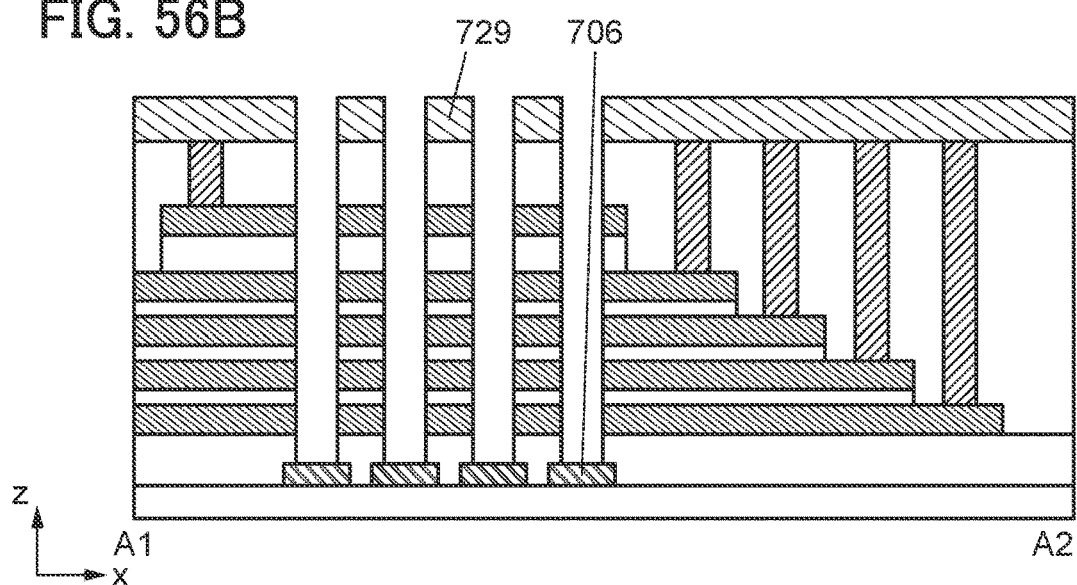
Figure 56C:
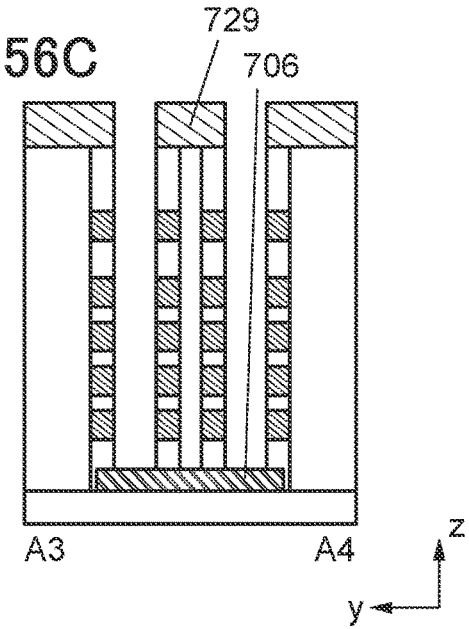

Next, a mask 729 is formed over the insulator 724 and the insulator 726, the insulator 724, the conductor 702, the conductor 701, the insulator 722, and the insulator 721 are processed by a lithography method, and second openings are formed to expose the conductor 706 (see FIGS. 56A to 56C).

Figure 57A:
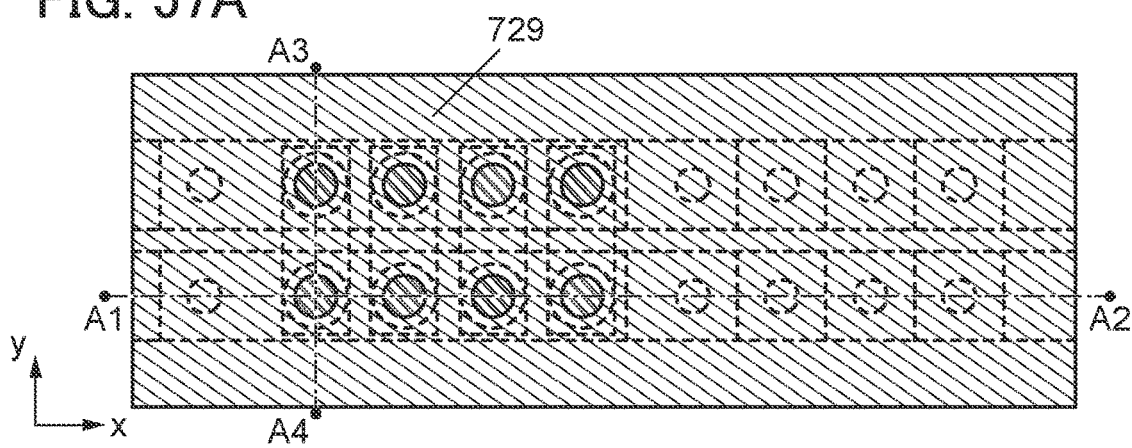
FIGS. 57A to 57C illustrate a manufacturing process of a semiconductor device of one embodiment of the present invention.
Figure 57B:
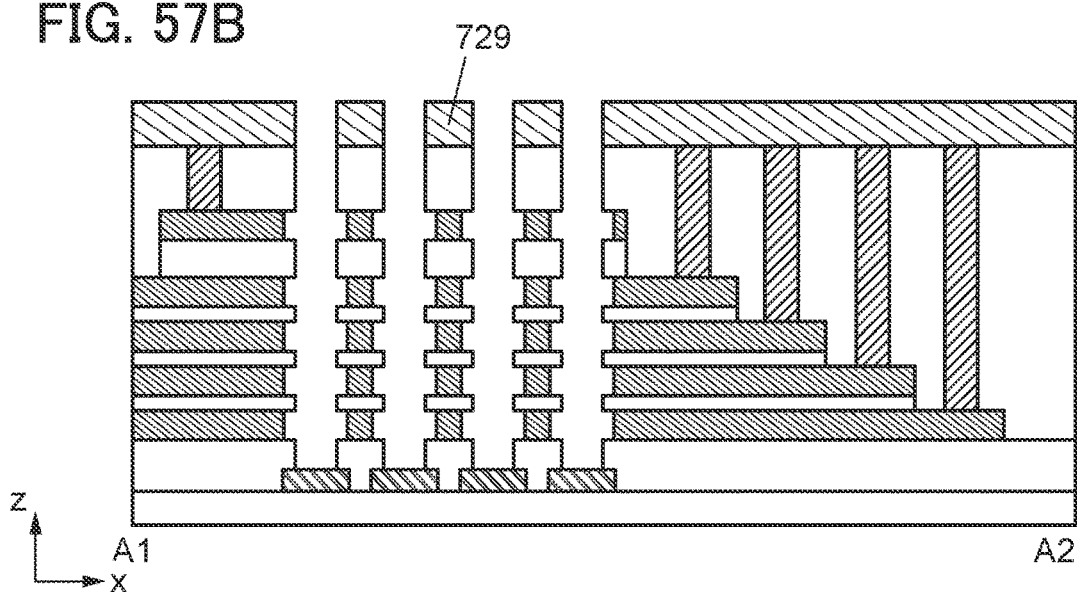
Figure 57C:
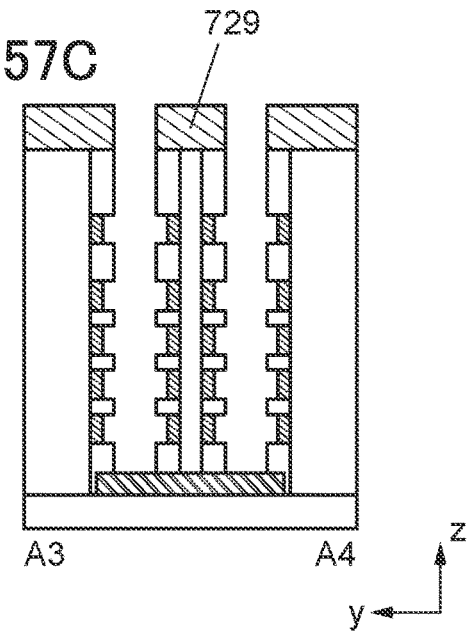

Next, the conductors 701 and 702 are subjected to isotropic etching to make the diameter of the opening in the conductors 701 and 702 large (see FIGS. 57A to 57C). By this treatment, the diameter of the opening in the conductors is larger than that of the opening in the insulators 721, 722, and 724. It can be said that the conductors are more recessed than the side surface of the insulator (the insulator 721, 722, or 724) positioned over or under the conductors. Such processing can be performed by isotropic etching using dry etching with a gas, a radical, plasma, or the like, or by isotropic etching using wet etching with a liquid. A liquid used for wet etching may be referred to as an etchant. In the case where isotropic etching is performed using dry etching, a gas, a radical, plasma, or the like containing at least one of chlorine, bromine, and fluorine can be used. In this embodiment, the isotropic etching is performed without removing the mask 729; however, the present invention is not limited to this example. The isotropic etching may be performed after removing the mask 729.

Figure 58A:
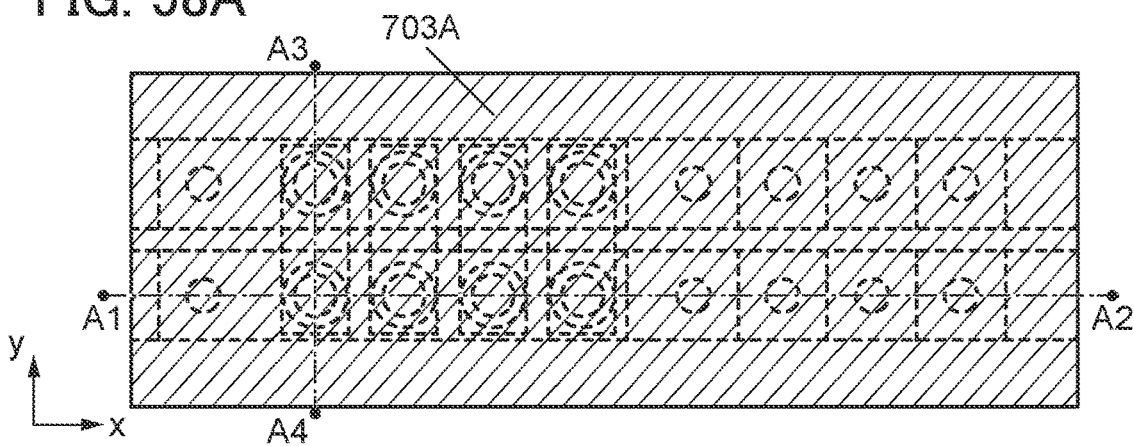
FIGS. 58A to 58C illustrate a manufacturing process of a semiconductor device of one embodiment of the present invention.
Figure 58B:
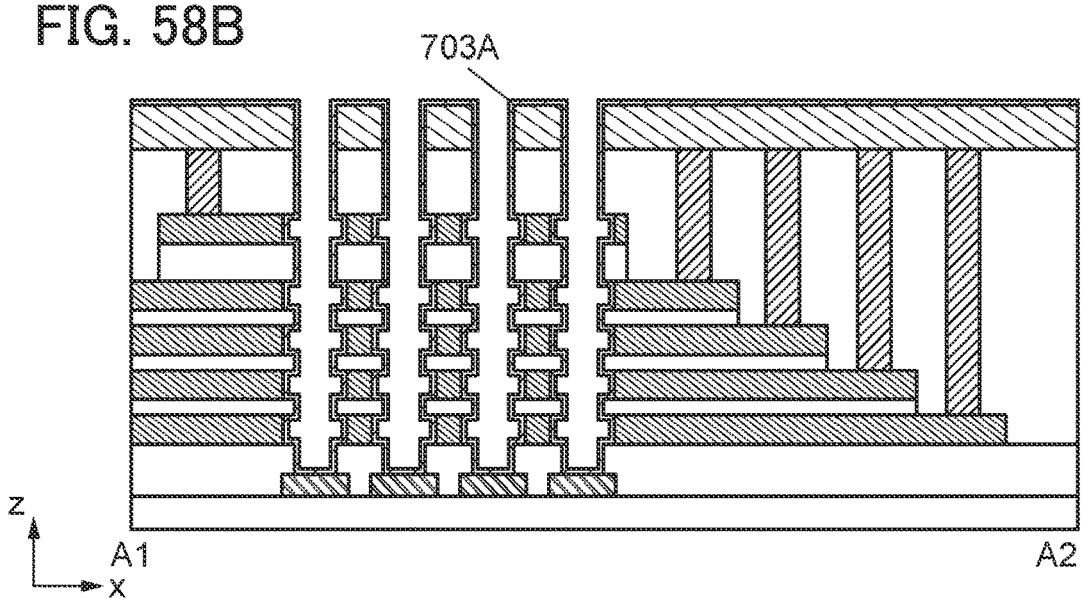
Figure 58C:
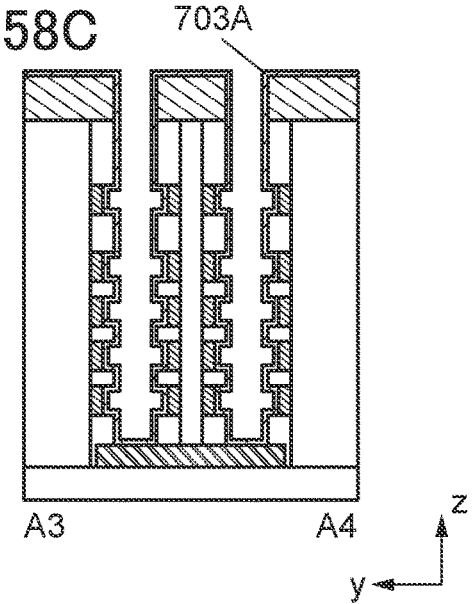
Figure 59A:
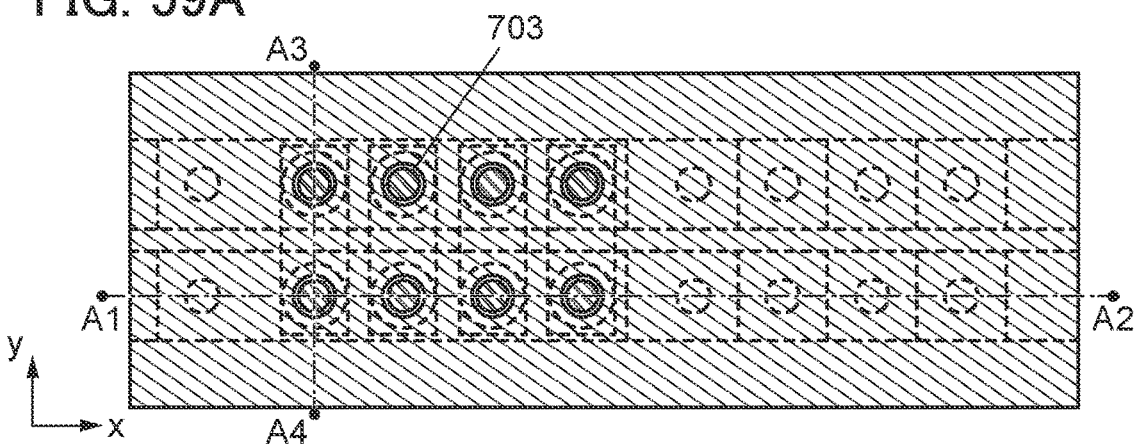
FIGS. 59A to 59D illustrate a manufacturing process of a semiconductor device of one embodiment of the present invention.
Figure 59B:
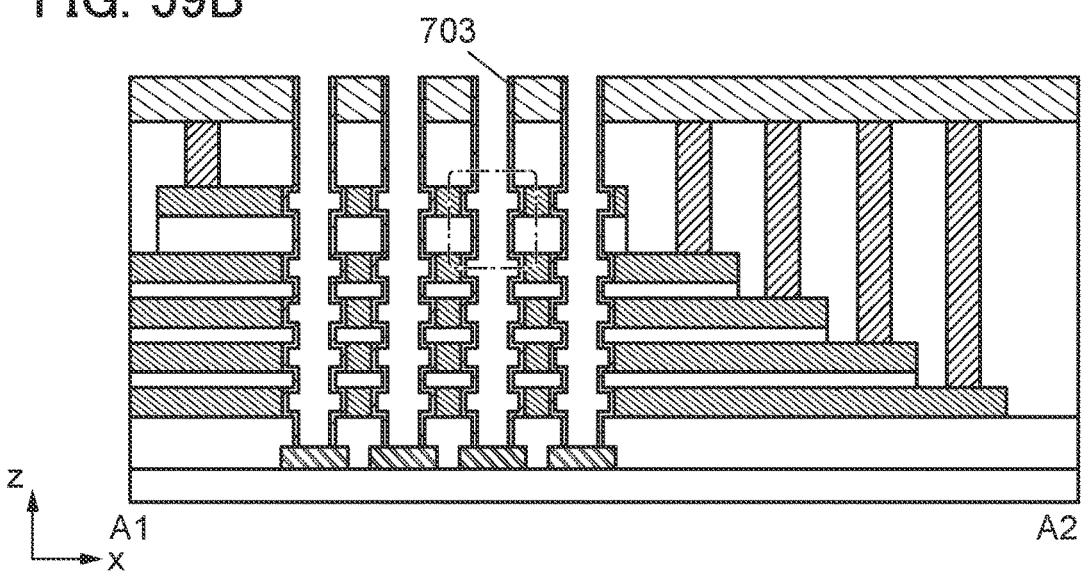
Figure 59C:
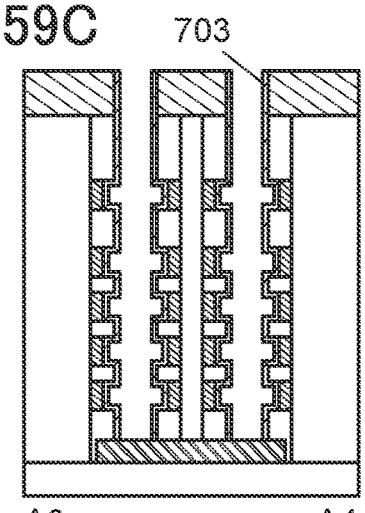
Figure 59D:
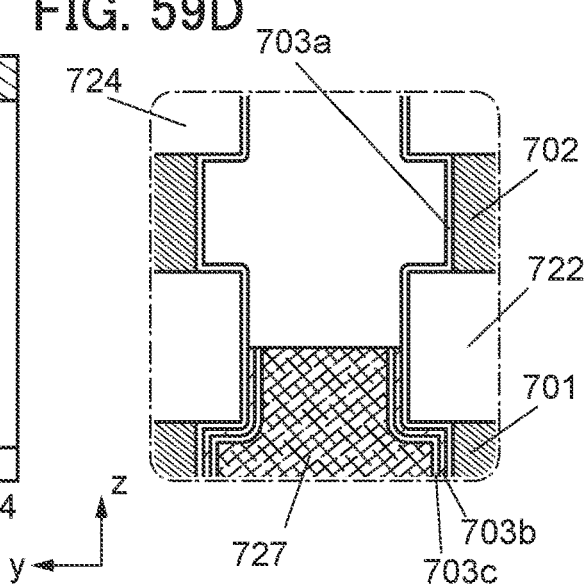

Next, an insulating film 703A to be the insulator 703 is formed to cover the insulator 724, the insulator 726, and the mask 729, and in the second opening (see FIGS. 58A to 58C). Note that, although not illustrated in FIGS. 58A to 58C, the insulating film 703A may be formed by stacking an insulating film to be the insulator 703a, an insulating film to be the insulator 703b, and an insulating film to be the insulator 703c in this order. The insulating film 703A can be formed by a CVD method or an ALD method. It is particularly preferable to employ an ALD method, in which case a film with a uniform thickness can be formed in a groove or an opening having a large aspect ratio. Alternatively, the insulating film 703A may be formed by a combination of an ALD method and a CVD method. The insulating film to be the insulator 703a, the insulating film to be the insulator 703b, and the insulating film to be the insulator 703c may be formed using the same deposition apparatus or different deposition apparatuses. Note that the insulating film to be the insulator 703c is preferably formed to be thinner than the insulating film to be the insulator 703a, in which case the insulator 703c is thinner than the insulator 703a.

The insulating film 703A formed by the above method can have high coverage and can be formed in the recessions of the conductors 701 and 702. That is, the insulating film 703A can be formed in contact with not only the side surfaces of the conductors 701 and 702 and the side surfaces of the insulators 721, 722, and 724, but also part of the top surfaces and part of the bottom surfaces of the insulators 721, 722, and 724.

Then, the insulating film 703A formed on the bottom portion of the second opening is removed, so that the insulator 703 is obtained. Anisotropic etching is preferably used to remove the insulating film 703A. Here, the insulating film 703A over the mask 729 is also removed; thus, the insulator 703 is provided only on the side wall of the second opening (see FIGS. 59A to 59D). The conductor 706 is exposed again by removing the insulating film 703A on the bottom portion of the second opening.

Here, as illustrated in FIG. 59D, the insulators 703b and 703c of the insulator 703 that are positioned in the upper portion of the second opening may be removed. FIG. 59D is an enlarged view of a portion surrounded by dashed-dotted line in FIG. 59B. First, the material 727 (also referred to as a sacrifice layer) which can be easily removed in a later step is formed to be embedded in the second opening, and the material 727 is removed by etching or the like to a desired depth in the second opening. The insulators 703c and 703b exposed by the etching are removed in this order, whereby only the insulator 703a can be used as the insulator 703 positioned in the horizontal direction (x-y direction) of the conductor 702. In this case, the gate insulating film of each of the selection transistors SST and SDT include the insulator 703a. After the insulators 703c and 703b are removed, the material 727 is removed.

Figure 60A:
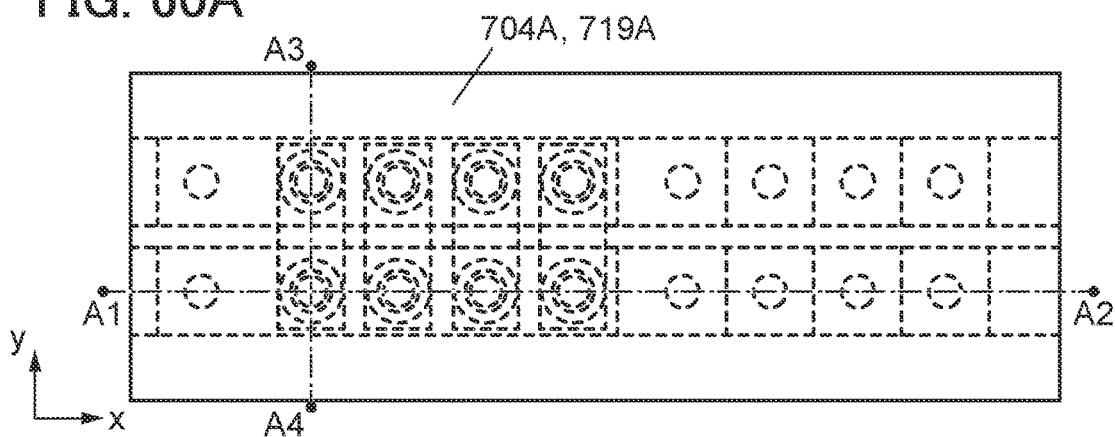
FIGS. 60A to 60C illustrate a manufacturing process of a semiconductor device of one embodiment of the present invention.
Figure 60B:
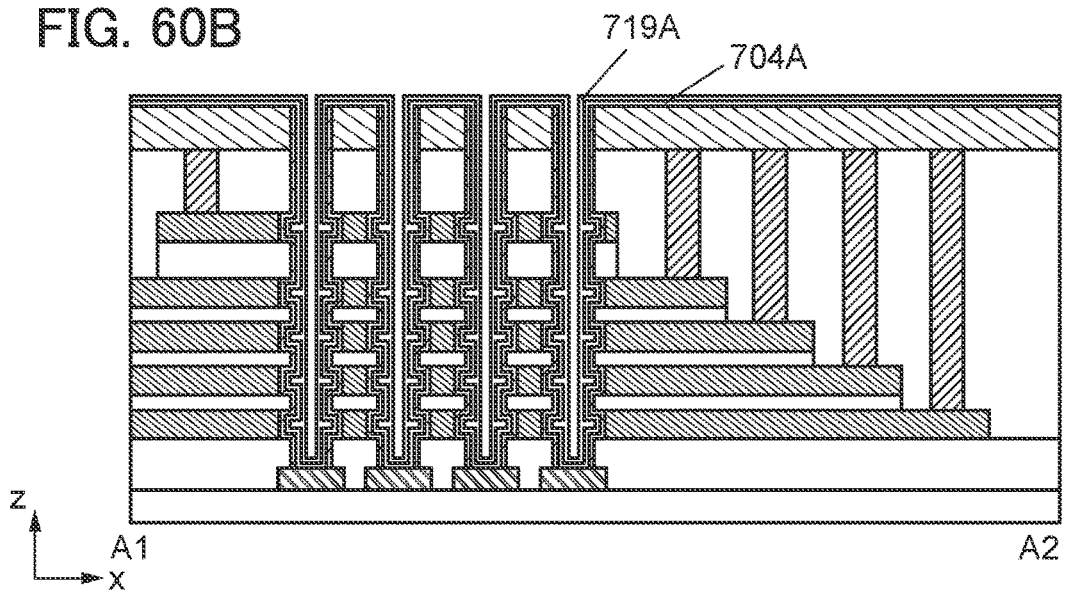
Figure 60C:
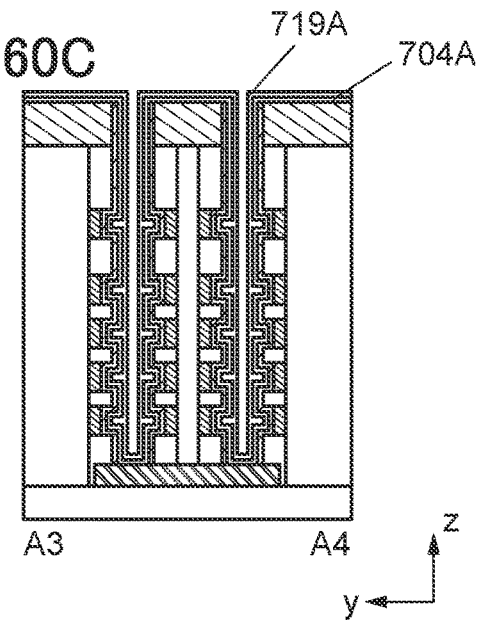

Next, an oxide film 704A to be the oxide 704 is formed in the second opening (see FIGS. 60A to 60C). The oxide film 704A can be formed in such a manner that an oxide film to be the oxide 704a, an oxide film to be the oxide 704b, and an oxide film to be the oxide 704c are formed in this order over the mask 729 and in the second opening. The oxide film 704A is formed along the recessions of the conductors 701 and 702 with the insulator 703 provided therebetween. Part of the oxide film 704A is formed in contact with the conductor 706.

The oxide film to be the oxide 704a, the oxide film to be the oxide 704b, and the oxide film to be the oxide 704c can be formed by a CVD method or an ALD method. It is particularly preferable to employ an ALD method, in which case a film with a uniform thickness can be formed in a groove or an opening having a large aspect ratio. Alternatively, the oxide films may be formed by a combination of an ALD method and a CVD method. Alternatively, the oxide films may be formed using different deposition methods or different deposition apparatuses.

Next, the insulating film 719A is formed in the second opening (see FIGS. 60A to 60C). The insulating film 719A is formed to fill at least the recessions of the conductors 701 and 702 with the insulator 703 and the oxide film 704A provided therebetween, and does not need to fill the second opening entirely. The insulating film 719A can be formed by a CVD method or an ALD method. It is particularly preferable to employ an ALD method, in which case a film with a uniform thickness can be formed in a groove or an opening having a large aspect ratio. Alternatively, the insulating film 719A may be formed by a combination of an ALD method and a CVD method.

Figure 61A:
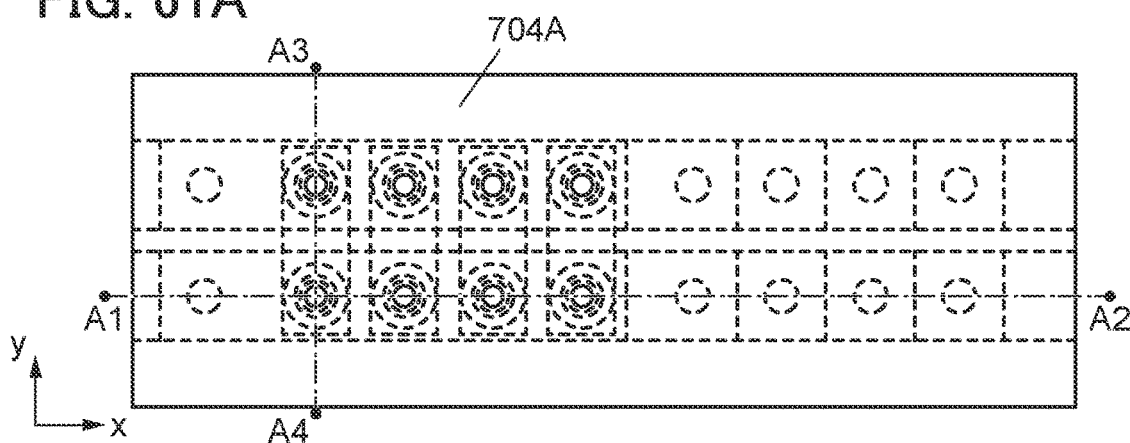
FIGS. 61A to 61C illustrate a manufacturing process of a semiconductor device of one embodiment of the present invention.
Figure 61B:
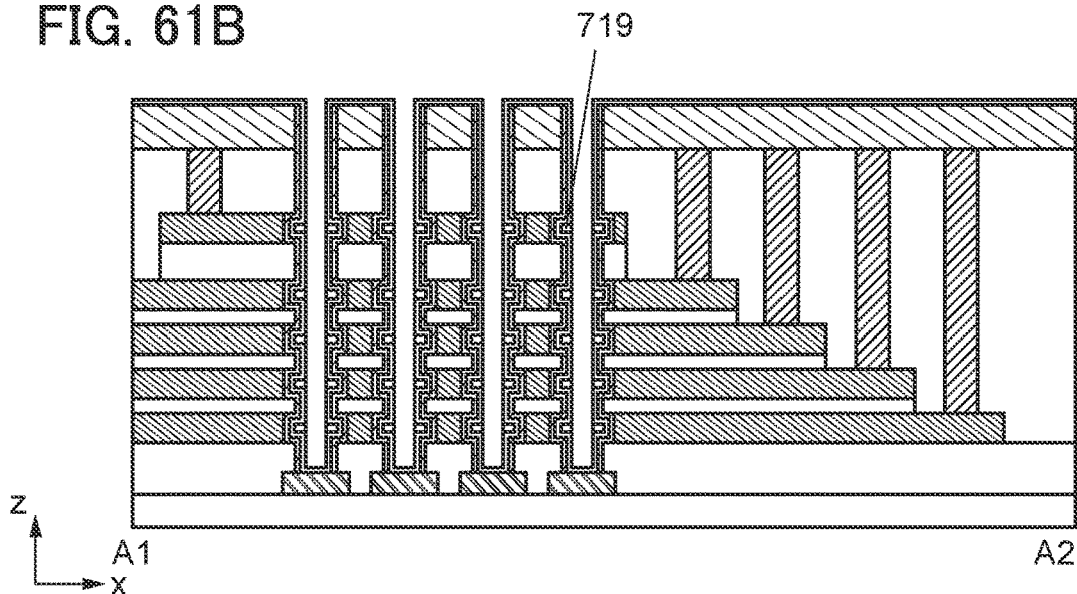
Figure 61C:
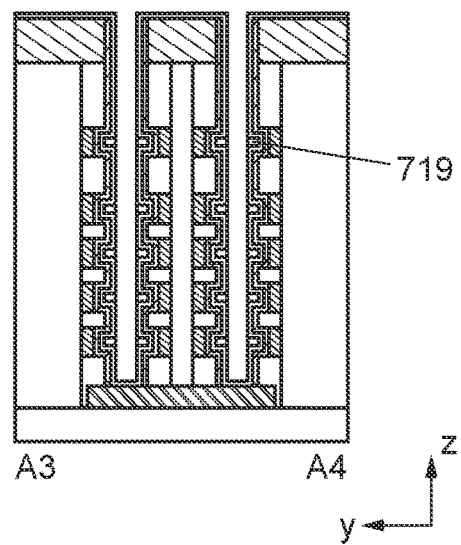
Figure 62A:
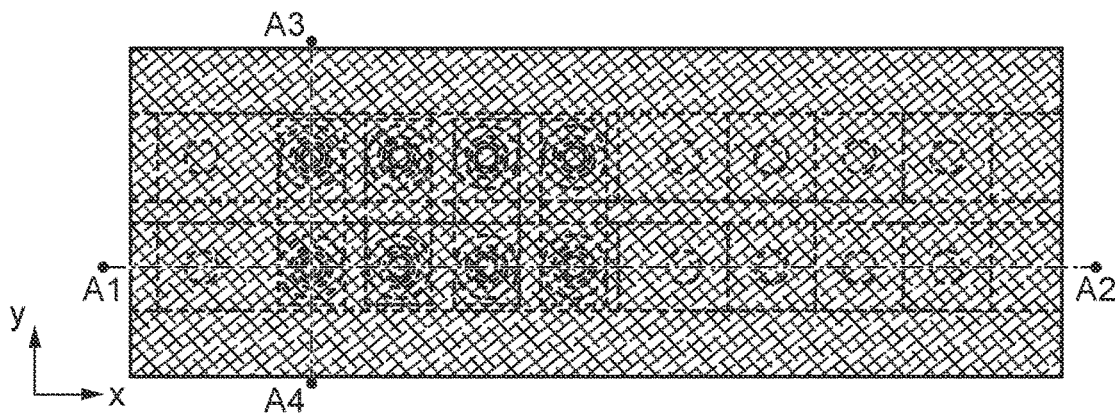
FIGS. 62A to 62D illustrate a manufacturing process of a semiconductor device of one embodiment of the present invention.
Figure 62B:
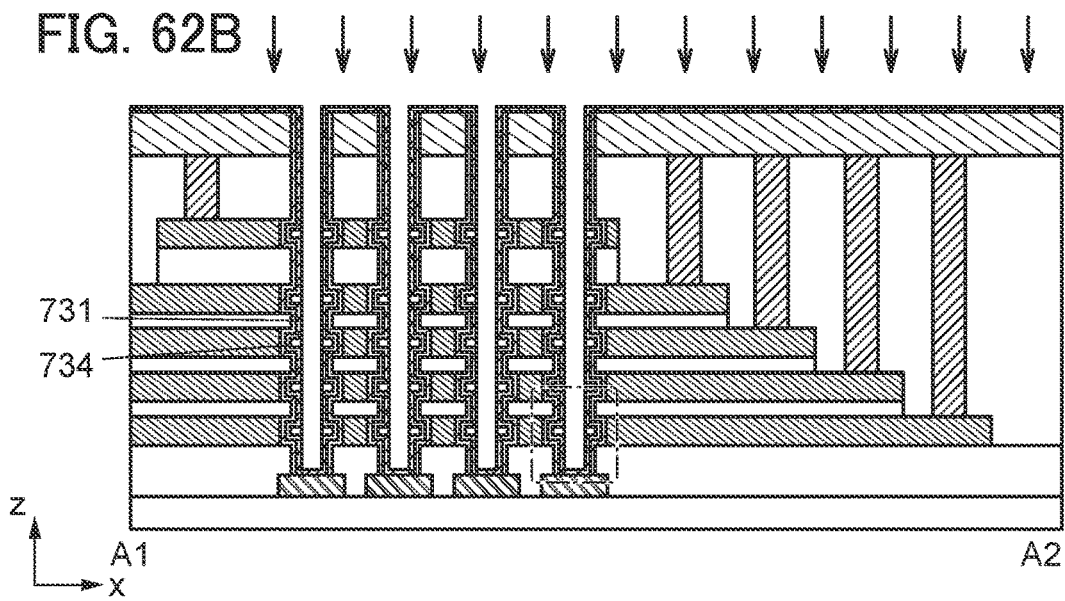
Figure 62C:
Figure 62D:
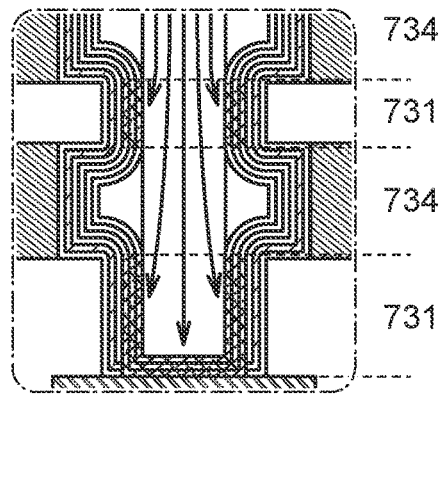

Next, the insulating film 719A is processed to form the insulator 719 (see FIGS. 61A to 61C). The processing of the insulating film 719A can be performed by isotropic etching or anisotropic etching. In the case where the insulating film 719A fills the recession and does not completely fill the opening as illustrated in FIGS. 60A to 60C, the insulating film 719A is preferably processed by isotropic etching. In contrast, in the case where the insulating film 719A is formed to fill the recession and the opening, it is preferable to use anisotropic etching. By such processing, the insulator 719 can be formed in the recession.

Next, a low-resistance region is formed in part of the oxide film 704A using the insulator 719 as a mask. The low-resistance region is formed by adding an element such as argon, hydrogen, boron, carbon, nitrogen, fluorine, phosphorus, sulfur, chlorine, helium, neon, krypton, or xenon, or a metal element that improves the conductivity of the oxide 704, such as aluminum, ruthenium, titanium, tantalum, tungsten, chromium, or indium to the oxide film 704A. As the method for adding the element, the plasma treatment, ion implantation treatment, ion doping treatment, reverse sputtering treatment, or the like can be used. The plasma treatment can be performed with an etching apparatus or a CVD apparatus. The reverse sputtering treatment can be performed with a sputtering apparatus. In this embodiment, argon plasma treatment is used to reduce the resistance of the region 731 of the oxide film 704A (see FIGS. 62A to 62D).

In addition, as a method for adding the above element to the oxide film 704A, a film containing the above element is formed in contact with the region 731 of the oxide film 704A, and heat treatment is performed as needed to reduce the resistance of the region 731. By such treatment, the element may be injected to the oxide film 704A. in addition, oxygen contained in the oxide film 704A is extracted to the film, and carriers may be generated in the oxide film 704A.

Note that the film is not necessarily removed. In the case where the film is an insulator or is oxidized by oxygen absorbed from the oxide 704 to be a high-resistant insulator, for example, the film may remain. In that case, the film may serve as a second gate insulating layer like the insulator 711.

Then, an insulating film 711A is formed on the inner side of the oxide film 704A and the insulator 719, and a conductive film 712A is formed on the inner side of the insulating film 711A. The insulating film 711A and the conductive film 712A can be formed by a CVD method or an ALD method. It is particularly preferable to employ an ALD method, in which case a film with a uniform thickness can be formed in a groove or an opening having a large aspect ratio. Alternatively, the insulating film 711A and the conductive film 712A may be formed by a combination of an ALD method and a CVD method (see FIGS. 63A to 63C).

The insulator 711 can be formed using a material for supplying oxygen to the oxide 704 or a material for supplying hydrogen to the oxide 704 in accordance with the characteristics needed for the memory transistors MT and the semiconductor devices including the memory transistors MT.

Next, heat treatment is performed. The heat treatment is preferably performed in a nitrogen atmosphere at 200° C. to 500° C. inclusive, preferably 300° C. to 400° C. inclusive.

The atmosphere in which heat treatment is performed is not limited to the above atmosphere as long as at least one of nitrogen, oxygen, and argon is contained. The heat treatment may be performed in a reduced-pressure atmosphere or in an atmospheric pressure atmosphere.

In addition, when the heat treatment is performed in the state where the oxide film 704A and the conductor 706 are in contact with each other, the resistance of the oxide film 704A is reduced in some cases. When the oxide film 704A is in contact with the conductor 706, a metal compound layer including a metal element contained in the conductor 706 and the component of the oxide film 704A are formed at the interface between the conductor 706 and the oxide film 704A in some cases. The metal compound layer is preferably formed, in which case the contact resistance between the conductor 706 and the oxide film 704A can be reduced. Oxygen contained in the oxide film 704A is absorbed by the conductor 706 in some cases. At this time, the resistance of the oxide film 704A in the vicinity of the interface between the conductor 706 and the oxide film 704A is reduced, so that the contact resistance between the conductor 706 and the oxide film 704A can be reduced. When the heat treatment is performed in the state where the oxide film 704A and the conductor 706 are in contact with each other, the oxide film 704A has lower resistance and the contact resistance between the conductor 706 and the oxide film 704A is further reduced.

Figure 63A:
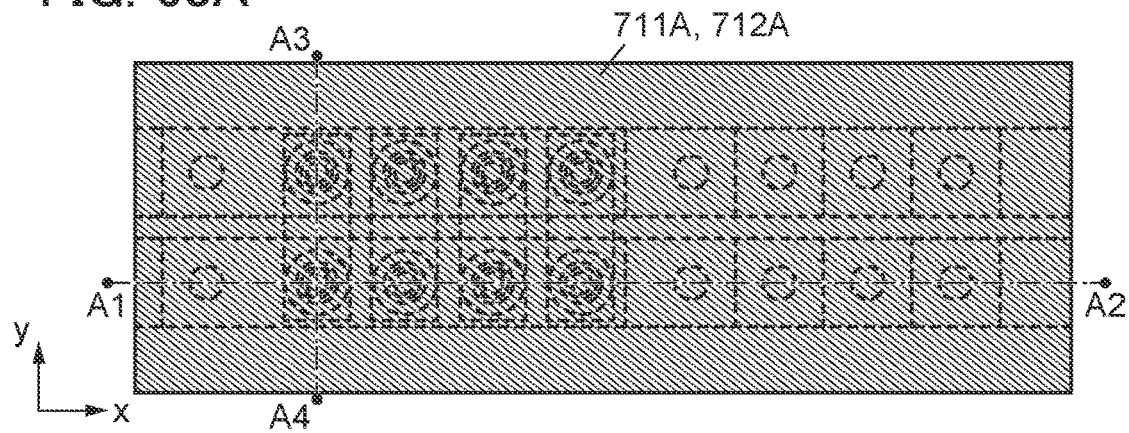
FIGS. 63A to 63C illustrate a manufacturing process of a semiconductor device of one embodiment of the present invention.
Figure 63B:
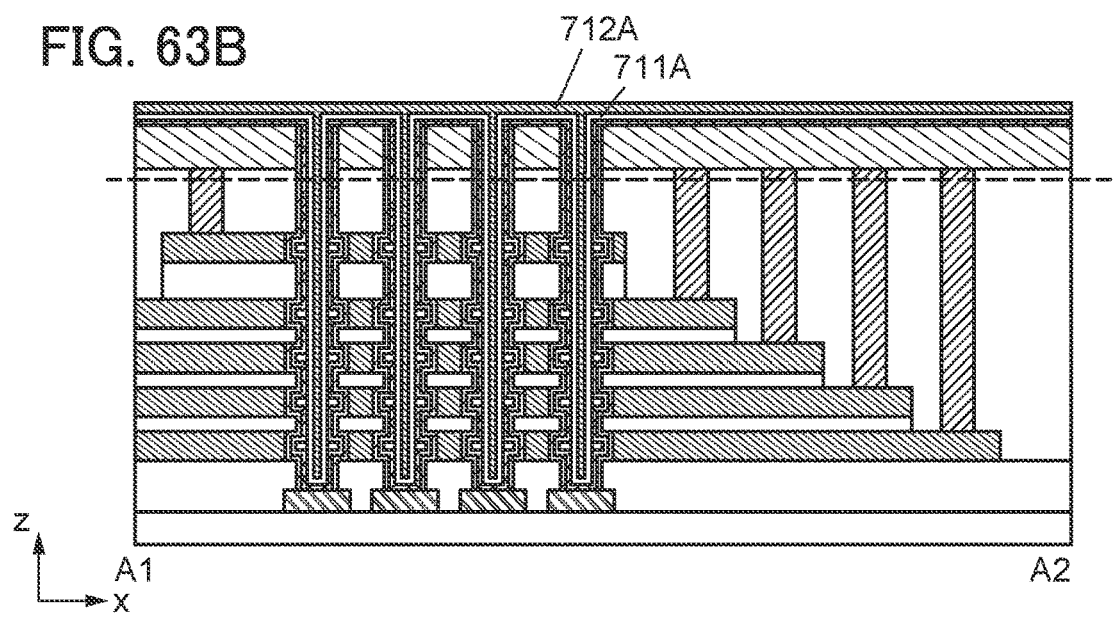
Figure 63C:
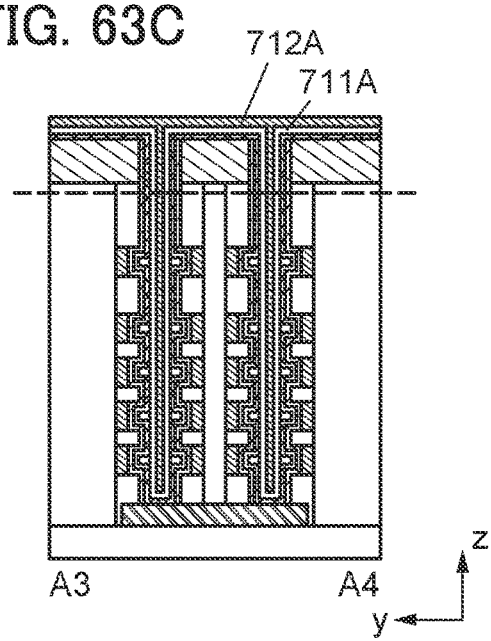
Figure 64A:
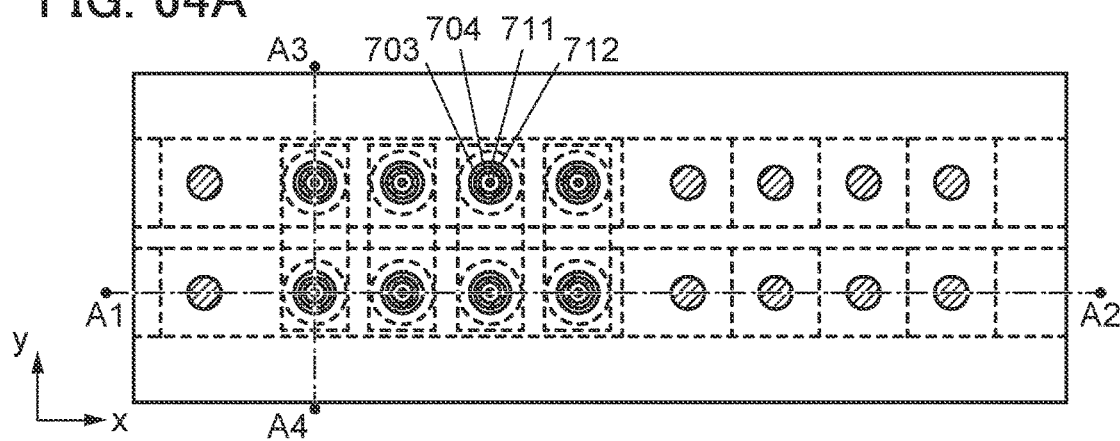
FIGS. 64A to 64C illustrate a manufacturing process of a semiconductor device of one embodiment of the present invention.
Figure 64B:
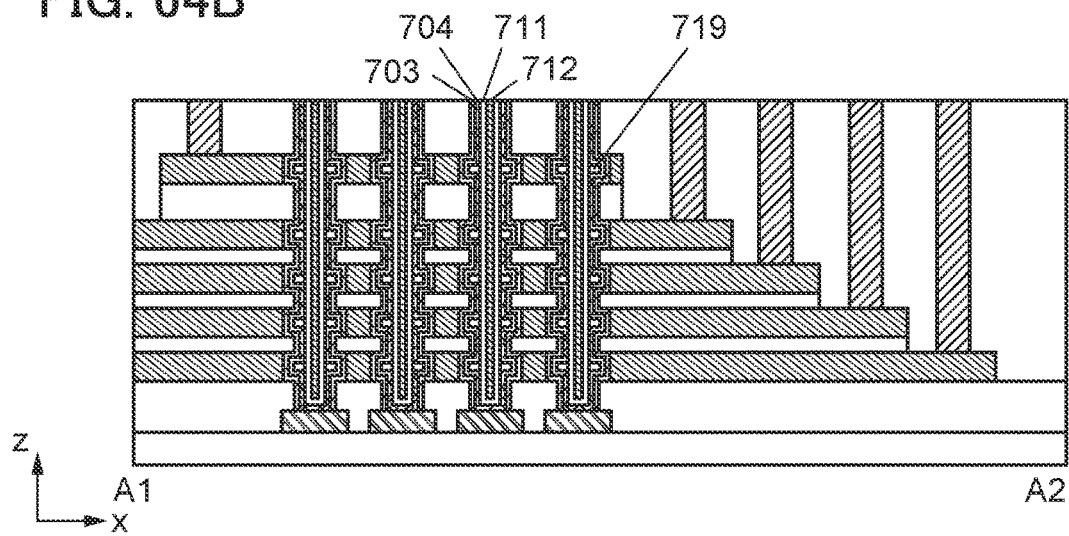
Figure 64C:
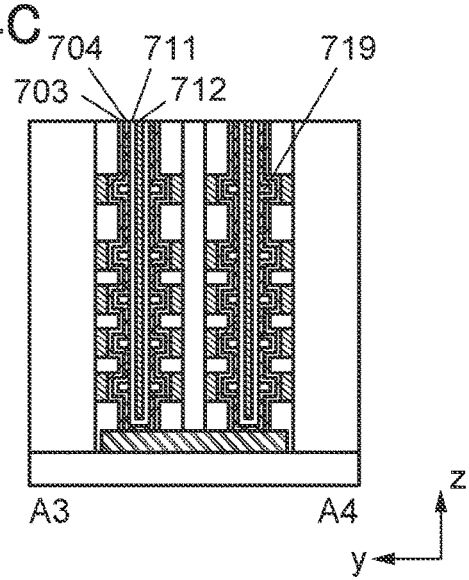

Next, the mask 729 and unnecessary portions of the conductive film 712A, the insulating film 711A, the oxide film 704A, the insulator 703, and the like, which are portions above the dotted line in FIGS. 63B and 63C, are removed by a CMP method or the like to obtain the oxide 704, the insulator 711, and the conductor 712 (see FIGS. 64A to 64C). Note that the above-described heat treatment may be performed after the removal of unnecessary portions of the conductive film 712A, the insulating film 711A, and the oxide film 704A. In the case where the mask 729 is removed after the formation of the first opening and before the formation of the insulating film 703A, the mask 729 is not necessarily removed in the present step.

Figure 65A:
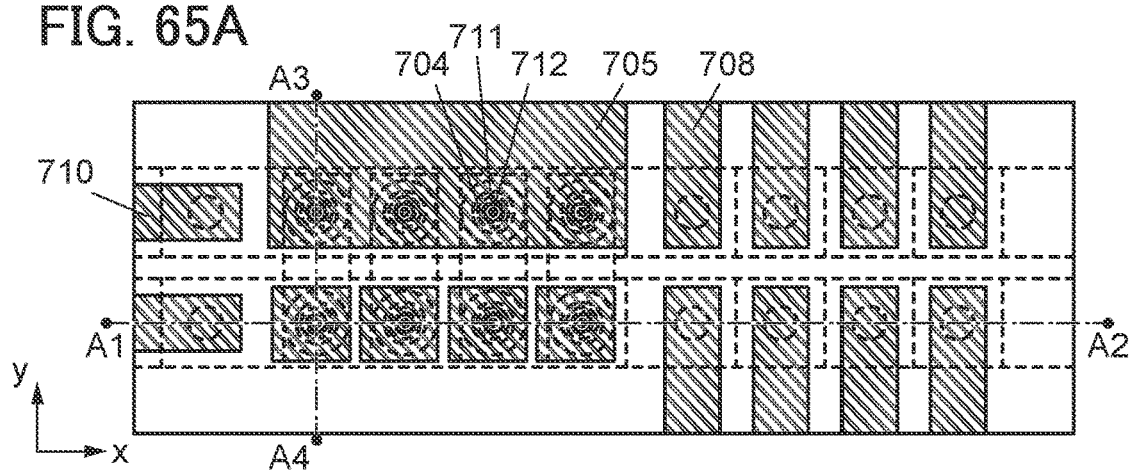
FIGS. 65A to 65C illustrate a manufacturing process of a semiconductor device of one embodiment of the present invention.
Figure 65B:
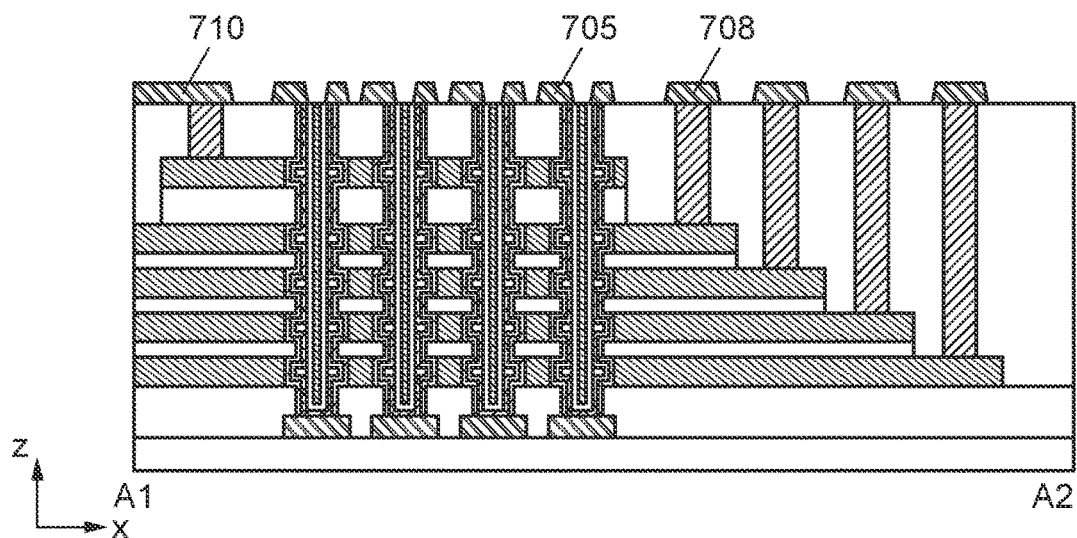
Figure 65C:
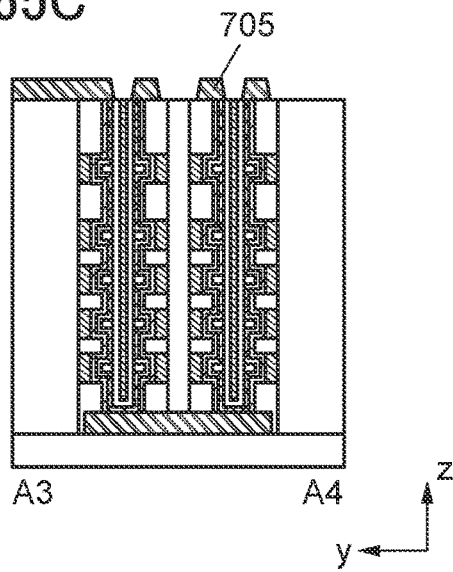

Next, as illustrated in FIGS. 65A to 65C, the conductor 705 serving as part of the bit line BL, the source line SL, and the word line WL is formed. The conductor 705 is provided to be electrically connected to the oxide 704 and the conductor 707. In the case where the conductor 712 is provided on the inner side of the oxide 704, it is preferable that at least an opening which exposes the conductor 712 be provided in the conductor 705 so that the conductor 705 and the conductor 712 are electrically separated from each other. In this case, the opening may be provided to expose the insulator 711. Part of the oxide 704 may be exposed.

Figure 66A:
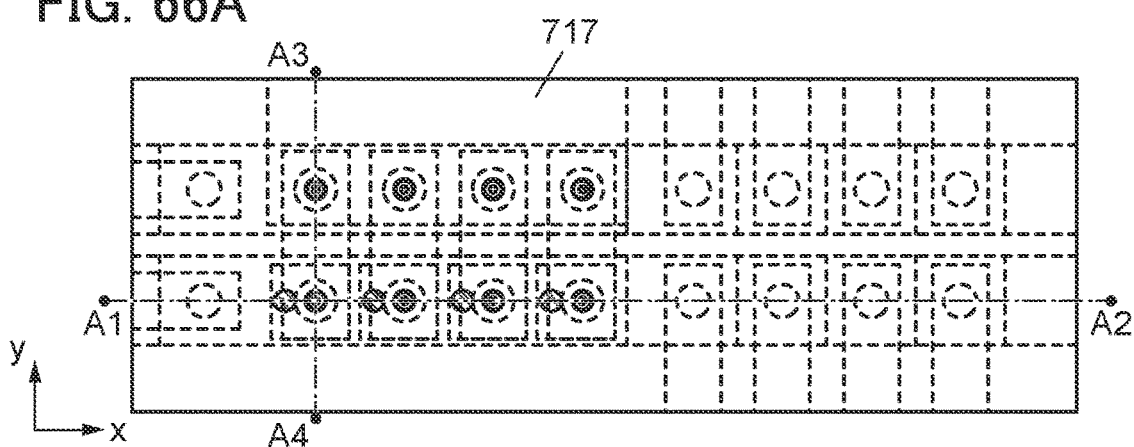
FIGS. 66A to 66C illustrate a manufacturing process of a semiconductor device of one embodiment of the present invention.
Figure 66B:
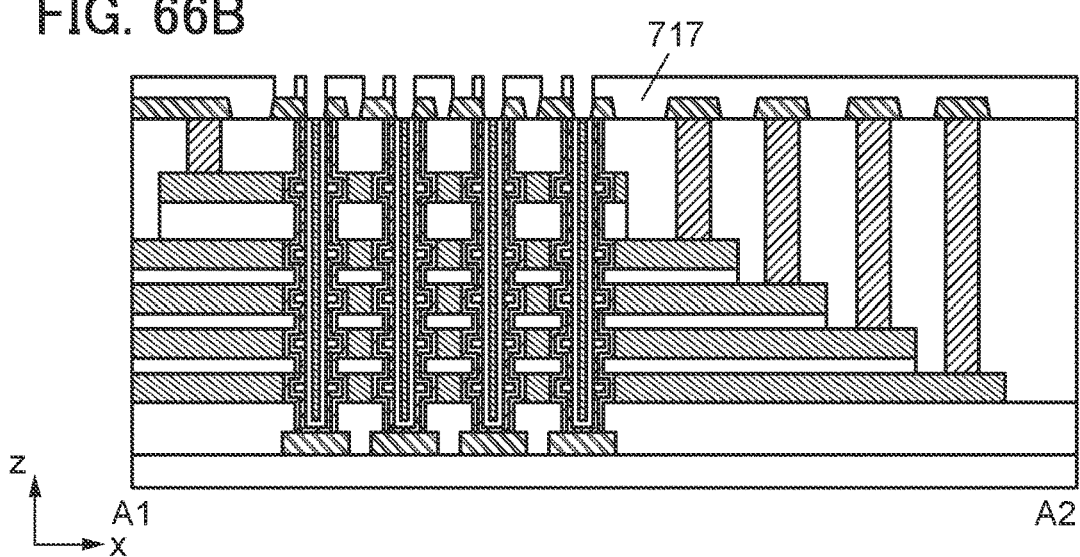
Figure 66C:
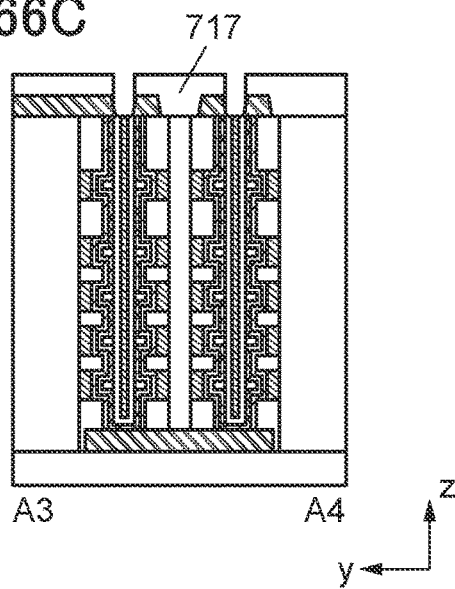

Then, as illustrated in FIGS. 66A to 66C, the insulator 717 is formed to cover the conductor 705. In the insulator 717, an opening which exposes part of the conductor 705 (the conductor 705 electrically connected to the oxide 704 on the bit line side) and the conductor 712 is provided. In the case where the opening which exposes the conductor 712 is formed, the diameter of the opening may be larger than that of the opening provided in the conductor 705. Since the conductor 705 includes an opening, the opening which exposes the conductor 712 can be formed in a self-aligned manner, and a defect such as formation of the opening whose diameter at the bottom portion has an unintentional size and a defect such as displacement of the opening from the conductor 712 can be prevented.

Figure 67A:
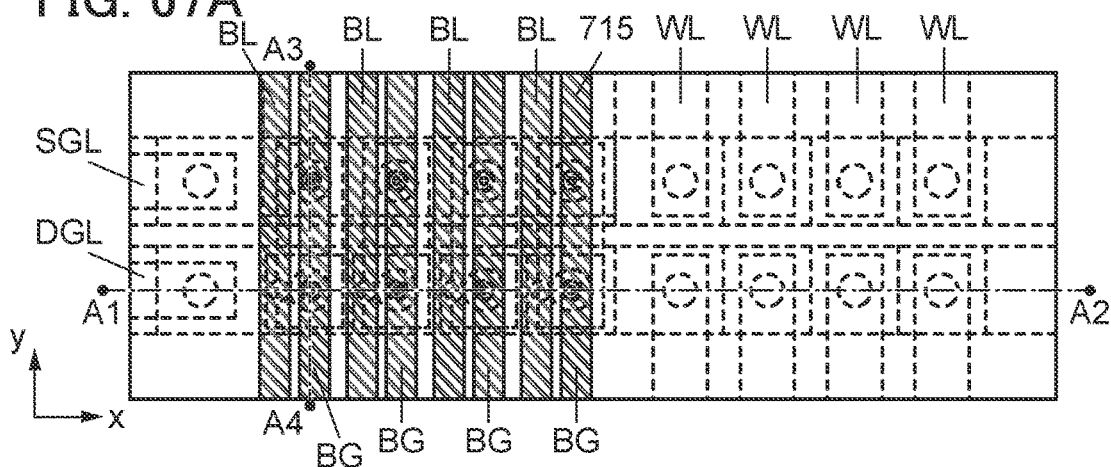
FIGS. 67A to 67C illustrate a manufacturing process of a semiconductor device of one embodiment of the present invention.
Figure 67B:
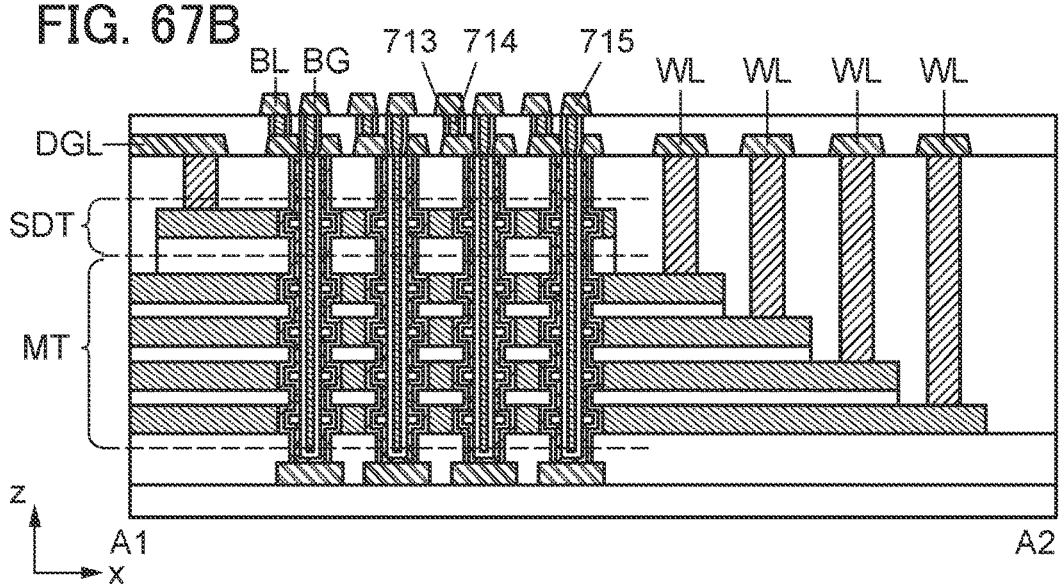
Figure 67C:
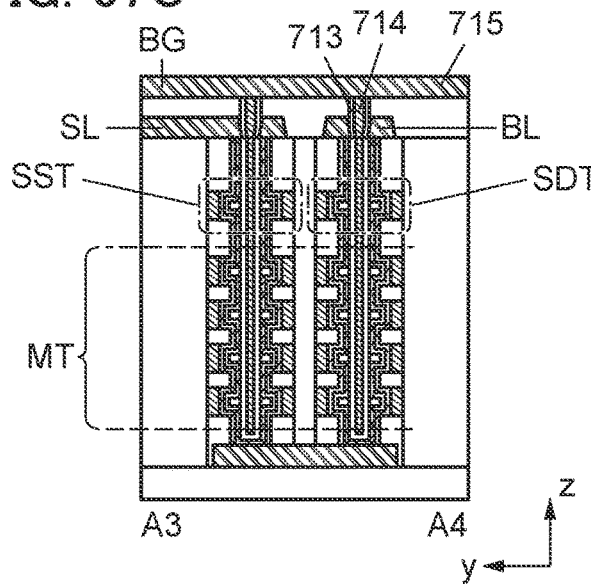

Then, as illustrated in FIGS. 67A to 67C, the insulator 713 is formed to cover the conductor 705 in the opening which is provided in the insulator 717 and exposes the conductor 712. First, an insulating film to be the insulator 713 is formed over the insulator 717 by a CVD method or an ALD method, and then anisotropic etching is performed, whereby the insulating film formed at the bottom portion of the opening is removed. At this time, the insulating film over the insulator 717 is also removed to form the insulator 713. The insulating film may be processed by a lithography method. At this time, the insulator 713 is also provided over the insulator 717 in some cases.

Next, the conductor 714 and the conductor 715 that serve as the bit line BL and the wiring BG are formed. Although the conductors 714 and 715 are illustrated as different layers in FIGS. 67A to 67C, the present invention is not limited thereto. The conductor 714 and the conductor 715 may be formed as one conductor at a time. When the conductor 714 and the conductor 715 are separately formed, a conductive film to be the conductor 714 is formed over the insulator 717 to be embedded in the opening in the insulator 717, and an unnecessary portion of conductive film is removed by a CMP method or the like, whereby the conductor 714 can be formed. After that, the conductor 715 is formed. The conductor 715 may be formed by a lithography method or a damascene method. At this time, the insulator 713 is provided on the side surface of the opening formed in the insulator 717 and the conductor 705; thus, the conductor 715 electrically connected to the conductor 712 is not electrically connected to the conductor 705. When the conductor 714 and the conductor 715 are formed at a time, a conductor serving as the conductor 714 and the conductor 715 can be formed by forming a conductive film over the insulator 717 to be embedded in the opening formed in the insulator 717 and processing the film by a lithography method.

Through the above steps, the memory cell array can be manufactured. In the description of this manufacturing process, the memory cell array includes four layers of the memory transistors MT and four memory strings; however, the present invention is not limited thereto. The memory cell may include five or more layers of the memory transistors MT or five or more memory strings. For example, a memory cell array including 32 layers, 64 layers, or 128 layers of the memory transistors MT can be manufactured. Moreover, a memory cell array including 200 or more layers of the memory transistors MT can be manufactured.

The memory cell array is manufactured in the above manner, whereby the memory transistors MT in a plurality of layers can be formed at a time without patterning for forming the memory transistors MT for each layer. Furthermore, in the case where a memory cell array is formed by the above method, even when the number of layers of the memory transistors MT is increased, the number of steps of patterning and etching is not increased. In this manner, the number of manufacturing steps of the memory cell array can be reduced; thus, a semiconductor device with high productivity can be provided.

The configuration example of 3D NAND in Embodiment 1 can be referred to for the configuration example of 3D NAND in this embodiment.

The description of the circuit operation (erasing operation, writing operation, and reading operation) of the memory device in Embodiment 1 can be referred to for the description of the circuit operation of the memory device in this embodiment.

The structure described in this embodiment can be used in appropriate combination with the structure described in any of the other embodiments.

Embodiment 3

In this embodiment, application examples of the storage device using the semiconductor device described in the above embodiment will be described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desk-top computers, but also to large computers such as server systems. Alternatively, the semiconductor device described in the above embodiment is applied to removable storage devices such as memory cards (e.g., SD cards), USB memories, and solid state drives (SSD). FIGS. 68A to 68E schematically illustrate some structural examples of removable storage devices. A packaged memory chip including the semiconductor device described in the above embodiment is used in a variety of storage devices and removable memories, for example.

Figure 68A:
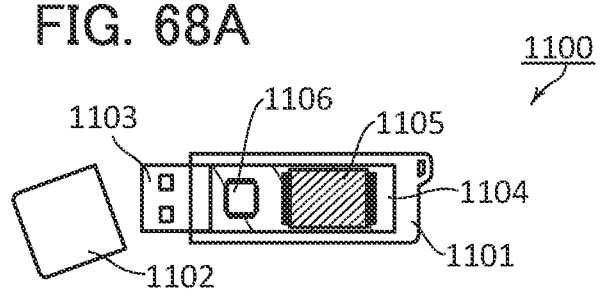
FIGS. 68A to 68E are schematic views of memory devices of embodiments of the present invention.

FIG. 68A is a schematic diagram of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figure 68B:
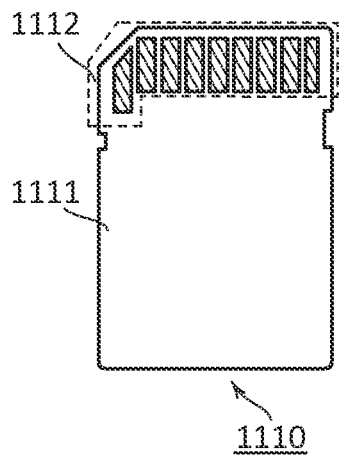
Figure 68C:
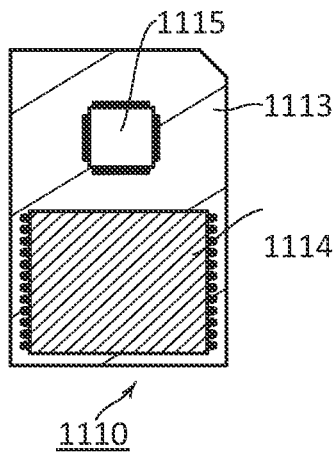

FIG. 68B is a schematic external diagram of an SD card, and FIG. 68C is a schematic diagram illustrating the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the back side of the substrate 1113, the capacity of the SD card 1110 can be increased. In addition, a wireless chip with a radio communication function may be provided on the substrate 1113. With such a wireless chip, the memory chip 1114 can read and write data by radio communication between the host device and the SD card 1110. The semiconductor device described in the above embodiment can be incorporated in the memory chip 1114 or the like on the substrate 1113.

Figure 68D:
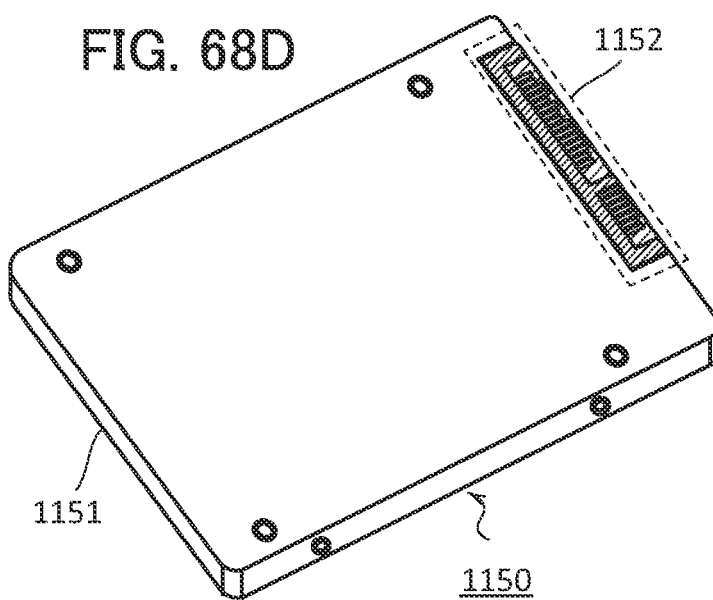
Figure 68E:
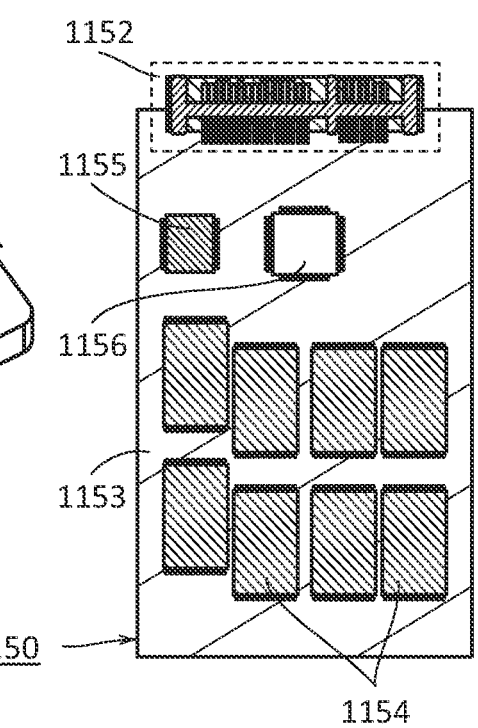

FIG. 68D is a schematic external diagram of an SSD, and FIG. 68E is a schematic diagram illustrating the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory of the controller chip 1156, and a DRAM chip may be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

The structure described in this embodiment can be used in appropriate combination with the structure described in any of the other embodiments.

Embodiment 4

In this embodiment, an AI system in which the semiconductor device of any of the above-described embodiments is used will be described with reference to FIG. 69.

Figure 69:
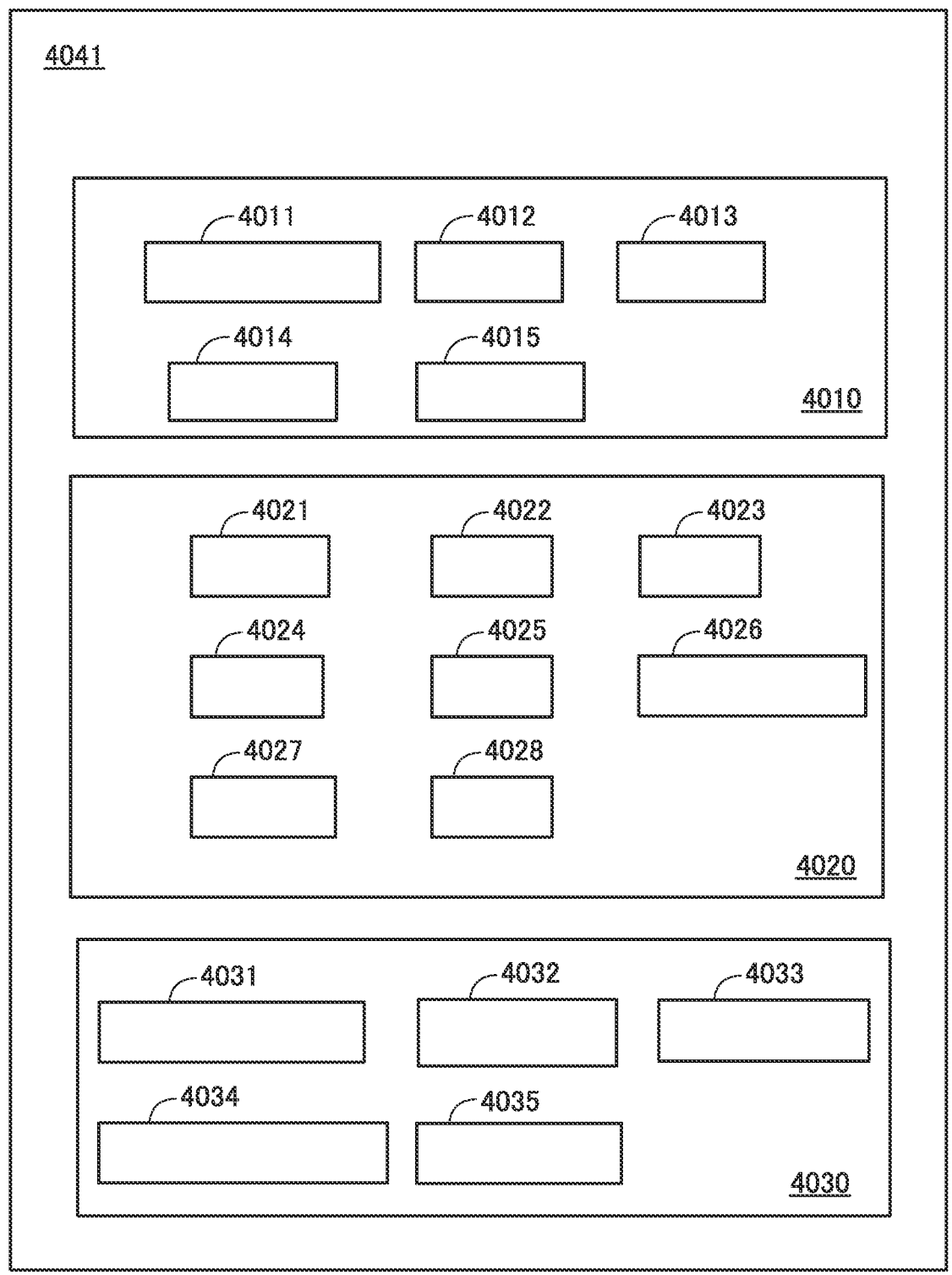
FIG. 69 is a block diagram illustrating a structure example of an AI system of one embodiment of the present invention.

FIG. 69 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, an FPGA 4014, and a 3D-NAND 4015.

DOSRAM (registered trademark) stands for "dynamic oxide semiconductor RAM," which is RAM including a 1T1C (one-transistor/one-capacitor) memory cell.

NOSRAM (registered trademark) stands for "nonvolatile oxide semiconductor RAM", which is RAM including a gain cell (2T or 3T) memory cell. DOSRAM and NOSRAM are each a memory utilizing a low off-state current of a transistor including an oxide in a semiconductor (hereinafter the transistor is referred to as an OS transistor). Hereinafter, a memory device including an OS transistor, such as NOSRAM, is referred to as an OS memory in some cases.

The control portion 4020 includes a central processing unit (CPU) 4021, a graphics processing unit (GPU) 4022, a phase locked loop (PLL) 4023, a static random access memory (SRAM) 4024, a programmable read only memory (PROM) 4025, a memory controller 4026, a power supply circuit 4027, and a power management unit (PMU) 4028.

The input/output portion 4030 includes an external memory control circuit 4031, an audio codec 4032, a video codec 4033, a general-purpose input/output module 4034, and a communication module 4035.

The arithmetic portion 4010 can perform neural network learning or neural network inference.

The analog arithmetic circuit 4011 includes an analog/digital (A/D) converter circuit, a digital/analog (D/A) converter circuit, and a product-sum operation circuit.

The analog arithmetic circuit 4011 is preferably formed using an OS transistor. The analog arithmetic circuit 4011 formed using an OS transistor includes an analog memory and can execute a product-sum operation necessary for the learning and the inference with low power consumption.

The DOSRAM 4012 is a DRAM including an OS transistor which temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in an SRAM, the input data has to be stored piece by piece because of the circuit area limitation and small storage capacity of the SRAM. The DOSRAM 4012 has a larger storage capacity than an SRAM because memory cells of the DOSRAM can be highly integrated even in a limited circuit area. Therefore, the DOSRAM 4012 can efficiently store the input data.

The NOSRAM 4013 is a nonvolatile memory including an OS transistor. The NOSRAM 4013 consumes less power in writing data than the other nonvolatile memories such as a flash memory, a resistive random access memory (ReRAM), and a magnetoresistive random access memory (MRAM). Furthermore, unlike a flash memory and a ReRAM which deteriorate by data writing, the NOSRAM does not have a limit on the number of times of data writing.

Furthermore, the NOSRAM 4013 can store multilevel data of two or more bits as well as one-bit binary data. The multilevel data storage in the NOSRAM 4013 leads to a reduction of the memory cell area per bit.

Because the NOSRAM 4013 can store analog data as well as digital data, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data might be included in the analog data.

Data and parameters used in the neural network calculation can be once stored in the NOSRAM 4013. The data and parameters may be stored in a memory provided outside the AI system 4041 via the CPU 4021. However, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA including an OS transistor. By including the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), a deep belief network (DBN), or the like described later, with a hardware. The connection of the neural network with a hardware enables higher speed performance.

The FPGA 4014 is an FPGA including an OS transistor. An OS-FPGA can have a smaller memory area than an FPGA formed using an SRAM. Thus, adding a context switching function only causes a small increase in area. Moreover, an OS-FPGA can transmit data and parameters at high speed by utilizing the boosting.

The 3D-NAND 4015 is a nonvolatile memory using an oxide semiconductor. The 3D-NAND 4015 is a highly integrated memory in which the storage capacity per unit area is large.

Furthermore, the 3D-NAND 4015 can store multilevel data of two or more bits as well as one-bit binary data. The multilevel data storage in the 3D-NAND 4015 leads to a reduction of the memory cell area per bit.

As the 3D-NAND 4015, for example, the semiconductor device in the above embodiment can be used. Since the area occupied by the memory cell can be reduced with use of such a semiconductor device, the 3D-NAND 4015 can be more highly integrated. Thus, the storage capacity per unit area of the 3D-NAND 4015 can be increased.

In the AI system 4041, the analog arithmetic circuit 4011, the DOSRAM 4012, the NOSRAM 4013, and the FPGA 4014 can be provided on one die (chip). Thus, the AI system 4041 can perform calculation of the neural network quickly with low power consumption. The analog arithmetic circuit 4011, the DOSRAM 4012, the NOSRAM 4013, and the FPGA 4014 can be manufactured through the same manufacturing process. This enables the AI system 4041 to be manufactured at low cost.

Note that the arithmetic portion 4010 need not necessarily include all of the following: the DOSRAM 4012, the NOSRAM 4013, and the FPGA 4014. One or more memories are selected from the DOSRAM 4012, the NOSRAM 4013, and the FPGA 4014 in accordance with a problem that is desired to be solved in the AI system 4041.

The AI system 4041 can implement a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for implementing at least one of the methods. Part or the whole of the program may be stored in the NOSRAM 4013 or the 3D-NAND 4015. The 3D-NAND 4015, which is a highly integrated memory in which the storage capacity per unit area is large, can store high-capacity program.

Most of the existing programs used as libraries are designed on the premise that the programs are processed by a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be performed at high speed.

The power supply circuit 4027 generates not only a low power supply potential for a logic circuit but also a potential for an analog operation. The power supply circuit 4027 may include an OS memory. In this case, storing a reference potential in the OS memory can reduce the power consumption of the power supply circuit 4027.

The PMU 4028 is configured to temporarily stop the power supply to the AI system 4041.

As a register in each of the CPU 4021 and the GPU 4022, an OS memory is preferably included. By including the OS memory, each of the CPU 4021 and the GPU 4022 can retain data (logic value) in the OS memory even when power supply is stopped. As a result, the AI system 4041 can save the power.

The PLL 4023 is configured to generate a clock. The AI system 4041 performs an operation on the basis of the clock generated by the PLL 4023. The PLL 4023 preferably includes an OS memory. When an OS memory is included in the PLL 4023, an analog potential with which the clock oscillation frequency is controlled can be held.

The AI system 4041 may store data in an external memory such as a DRAM. For this reason, the AI system 4041 preferably includes the memory controller 4026 functioning as an interface with the external DRAM. Furthermore, the memory controller 4026 is preferably provided near the CPU 4021 or the GPU 4022. Thus, quick data transmission can be achieved.

Some or all of the circuits illustrated in the control portion 4020 can be formed on the same die as the arithmetic portion 4010. Thus, the AI system 4041 can execute neural network calculation at high speed with low power consumption.

Data used for neural network calculation is stored in an external memory device such as a hard disk drive (HDD) or a solid state drive (SSD) in many cases. Therefore, the AI system 4041 preferably includes the external memory control circuit 4031 functioning as an interface with the external memory device.

Because audio and video are often subjects of the learning and inference using the neural network, the AI system 4041 includes the audio codec 4032 and the video codec 4033. The audio codec 4032 encodes and decodes audio data, and the video codec 4033 encodes and decodes video data.

The AI system 4041 can perform learning or make an inference using data obtained from an external sensor. For this reason, the AI system 4041 includes the general-purpose input/output module 4034. The general-purpose input/output module 4034 includes a universal serial bus (USB), an inter-integrated circuit (I2C), or the like, for example.

The AI system 4041 can perform learning or make an inference using data obtained via the Internet. For this reason, the AI system 4041 preferably includes the communication module 4035.

The analog arithmetic circuit 4011 may include a multi-level flash memory as an analog memory. However, the flash memory has a limit on the number of rewriting times. In addition, the multi-level flash memory is extremely difficult to embed; in other words, the arithmetic circuit and the memory are difficult to form on the same die.

Alternatively, the analog arithmetic circuit 4011 may include a ReRAM as an analog memory. However, the ReRAM has a limit on the number of rewriting times and also has a problem in storage accuracy. Moreover, because the ReRAM is a two-terminal element, the complicated circuit design is necessary for separating data writing and data reading.

Further alternatively, the analog arithmetic circuit 4011 may include an MRAM as an analog memory. However, the MRAM has a problem in storage capacity because of its low magnetoresistive ratio.

In consideration of the above, an OS memory is preferably used as an analog memory in the analog arithmetic circuit 4011.

The structure described in this embodiment can be used in appropriate combination with the structure described in any of the other embodiments.

Embodiment 5

Application Example of AI System

In this embodiment, application examples of the AI system described in the above embodiment will be described with reference to FIGS. 70A and 70B.

Figure 70A:
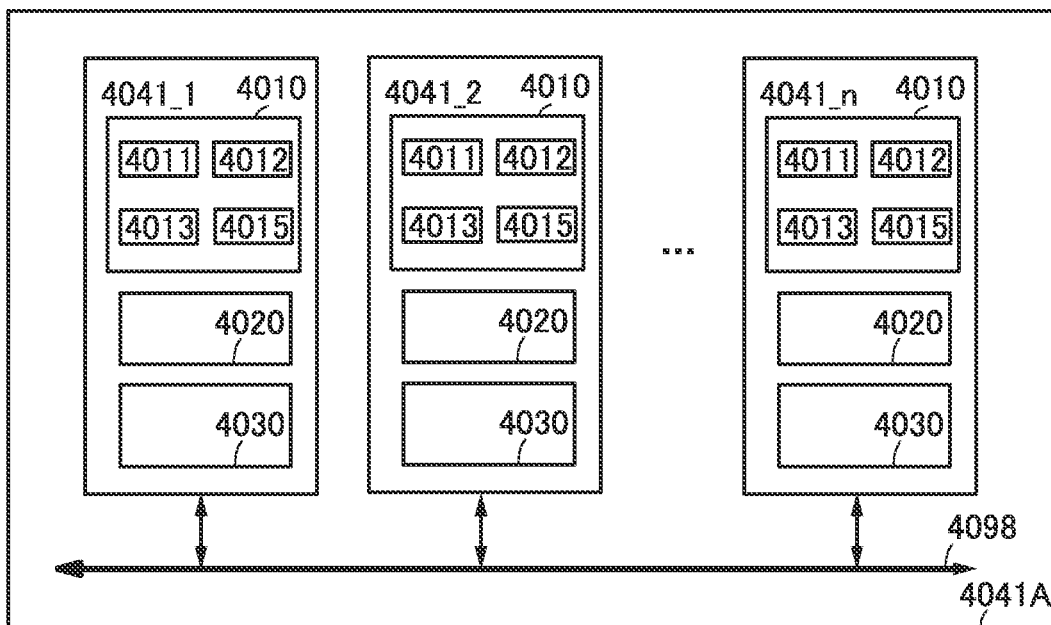
FIGS. 70A and 70B are block diagrams each illustrating an application example of an AI system of one embodiment of the present invention.

FIG. 70A illustrates an AI system 4041A in which the AI systems 4041 described with FIG. 69 are arranged in parallel and a signal can be transmitted between the systems via a bus line.

The AI system 4041A illustrated in FIG. 70A includes AI systems 4041_1 to 4041_n (n is a natural number). The AI systems 4041_1 to 4041_n are connected to each other via a bus line 4098.

Figure 70B:
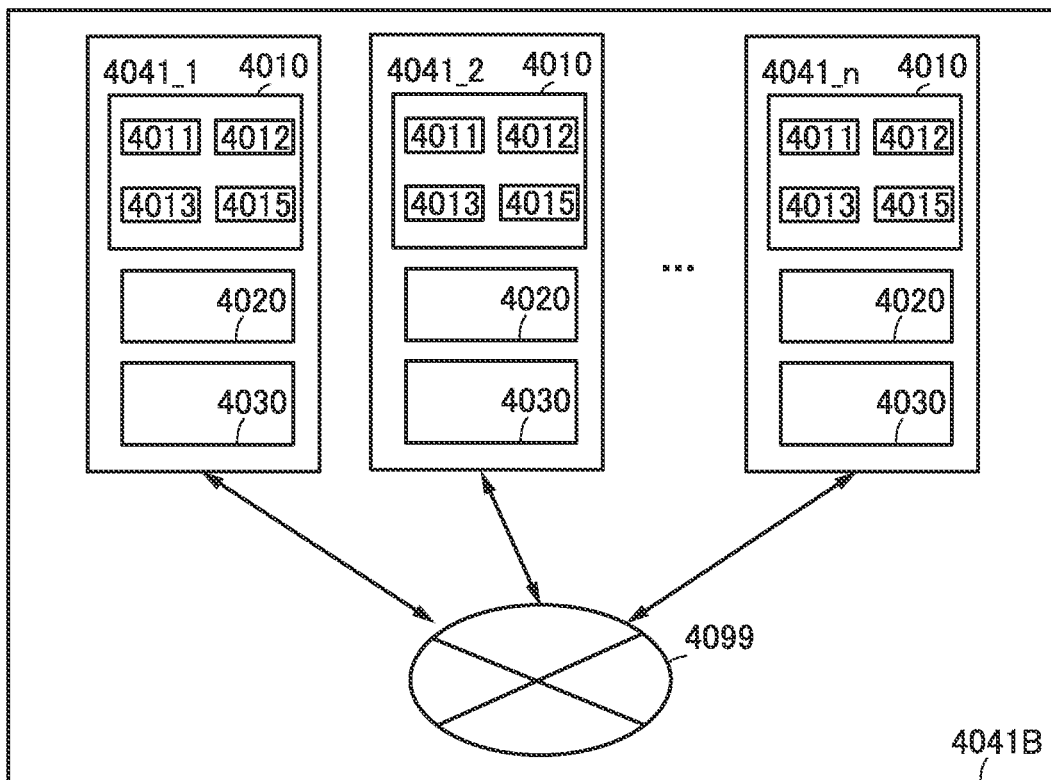

FIG. 70B illustrates an AI system 4041B in which the AI systems 4041 described with FIG. 69 are arranged in parallel as in FIG. 70A and a signal can be transmitted between the systems via a network.

The AI system 4041B illustrated in FIG. 70B includes the AI systems 4041_1 to 4041_n. The AI systems 4041_1 to 4041_n are connected to each other via a network 4099.

A communication module is provided in each of the AI systems 4041_1 to 4041_n; such a configuration enables wireless or wired communication via the network 4099. A communication module can communicate via an antenna. Communication can be performed when an electronic device is connected to a computer network such as the Internet (infrastructure of the World Wide Web, WWW), an intranet, an extranet, a personal area network (PAN), a local area network (LAN), a campus area network (CAN), a metropolitan area network (MAN), a wide area network (WAN), or a global area network (GAN), for example. In the case of performing wireless communication, it is possible to use, as a communication protocol or a communication technology, a communications standard such as Long-Term Evolution (LTE), Global System for Mobile Communication (GSM: registered trademark), Enhanced Data Rates for GSM Evolution (EDGE), Code Division Multiple Access 2000 (CDMA2000), or W-CDMA (registered trademark), or a communications standard developed by IEEE such as Wi-Fi (registered trademark), Bluetooth (registered trademark), or ZigBee (registered trademark).

With the configuration illustrated in FIG. 70A or 70B, analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. Since each of the AI systems performs signal processing or learning, the amount of information processed by each AI system can be reduced. Accordingly, the signal processing or learning requires a smaller amount of arithmetic processing. As a result, recognition accuracy can be increased. With the use of data obtained with each AI system, biological information that irregularly changes should be able to be collectively grasped instantly.

The structure described in this embodiment can be used in appropriate combination with the structure described in any of the other embodiments.

Embodiment 6

This embodiment shows an example of an IC incorporating the AI system described in the above embodiment.

In the AI system described in the above embodiment, a digital processing circuit (e.g., a CPU) that includes a Si transistor and a 3D-NAND, an OS-FPGA, an OS memory (e.g., a DOSRAM or a NOSRAM), and an analog arithmetic circuit that include OS transistors can be integrated into one die.

Figure 71:
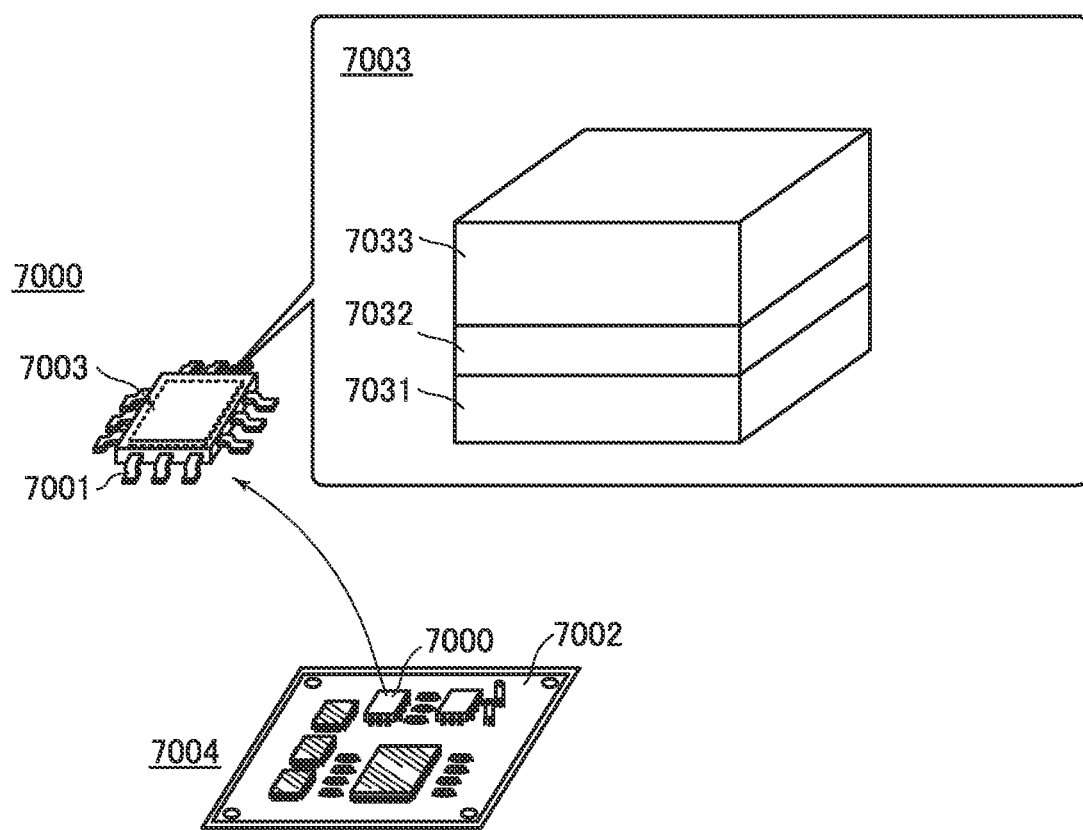
FIG. 71 is a schematic perspective view illustrating a structure example of an IC including an AI system of one embodiment of the present invention.

FIG. 71 illustrates the example of the IC incorporating the AI system. An AI system IC 7000 illustrated in FIG. 71 includes a lead 7001 and a circuit portion 7003. The AI system IC 7000 is mounted on a printed circuit board 7002, for example. A plurality of such IC chips are combined and electrically connected to each other on the printed circuit board 7002; thus, a circuit board on which electronic components are mounted (a circuit board 7004) is formed. In the circuit portion 7003, the circuits described in the above embodiment are provided on one die. The circuit portion 7003 has a stacked-layer structure as described in the above embodiment, which is broadly divided into a Si transistor layer 7031, a wiring layer 7032, and an OS transistor layer 7033. Since the OS transistor layer 7033 can be stacked over the Si transistor layer 7031, the size of the AI system IC 7000 can be easily reduced.

Although a Quad Flat Package (QFP) is used as a package of the AI system IC 7000 in FIG. 71, the package is not limited thereto.

The digital processing circuit (e.g., a CPU) and the 3D-NAND, the OS-FPGA, the OS memory (e.g., a DOSRAM or a NOSRAM), and the analog arithmetic circuit that include OS transistors can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in appropriate combination with the structure described in any of the other embodiments.

Embodiment 7

<Electronic Device>

The semiconductor device of one embodiment of the present invention can be used for a variety of electronic devices. FIGS. 72A and 72B and FIGS. 73A to 73F illustrate specific examples of the electronic devices each including the semiconductor device in one embodiment of the present invention.

Figure 72A:
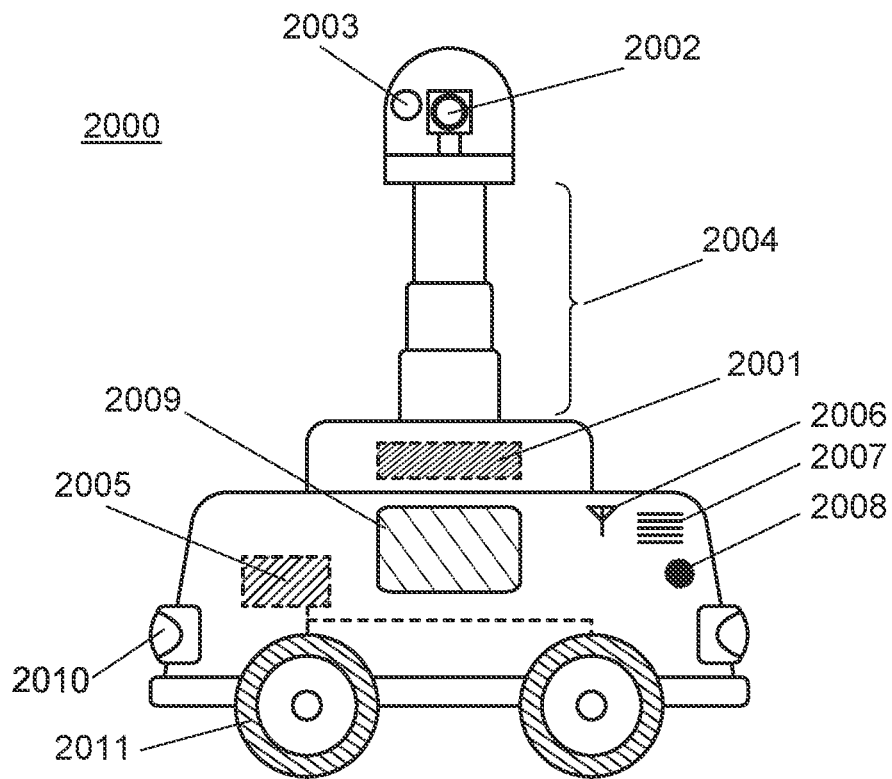
FIGS. 72A and 72B illustrate an electronic device of one embodiment of the present invention.

A robot 2000 illustrated in FIG. 72A includes an arithmetic device 2001, a sensor 2002, a light 2003, a lift 2004, a driver portion 2005, and a moving mechanism 2011, and can take a still image and a moving image while being moved. Such a robot can be used for a security system or a monitoring system.

The robot 2000 may further include a communication means 2006, a speaker 2007, a microphone 2008, a display portion 2009, a light-emitting portion 2010, and the like.

In the arithmetic device 2001, the semiconductor device of one embodiment of the present invention can be used. As the arithmetic device 2001, an IC in which the AI system of one embodiment of the present invention is incorporated can be used. The sensor 2002 functions as a camera which takes images of surroundings of the robot 2000. The light 2003 is a light unit which can be used when the surroundings of the robot 2000 taken by the sensor 2002. When a still image is taken by the sensor 2002, the light 2003 preferably functions as a flashlight. The sensor 2002 is connected to a main body of the robot via the lift 2004. The height of the sensor 2002 can be adjusted by the lift 2004. The lift 2004 is preferably telescopic. Alternatively, the lift 2004 may be a foldable lift composed of a plurality of booms. The robot 2000 including the driver portion 2005 and the moving mechanism 2011 connected to the driver portion 2005 is preferably used, in which case an imaging range of the sensor 2002, that is, a monitoring range, is expanded.

The communication means 2006 can send data taken by the sensor 2002 to a manager or the server owned by the manager. In addition, when judging the occurrence of an emergency such as a crime, an accident, or a fire after the arithmetic device 2001 analyzes the image taken by the sensor 2002, the arithmetic device 2001 can report to the security company, the police, the fire station, the medical institution, or the owner of the land or the building. The speaker 2007 can transmit information such as an alert to a criminal, a call to an injured person or an emergency patient, and evacuation guidance, to the surroundings of the robot. The microphone 2008 can be used to obtain sounds around the robot 2000. The use of the communication means 2006 and the speaker 2007 enables the robot 2000 to function as a telephone. A person around the robot 2000 can have a conversation with the manager or a specific person. The display portion 2009 can display specific data. In emergency, the disaster information and the evacuation route can be displayed. The use in combination with the communication means 2006, the speaker 2007, and the microphone 2008 enables the robot 2000 to function as the videophone. A person around the robot 2000 can have a conversation with the manager or a given person while seeing the display portion 2009.

The light-emitting portion 2010 emits light or displays characters to show the direction of movement and the stopped state of the robot 2000. In addition, emergency may also be shown.

Figure 72B:
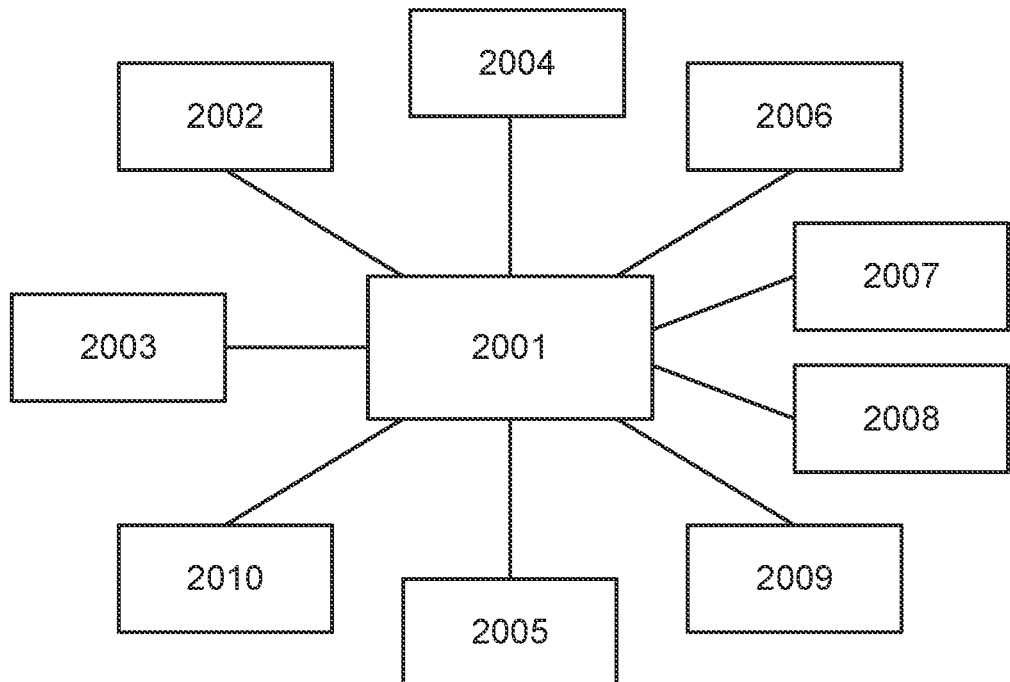

FIG. 72B is a block diagram illustrating a configuration of the robot 2000. The arithmetic device 2001 adjusts turning on or off and the brightness of the light 2003 from data such as an image obtained by the sensor 2002. In addition, the height of the lift 2004 is adjusted or the driver portion 2005 is controlled to align the positions of the robot 2000 and the sensor 2002. The operating condition of the driver portion 2005 can be shown by using the light-emitting portion 2010. With the communication means 2006, information around the robot 2000 obtained from the sensor 2002 and the microphone 2008 can be transmitted to the manager or the server owned by the manager. Depending on the judgement of the arithmetic device 2001 or the manager, information can be sent to the surroundings of the robot 2000 with the speaker 2007 and the display portion 2009.

In the case where a sensor that can take an image even in dark surroundings is used as the sensor 2002, the light 2003 is not necessarily provided. As such a sensor, an image sensor containing selenium (Se) in the light receiving portion can be used.

Such a robot 2000 can be used in commercial facilities and for security of the office. Data obtained from the sensor 2002 and the microphone 2008 is stored in the arithmetic device 2001 or the server. The stored data is analyzed by an AI system to check whether there is an anomaly situation such as loss or damage of an object, entry of suspicious individual, or disaster such as a fire. For the data analysis, deep learning may be used. When there is an unusual situation, the robot 2000 performs report to the manager and transmits information to the surroundings, and records the conditions of the surroundings.

The robot 2000 may be used for monitoring the growing conditions of the crops. The robot 2000 placed in a rice field or a field monitors the shapes, the sizes, or the colors of leaves or fruit by the sensor 2002 to check whether the crops are damaged or not or whether the crops are harmed by pests or not. Since the moving mechanism 2011 is provided for the robot 2000, the growing conditions of the crops can be monitored in a wide range. In addition, since the robot 2000 is provided with the lift 2004, the leaves and fruit at a certain height can be monitored regardless of the kind of crops and the growing conditions. The monitoring results are transmitted to a grower using the communication means 2006, and the grower can determine the kind, the amount, and the spraying timing of fertilizer and agricultural chemicals necessary for the crops. Alternatively, the monitoring results may be analyzed with an AI system using the arithmetic device 2001, and the kind, the amount, and the spraying timing of fertilizer and agricultural chemicals necessary for the crops may be determined and reported to the grower. Deep learning may be used for analysis of the monitoring results.

Figure 73A:
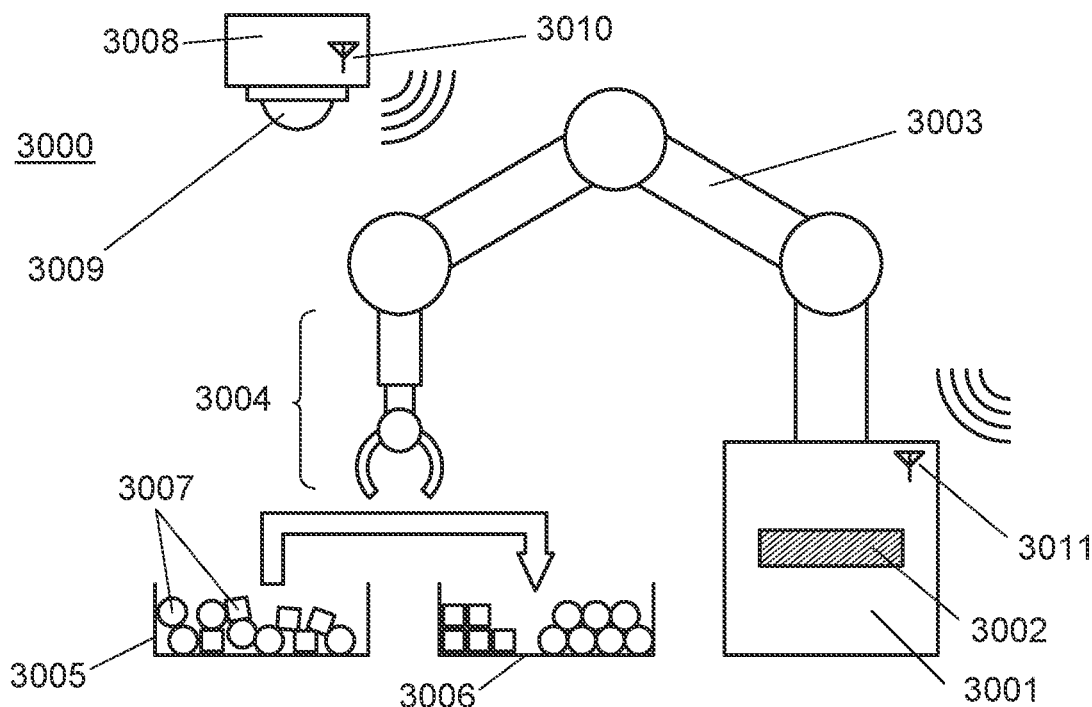
FIGS. 73A to 73F illustrate electronic devices of one embodiment of the present invention.

FIG. 73A illustrates a sorting system 3000 using a robot 3001. The robot 3001 includes an arithmetic device 3002, a boom 3003, and an arm 3004. The robot 3001 may further include a wired or wireless communication means 3011. In addition, the sorting system 3000 includes a housing 3008 including a sensor 3009. The housing 3008 includes a communication means 3010. The housing 3008 is provided for a ceiling, a wall, or a beam (not illustrated) of the sorting system 3000 or a sorting operation area. The housing 3008 may be provided in the robot 3001. For example, the housing 3008 may be provided for the boom 3003 or the arm 3004.

In the case where the housing 3008 is provided in the robot 3001, data obtained by the sensor 3009 may be transmitted to the arithmetic device 3002 without passing through the communication means 3010 or the communication means 3011, and processed.

The boom 3003 is movable, and the arm 3004 can be placed at a desired position. The arm 3004 may be telescopic. The arm 3004 placed over a desired object 3007 may be stretched to grab the desired object 3007, shortened, and then moved by the boom 3003.

The sorting system 3000 can transfer the object 3007 in a container 3005 to a container 3006. The container 3005 and the container 3006 may have the same shape or different shapes. Furthermore, a plurality of objects 3007 put in one container 3005 may be moved separately to a plurality of containers 3006.

As the container 3005 and the container 3006, a container, a cardboard box, a box for packing a product, a case, a film, a bag, a tray for storing foods, a lunch box, or the like is used. Furthermore, at least one of the container 3005 and the container 3006 may be cooking utensils such as a pot or a frying pan.

For the arithmetic device 3002, the semiconductor device of one embodiment of the present invention can be used. In the arithmetic device 3002, an IC in which the AI system of one embodiment of the present invention is incorporated can be used.

The sensor 3009 receives the positions or the number of containers 3005, the positions or the number of containers 3006, the state of the inside of the container 3005, and the state of the object 3007 in the container 3005 and transmits the data to the arithmetic device 3002 using the communication means 3010. Transmission of data is performed with or without a wire. Alternatively, the data may be transmitted through a wire without the communication means 3010. The arithmetic device 3002 analyzes the transmitted data. Here, the state of the object 3007 indicates the shape or the number of objects 3007, the overlap between the objects 3007, or the like. The arithmetic device 3002 performs analyzation on the basis of information from the sensor 3009 and obtains detailed information of the object 3007. The three-dimensional shape and hardness (or softness) of the object 3007 are obtained by comparison with the data stored in the arithmetic device 3002 or the server that can be communicated with the robot 3001. Depending on the three-dimensional shape and hardness (or softness) of the object 3007, the shape of the arm 3004 can be changed. Furthermore, depending on the shape or the size of the object 3007, the position in the container 3006 may be changed or a plurality of containers 3006 may be provided to sort the objects 3007.

To obtain the detailed data of the object 3007, analysis using an AI system can be utilized. Deep learning may be used to analyze the data.

Figure 73B:
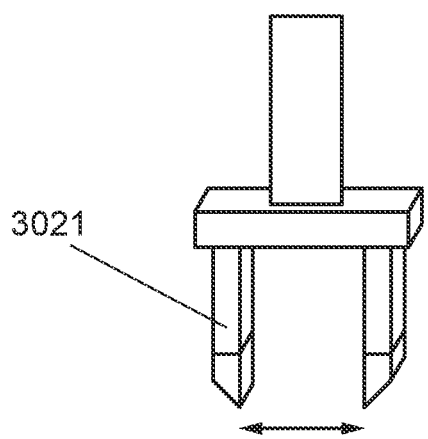
Figure 73C:
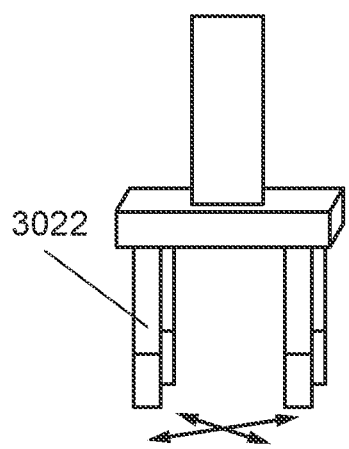
Figure 73D:
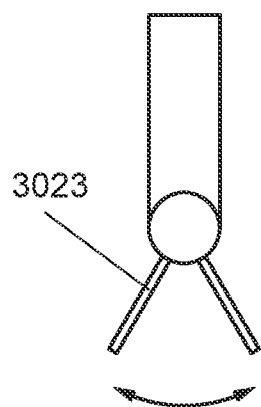
Figure 73E:
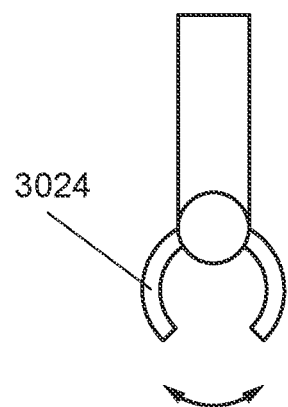
Figure 73F:
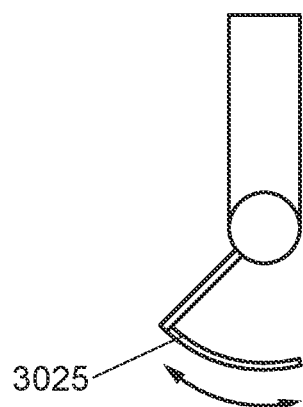

FIG. 73B illustrates an arm in which a pair of plates 3021 can move in the horizontal direction to pick up the object 3007. The pair of plates 3021 moves toward the center horizontally, whereby the object 3007 can be picked up. Such an arm can hold a surface of the object 3007, and is suitable for picking up the object 3007 with a columnar shape, such as a cube or a rectangular solid. FIG. 73C illustrates an arm in which a plurality of bars 3022 can move in the horizontal direction to pick up the object 3007. The plurality of bars 3022 move toward the center horizontally, whereby the object 3007 can be picked up. Such an arm can pinch a point of the object 3007, and is suitable for picking up the object 3007 in a spherical shape or in a non-fixed shape, that is, the object 3007 in an irregular shape. Note that although the number of bars 3022 is four in FIG. 73C, this embodiment is not limited to this structure. The number of bars 3022 may be three or five or more. FIG. 73D illustrates an arm in which a pair of plates 3023 rotates around the common axis to be closer to each other to pick up the object 3007. Such an arm can hold a surface of the object 3007, and is suitable for picking up the object 3007 with a thin-film shape, such as paper or films. FIG. 73E illustrates an arm in which a pair of crook-shaped plates 3024 rotates around the common axis such that the ends of them are closer to each other to pick up the object 3007. Such an arm can pinch a point or a side of the object 3007, and is suitable for picking up the object 3007 with a thin-film shape, such as paper or films or the object 3007 with a smaller particulate shape. As illustrated in FIG. 73F, a spatula 3025 may be attached to the tip of the arm, and the object 3007 with a smaller particulate shape may be scooped.

The arms illustrated in FIGS. 73A to 73F are just examples and one embodiment of the present invention is not limited to these shapes. In addition, the application of the arms is just an example and one embodiment of the present invention is not limited thereto.

The robot 3001 moves the boom 3003 to move the arm 3004 to a position over the desired object 3007 in the container 3005 on the basis of signals from the arithmetic device 3002. In the case of using the telescopic arm 3004, the arm 3004 is stretched, and the tip of the arm 3004 is brought down to a position on the same level of the object 3007. The tip of the arm is moved to catch the desired object 3007. The arm is shortened while catching the object 3007. The boom 3003 is moved again to transfer the arm 3004 to the desired position in the container 3006. At this time, the arm 3004 may be rotated to adjust the angle of the object 3007 to the container 3006. The arm 3004 is stretched to place the object 3007 in the container 3006, and the arm 3004 releases the object 3007. The above operation is repeated, so that the robot 3001 can move the object 3007 from the container 3005 to the container 3006.

Since the positional information on the containers 3005 and 3006 and the state of the object 3007 are analyzed using the AI system, the object 3007 can be moved surely regardless of the shape or hardness of the object 3007. Examples of the object 3007 include not only an object packed in a box with a shape of a cube or a rectangular solid or a box or a case with a given shape but also shaped processed foods such as an egg, a hamburger steak, and a croquette, foods such as vegetables with an irregular shape such as a potato and a tomato, machine parts such as a screw and a nut, a thin film of a paper or a film, and the like. Since in the sorting system 3000 in this embodiment, the shape of the arm can be changed in consideration of the shape and the hardness of the object 3007, the objects 3007 given above as examples can be transferred from the container 3005 to the container 3006 regardless of the shape and the hardness.

A memory device including the semiconductor device of one embodiment of the present invention can hold control data, a control program, or the like of the above electronic device for a long time. With the use of the semiconductor device of one embodiment of the present invention, a highly reliable electronic device can be provided.

An IC in which the above AI system is incorporated can be used for the arithmetic device or the like of the above-described electronic device, for example. Accordingly, the electronic device of this embodiment can perform optimal operations depending on circumstances with low power consumption by utilizing the AI system.

This embodiment can be implemented in an appropriate combination with any of the structures described in the other embodiments.

This application is based on Japanese Patent Application Serial No. 2017-119073 filed with Japan Patent Office on Jun. 16, 2017, and Japanese Patent Application Serial No. 2017-132740 filed with Japan Patent Office on Jul. 6, 2017, the entire contents of which are hereby incorporated by reference.

What is claimed is:

1. A semiconductor device comprising:
a first conductor over a substrate;
a first insulator over the first conductor;
a second conductor over the first insulator; and
a third conductor, a second insulator, and an oxide which are embedded in a first opening in the first insulator and a second opening in the second conductor,
wherein the oxide comprises indium and zinc,
wherein the third conductor, the second insulator, and the oxide extend in a direction intersecting a top surface of the substrate,
wherein the oxide surrounds the third conductor with the second insulator provided therebetween, and
wherein a bottom surface of the oxide is in contact with a top surface of the first conductor.

2. The semiconductor device according to claim 1, further comprising a third insulator between the oxide and the third conductor.

3. The semiconductor device according to claim 1, wherein the oxide is in a columnar shape.

4. The semiconductor device according to claim 1, wherein a width of the first opening is smaller than a width of the second opening.

5. The semiconductor device according to claim 1, wherein the oxide further comprises a metal element selected from Al, Ga, Y, and Sn.

6. The semiconductor device according to claim 1, wherein a top surface of the oxide is electrically connected to a fourth conductor.

7. The semiconductor device according to claim 6,
wherein the first conductor is one of a bit line and a source line, and
wherein the fourth conductor is the other of the bit line and the source line.

8. A semiconductor device comprising:
a first conductor over a substrate;
a first insulator over the first conductor;
a second conductor over the first insulator; and
a third conductor, a second insulator, and an oxide which are embedded in a first opening in the first insulator and a second opening in the second conductor,
wherein the oxide comprises indium and zinc,
wherein the third conductor, the second insulator, and the oxide extend in a direction intersecting a top surface of the substrate,
wherein the oxide surrounds the third conductor with the second insulator provided therebetween,
wherein a bottom surface of the oxide is in contact with a top surface of the first conductor,
wherein the oxide comprises a first region in the first opening and a second region in the second opening, and
wherein the resistance of the first region is lower than the resistance of the second region.

9. The semiconductor device according to claim 8, further comprising a third insulator between the oxide and the third conductor.

10. The semiconductor device according to claim 8, wherein the oxide is in a columnar shape.

11. The semiconductor device according to claim 8, wherein a width of the first opening is smaller than a width of the second opening.

12. The semiconductor device according to claim 8, wherein the oxide further comprises a metal element selected from Al, Ga, Y, and Sn.

13. The semiconductor device according to claim 8, wherein a top surface of the oxide is electrically connected to a fourth conductor.

14. The semiconductor device according to claim 13,
wherein the first conductor is one of a bit line and a source line, and
wherein the fourth conductor is the other of the bit line and the source line.

* * * * *